(12) United States Patent
Umezaki

(10) Patent No.: US 7,687,808 B2
(45) Date of Patent: Mar. 30, 2010

(54) DISPLAY DEVICE

(75) Inventor: Atsushi Umezaki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 298 days.

(21) Appl. No.: 11/863,913

(22) Filed: Sep. 28, 2007

(65) Prior Publication Data
US 2009/0224245 A1 Sep. 10, 2009

(30) Foreign Application Priority Data
Sep. 29, 2006 (JP) ............................. 2006-269689

(51) Int. Cl.
G09G 3/36 (2006.01)
(52) U.S. Cl. .......................................... 257/72; 349/44
(58) Field of Classification Search .................. 257/59, 257/72; 349/44
See application file for complete search history.

(56) References Cited

U.S. PATENT DOCUMENTS

| 5,313,222 | A | * | 5/1994 | Lee | ............. | 345/58 |
| 5,648,790 | A | * | 7/1997 | Lee | ............. | 345/58 |
| 7,106,292 | B2 | | 9/2006 | Moon | | |
| 2003/0227433 | A1 | * | 12/2003 | Moon | ......... | 345/100 |
| 2005/0220263 | A1 | | 10/2005 | Moon | | |
| 2006/0256066 | A1 | | 11/2006 | Moon | | |

FOREIGN PATENT DOCUMENTS

JP 2004-157508 6/2004
JP 2005-293817 10/2005

OTHER PUBLICATIONS

Soo Young Yoon et al.; "P-172L: *Late-News Poster*: Highly Stable Integrated Gate Driver Circuit using a-Si TFT with Dual Pull-down Structure"; *SID 05 Digest*; pp. 348-351; 2005.
Binn Kim et al.; "a-Si Gate Driver Integration with Time Shared Data Driving"; *IDW/AD '05*; pp. 1073-1076; 2005.
Mindoo Chun et al.; "Integrated Gate Driver Using Highly Stable a-Si TFT's"; *IDW/AD '05*; pp. 1077-1080; 2005.

(Continued)

*Primary Examiner*—Thomas L Dickey
(74) *Attorney, Agent, or Firm*—Fish & Richardson P.C.

(57) ABSTRACT

By applying an AC pulse to a gate of a transistor which easily deteriorates, a shift in threshold voltage of the transistor is suppressed. However, in a case where amorphous silicon is used for a semiconductor layer of a transistor, the occurrence of a shift in threshold voltage naturally becomes a problem for a transistor which constitutes a part of circuit that generates an AC pulse. A shift in threshold voltage of a transistor which easily deteriorates and a shift in threshold voltage of a turned-on transistor are suppressed by signal input to a gate electrode of the transistor which easily deteriorates through the turned-on transistor. In other words, a structure for applying an AC pulse to a gate electrode of a transistor which easily deteriorates through a transistor to a gate electrode of which a high potential (VDD) is applied, is included.

25 Claims, 106 Drawing Sheets

OTHER PUBLICATIONS

Chun-Ching Wei et al.; "Integrated Gate Driver Circuit Using a-Si TFT"; *IDW/AD '05*; pp. 1023-1026; 2005.

Yong Ho Jang et al.; "P-5: A-Si TFT Integrated Gate Driver with AC-driven Single Pull-down Structure"; *SID 06 Digest*; pp. 208-211; 2006.

Jin Young Choi et al.; "P-218L: *Late-News Poster*: A Compact and Cost-efficient TFT-LCD through the Triple-Gate Pixel Structure"; *SID 06 Digest*; 274-276; 2006.

YongSoon Lee et al.; "16.2: Advanced TFT-LCD Data Line Reduction Method"; *SID 06 Digest*; pp. 1083-1086; 2006.

* cited by examiner

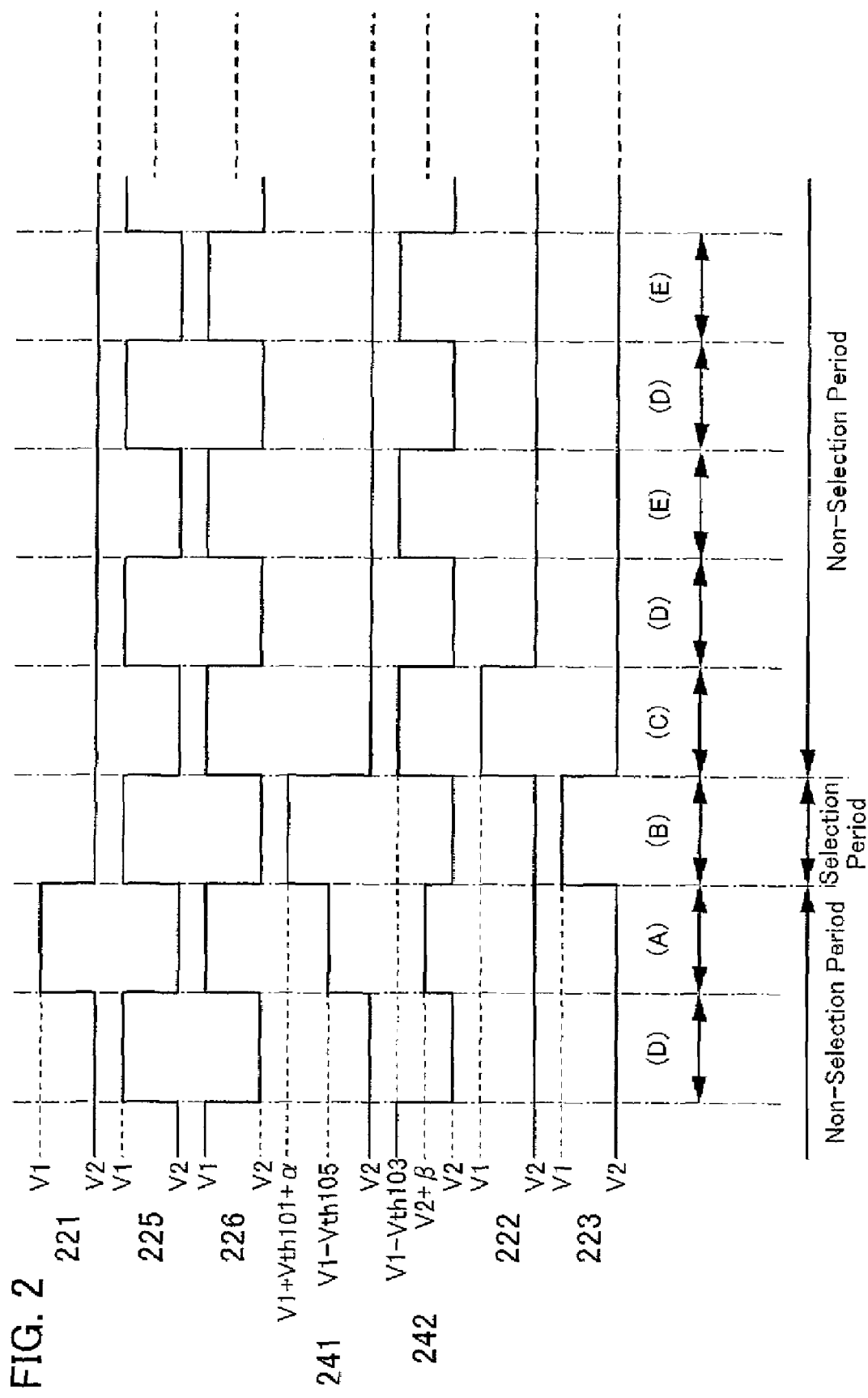

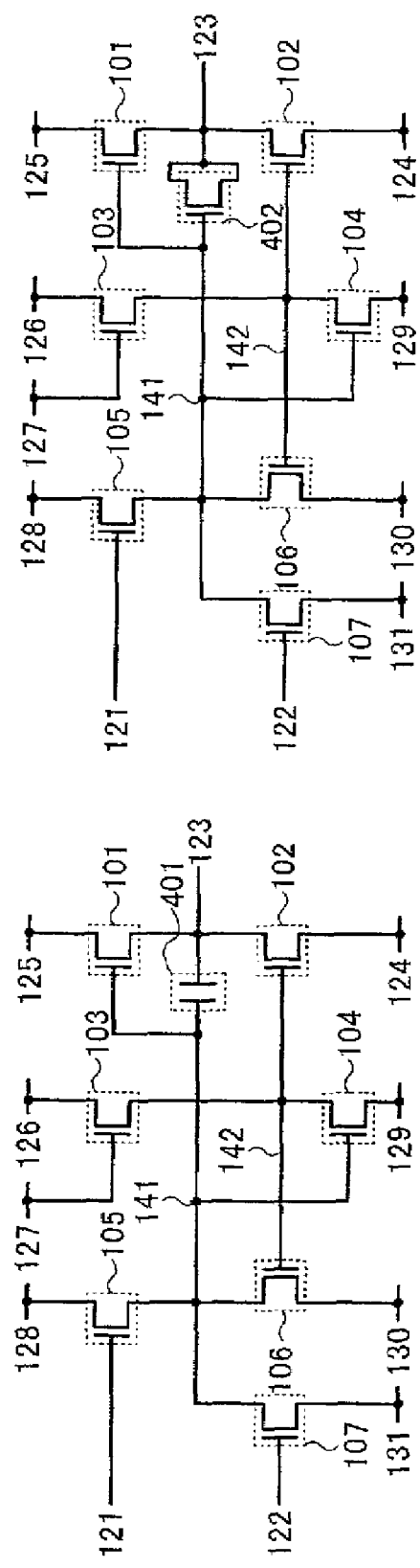
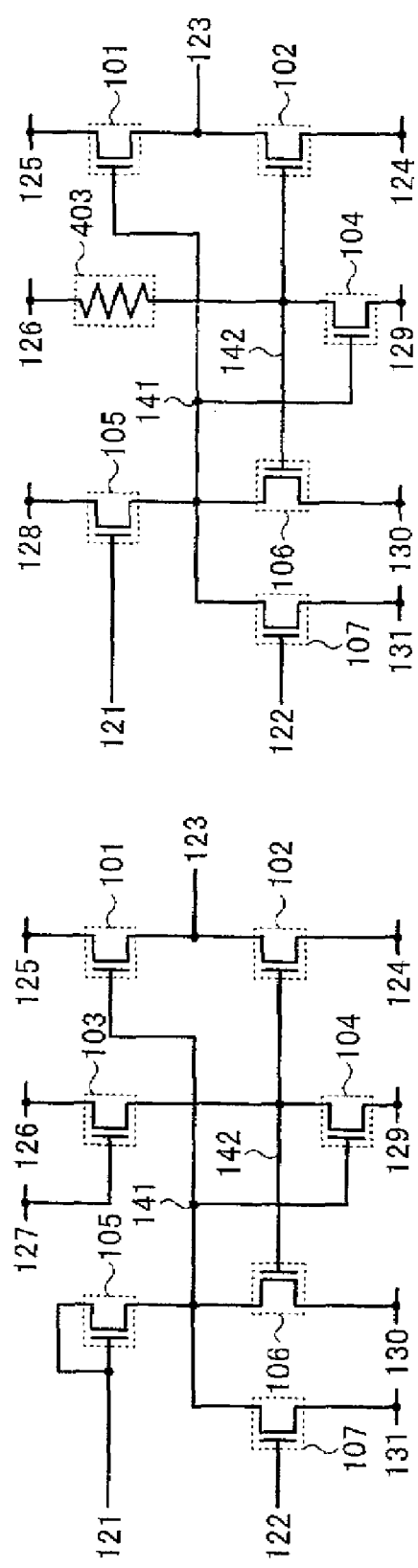
FIG. 4B
FIG. 4D
FIG. 4A
FIG. 4C

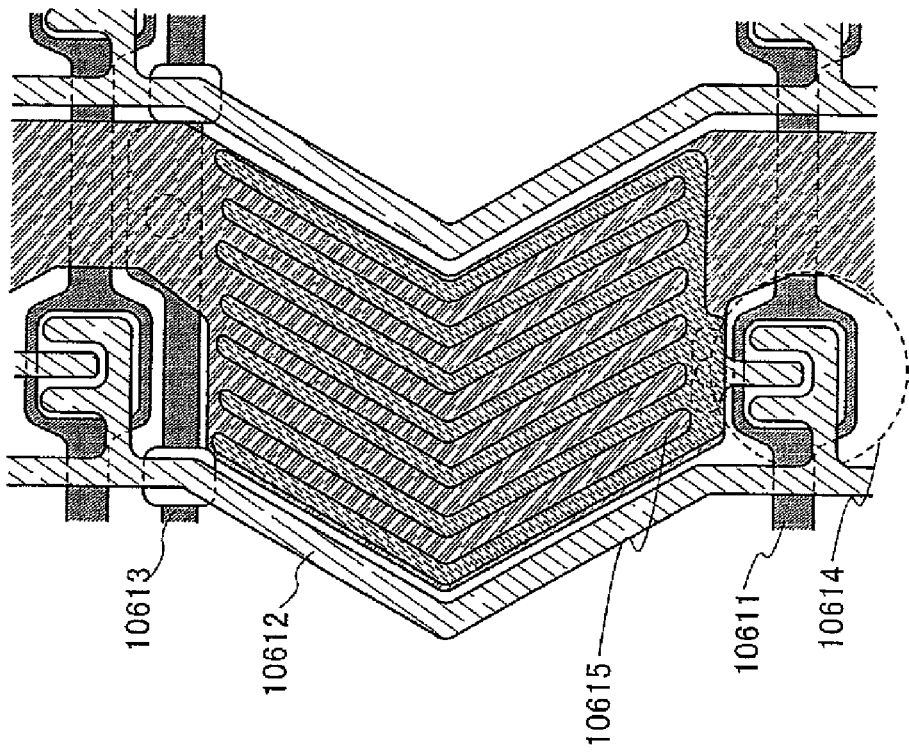
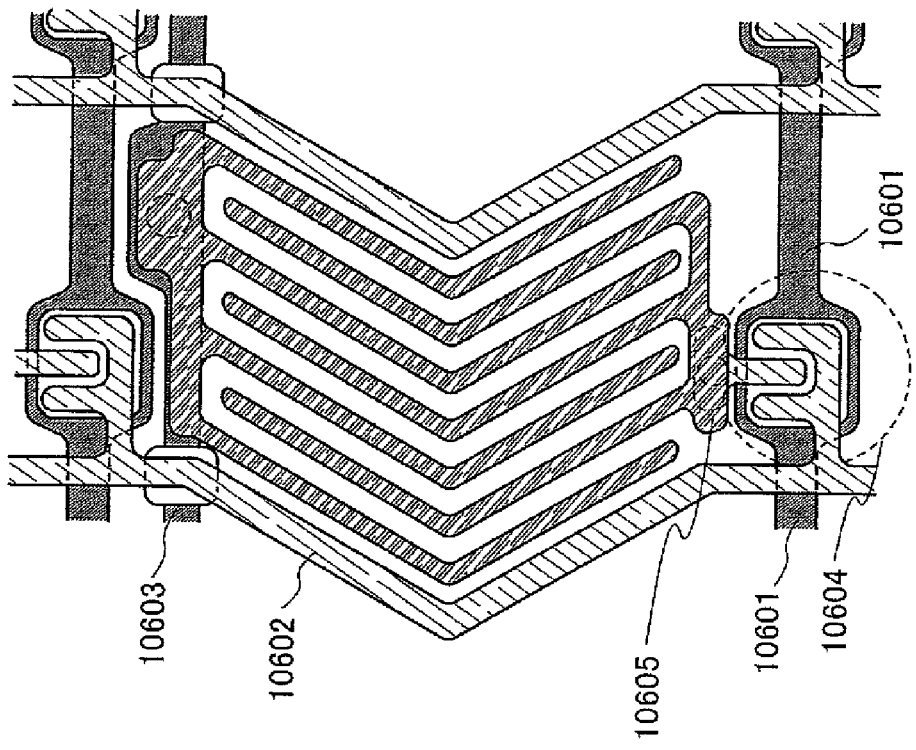

Semiconductor Layer
Gate Metal
Wiring
Transparent Conductive Film 901301
901303
901302

901301
901303
901302

DISPLAY DEVICE

BACKGROUND OF THE INVENTION

1. Field of the Invention

The present invention relates to a display device which includes a circuit configured using a transistor. The present invention particularly relates to a display device using a light emitting element, an electro-optical element such as a liquid crystal element, or the like as a display medium and to a method for driving the display device.

2. Description of the Related Art

In recent years, with the increase of large-scale display devices such as liquid crystal televisions, display devices have been actively developed. In particular, a technique for forming a pixel circuit and a driver circuit including a shift register and the like (hereinafter also referred to as an internal circuit) over the same insulating substrate by using transistors formed of a non-crystalline semiconductor (hereinafter also referred to as amorphous silicon) has been actively developed because the technique greatly contributes to reductions in power consumption and cost. The internal circuit formed over the insulating substrate is connected to a controller IC or the like (hereinafter also referred to as an external circuit) through an FPC or the like, and thus its operation is controlled.

Among the aforementioned internal circuits, a shift register using transistors formed of a non-crystalline semiconductor (hereinafter also referred to as amorphous silicon transistors) has been devised. FIG. 106A shows a structure of a flip-flop included in a conventional shift register (Reference 1: Japanese Published Patent Application No. 2004-157508). The flip-flop of FIG. 106A includes a transistor 11, a transistor 12, a transistor 13, a transistor 14, a transistor 15, a transistor 16, and a transistor 17, and is connected to a signal line 21, a signal line 22, a wiring 23, a signal line 24, a power supply line 25, and a power supply line 26. A start signal, a reset signal, a clock signal, a power supply potential VDD, and a power supply potential VSS are input to the signal line 21, the signal line 22, the signal line 24, the power supply line 25, and the power supply line 26, respectively. An operation period of the flip-flop of FIG. 106A is divided into a set period, a selection period, a reset period, and a non-selection period as shown in a timing chart of FIG. 106B, and most of the operation period is a non-selection period.

Here, the transistor 12 and the transistor 16 are turned on in a non-selection period. Because amorphous silicon is used for semiconductor layers of the transistor 12 and the transistor 16, fluctuation in threshold voltage (Vth) is caused due to deterioration or the like. Specifically, a threshold voltage is increased. In other words, a conventional shift register, in which the transistor 12 and the transistor 16 cannot be turned on due to an increase in threshold voltage, cannot supply VSS to a node 41 and the wiring 23 and causes malfunction.

In order to solve this problem, shift registers which can suppress a shift in threshold voltage of the transistor 12 have been devised in References 2, 3, and 4 (Reference 2: Soo Young Yoon et al., "Highly Stable Integrated Gate Driver Circuit using a-Si TFT with Dual Pull-down Structure", SOCIETY FOR INFORMATION DISPLAY 2005 INTERNATIONAL SYMPOSIUM DIGEST OF TECHNICAL PAPERS, Volume XXXVI, pp. 348-351, Reference 3: Binn Kim et al., "a-Si Gate Driver Integration with Time Shared Data Driving", Proceedings of The 12$^{th}$ International Display Workshops in conjunction with Asia Display 2005, pp. 1073-1076, and Reference 4: Mindoo Chun et al., "Integrated Gate Driver Using Highly Stable a-Si TFT's", Proceedings of The 12$^{th}$ International Display Workshops in conjunction with Asia Display 2005, pp. 1077-1080). In References 2, 3, and 4, an additional transistor (called a first transistor) is arranged in parallel with the transistor 12 (called a second transistor), and signals inverted with respect to each other are input to gate electrodes of the first transistor and the second transistor in a non-selection period; thus, shifts in threshold voltage of the first transistor and the second transistor are suppressed.

Further, in Reference 5, a shift register, which can suppress a shift in threshold voltage of the transistor 16 as well as the transistor 12, has been devised (Reference 5: Chun-Ching et al., "Integrated Gate Driver Circuit Using a-Si TFT", Proceedings of The 12$^{th}$ International Display Workshops in conjunction with Asia Display 2005, pp. 1023-1026). In Reference 5, an additional transistor (called a first transistor) is arranged in parallel with the transistor 12 (called a second transistor) and another additional transistor (called a third transistor) is arranged in parallel with the transistor 16 (called a fourth transistor). In a non-selection period, signals inverted with respect to each other are input to gate electrodes of the first transistor and the second transistor, and signals inverted with respect to each other are input to gate electrodes of the third transistor and the fourth transistor; thus, shifts in threshold voltage of the first, second, third, and fourth transistors are suppressed.

Furthermore, in Reference 6, a shift in threshold voltage of the transistor 12 is suppressed by applying an AC pulse to the gate electrode of the transistor 12 (Reference 6: Yong Ho Jang et al., "A-Si TFT Integrated Gate Driver with AC-Driven Single Pull-down Structure", SOCIETY FOR INFORMATION DISPLAY 2006 INTERNATIONAL SYMPOSIUM DIGEST OF TECHNICAL PAPERS, Volume XXXVII, pp. 208-211).

Note that in each of the display devices in References 7 and 8, the number of signal lines is reduced to one third by using a shift register formed using an amorphous silicon transistor as a scan line driver circuit and inputting a video signal to each of subpixels of R, G, and B through one signal line (Reference 7: Jin Young Choi et al., "A Compact and Cost-efficient TFT-LCD through the Triple-Gate Pixel Structure", SOCIETY FOR INFORMATION DISPLAY 2006 INTERNATIONAL SYMPOSIUM DIGEST OF TECHNICAL PAPERS, Volume XXXVII, pp. 274-276, and Reference 8: Yong Soon Lee et al., "Advanced TFT-LCD Data Line Reduction Method", SOCIETY FOR INFORMATION DISPLAY 2006 INTERNATIONAL SYMPOSIUM DIGEST OF TECHNICAL PAPERS, Volume XXXVII, pp. 1083-1086). Thus, in each of the display devices in References 7 and 8, the number of connections between a display panel and a driver IC is reduced.

SUMMARY OF THE INVENTION

According to the conventional art, by applying an AC pulse to a gate of a transistor which easily deteriorates, a shift in threshold voltage of the transistor is suppressed. However, in a case where amorphous silicon is used for a semiconductor layer of the transistor, the occurrence of a shift in threshold voltage naturally becomes a problem for a transistor included in a circuit that generates an AC pulse.

In addition, although a reduction in number of contact points between a display panel and a driver IC through a reduction in number of signal lines to one third has been proposed (References 7 and 8), a further reduction in number of contact points of a driver IC is practically needed.

In other words, objects left unachieved by the conventional art are as follows: a circuit technology for suppressing a fluctuation in threshold voltage of a transistor; a technique for reducing the number of contact points of a driver IC mounted on a display panel; a reduction in power consumption of a display device; and an increase in size or definition of a display device.

It is an object of the invention disclosed by this specification to provide an industrially-useful technique by achieving one or more of these objects.

A display device according to the present invention suppresses a shift in threshold voltage of a transistor which easily deteriorates and a shift in threshold voltage of a transistor in an on state by signal input to a gate electrode of the transistor which easily deteriorates through the transistor in an on state. In other words, the present invention includes a structure for applying an AC pulse to a gate electrode of a transistor which easily deteriorates through a transistor (or an element having a resistance) to a gate electrode of which a high potential (VDD) is applied.

Switches in this specification can be of various types. An electrical switch, a mechanical switch, and the like are given as examples. That is, any element can be used as long as it can control a current flow, without limitation to a particular element. For example, a transistor (e.g., a bipolar transistor or a MOS transistor), a diode (e.g., a PN diode, a PIN diode, a Schottky diode, a MIM (Metal Insulator Metal) diode, a MIS (Metal Insulator Semiconductor) diode, or a diode-connected transistor), a thyristor, or the like can be used as a switch. Alternatively, a logic circuit combining such elements can be used as a switch.

In the case of using a transistor as a switch, polarity (a conductivity type) of the transistor is not particularly limited because it operates just as a switch. However, a transistor having polarity with smaller off-current is preferably used when off-current should be small. A transistor provided with an LDD region, a transistor with a multi-gate structure, and the like are given as examples of a transistor with smaller off-current. When a transistor, which is operated as a switch, operates with a potential of its source terminal close to a low-potential-side power supply (e.g., VSS, GND, or 0 V), an n-channel transistor is preferably used. On the other hand, when a transistor, which is operated as a switch, operates with a potential of its source terminal closer to a potential of a high-potential-side power supply (e.g., VDD), a p-channel transistor is preferably used. This is because the absolute value of gate-source voltage can be increased and switching characteristics become favorable when an n-channel transistor operates with a potential of its source terminal closer to a low-potential-side power supply or when a p-channel transistor operates with a potential of its source terminal closer to a potential of a high-potential-side power supply. This is also because the transistors hardly conduct a source follower operation, so that reduction in output voltage hardly occurs.

A CMOS switch may be employed as a switch by using both N-channel and p-channel transistors. A CMOS switch can more precisely operate as a switch because current can flow when either the p-channel transistor or the n-channel transistor is turned on. For example, voltage can be appropriately output regardless of whether voltage of an input signal of the switch is high or low. In addition, since a voltage amplitude value of a signal for turning on or off the switch can be made small, power consumption can be reduced.

When a transistor is employed as a switch, the switch includes an input terminal (one of a source terminal and a drain terminal), an output terminal (the other of the source terminal and the drain terminal), and a terminal for controlling electrical conduction (a gate terminal). On the other hand, when a diode is employed as a switch, some switches do not have a terminal for controlling electrical conduction. Therefore, the number of wirings for controlling terminals can be more reduced than the case of using a transistor, when a diode is used as a switch.

When it is explicitly described in this specification that "A and B are connected", the case where A and B are electrically connected, the case where A and B are functionally connected, and the case where A and B are directly connected are included therein. Here, each of A and B is an object (e.g., a device, an element, a circuit, a wiring, an electrode, a terminal, a conductive film, or a layer). Accordingly, connections other than the connections described in this specification and illustrated in the drawings are also included in the structures disclosed by this specification, without limitations to predetermined connections and the connections described in this specification and illustrated in the drawings.

For example, in the case where A and B are electrically connected, one or more elements which enable electrical connection of A and B (e.g., a switch, a transistor, a capacitor, an inductor, a resistor, and/or a diode) may be provided between A and B. In addition, in the case where A and B are functionally connected, one or more circuits which enable functional connection of A and B (e.g., a logic circuit such as an inverter, a NAND circuit, or a NOR circuit, a signal converter circuit such as a DA converter circuit, an AD converter circuit, or a gamma correction circuit, a potential level converter circuit such as a power supply circuit (e.g., a step-up circuit or a step-down circuit) or a level shifter circuit for changing a potential level of a signal, a voltage source, a current source, a switching circuit, an amplifier circuit such as a circuit which can increase signal amplitude, the amount of current, or the like (e.g., an operational amplifier, a differential amplifier circuit, a source follower circuit, or a buffer circuit), a signal generating circuit, a memory circuit, and/or a control circuit) may be provided between A and B. Alternatively, in the case where A and B are directly connected, A and B may be directly connected without interposing another element or another circuit therebetween.

When it is explicitly described that "A and B are directly connected", the case where A and B are directly connected (i.e., the case where A and B are connected without interposing another element or another circuit therebetween) and the case where A and B are electrically connected (i.e., the case where A and B are connected with another element or another circuit interposed therebetween) are included therein.

When it is explicitly described that "A and B are electrically connected", the case where A and B are electrically connected (i.e., the case where A and B are connected with another element or another circuit interposed therebetween), the case where A and B are functionally connected (i.e., the case where A and B are functionally connected with another circuit interposed therebetween), and the case where A and B are directly connected (i.e., the case where A and B are connected without interposing another element or another circuit therebetween) are included therein. That is, when it is explicitly described that "A and B are electrically connected", the description is the same as the case where it is explicitly and simply described that "A and B are connected".

A display element, a display device which is a device having a display element, a light-emitting element, and a light-emitting device which is a device having a light-emitting element can be of various types and can include various elements. For example, as a display element, a display device, a light-emitting element, or a light-emitting device, a display medium whose contrast, luminance, reflectivity, transmitivity, or the like changes by an electromagnetic action, such as an EL element (e.g., an organic EL element, an inorganic EL element, or an EL element including both organic and inorganic materials), an electron-emissive element, a liquid crystal element, electronic ink, an electrophoresis element, a grating light valve (GLV), a plasma display panel (PDP), a digital micromirror device (DMD), a piezoelectric ceramic display, or a carbon nanotube can be employed. Note that display devices using an EL element include an EL display; display devices using an electron-emissive element include a field emission display (FED), an SED-type flat panel display (SED: Surface-conduction Electron-emitter Display), and the like; display devices using a liquid crystal element include a liquid crystal display (e.g., a transmissive liquid crystal display, a semi-transmissive liquid crystal display, a reflective liquid crystal display, a direct-view liquid crystal display, or a projection liquid crystal display); and display devices using electronic ink or an electrophoresis element include electronic paper.

Transistors in this specification can be of various types without limitations to a particular type. For example, thin film transistors (TFT) including a non-single crystalline semiconductor film typified by amorphous silicon, polycrystalline silicon, microcrystal (also referred to as semi-amorphous) silicon, or the like can be employed. In the case of using such TFTs, there are various advantages. For example, since TFTs can be formed at temperature lower than those using single crystalline silicon, the manufacturing cost can be reduced and the size of a manufacturing device can be increased. Since the manufacturing device can be made larger, the TFTs can be formed using a large substrate. Therefore, since a large number of display devices can be formed at the same time, they can be formed at low cost. In addition, because the manufacturing temperature is low, a substrate having low heat resistance can be used. Thus, transistors can be formed using a light-transmitting substrate. Further, transmission of light in a display element can be controlled by using the transistors formed using the light-transmitting substrate. Furthermore, a part of a film which forms a transistor can transmit light because film thickness of the transistor is thin. Accordingly, an aperture ratio can be improved.

By using a catalyst (e.g., nickel) in the case of forming polycrystalline silicon, crystallinity can be more improved and a transistor having excellent electric characteristics can be formed. Accordingly, a gate driver circuit (e.g., a scan line driver circuit), a source driver circuit (e.g., a signal line driver circuit), and a signal processing circuit (e.g., a signal generation circuit, a gamma correction circuit, or a DA converter circuit) can be formed over the same substrate.

By using a catalyst (e.g., nickel) in the case of forming microcrystal silicon, crystallinity can be more improved and a transistor having excellent electric characteristics can be formed. At this time, crystallinity can be improved by performing heat treatment without using a laser. Accordingly, a gate driver circuit (e.g., a scan line driver circuit) and a part of a source driver circuit (e.g., an analog switch) can be formed over the same substrate. In addition, in the case of not using a laser for crystallization, crystallinity unevenness (mura) of silicon can be suppressed. Therefore, an image having high image quality can be displayed.

Note that polycrystalline silicon and microcrystal silicon can be formed without using a catalyst (e.g., nickel).

In addition, a transistor can be formed by using a semiconductor substrate, an SOI substrate, or the like. In that case, a MOS transistor, a junction transistor, a bipolar transistor, or the like can be used as the transistor in this specification. With such a transistor, a transistor with almost no variations in characteristics, sizes, shapes, or the like, with high current supply capacity, and with a small size can be formed. By using such a transistor, a circuit which consumes less power can be structured, or higher integration can be achieved.

In addition, a transistor including a compound semiconductor or an oxide semiconductor such as ZnO, a-InGaZnO, SiGe, GaAs, IZO, ITO (indium tin oxide), or SnO, and a thin film transistor or the like with a thin film of such a compound semiconductor or an oxide semiconductor can be used. Therefore, manufacturing temperature can be lowered and for example, such a transistor can be formed at room temperature. Accordingly, the transistor can be formed directly on a substrate having low heat resistance such as a plastic substrate or a film substrate. Note that such a compound semiconductor or an oxide semiconductor can be used for not only a channel portion of a transistor but also other applications. For example, such a compound semiconductor or an oxide semiconductor can be used for a resistor, a pixel electrode, or a light-transmitting electrode. Further, since such an element can be formed at the same time as the transistor, the cost can be reduced.

Transistors or the like formed by using an inkjet method or a printing method can also be used. Accordingly, transistors can be formed at room temperature, can be formed at a low vacuum, or can be formed using a large substrate. In addition, since transistors can be formed without using a mask (a reticle), layout of the transistors can be easily changed. Further, since it is not necessary to use a resist, the material cost is reduced and the number of steps can be reduced. Furthermore, since a film is formed only in a necessary portion, a material is not wasted compared with a manufacturing method in which etching is performed after a film is formed over the entire surface, so that the cost can be reduced.

Further, transistors or the like including an organic semiconductor or a carbon nanotube can be used. Accordingly, such transistors can be formed using a bendable or flexible substrate. Therefore, such transistors can resist a shock.

Furthermore, various transistors other than the above-described types can be used.

Substrates over which transistors are formed can be of various types and are not limited to those of specific types. Examples of substrate over which transistors are formed are: a single crystalline substrate; an SOI substrate; a glass substrate; a quartz substrate; a plastic substrate; a paper substrate; a cellophane substrate; a stone substrate; a wood substrate; a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like); a leather substrate; a rubber substrate; a stainless-steel substrate; a substrate including stainless-steel foil; and the like. Alternatively, a skin (e.g., cuticle or corium) or hypodermal tissue of an animal such as a human being can be used as a substrate. In addition, transistors may be formed using a substrate, and then, the transistors may be transferred to another substrate. As a substrate to which the transistors are transferred, a single crystalline substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, a stainless-steel substrate, a substrate including stainless-steel foil, or the like can be used. By using such a substrate, transistors with excellent properties or transistors which consume less power can be formed, a device with high durability or high heat resistance can be formed, or reduction in weight can be achieved.

Transistors can have various structures without limitation to a certain structure. For example, a multi-gate structure having two or more gate electrodes may be used. In the multi-gate structure, a plurality of transistors are connected in series because channel regions are connected in series. By using the multi-gate structure, off-current can be reduced or the withstand voltage of transistors can be increased to improve reliability. Alternatively, drain-source current does not fluctuate very much even if drain-source voltage fluctuates when the transistor operates in a saturation region, so that voltage-current characteristics with a flat slope can be obtained. By utilizing the voltage-current characteristics with a flat slope, an ideal current source circuit or an active load having an extremely high resistance value can be provided. Accordingly, a differential circuit or a current mirror circuit having excellent properties can be provided. Alternatively, a structure where gate electrodes are formed above and below a channel may be used. By using the structure where gate electrodes are formed above and below the channel, a channel region is enlarged, so that the amount of current flowing therethrough can be increased. Alternatively, a depletion layer can be easily formed to decrease a subthreshold swing (S value). When the gate electrodes are formed above and below the channel, a structure where a plurality of transistors are connected in parallel is provided.

Alternatively, a structure where a gate electrode is formed above a channel region, or a structure where a gate electrode is formed below a channel region may be employed. Still alternatively, a staggered structure or an inverted staggered structure may be employed; a channel region may be divided into a plurality of regions; channel regions may be connected in parallel; or channel regions may be connected in series. In addition, a source electrode or a drain electrode may overlap with a channel region (or part of it). By using the structure where the source electrode or the drain electrode overlaps with the channel region (or part of it), an unstable operation due to electric charges accumulated in part of the channel region can be prevented. Further, an LDD region may be provided. By providing the LDD region, off-current can be reduced or the withstand voltage of transistors can be increased to improve reliability. Alternatively, by providing the LDD region, drain-source current does not fluctuate so much even if drain-source voltage fluctuates when a transistor operates in the saturation region, so that voltage-current characteristics with a flat slope can be obtained.

In this specification, one pixel corresponds to the smallest unit of an image. Accordingly, in the case of a full-color display device having color elements of R (Red), G (Green), and B (Blue), one pixel includes a dot of a color element of R (Red), a dot of a color element of G (Green), and a dot of a color element of B (Blue). Note that the color elements are not limited to three colors, and color elements of three or more colors may be used or a color other than RGB may be used. For example, RGBW (W corresponds to white) may be used by adding white. In addition, RGB plus one or more colors of yellow, cyan, magenta, emerald green, vermilion, and the like may be used. Further, a color similar to at least one of R, G, and B may be added to RGB. For example, R, G, B1, and B2 may be used. Although both B1 and B2 are blue, they have slightly different frequency. Similarly, R1, R2, G, and B may be used. By using such color elements, display which is closer to the real object can be performed or power consumption can be reduced. Note that one pixel may include a plurality of dots of color elements of the same color. In that case, the plurality of color elements may have different sizes of regions that contribute to display. In addition, by separately controlling the plurality of dots of color elements of the same color, grayscale may be expressed. This method is referred to as an area-grayscale method. Alternatively, with the use of the plurality of dots of color elements of the same color, signals supplied to each of the plurality of dots may be slightly varied to widen a viewing angle. That is, potentials of pixel electrodes included in a plurality of color elements of the same color may be different from each other. Accordingly, voltages applied to liquid crystal molecules are varied depending on the pixel electrodes. Therefore, the viewing angle can be widened.

In this specification, one pixel corresponds to one element whose brightness can be controlled. Therefore, as an example, one pixel corresponds to one color element and brightness is expressed with the one color element. Accordingly, in the case of a color display device having color elements of R (Red), G (Green), and B (Blue), the minimum unit of an image is formed of three pixels of an R pixel, a G pixel, and a B pixel. Note that the color elements are not limited to three colors, and color elements of three or more colors may be used or a color other than RGB may be used. For example, RGBW (W corresponds to white) may be used by adding white. In addition, RGB plus one or more colors of yellow, cyan, magenta, emerald green, vermilion, and the like can be used. Further, a color similar to at least one of R, G, and B may be added to RGB. For example, R, G, B1, and B2 may be used. Although both B1 and B2 are blue, they have slightly different frequency. Similarly, R1, R2, G, and B may be used. By using such color elements, display which is closer to the real object can be performed, or power consumption can be reduced. Alternatively, as another example, in the case of controlling brightness of one color element by using a plurality of regions, one region may correspond to one pixel. Therefore, as an example, in the case of performing area ratio grayscale display or the case of including subpixels, a plurality of regions which control brightness are provided for each color element and grayscales are expressed with all of the regions. In this case, one region which controls brightness may correspond to one pixel. Thus, in this case, one color element includes a plurality of pixels. Alternatively, even when a plurality of regions which control brightness are provided in one color element, one color element including the plurality of regions may correspond to one pixel. Thus, in this case, one color element includes one pixel. Further, when brightness is controlled by a plurality of regions for each color element, regions which contribute to display have different area dimensions depending on pixels in some cases. In addition, in a plurality of regions which control brightness in each color element, signals supplied to each of the plurality of regions may be slightly varied to widen a viewing angle. That is, potentials of pixel electrodes included in a plurality of regions provided in each color element may be different from each other. Accordingly, voltages applied to liquid crystal molecules are varied depending on the pixel electrodes. Therefore, the viewing angle can be widened.

When "one pixel (for three colors)" is explicitly described, it corresponds to the case where three pixels of R, G, and B are considered as one pixel. Meanwhile, when "one pixel (for one color)" is explicitly described, it corresponds to the case where a plurality of regions are provided for each color element and collectively considered as one pixel.

In this specification, pixels are provided (arranged) in matrix in some cases. Here, description that pixels are provided (arranged) in matrix includes the case where the pixels are arranged in a straight line and the case where the pixels are arranged in a jagged line, in a longitudinal direction or a lateral direction. For example, in the case of performing full color display with three color elements (e.g., RGB), a case where pixels are arranged in stripes and a case where dots of the three color elements are arranged in a delta pattern are included. Additionally, a case which dots of the three color elements are provided in Bayer arrangement is also included. Note that the color elements are not limited to three colors, and more than three color elements may be employed. RGBW (W corresponds to white), RGB plus one or more of yellow, cyan, magenta, and the like, or the like is given as an example. Further, the sizes of display regions may be different between respective dots of color elements. Thus, power consumption can be reduced, or the life of a display element can be prolonged.

In this specification, an active matrix method in which an active element is included in a pixel or a passive matrix method in which an active element is not included in a pixel can be used.

In the active matrix method, as an active element (a non-linear element), not only a transistor but also various active elements (non-linear elements) can be used. For example, a MIM (Metal Insulator Metal), a TFD (Thin Film Diode), or the like can also be used. Since such an element needs a smaller number of manufacturing steps, the element can be manufactured at low cost, or a yield can be improved. Further, since the size of such an element is small, an aperture ratio can be improved, so that power consumption can be reduced and higher luminance can be achieved.

As a method other than the active matrix method, the passive matrix method in which an active element (a non-linear element) is not used can also be used. Since an active element (a non-linear element) is not used, the number of manufacturing steps is smaller, so that the element can be manufactured at low cost, or the yield can be improved. Further, since an active element (a non-linear element) is not used, the aperture ratio can be improved, so that power consumption can be reduced and high luminance can be achieved.

Note that a transistor is an element having at least three terminals of a gate, a drain, and a source. The transistor has a channel region between a drain region and a source region, and current can flow through the drain region, the channel region, and the source region. Here, since the source and the drain of the transistor may change depending on the structure, the operating condition, etc., of the transistor, it is difficult to define which is a source or a drain. Therefore, in this specification, a region functioning as a source and a drain is not called the source or the drain in some cases. In such a case, for example, one of the source and the drain may be described as a first electrode and the other thereof may be described as a second electrode.

A transistor may be an element having at least three terminals of a base, an emitter, and a collector. In this case also, one of the emitter and the collector may be similarly called a first terminal and the other terminal may be called a second terminal.

A gate corresponds to the whole or part of a gate electrode and a gate wiring (also called a gate line, a gate signal line, a scan line, a scan signal line, or the like). A gate electrode corresponds to part of a conductive film which overlaps with a semiconductor which forms a channel region with a gate insulating film interposed therebetween. Note that part of the gate electrode overlaps with an LDD (Lightly Doped Drain) region, or the source region and the drain region with the gate insulating film interposed therebetween in some cases. A gate wiring corresponds to a wiring for connection between gate electrodes of transistors, or a wiring for connection between a gate electrode and another wiring.

Note that there is a portion (a region, a conductive film, a wiring, or the like) which acts as both a gate electrode and a gate wiring. Such a portion (a region, a conductive film, a wiring, or the like) may be called either a gate electrode or a gate wiring. That is, there is a region where a gate electrode and a gate wiring cannot be clearly distinguished from each other. For example, in the case where a channel region overlaps with part of an extended gate wiring, the overlapped portion (region, conductive film, wiring, or the like) functions as both a gate wiring and a gate electrode. Accordingly, such a portion (a region, a conductive film, a wiring, or the like) may be called either a gate electrode or a gate wiring.

In addition, a portion (a region, a conductive film, a wiring, or the like) which is formed of the same material as a gate electrode and which forms the same island as the gate electrode to be connected to the gate electrode may also be called a gate electrode. Similarly, a portion (a region, a conductive film, a wiring, or the like) which is formed of the same material as a gate wiring and which forms the same island as the gate wiring to be connected to the gate wiring may also be called a gate wiring. In a strict sense, such a portion (a region, a conductive film, a wiring, or the like) does not overlap with a channel region and does not have a function of connecting a gate electrode to another gate electrode in some cases. However, there is a portion (a region, a conductive film, a wiring, or the like) which is formed of the same material as a gate electrode or a gate wiring and which forms the same island as the gate electrode or the gate wiring to be connected to the gate electrode or the gate wiring. Such a portion (a region, a conductive film, a wiring, or the like) may also be called either a gate electrode or a gate wiring.

In a multi-gate transistor, for example, a gate electrode is often connected to another gate electrode by using a conductive film which is formed of the same material as the gate electrodes. Since such a portion (a region, a conductive film, a wiring, or the like) is a portion (a region, a conductive film, a wiring, or the like) for connecting the gate electrode to another gate electrode, it may be called a gate wiring, but it may also be called a gate electrode because a multi-gate transistor can be considered as one transistor. That is, a portion (a region, a conductive film, a wiring, or the like) which is formed of the same material as a gate electrode or a gate wiring and which forms the same island as the gate electrode or the gate wiring to be connected to the gate electrode or the gate wiring may be called either a gate electrode or a gate wiring. In addition, for example, part of a conductive film which connects a gate electrode and a gate wiring and which is formed from a different material from the gate electrode and the gate wiring may also be called either a gate electrode or a gate wiring.

A gate terminal corresponds to part of a portion (a region, a conductive film, a wiring, or the like) of a gate electrode or a portion (a region, a conductive film, a wiring, or the like) which is electrically connected to the gate electrode.

When a wiring is called a gate wiring, a gate line, a gate signal line, a scan line, a scan signal line, or the like, there is a case in which a gate of a transistor is not connected to a wiring. In this case, the gate wiring, the gate line, the gate signal line, the scan line, or the scan signal line corresponds to a wiring formed in the same layer as the gate of the transistor, a wiring formed of the same material of the gate of the transistor, or a wiring formed at the same time as the gate of the transistor in some cases. Examples are: a wiring for storage capacitor; a power supply line; a reference potential supply line; and the like.

A source corresponds to the whole or part of a source region, a source electrode, and a source wiring (also called a source line, a source signal line, a data line, a data signal line, or the like). A source region corresponds to a semiconductor region containing a large amount of p-type impurities (e.g., boron or gallium) or n-type impurities (e.g., phosphorus or arsenic). Accordingly, a region containing a small amount of p-type impurities or n-type impurities, namely, an LDD (Lightly Doped Drain) region is not included in the source region. A source electrode is part of a conductive layer which is formed of a material different from that of a source region and electrically connected to the source region. Note that there is a case where a source electrode and a source region are collectively called a source electrode. A source wiring is a wiring for connection between source electrodes of transistors, or a wiring for connection between a source electrode and another wiring.

However, there is a portion (a region, a conductive film, a wiring, or the like) functioning as both a source electrode and a source wiring. Such a portion (a region, a conductive film, a wiring, or the like) may be called either a source electrode or a source wiring. That is, there is a region where a source electrode and a source wiring cannot be clearly distinguished from each other. For example, in a case where a source region overlaps with part of an extended source wiring, the overlapped portion (region, conductive film, wiring, or the like) functions as both a source wiring and a source electrode. Accordingly, such a portion (a region, a conductive film, a wiring, or the like) may be called either a source electrode or a source wiring.

In addition, a portion (a region, a conductive film, a wiring, or the like) which is formed of the same material as a source electrode and which forms the same island as the source electrode to be connected to the source electrode, or a portion (a region, a conductive film, a wiring, or the like) which connects a source electrode and another source electrode may also be called a source electrode. Further, a portion which overlaps with a source region may be called a source electrode. Similarly, a portion (a region, a conductive film, a wiring, or the like) which is formed of the same material as a source wiring and which forms the same island as the source wiring to be connected to the source wiring may also be called a source wiring. In a strict sense, such a portion (a region, a conductive film, a wiring, or the like) does not have a function of connecting a source electrode to another source electrode in some cases. However, there is a portion (a region, a conductive film, a wiring, or the like) which is formed of the same material as a source electrode or a source wiring and is connected to the source electrode or the source wiring. Thus, such a portion (a region, a conductive film, a wiring, or the like) may also be called either a source electrode or a source wiring.

In addition, for example, part of a conductive film which connects a source electrode and a source wiring and is formed of a material different from that of the source electrode or the source wiring may be called either a source electrode or a source wiring.

A source terminal corresponds to part of a source region, a source electrode, or a portion (a region, a conductive film, a wiring, or the like) which is electrically connected to the source electrode.

When a wiring is called a source wiring, a source line, a source signal line, a data line, a data signal line, or the like, there is a case in which a source (a drain) of a transistor is not connected to a wiring. In this case, the source wiring, the source line, the source signal line, the data line, or the data signal line corresponds to a wiring formed in the same layer as the source (the drain) of the transistor, a wiring formed of the same material of the source (the drain) of the transistor, or a wiring formed at the same time as the source (the drain) of the transistor in some cases. Examples are: a wiring for storage capacitor; a power supply line; a reference potential supply line; and the like.

The same applies to a drain as to the source.

A semiconductor device corresponds to a device having a circuit including a semiconductor element (e.g., a transistor, a diode, or thyristor). The semiconductor device may be general devices that can function by utilizing semiconductor characteristics.

A display element corresponds to an optical modulation element, a liquid crystal element, a light-emitting element, an EL element (an organic EL element, an inorganic EL element, or an EL element including organic and inorganic materials), an electron-emissive element, an electrophoresis element, a discharging element, a light-reflecting element, a light diffraction element, a digital micromirror device (DMD), or the like. Note that the present invention is not limited to these examples.

A display device corresponds to a device having a display element. Note that a display device may correspond to a main body of a display panel where a plurality of pixels each including a display element and a peripheral driver circuit for driving these pixels are formed over the same substrate. In addition, a display device may also include a peripheral driver circuit provided over a substrate by wire bonding or bump bonding, namely, an IC chip connected by chip on glass (COG) or an IC chip connected by TAB or the like. Further, a display device may include a flexible printed circuit (FPC) to which an IC chip, a resistor, a capacitor, an inductor, a transistor, or the like is attached. Note that a display device includes a printed wiring board (PWB) which is connected through a flexible printed circuit (FPC) and to which an IC chip, a resistor, a capacitor, an inductor, a transistor, or the like is attached. A display device may also include an optical sheet such as a polarizing plate or a retardation plate. A display device may also include a lighting device, a housing, an audio input and output device, a light sensor, and the like. Here, a lighting device such as a backlight unit may include a light guide plate, a prism sheet, a diffusion sheet, a reflective sheet, a light source (e.g., an LED or a cold cathode tube), a cooling device (e.g., a water cooling device or an air cooling device), or the like.

A lighting device corresponds to a device having a backlight unit, a light guide plate, a prism sheet, a diffusion sheet, a reflective sheet, or a light source (e.g., an LED, a cold cathode tube, or a hot cathode tube), a cooling device, or the like.

A light-emitting device corresponds to a device having a light-emitting element or the like.

A reflective device corresponds to a device having a light-reflecting element, a light-diffraction element, a light-reflecting electrode, or the like.

A liquid crystal display device corresponds to a display device including a liquid crystal element. Liquid crystal display devices include a direct-view liquid crystal display, a projection liquid crystal display, a transmissive liquid crystal display, a semi-transmissive liquid crystal display, a reflective liquid crystal display, and the like.

A driving device corresponds to a device having a semiconductor element, an electric circuit, an electronic circuit, and/or the like. For example, a transistor which controls input of a signal from a source signal line to a pixel (also called a selection transistor, a switching transistor, or the like), a transistor which supplies voltage or current to a pixel electrode, a transistor which supplies voltage or current to a light-emitting element, and the like are examples of the driving device. A circuit which supplies a signal to a gate signal line (also called a gate driver, a gate line driver circuit, or the like), a circuit which supplies a signal to a source signal line (also called a source driver, a source line driver circuit, or the like) are also examples of the driving device.

A display device, a semiconductor device, a lighting device, a cooling device, a light-emitting device, a reflective device, a driving device, and the like are provided together in some cases. For example, a display device includes a semiconductor device and a light-emitting device in some cases, or a semiconductor device includes a display device and a driving device in some cases.

When "B is formed on A" or "B is formed over A" is explicitly described in this specification, it does not necessarily mean that B is formed in direct contact with A. The description includes a case where A and B are not in direct contact with each other, i.e., a case where another object is interposed between A and B. Here, each of A and B corresponds to an object (e.g., a device, an element, a circuit, a wiring, an electrode, a terminal, a conductive film, or a layer).

Accordingly, for example, when "a layer B is formed on (or over) a layer A" is explicitly described, it includes both a case where the layer B is formed in direct contact with the layer A, and a case where another layer (e.g., a layer C or a layer D) is formed in direct contact with the layer A, and the layer B is formed in direct contact with the layer C or D. Note that another layer (e.g., a layer C or a layer D) may be a single layer or a plurality of layers.

Similarly, when "B is formed above (or over) A" is explicitly described, it does not necessarily mean that B is formed in direct contact with A, and another object may be interposed between A and B. Accordingly, for example, when "a layer B is formed above a layer A" is explicitly described, it includes both a case where the layer B is formed in direct contact with the layer A, and a case where another layer (e.g., a layer C or a layer D) is formed in direct contact with the layer A, and the layer B is formed in direct contact with the layer C or D. Note that another layer (e.g., a layer C or a layer D) may be a single layer or a plurality of layers.

When it is explicitly described that B is formed in direct contact with A, it includes the case where B is formed in direct contact with A, but not the case where another object is interposed between A and B.

The same applies to a case where "B is formed below or under A" is explicitly described.

Characteristic deterioration of all transistors included in a shift register can be suppressed. Therefore, the malfunction of a semiconductor device employing the shift register, such as a liquid crystal display device, can be suppressed.

BRIEF DESCRIPTION OF DRAWINGS

FIG. 2 is a timing chart illustrating an operation of the flip-flop shown in FIG. 1.

FIGS. 4A to 4D are diagrams illustrating structures of flip-flops described in Embodiment Mode 1.

FIGS. 42A to 42C are diagrams illustrating structures of protective diodes described in Embodiment Mode 6.

FIGS. 43A and 43B are diagrams illustrating structures of protective diodes described in Embodiment Mode 6.

FIGS. 72A and 72B are pixel layout examples of a semiconductor device according to the present invention.

DETAILED DESCRIPTION OF THE INVENTION

Figure 1:
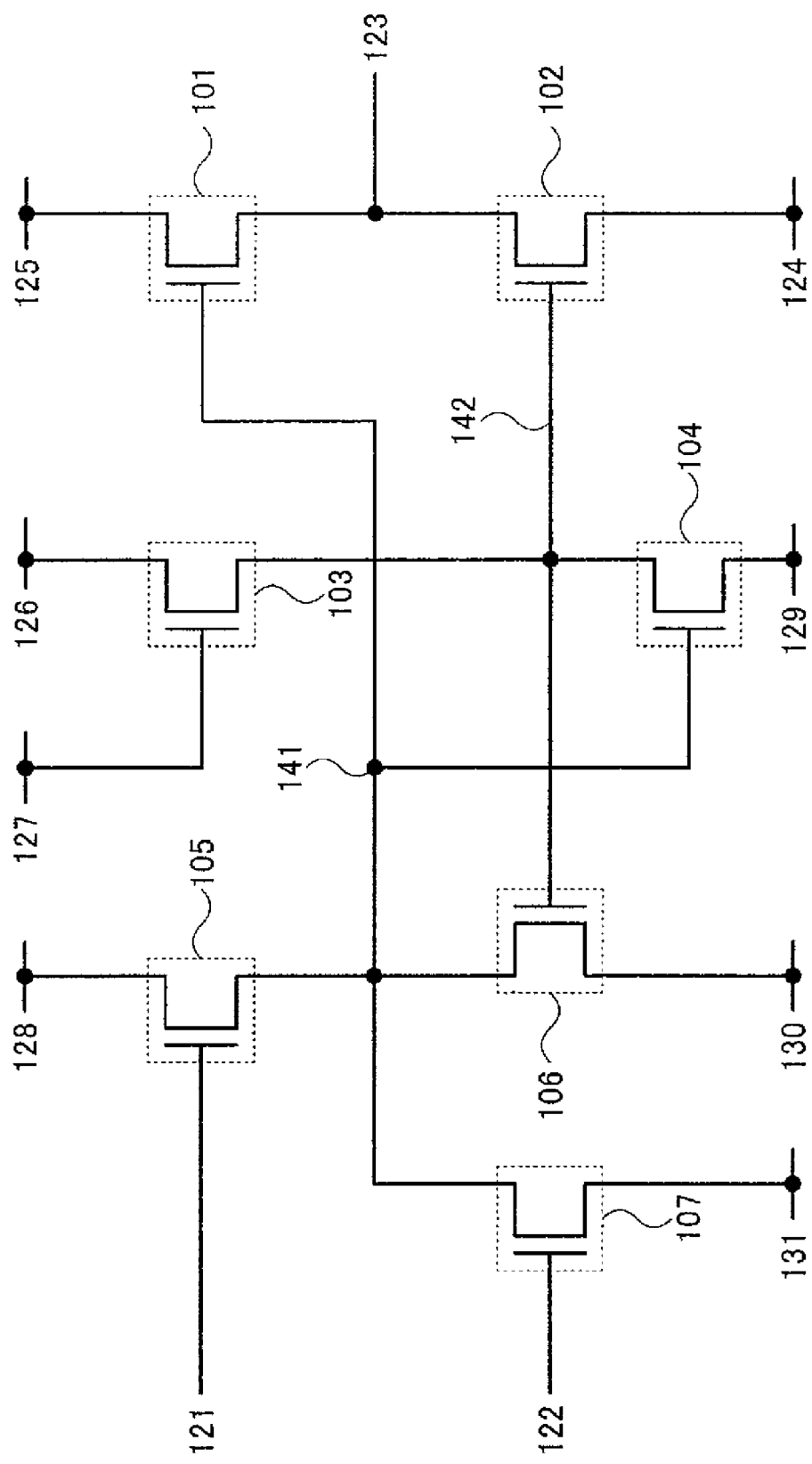
FIG. 1 is a diagram illustrating a structure of a flip-flop described in Embodiment Mode 1.

Embodiment modes of the present invention will be hereinafter described with reference to the drawings. Note that the present invention can be carried out in many different modes, and it is easily understood by those skilled in the art that the mode and the detail of the invention can be variously changed without departing from the spirit and the scope thereof. Therefore, the present invention is not interpreted as being limited to the description of embodiment modes.

Embodiment Mode 1

This embodiment mode describes structures and driving methods of a flip-flop, a driver circuit including the flip-flop, and a display device including the driver circuit.

A basic structure of a flip-flop of this embodiment mode is described with reference to FIG. 1. A flip-flop shown in FIG. 1 includes a first transistor 101, a second transistor 102, a third transistor 103, a fourth transistor 104, a fifth transistor 105, a sixth transistor 106, and a seventh transistor 107. In this embodiment mode, each of the first transistor 101, the second transistor 102, the third transistor 103, the fourth transistor 104, the fifth transistor 105, the sixth transistor 106, and the seventh transistor 107 is an n-channel transistor and becomes conductive when a gate-source voltage (Vgs) exceeds a threshold voltage (Vth).

The connection relationship of the flip-flop of FIG. 1 is described. A first electrode (one of a source electrode and a drain electrode) of the first transistor 101 is connected to a fifth wiring 125, and a second electrode (the other of the source electrode and the drain electrode) of the first transistor 101 is connected to a third wiring 123. A first electrode of the second transistor 102 is connected to a fourth wiring 124, and a second electrode of the second transistor 102 is connected to the third wiring 123. A first electrode of the third transistor 103 is connected to a sixth wiring 126; a second electrode of the third transistor 103 is connected to a gate electrode of the second transistor 102; and a gate electrode of the third transistor 103 is connected to a seventh wiring 127. A first electrode of the fourth transistor 104 is connected to a ninth wiring 129; a second electrode of the fourth transistor 104 is connected to the gate electrode of the second transistor 102; and a gate electrode of the fourth transistor 104 is connected to a gate electrode of the first transistor 101. A first electrode of the fifth transistor 105 is connected to an eighth wiring 128; a second electrode of the fifth transistor 105 is connected to the gate electrode of the first transistor 101; and a gate electrode of the fifth transistor 105 is connected to a first wiring 121. A first electrode of the sixth transistor 106 is connected to a tenth wiring 130; a second electrode of the sixth transistor 106 is connected to the gate electrode of the first transistor 101; and a gate electrode of the sixth transistor 106 is connected to the gate electrode of the second transistor 102. A first electrode of the seventh transistor 107 is connected to an eleventh wiring 131; a second electrode of the seventh transistor 107 is connected to the gate electrode of first transistor 101; and a gate electrode of the seventh transistor 107 is connected to a second wiring 122.

Note that a connection portion of the gate electrode of the first transistor 101, the gate electrode of the fourth transistor 104, the second electrode of the fifth transistor 105, the second electrode of the sixth transistor 106, and the second electrode of the seventh transistor 107 is referred to as a node 141. A connection portion of the gate electrode of the second transistor 102, the second electrode of the third transistor 103, the second electrode of the fourth transistor 104, and the gate electrode of the sixth transistor 106 is referred to as a node 142.

The fourth wiring 124, the ninth wiring 129, the tenth wiring 130, and the eleventh wiring 131 may be connected to each other or may be a single wiring. The seventh wiring 127 and the eighth wiring 128 may be connected to each other or may be a single wiring.

The first wiring 121, the second wiring 122, the third wiring 123, the fifth wiring 125, and the sixth wiring 126 may be referred to as a first signal line, a second signal line, a third signal line, a fourth signal line, and a fifth signal line, respectively. The fourth wiring 124, the seventh wiring 127, the eighth wiring 128, the ninth wiring 129, the tenth wiring 130, and the eleventh wiring 131 may be referred to as a first power supply line, a second power supply line, a third power supply line, a fourth power supply line, a fifth power supply line, and a sixth power supply line, respectively.

The seventh wiring 127 and the eighth wiring 128 are each supplied with a potential V1, and the fourth wiring 124, the ninth wiring 129, the tenth wiring 130, and the eleventh wiring 131 are each supplied with a potential V2. The relationship of V1>V2 is satisfied.

Signals are each input to the first wiring 121, the second wiring 122, the fifth wiring 125, and the sixth wiring 126. The signal input to the first wiring 121 is a start signal; the signal input to the second wiring 122 is a reset signal; the signal input to the fifth wiring 125 is a first clock signal; and the signal input to the sixth wiring 126 is a second clock signal. Further, each of the signals input to the first wiring 121, the second wiring 122, the fifth wiring 125, and the sixth wiring 126 is a digital signal including an H signal with a potential of V1 (hereinafter also referred to as an H level) and an L signal with a potential of V2 (hereinafter also referred to as an L level).

Various signals, potentials, or currents may be input to the first wiring 121, the second wiring 122, and the fourth to eleventh wirings 124 to 131.

Through the third wiring 123, a signal is output. The signal output through the third wiring 123 is an output signal of a flip-flop of each stage and is also a start signal of a flip-flop of the next stage (hereinafter also referred to as a transfer signal). The signal output through the third wiring 123 is a digital signal including an H signal with a potential of V1 (hereinafter also referred to as an H level) and an L signal with a potential of V2 (hereinafter also referred to as an L level).

Next, an operation of the flip-flop shown in FIG. 1 is described with reference to a timing chart of FIGS. 2, and 3A to 3E. In addition, the timing chart of FIG. 2 is described with an operation period divided into a selection period and a non-selection period. Further, the timing chart is described with the non-selection period divided into a first non-selection period, a second non-selection period, a set period, and a reset period. Furthermore, during an operation period in the non-selection period except for the set period and the reset period, the first non-selection period and the second non-selection period are sequentially repeated.

Note that in FIG. 2, a signal 221, a signal 225, a signal 226, a potential 241, a potential 242, a signal 222, and a signal 223 refer to the signal input to the first wiring 121, the signal input to the fifth wiring 125, the signal input to the sixth wiring 126, a potential of the node 141, a potential of the node 142, the signal input to the second wiring 122, and the signal output through the third wiring 123, respectively.

Figure 3A:
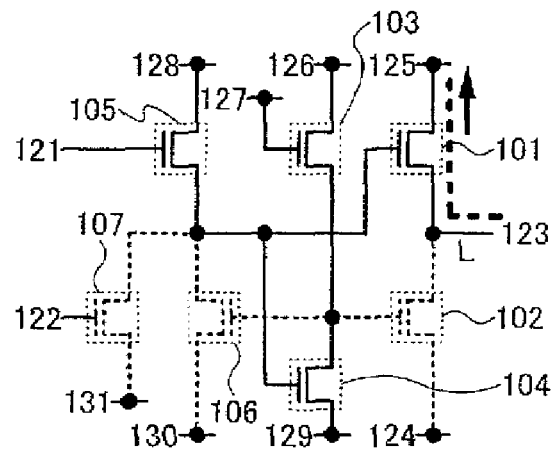
FIGS. 3A to 3E are diagrams illustrating operations of the flip-flop shown in FIG. 1.

First, in the set period shown as period A in FIG. 2 and shown in FIG. 3A, the fifth transistor 105 is turned on because the signal 221 is at the H level, and the seventh transistor 107 is turned off because the signal 222 is at the L level. The potential of the node 141 (the potential 241) at this time is V1−Vth(105) (Vth(105): a threshold voltage of the fifth transistor 105) because the second electrode of the fifth transistor 105 serves as a source electrode and the potential of the node 141 is a value obtained by subtracting the threshold voltage of the fifth transistor 105 from the potential of the eighth wiring 128. Thus, the first transistor 101 and the fourth transistor 104 are turned on, and the fifth transistor 105 is turned off. The potential of the node 142 (the potential 242) at this time is determined by a resistance ratio of the third transistor 103 and the fourth transistor 104 (L/W and an application voltage) and is V2+β (β: a given positive number). The relationships of β<Vth(102) (Vth(102): a threshold voltage of the second transistor 102) and β<Vth(106) (Vth(106): a threshold voltage of the sixth transistor 106) are satisfied. In other words, a potential difference (V1−V2) between the potential of the ninth wiring 129 (V2) and the potential of the sixth wiring 126 (V1) is divided by the third transistor 103 and the fourth transistor 104. Accordingly, the second transistor 102 and the sixth transistor 106 are turned off. Thus, in the set period, the third wiring 123 is electrically connected to the fifth wiring 125 to which the L signal is input, so that the potential of the third wiring 123 becomes V2. Accordingly, the L signal is output through the third wiring 123. Further, the node 141 is in a floating state with the potential maintained at V1−Vth (105).

Figure 3B:
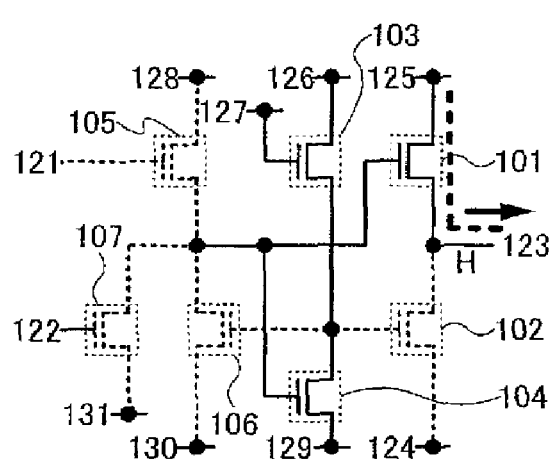

In the selection period shown as period B in FIG. 2 and shown in FIG. 3B, the fifth transistor 105 is turned off because the signal 221 is at the L level, and the seventh transistor 107 remains off because the signal 222 remains at the L level. The potential of the node 141 at the time is maintained at V1−Vth (105). Thus, the first transistor 101 and the fourth transistor 104 remain on. The potential of the node 142 at this time is V2 because the sixth wiring 126 is at the L level. Thus, the second transistor 102 and the sixth transistor 106 remain off. Here, the H signal is input to the fifth wiring 125, so that the potential of the third wiring 123 starts to increase. The potential of the node 141 at this time increases by a bootstrap operation from V1−Vth(105) to V1+Vth(101)+α (Vth(101): a threshold voltage of the first transistor 101, α: a given positive number). Accordingly, the potential of the third wiring 123 becomes equal to that of the fifth wiring 125, which is V1. Note that the bootstrap operation is performed by capacitive coupling of a parasitic capacitance between the gate electrode and the second electrode of the first transistor 101. Thus, in the selection period, the third wiring 123 is electrically connected to the fifth wiring 125 to which the H signal is input, so that the potential of the third wiring 123 is V1. Accordingly, the H signal is output through the third wiring 123.

Figure 3C:
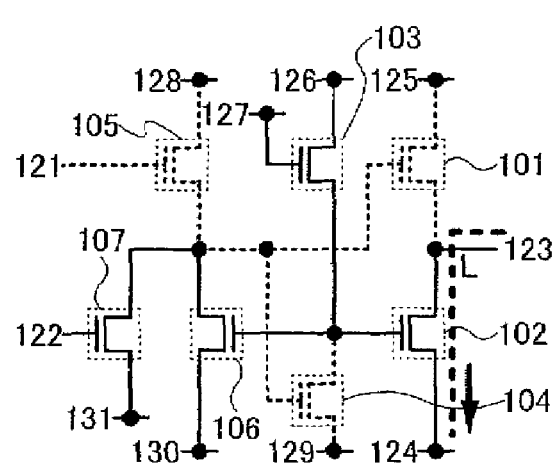

In the reset period shown as period C in FIG. 2 and shown in FIG. 3C, the fifth transistor 105 remains off because the signal 221 remains at the L level, and the seventh transistor 107 is turned on because the signal 222 is at the H level. The potential of the node 141 at this time is V2 because the potential of the eleventh wiring 131 (V2) is supplied through the seventh transistor 107. Thus, the first transistor 101 and the fourth transistor 104 are turned off. The potential of the node 142 at this time is V1−Vth(103) (Vth(103): a threshold voltage of the third transistor 103) because the second electrode of the third transistor 103 serves as a source electrode and the potential of the node 142 is a value obtained by subtracting the threshold voltage of the third transistor 103 from the potential of the sixth wiring 126 (V1). Accordingly, the second transistor 102 and the sixth transistor 106 are turned on. Thus, in the reset period, the third wiring 123 is electrically connected to the fourth wiring 124 to which V2 is supplied, so that the potential of the third wiring 123 is V2. Thus, the L signal is output through the third wiring 123.

Figure 3D:
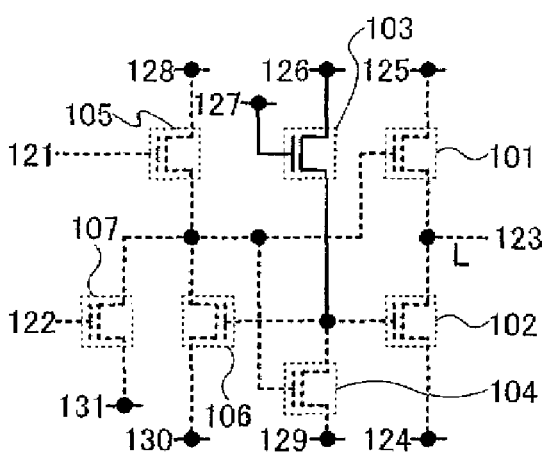

In the first non-selection period shown as period D in FIG. 2 and shown in FIG. 3D, the fifth transistor 105 remains off because the signal 221 remains at the L level, and the seventh transistor 107 is turned off because the signal 222 is at the L level. The potential of the node 142 at this time is V2 because the L signal is input to the sixth wiring 126. Thus, the second transistor 102 and the sixth transistor 106 are turned off. Because the node 141 at this time is in a floating state, the potential thereof is maintained at V2. Accordingly, the first transistor 101 and the fourth transistor 104 remain off. Thus, in the first non-selection period, the third wiring 123 is in a floating state, so that the potential of the third wiring 123 is maintained at V2.

Figure 3E:
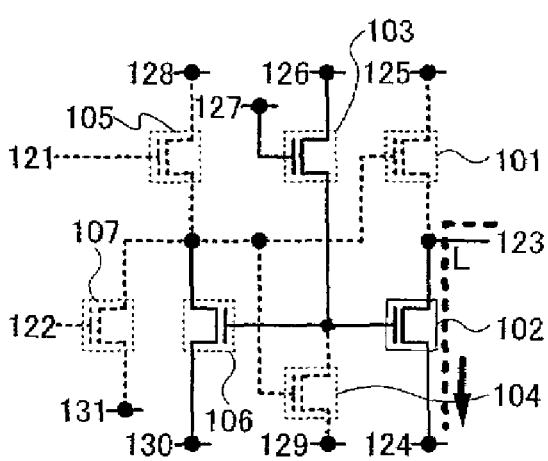

In the second non-selection period shown as period E of FIG. 2 and shown in FIG. 3E, the fifth transistor 105 remains off because the signal 221 remains at the L level, and the seventh transistor 107 remains off because the signal 222 remains at the L level. The potential of the node 142 at this time is V1−Vth(103) because the H signal is input to the sixth wiring 126 and the fourth transistor 104 is turned off. Thus, the second transistor 102 and the sixth transistor 106 are turned on. The potential of the node 141 at this time remains at V2 because the potential of the tenth wiring 130 (V2) is supplied through the sixth transistor 106. Accordingly, the first transistor 101 and the fourth transistor 104 remain off. Thus, in the second non-selection period, the third wiring 123 is electrically connected to the fourth wiring 124 to which V2 is supplied, so that the potential of the third wiring 123 remains at V2. Thus, the L signal is output through the third wiring 123.

Accordingly, the flip-flop of FIG. 1 can make the potential of the third wiring 123 V1 by making the potential of the node 141 higher than V1+Vth(101) using a bootstrap operation in the selection period. Further, the flip-flop of FIG. 1 can obtain merits such as reductions in layout area and number of elements because the bootstrap operation is performed using a capacitive coupling of a parasitic capacitance between the second electrode and the gate electrode of the first transistor 101.

Furthermore, the flip-flop of FIG. 1 can suppress shifts in threshold voltage of the second transistor 102 and the sixth transistor 106 because the second transistor 102 and the sixth transistor 106 are turned on only in the second non-selection period during the first and second non-selection periods.

Note that the flip-flop of FIG. 1 can also suppress a shift in threshold voltage of the third transistor 103 by supplying V1 to the gate electrode of the third transistor 103 and inputting the second clock signal to the first electrode.

In addition, the flip-flop of FIG. 1 can suppress shifts in threshold voltage of the first transistor 101, the fourth transistor 104, the fifth transistor 105, and the seventh transistor 107 because the first transistor 101, the fourth transistor 104, the fifth transistor 105, and the seventh transistor 107 are not turned on in the first non-selection period and the second non-selection period.

Further, the flip-flop of FIG. 1 can reset the potentials of the node 141 and the third wiring 123 to V2 by supplying V2 to the node 141 and the third wiring 123 in the second non-selection period even if the potentials of the node 141 and the third wiring 123 fluctuate in the first non-selection period. Thus, the flip-flop of FIG. 1 can suppress a malfunction of which cause is that the node 141 and the third wiring 123 are in a floating state and the potentials of the node 141 and the third wiring 123 fluctuate.

Furthermore, because the flip-flop of FIG. 1 can suppress a shift in threshold voltage of a transistor, the flip-flop can suppress a malfunction of which cause is a shift in threshold voltage of a transistor.

Moreover, in the flip-flop of FIG. 1, all of the first to seventh transistors 101 to 107 are n-channel transistors. Thus, amorphous silicon can be used for a semiconductor layer of each transistor of the flip-flop of FIG. 1, so that simplification of a manufacturing process can be achieved, and a reduction in manufacturing cost and an improvement in yield can be achieved. Further, a large-scale display device can also be manufactured. Note that simplification of a manufacturing process can be achieved even if all n-channel transistors are formed using polysilicon or single crystalline silicon for a semiconductor layer of each transistor.

Note that even if amorphous silicon which exhibits notable characteristic deterioration (shift in threshold voltage) is used for a semiconductor layer of each transistor, the flip-flop of FIG. 1 can suppress characteristic deterioration of each transistor. Therefore, a display device with long life can be manufactured.

Here, functions of the first to seventh transistors 101 to 107 are described. The first transistor 101 functions to select timing for supplying the potential of the fifth wiring 125 to the third wiring 123 and to increase the potential of the node 141 by a bootstrap operation, and functions as a bootstrap transistor. The second transistor 102 functions to select timing for supplying the potential of the fourth wiring 124 to the third wiring 123 and functions as a switching transistor. The third transistor 103 functions to divide a potential difference between the potential of the sixth wiring 126 and the potential of the ninth wiring 129 and functions as a resistor or a transistor having a resistance. The fourth transistor 104 functions to select timing for supplying the potential of the ninth wiring 129 to the node 142 and functions as a switching transistor. The fifth transistor 105 functions to select timing for supplying the potential of the eighth wiring 128 to the node 141 and functions as an input transistor. The sixth transistor 106 functions to select timing for supplying the potential of the tenth wiring 130 to the node 141 and functions as a switching transistor. The seventh transistor 107 functions to select timing for supplying the potential of the eleventh wiring 131 to the node 141 and functions as a switching transistor. Note that the first to seventh transistors 101 to 107 are not limited to transistors and may be any other elements that have the above-described functions. For example, the second transistor 102, the fourth transistor 104, the sixth transistor 106, and the seventh transistor 107 each functioning as the switching transistor may be any element that has a switching function, such as a diode, a CMOS analog switch, or various logic circuits. The fifth transistor 105 functioning as the input transistor may be any element that functions to select timing for being turned off by increasing the potential of the node 141, such as a PN junction diode or a diode-connected transistor.

Note that the third transistor 103 and the fourth transistor 104 constitute an AC pulse generating circuit. The AC pulse generating circuit outputs the signal input through the first electrode of the third transistor 103 to the node 142. Note that the AC pulse generating circuit outputs the L signal to the node 142 regardless of the signal input through the first electrode of the third transistor 103 when the gate electrode of the fourth transistor 104 is at the H level.

In the flip-flop of this embodiment mode, fall time and rise time of the signal 223 can be shortened when a value of W/L of the first transistor 101 is the highest among those of the first to seventh transistors 101 to 107. Accordingly, the flip-flop of this embodiment mode can output a signal with less distortion or delay even if a large load is connected to the third wiring 123.

In the flip-flop of this embodiment mode, a value of W/L of the first transistor 101 is preferably twice to five times, more preferably three to four times as high as that of the fifth transistor 105. Accordingly, the flip-flop of this embodiment mode can output a signal with less distortion or delay even if a large load is connected to the third wiring 123.

In the flip-flop of this embodiment mode, the potential of the node 142 in the set period can be decreased when a value of W/L of the fourth transistor 104 is greater than that of the third transistor 103. Accordingly, the flip-flop of this embodiment mode can suppress a malfunction because the sixth transistor 106 can surely be turned off in the set period.

In the flip-flop of this embodiment mode, a value of L of the third transistor 103 is preferably higher than, more preferably twice to three times as high as that of the fourth transistor 104. Accordingly, the flip-flop of this embodiment mode can decrease a value of W of the fourth transistor 104 because a value of W/L of the third transistor 103 is decreased and can achieve a reduction in layout area.

The arrangement, the number, and the like of the transistors are not limited to those in FIG. 1 as long as an operation similar to FIG. 1 is achieved. In this embodiment mode, as is apparent from FIGS. 3A to 3E illustrating the operations of the flip-flop in FIG. 1, electrical connections in the set period, the selection period, the reset period, the first non-selection period, and the second non-selection period are achieved as indicated by solid lines in FIGS. 3A to 3E, respectively. Accordingly, a transistor, an element (e.g., a resistor or a capacitor), a diode, a switch, various logic circuits, or the like may be additionally provided if the flip-flop has a structure in which transistors or the like are arranged and operated to satisfy the above conditions.

For example, a flip-flop shown in FIG. 4A can perform a more stable bootstrap operation in the selection period when a capacitor 401 is provided between the gate electrode and the second electrode of the first transistor 101. In addition, in the flip-flop in FIG. 4A, a parasitic capacitance between the gate electrode and the second electrode of the first transistor 101 can be decreased; thus, each transistor can be switched at high speed. Alternatively, the capacitor 401 may be replaced by a transistor 402 as shown in FIG. 4B. The transistor 402 can function as a capacitor with a large capacity when a gate electrode is connected to the node 141 and a first electrode and a second electrode are connected to the third wiring 123. Note that the transistor 402 can function as a capacitor even when one of the first and second electrodes is in a floating state. Note that components in common with those in FIG. 1 are denoted by common reference numerals, and the description is omitted.

Note that the capacitor 401 may use a gate insulating film as an insulating layer, and a gate electrode layer and a wiring layer as conductive layers; a gate insulating film as an insulating layer, and a gate electrode layer and a semiconductor layer to which an impurity is added as conductive layers; or an interlayer film (insulating film) as an insulating layer, and a wiring layer and a transmissive electrode layer as conductive layers. Note that when the capacitor 401 uses a gate electrode layer and a wiring layer as conductive layers, the gate electrode layer is preferably connected to the gate electrode of the first transistor 101 and the wiring layer is preferably connected to the second electrode of the first transistor 101. More preferably, when the capacitor 401 uses a gate electrode layer and a wiring layer as conductive layers, the gate electrode layer is directly connected to the gate electrode of the first transistor 101 and the wiring layer is directly connected to the second electrode of the first transistor 101. This is because an increase in layout area of the flip-flop due to the arrangement of the capacitor 401 can be reduced.

Another example is a flip-flop shown in FIG. 4C. By connection of the first electrode of the fifth transistor 105 to the first wiring 121 (by diode-connection of the first transistor 101), the eighth wiring 128 becomes unnecessary. Thus, one wiring and power supply (V1) can be reduced. Note that components in common with those in FIG. 1 are denoted by common reference numerals, and the description is omitted.

Another example is a flip-flop shown in FIG. 4D. With the use of a resistor 403 instead of the third transistor 103, one wiring and power supply can be reduced. In addition, the flip-flop of FIG. 4D can make the potential of the node 142 equal to the potential of the sixth wiring 126 (V1) in the second non-selection period, so that drive capability of the flip-flop can be improved. Note that components in common with those in FIG. 1 are denoted by common reference numerals, and the description is omitted.

Figure 7A:
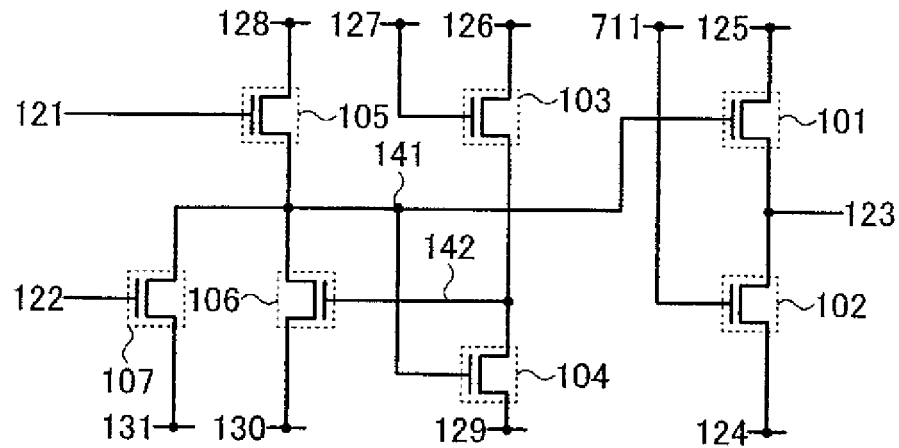
FIGS. 7A to 7C are diagrams illustrating structures of flip-flops described in Embodiment Mode 1.

Another example is a flip-flop shown in FIG. 7A. By connection of the gate electrode of the second transistor 102 to a wiring 711 to which a given signal is input, a reverse bias can be applied to the gate electrode of the second transistor 102. In addition, Vgs of the second transistor 102 can be reduced. Thus, a shift in threshold voltage of the second transistor 102 can further be suppressed. Note that components in common with those in FIG. 1 are denoted by common reference numerals, and the description is omitted.

Figure 7B:
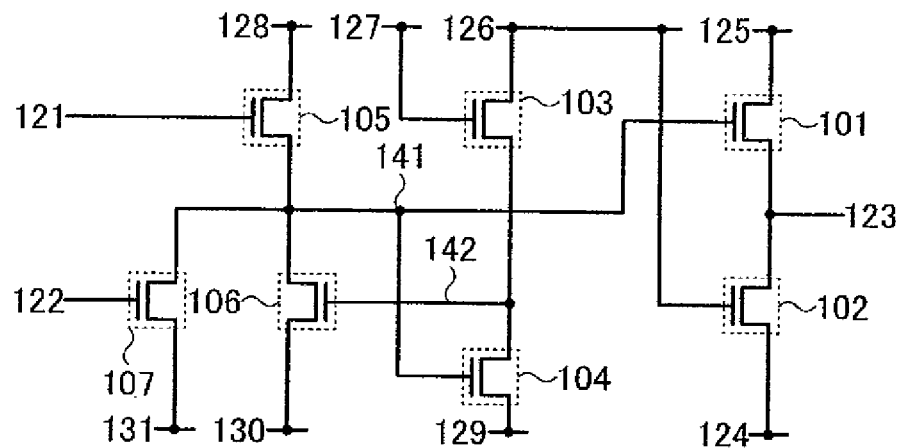

Another example is a flip-flop shown in FIG. 7B. By connection of the gate electrode of the second transistor 102 to the sixth wiring 126, the second transistor 102 can be turned on also in the set period. Therefore, drive capability can be improved. In addition, noise of the third wiring 123 can be reduced. Note that components in common with those in FIG. 1 are denoted by common reference numerals, and the description is omitted.

Figure 7C:
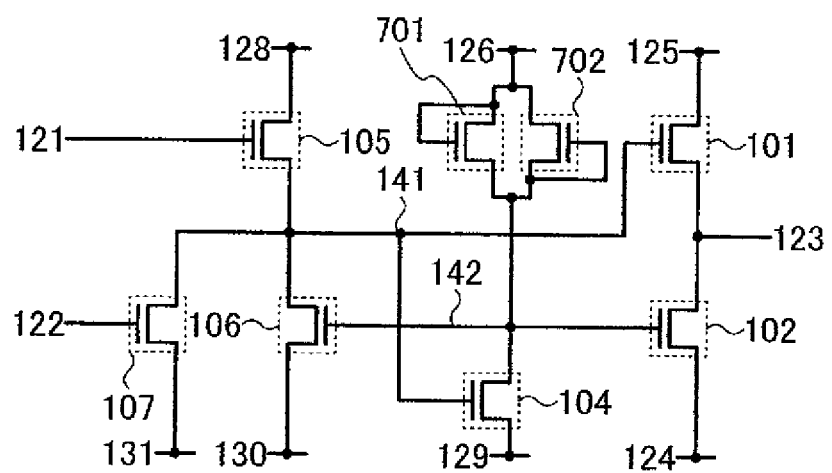

Another example is a flip-flop shown in FIG. 7C. With the use of a diode-connected transistor 701 and a diode-connected transistor 702 instead of the third transistor 103, one wiring and power supply can be reduced. A first electrode of the transistor 701, a second electrode of the transistor 702, and a gate electrode of the transistor 701 are connected to the sixth wiring 126. A second electrode of the transistor 701, a first electrode of the transistor 702, and a gate electrode of the transistor 702 are connected to the node 141. In other words, two reversed diodes are connected in parallel between the sixth wiring 126 and the node 141. Note that components in common with those in FIG. 1 are denoted by common reference numerals, and the description is omitted.

Figure 21A:
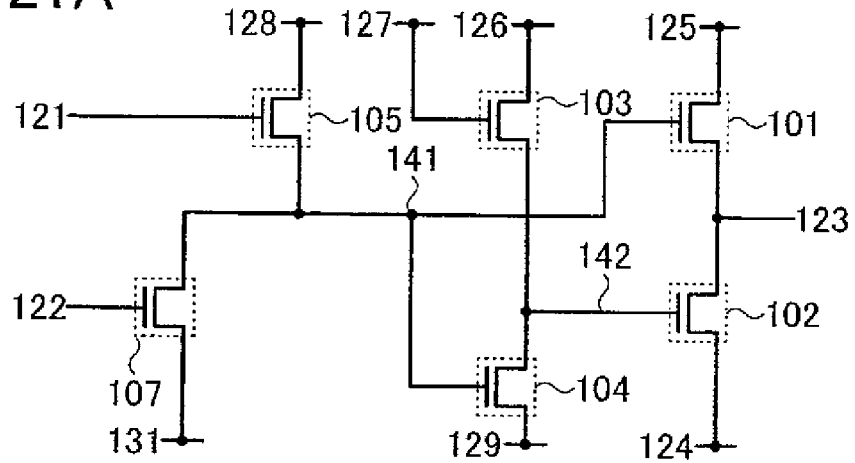
FIGS. 21A to 21C are diagrams illustrating structures of flip-flops described in Embodiment Mode 1.

In another example, the sixth transistor 106 is not necessarily needed, as shown in FIG. 21A, when the potential of the node 141 can be maintained at the L level in the non-selection period. Therefore, because the number of transistors can be reduced, the flip-flop of FIG. 21A can obtain a merit such as a reduction in layout area. Note that components in common with those in FIG. 1 are denoted by common reference numerals, and the description is omitted.

Figure 21B:
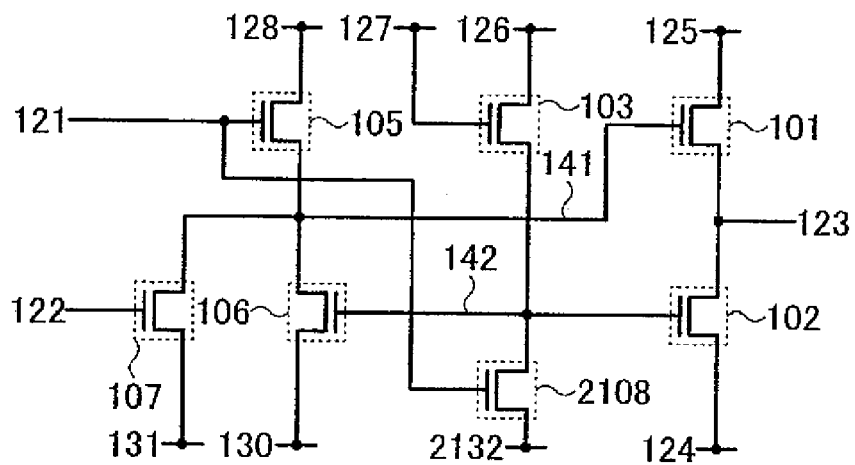

In another example, the fourth transistor 104 may be replaced by an eighth transistor 2108 as shown in FIG. 21B. A first electrode of the eighth transistor 2108 is connected to a twelfth wiring 2132; a second electrode of the eighth transistor 2108 is connected to the node 142; and a gate electrode of the eighth transistor 2108 is connected to the first wiring 121. In addition, V2 is supplied to the twelfth wiring 2132. Accordingly, whether the eighth transistor 2108 is turned on or off is controlled by the start signal. Therefore, the flip-flop of FIG. 21B can shorten fall time of potential of the node 142 in the set period and can make the second transistor 102 and the sixth transistor 106 turned off in less time. In addition, since the sixth transistor 106 is made to be turned off in less time, the flip-flop of FIG. 21B can shorten rise time of the potential of the node 141 in the set period. Thus, drive capability of the flip-flop of FIG. 21B can be improved. Note that components in common with those in FIG. 1 are denoted by common reference numerals, and the description is omitted.

Note that the eighth wiring 128 may be connected to the fourth wiring 124, the ninth wiring 129, the tenth wiring 130, or the eleventh wiring 131.

Figure 21C:
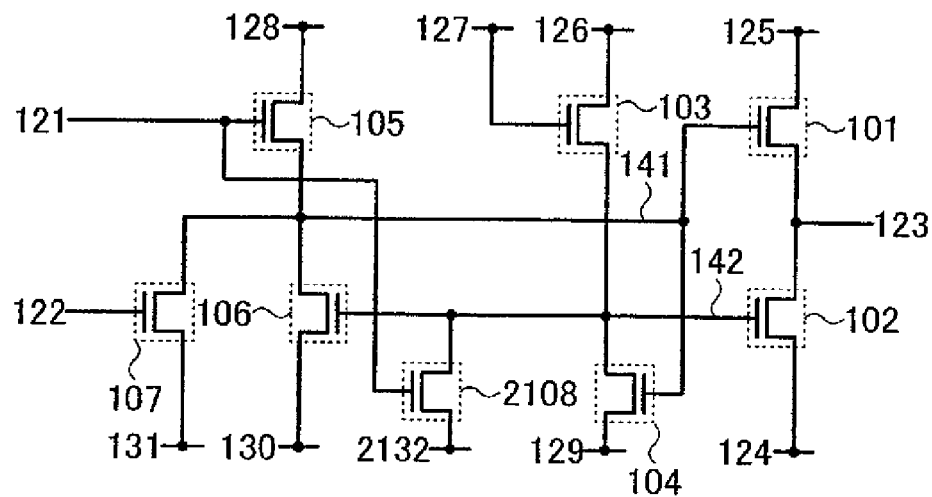

In another example, the eighth transistor 2108 may be additionally provided as shown in FIG. 21C. It is acceptable as long as the potential of the node 142 is at the L level when the start signal is at the H level; therefore, the size of the eighth transistor 2108 can be small. In addition, whether the eighth transistor 2108 is turned on or off is controlled by the start signal; therefore, drive capability of the flip-flop of FIG. 21C can be improved similarly to the flip-flop of FIG. 21B. Note that components in common with those in FIGS. 1 and 21B are denoted by common reference numerals, and the description is omitted.

Note that the connection relationship of the wirings is not limited to that in FIG. 1 as long as a similar operation to FIG. 1 is achieved. As is apparent from FIGS. 3A to 3E illustrating the operations of the flip-flop in FIG. 1, in this embodiment mode, electrical connections in the set period, the selection period, the reset period, the first non-selection period, and the second non-selection period are achieved as indicated by solid lines in FIGS. 3A to 3E, respectively. Thus, the wirings may be provided or connected to satisfy the above conditions.

Figure 5A:
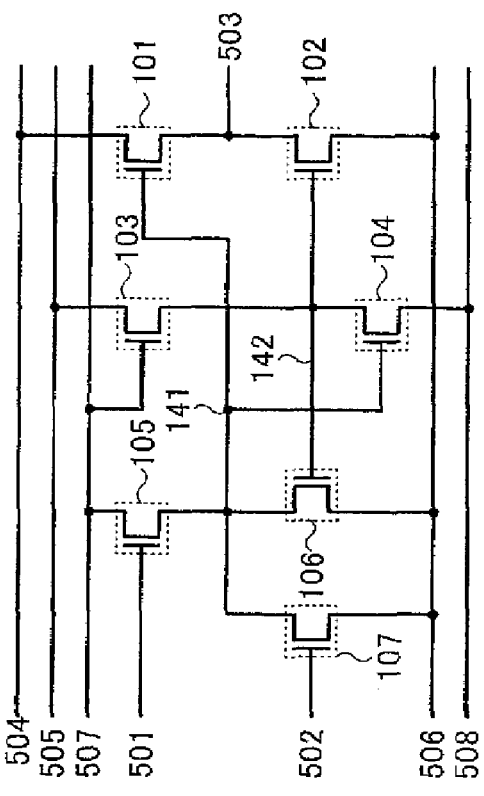
FIGS. 5A to 5D are diagrams illustrating structures of flip-flops described in Embodiment Mode 1.

For example, the first electrode of the second transistor 102, the first electrode of the fourth transistor 104, the first electrode of the sixth transistor 106, and the first electrode of the seventh transistor 107 may be connected to a sixth wiring 506 as shown in FIG. 5A. In addition, the gate electrode of the third transistor 103 and the first electrode of the fifth transistor 105 may be connected to a seventh wiring 507. Thus, in the flip-flop of FIG. 5A, the number of wirings can be reduced from eleven to seven as compared with the flip-flop of FIG. 1. Further, because the number of wirings of the flip-flop in FIG. 5A can be reduced, a yield of a shift register can be improved. Furthermore, in the flip-flop of FIG. 5A, an area for leading wirings can be decreased and a layout area of a shift register can be reduced. Moreover, in the flip-flop of FIG. 5A, the width of each wiring can be increased, so that a voltage drop can be reduced and drive capability of a shift register can be improved. Note that components in common with those in FIG. 1 are denoted by common reference numerals, and the description is omitted.

Note that the sixth wiring 506 shown in FIG. 5A corresponds to the fourth wiring 124, the ninth wiring 129, the tenth wiring 130, and the eleventh wiring 131 shown in FIG. 1. The seventh wiring 507 shown in FIG. 5A corresponds to the seventh wiring 127 and the eighth wiring 128 shown in FIG. 1. A first wiring 505, a second wiring 502, a third wiring 503, a fourth wiring 504, and a fifth wiring 505 shown in FIG. 5A correspond to the first wiring 121, the second wiring 122, the third wiring 123, the fifth wiring 125, and the sixth wiring 126 shown in FIG. 1, respectively.

The sixth wiring 506 and the seventh wiring 507 may be referred to as a first power supply line and a second power supply line, respectively. The first wiring 501, the second wiring 502, the third wiring 503, the fourth wiring 504, and the fifth wiring 505 may be referred to as a first signal line, a second signal line, a third signal line, a fourth signal line, and a fifth signal line, respectively.

Figure 5B:
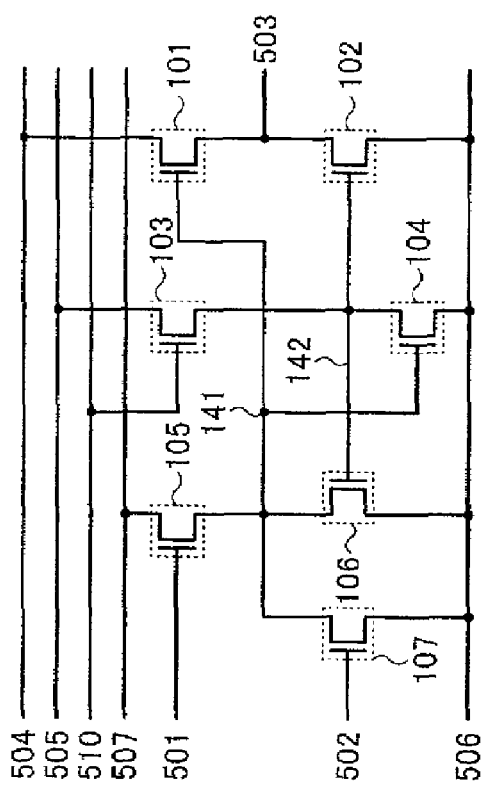

In another example, the first electrode of the fourth transistor 104 may be connected to an eighth wiring 508 as shown in FIG. 5B. The flip-flop of FIG. 5B can suppress a malfunction due to voltage drop of the sixth wiring 506 by allowing an instantaneous current generated in the fourth transistor 104 in the set period to flow to the eighth wiring 508. Note that components in common with those in FIGS. 1 and 5A are denoted by common reference numerals, and the description is omitted.

Figure 5C:
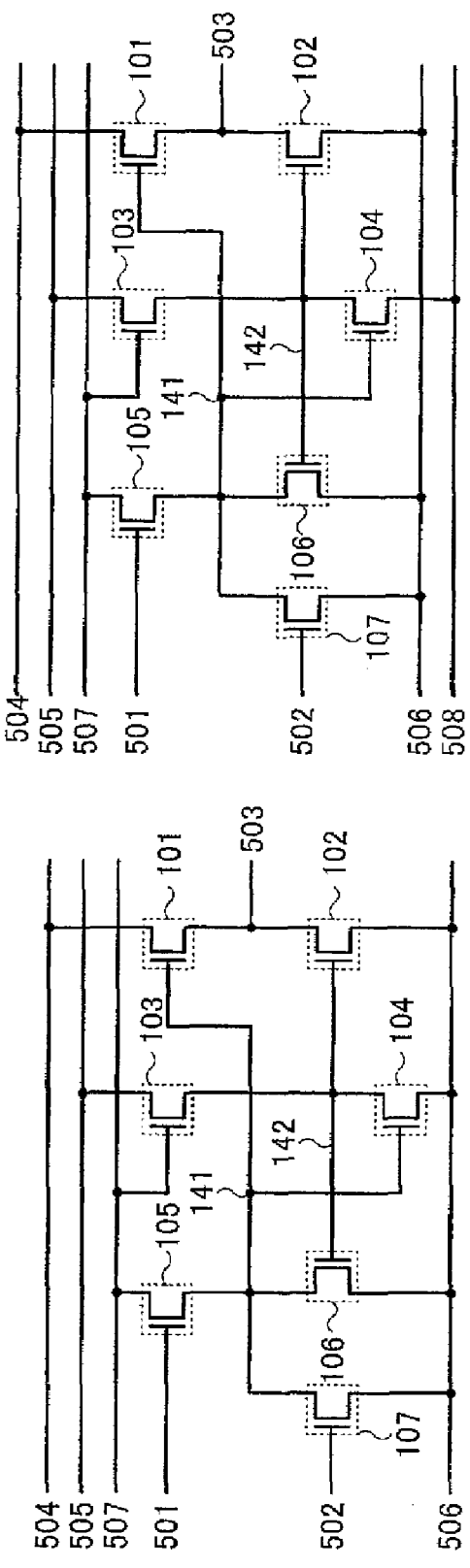

In another example, the first electrode of the second transistor 102 may be connected to a ninth wiring 509 as shown in FIG. 5C. The flip-flop of FIG. 5C can suppress a malfunction due to voltage drop of the sixth wiring 506 by allowing an instantaneous current generated in the second transistor 102 in the reset period to flow to the ninth wiring 509. Note that components in common with those in FIGS. 1 and 5A are denoted by common reference numerals, and the description is omitted.

Figure 5D:
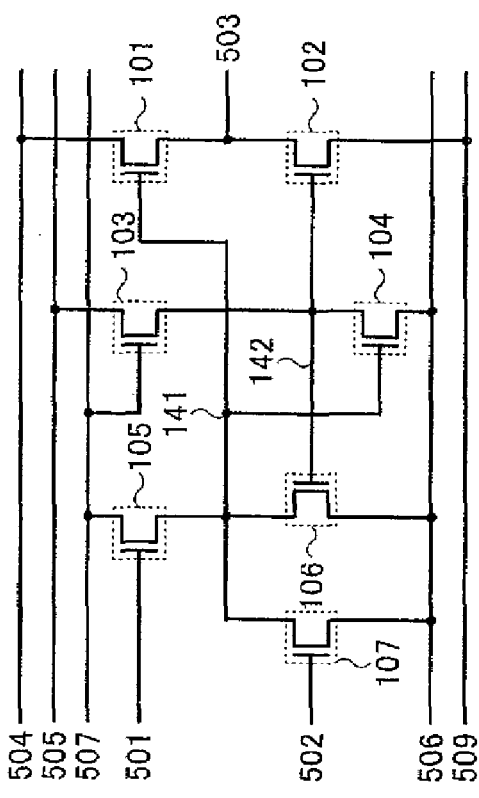

In another example, the gate electrode of the third transistor 103 may be connected to a tenth wiring 510 as shown in FIG. 5D. The flip-flop of FIG. 5D can suppress characteristic deterioration of the second transistor 102 and the sixth transistor 106 because the potential of the gate electrode of the second transistor 102 and the potential of the gate electrode of the sixth transistor 106 can be lowered in the second non-selection period by supplying a potential lower than V1 to the tenth wiring 510. Note that components in common with those in FIGS. 1 and 5A are denoted by common reference numerals, and the description is omitted.

Note that the power supply potential, signal amplitude, and signal timing are not limited by the timing chart of FIG. 2 as long as a similar operation to FIG. 1 is achieved. As is apparent from FIGS. 3A to 3E illustrating the operations of the flip-flop in FIG. 1, in this embodiment mode, electrical connections in the set period, the selection period, the reset period, the first non-selection period, and the second non-selection period are achieved as indicated by solid lines in FIGS. 3A to 3E, respectively. Thus, the power supply potential, signal amplitude, and signal timing may be changed to satisfy the above conditions.

Figure 6:
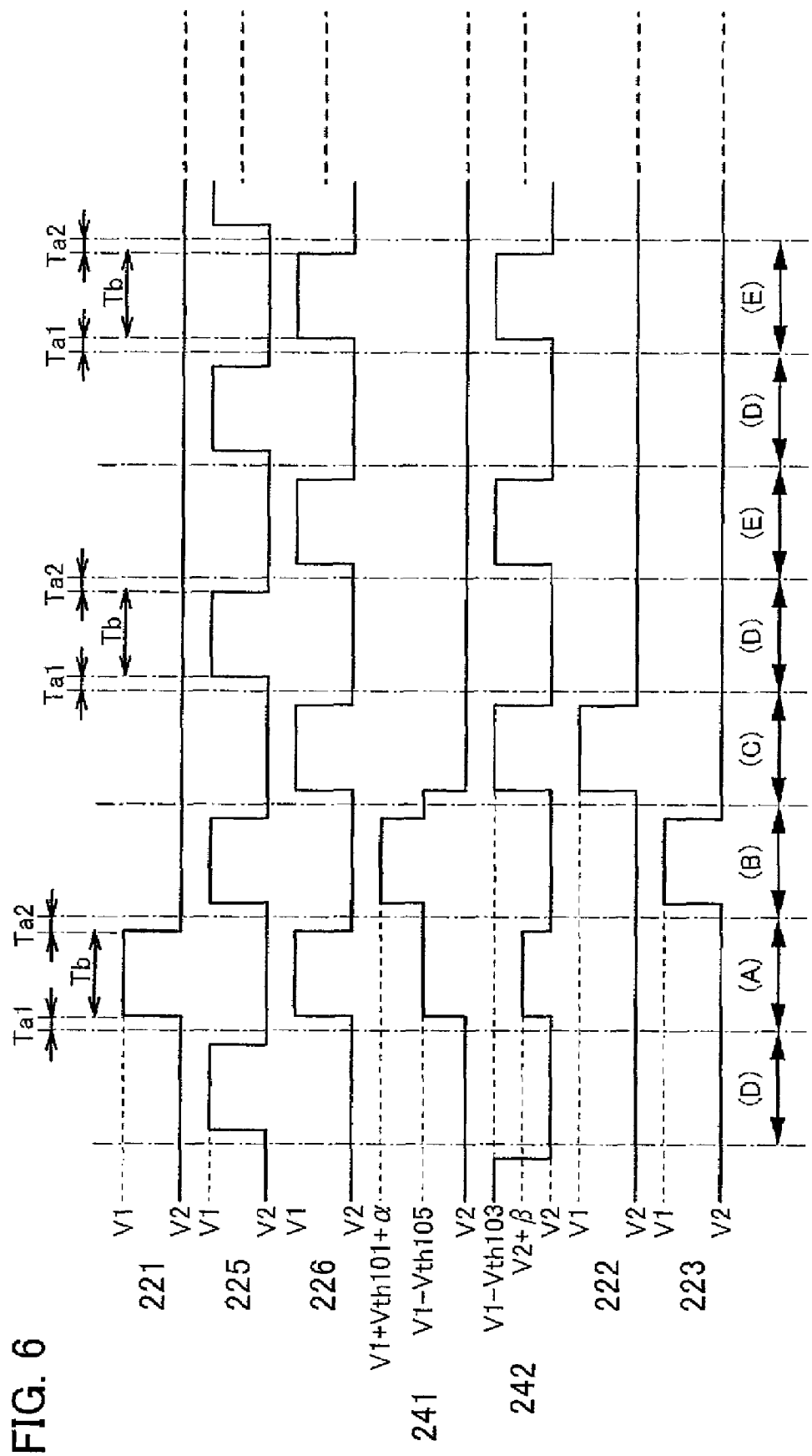
FIG. 6 is a timing chart illustrating an operation of a flip-flop described in Embodiment Mode 1.

For example, periods for inputting the H signal to the first wiring 121, the fifth wiring 125, and the sixth wiring 126 may be shorter as shown in a timing chart of FIG. 6. In FIG. 6, as compared with the timing chart of FIG. 2, timing at which a signal is switched from L level to H level is delayed for a period Ta1, and timing at which a signal is switched from H level to L level is advanced for a period Ta2. In other words, in FIG. 6, as compared with FIG. 2, a period in which a signal is at the H level (period Th) is shorter by (the period Ta1+the period Ta2). Thus, in a flip-flop to which the timing chart of FIG. 6 is applied, instantaneous current through each wiring is reduced, so that power saving, suppression of malfunction, improvement of drive capability, and the like can be realized. Further, in the flip-flop to which the timing chart of FIG. 6 is applied, fall time of the signal output through the third wiring 123 can be shortened in the reset period. This is because timing at which the potential of the node 141 becomes L level is delayed for (the period Ta1+the period Ta2), so that an L signal input to the fifth wiring 125 is supplied to the third wiring 123 through the first transistor 101 with high current supply capability (with a large channel width). Note that portions in common with those in the timing chart of FIG. 2 are denoted by common reference numerals, and the description is omitted.

Note that the relationship between the period Ta1, the period Ta2, and the period Tb preferably satisfies $((Ta1+Tb)/(Ta1+Ta2+Tb))\times100<10[\%]$. More preferably, the relationship satisfies $((Ta1+Tb)/(Ta1+Ta2+Tb))\times100<5[\%]$. Still more preferably, the relationship of (the period Ta1≈the period Ta2) is satisfied.

In another example, shifts in threshold voltage of the second transistor 102 and the sixth transistor 106 can be suppressed because the potential of the node 142 is Va−Vth(103) in the reset period and the second non-selection period if Va (V2<Va<V1) is supplied to the seventh wiring 127.

In another example, the second transistor 102 and the sixth transistor 106 can easily be turned on because the potential of the node 142 is V1 in the reset period and the second non-selection period if Vb (V1+Vth(103)<Vb) is supplied to the seventh wiring 127.

In another example, shifts in threshold voltage of the second transistor 102 and the sixth transistor 106 can be suppressed by inputting the L signal with a potential of Vc (Vc<V2) and the H signal with a potential of Vd (V1>Vd>V2) to the sixth wiring 126. This is because the potential of the node 142 is Vc in the set period and the first non-selection period, so that a reverse bias is applied to the second transistor 102 and the sixth transistor 106. Another reason is that the potential of the node 142 is Vd in the reset period and the second non-selection period, so that Vgs of the second transistor 102 and the sixth transistor 106 is decreased.

Figure 25:
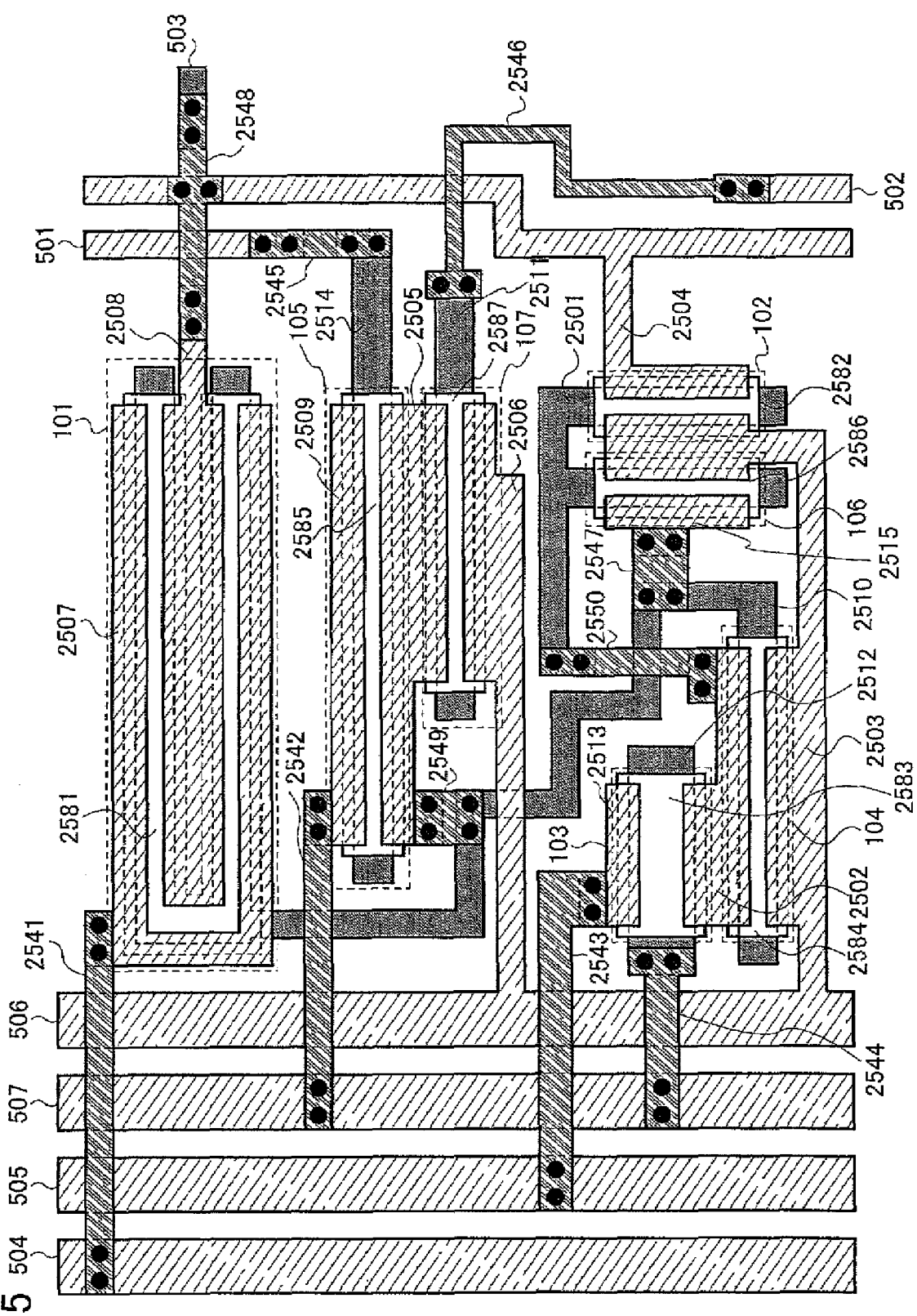
FIG. 25 is a top view of the flip-flop shown in FIG. 1.

FIG. 25 shows an example of a top view of the flip-flop shown in FIG. 5A. A conductive layer 2501 includes portions functioning as the gate electrode of the second transistor 102 and the gate electrode of the sixth transistor 106 and is connected to a conductive layer 2502 through a wiring 2550. The conductive layer 2502 includes portions functioning as the second electrode of the third transistor 103 and the second electrode of the fourth transistor 104. A conductive layer 2503 includes portions functioning as the first electrode of the second transistor 102, the first electrode of the sixth transistor 106, and the first electrode of the fourth transistor 104 and is connected to the sixth wiring 506. A conductive layer 2504 includes a portion functioning as the second electrode of the second transistor 102 and is connected to the third wiring 503 through a wiring 2548. A conductive layer 2505 includes portions functioning as the second electrode of the fifth transistor 105 and the second electrode of the seventh transistor 107 and is connected to a conductive layer 2510 through a wiring 2549. A conductive layer 2506 includes a portion functioning as the first electrode of the seventh transistor 107 and is connected to the sixth wiring 506. A conductive layer 2507 includes a portion functioning as the first electrode of the first transistor 101 and is connected to the fourth wiring 504 through a wiring 2541. A conductive layer 2508 includes a portion functioning as the second electrode of the first transistor 101 and is connected to the third wiring 503 through the wiring 2548. A conductive layer 2509 includes a portion functioning as the first electrode of the fifth transistor 105 and is connected to the seventh wiring 507 through a wiring 2542. The conductive layer 2510 includes portions functioning as the gate electrode of the first transistor 101 and the gate electrode of the fourth transistor 104. A conductive layer 2511 includes a portion functioning as the gate electrode of the seventh transistor 107 and is connected to the second wiring 502 through a wiring 2546. A conductive layer 2512 includes a portion functioning as the gate electrode of the third transistor 103 and is connected to the seventh wiring 507 through a wiring 2544. A conductive layer 2513 includes a portion functioning as the first electrode of the third transistor 103 and is connected to the fifth wiring 505 through a wiring 2543. A conductive layer 2514 includes a portion functioning as the gate electrode of the fifth transistor 105 and is connected to the first wiring 501 through a wiring 2545. A conductive layer 2515 includes a portion functioning as the second electrode of the sixth transistor 106 and is connected to the conductive layer 2510 through a wiring 2547.

Here, the width of the wiring 2546 is narrower than that of the wiring 2541, 2542, 2543, 2544, 2545, 2547, 2548, 2549, or 2550. Alternatively, the length of the wiring 2546 is long. In other words, the wiring 2546 has a high resistance. Accordingly, timing at which a potential of the conductive layer 2511 becomes H level can be delayed in the reset period. Thus, timing at which the seventh transistor 107 is turned on can be delayed in the reset period, so that a signal of the third wiring 503 can become L level in a shorter period. This is because timing at which the node 141 becomes L level is delayed, and in this delay period, the L signal is supplied to the third wiring 503 through the first transistor 101.

Note that the wirings 2541, 2542, 2543, 2544, 2545, 2546, 2547, 2548, 2549, and 2550 are similar to pixel electrodes (also referred to as light-transmitting electrodes or reflective electrodes) and are formed using a similar process and material thereto.

Note that the portions functioning as the gate electrode, the first electrode, and the second electrode of the first transistor 101 are portions where the conductive layers including each electrode overlap with a semiconductor layer 2581. The portions functioning as the gate electrode, the first electrode, and the second electrode of the second transistor 102 are portions where the conductive layers including each electrode overlap with a semiconductor layer 2582. The portions functioning as the gate electrode, the first electrode, and the second electrode of the third transistor 103 are portions where the conductive layers including each electrode overlap with a semiconductor layer 2583. The portions functioning as the gate electrode, the first electrode, and the second electrode of the fourth transistor 104 are portions where the conductive layers including each electrode overlap with a semiconductor layer 2584. The portions functioning as the gate electrode, the first electrode, and the second electrode of the fifth transistor 105 are portions where the conductive layers including each electrode overlap with a semiconductor layer 2585. The portions functioning as the gate electrode, the first electrode, and the second electrode of the sixth transistor 106 are portions where the conductive layers including each electrode overlap with a semiconductor layer 2586. The portions functioning as the gate electrode, the first electrode, and the second electrode of the seventh transistor 107 are portions where the conductive layers including each electrode overlap with a semiconductor layer 2587.

A structure and a driving method of a shift register including the aforementioned flip-flop of this embodiment mode are described.

A structure of a shift register of this embodiment mode is described with reference to FIG. 10. The shift register in FIG. 10 includes n flip-flops (flip-flops 1001_1 to 1001_n).

Figure 10:
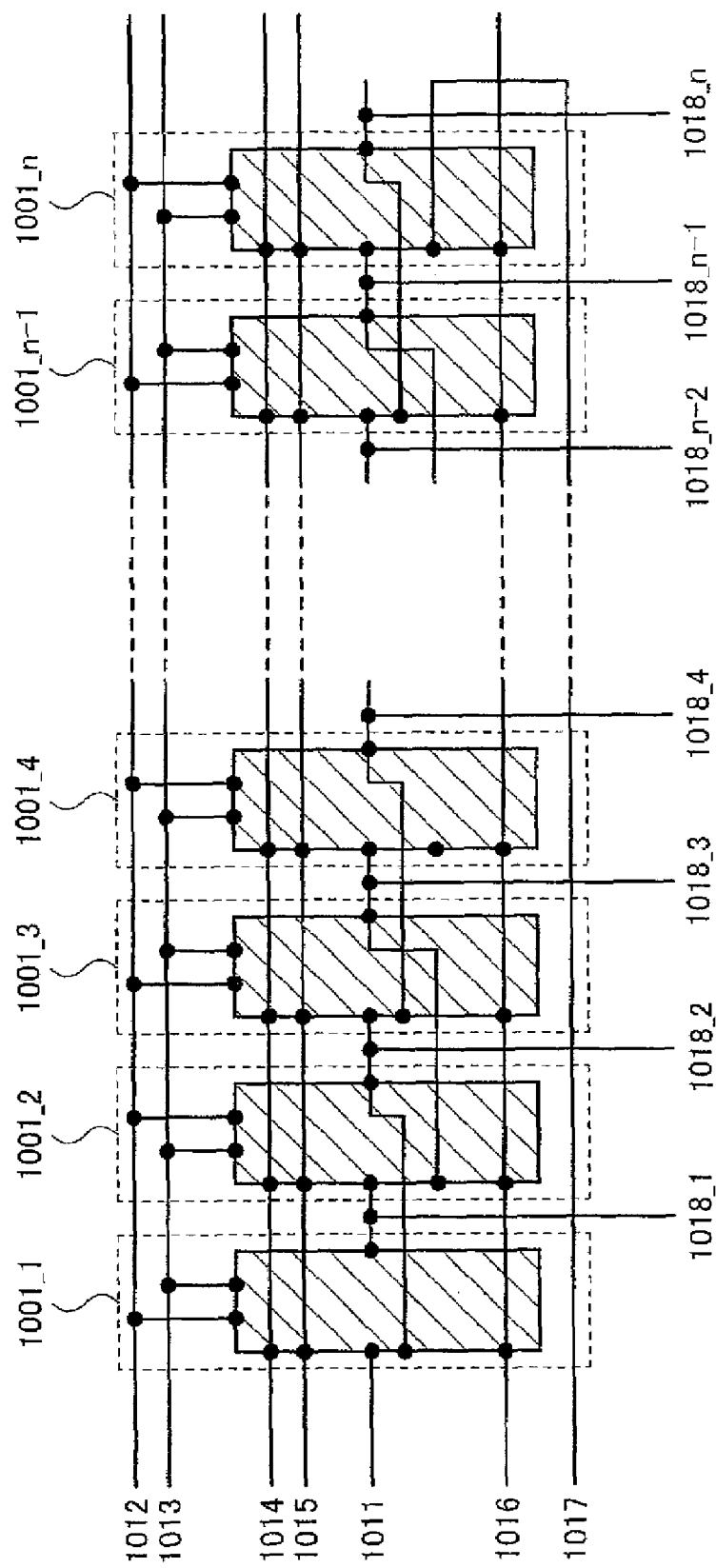
FIG. 10 is a diagram illustrating a structure of a shift register described in Embodiment Mode 1.

The connection relationship of the shift register in FIG. 10 is described. In the shift register in FIG. 10, a flip-flop 1001_i in an i-th stage (one of the flip-flops 1001_1 to 1001_n) is connected to a second wiring 1012, a third wiring 1013, a fourth wiring 1014, a fifth wiring 1015, a sixth wiring 1016, an eighth wiring 1018_i−1, an eighth wiring 1018_i, and an eighth wiring 1018_i+1. Note that the flip-flop 1001_1 in the first stage is connected to a first wiring 1011, the second wiring 1012, the third wiring 1013, the fourth wiring 1014, the fifth wiring 1015, the sixth wiring 1016, an eighth wiring 1018_1, and an eighth wiring 1018_2. The flip-flop 1001_n in an n-th stage is connected to the second wiring 1012, the third wiring 1013, the fourth wiring 1014, the fifth wiring 1015, the sixth wiring 1016, the seventh wiring 1017, an eighth wiring 1018_n−1, and an eighth wiring 1018_n.

The first wiring 1011 is connected to the first wiring 121 shown in FIG. 1 of the flip-flop 1001_1. The second wiring 1012 is connected to the fifth wiring 125 shown in FIG. 1 of a flip-flop in an odd-numbered stage, and is connected to the sixth wiring 126 shown in FIG. 1 of a flip-flop in an even-numbered stage. The third wiring 1013 is connected to the sixth wiring 126 shown in FIG. 1 of a flip-flop in an odd-numbered stage, and is connected to the fifth wiring 125 shown in FIG. 1 of a flip-flop in an even-numbered stage. The fourth wiring 1014 is connected to the seventh wiring 127 shown in FIG. 1 of a flip-flop in every stage. The fifth wiring 1015 is connected to the eighth wiring 128 shown in FIG. 1 of a flip-flop of every stage. The sixth wiring 1016 is connected to the fourth wiring 124, the ninth wiring 129, the tenth wiring 130, and the eleventh wiring 131 shown in FIG. 1 of a flip-flop of every stage. The eighth wiring 1018_i is connected to the second wiring 122 shown in FIG. 1 of the flip-flop_i−1, the third wiring 123 shown in FIG. 1 of the flip-flop 1001_i, and the first wiring 121 shown in FIG. 1 of the flip-flop 1001_i+1. Note that the eighth wiring 1018_1 is connected to the third wiring 123 shown in FIG. 1 of the flip-flop 1001_1 and the first wiring 121 shown in FIG. 1 of the flip-flop 1001_2. The eighth wiring 1018_n is connected to the second wiring 122 shown in FIG. 1 of the flip-flop 1001_n−1 and the third wiring 123 shown in FIG. 1 of the flip-flop 1001_n.

The fourth wiring 1014 and the fifth wiring 1015 are each supplied with the potential V1, and the sixth wiring 1016 is supplied with the potential V2.

Signals are input to the first wiring 1011, the second wiring 1012, the third wiring 1013, and the seventh wiring 1017. The signal input to the first wiring 1011 is a start signal; the signal input to the second wiring 1012 is a first clock signal; the signal input to the third wiring 1013 is a second clock signal; and the signal input to the seventh wiring 1017 is a reset signal. In addition, each of the signals input to the first wiring 1011, the second wiring 1012, the third wiring 1013, and the seventh wiring 1017 is a digital signal including an H signal with a potential of V1 and an L signal with a potential of V2.

Various signals, power supply potentials, or currents may be input to the first to seventh wirings 1011 to 1017.

Signals are output through the eighth wirings 1018_1 to 1018_n. For example, the signal output through the eighth wiring 1018_i is an output signal of the flip-flop 1001_i. Further, the signal output through the eighth wiring 1018_i is a start signal of the flip-flop 1001_i+1 and a reset signal of the flip-flop 1001_i−1.

Note that when the same signal is input to or the same voltage is supplied to the first to seventh wirings 1011 to 1017, the first to seventh wirings 1011 to 1017 may be connected to each other or may be a single wiring.

Figure 11:
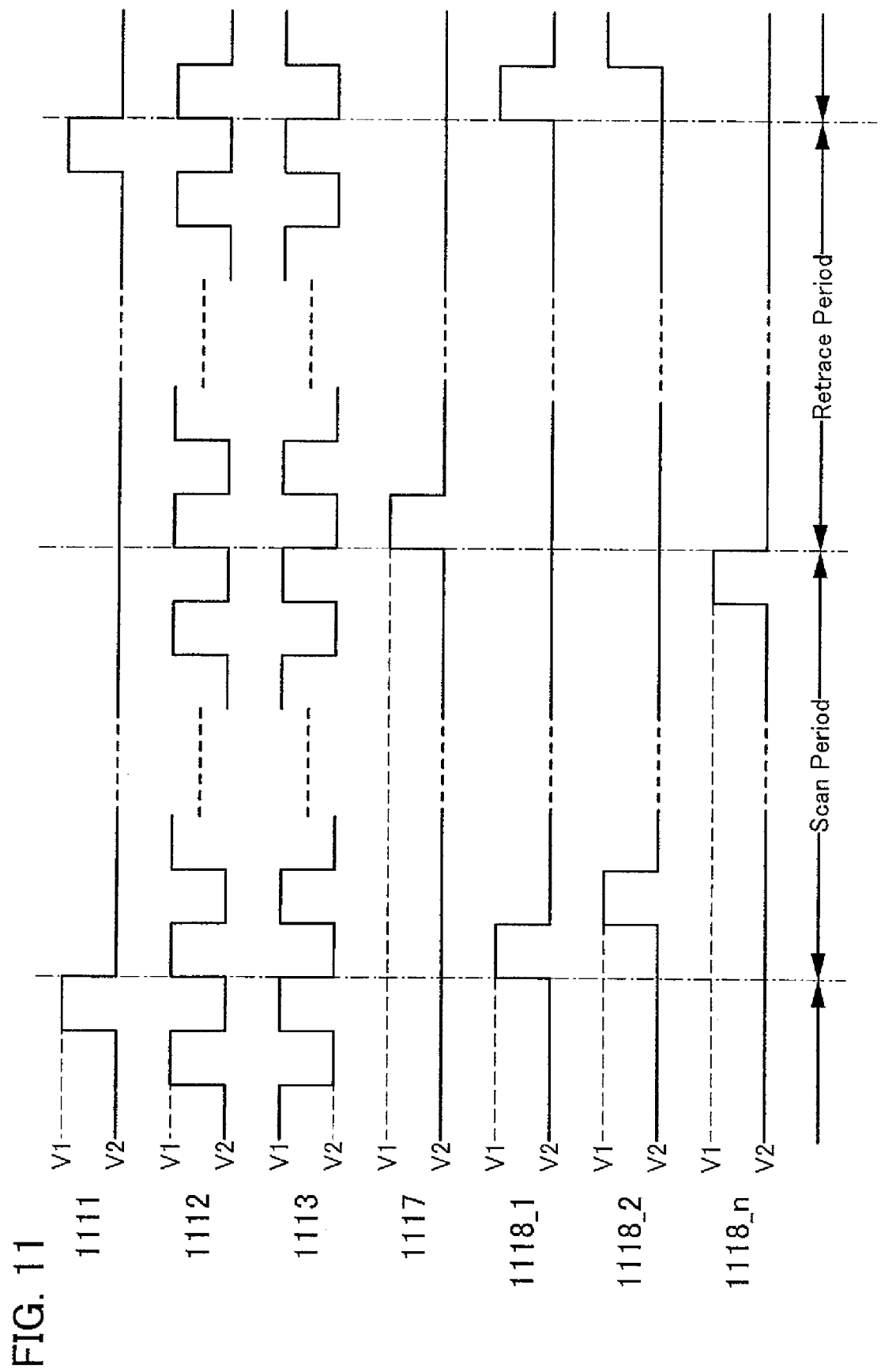
FIG. 11 is a timing chart illustrating an operation of the shift register shown in FIG. 10.

Next, the operation of the shift register shown in FIG. 10 is described with reference to a timing chart of FIG. 11 and a timing chart of FIG. 12. The timing chart of FIG. 11 is divided into a scan period and a retrace period. The scan period corresponds to a period from the time when output of a selection signal from the eighth wiring 1018_1 starts to the time when output of a selection signal from the eighth wiring 1018_n ends. The retrace period corresponds to a period from the time when output of the selection signal from the eighth wiring 1018_n ends to the time when output of the selection signal from the eighth wiring 1018_1 starts.

Note that FIG. 11 shows a signal 1111 input to the first wiring 1011, a signal 1112 input to the second wiring 1012, a signal 1113 input to the third wiring 1013, a signal 1117 input to the seventh wiring 1017, a signal 1118_1 output to the eighth wiring 1018_1, a signal 1118_2 output to the eighth wiring 1018_2, and a signal 1118_n output to the eighth wiring 1018_n. FIG. 12 shows a signal 1211 input to the first wiring 1011, a signal 1218_1 output through the eighth wiring 1018_1, a signal 1218_i output to the eighth wiring 1018_i, a signal 1218_i+1 output to the eighth wiring 1018_i+1, and a signal 1218_n output to the eighth wiring 1018_n.

Figure 12:
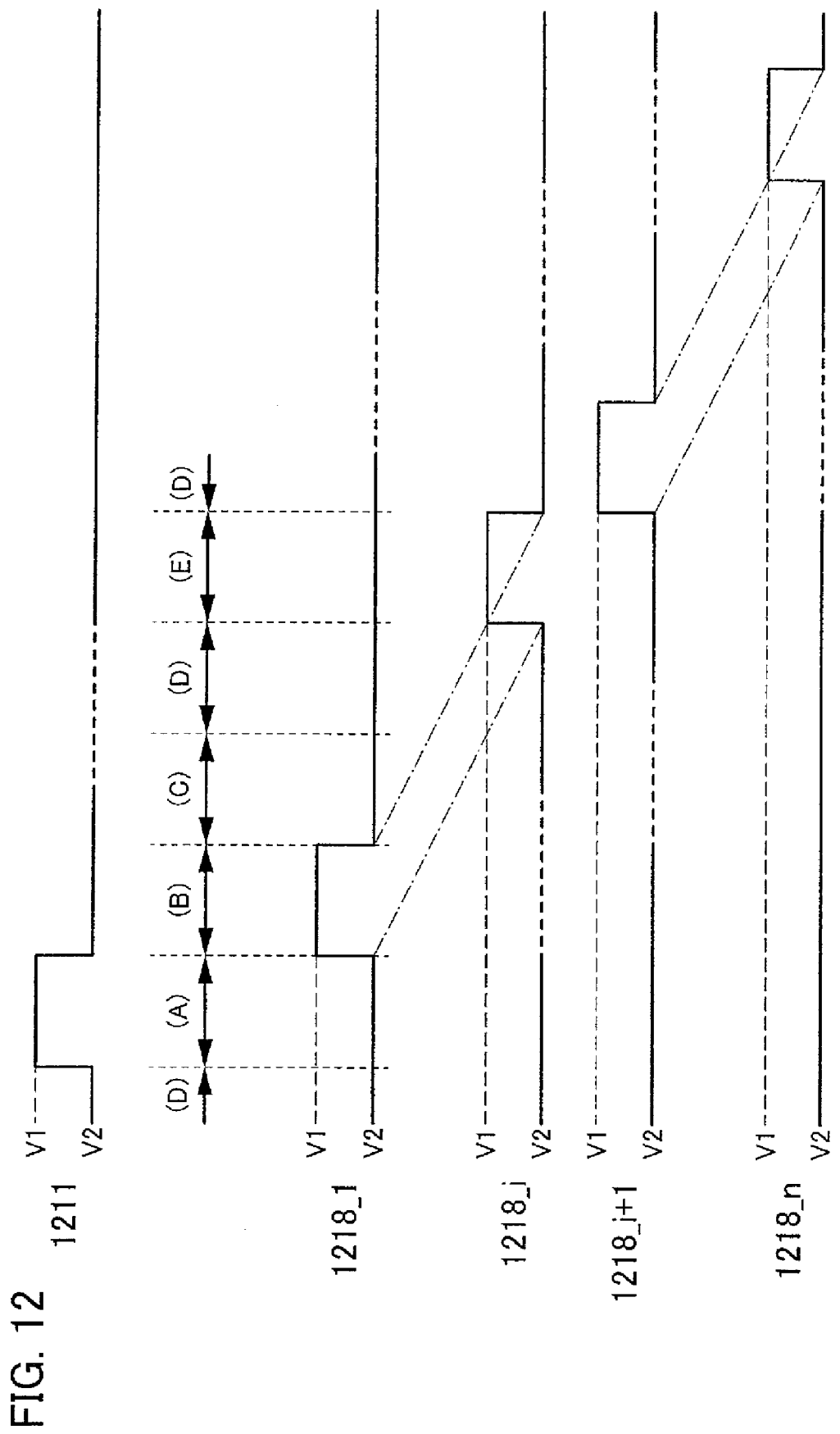
FIG. 12 is a timing chart illustrating an operation of the shift register shown in FIG. 10.

As shown in FIG. 12, if the flip-flop 1001_i, for example, is in the selection period, the H signal is output to the eighth wiring 1018_i. At this time, the flip-flop 1001_i+1 is in the set period. Subsequently, the flip-flop 1001_i is in the reset period, and the L signal is output through the eighth wiring 1018_i. At this time, the flip-flop 1001_i+1 is in the selection period. After that, the flip-flop 1001_i is in the first non-selection period, and the eighth wiring 1018_i is in a floating state to maintain the potential at the L level. At this time, the flip-flop 1001_i+1 is in the reset period. After that, the flip-flop 1001_i is in the second non-selection period, and the L signal is output through the eighth wiring 1018_i. At this time, the flip-flop 1001_i+1 is in the first non-selection period. Thus, the flip-flop 1001_i repeats the first non-selection period and the second non-selection period until the next set period.

Accordingly, the shift register of FIG. 10 can output a selection signal sequentially through the eighth wirings 1018_1 to 1018_n. In other words, the shift register of FIG. 10 can scan the eighth wirings 1018_1 to 1018_n. Therefore, the shift register of FIG. 10 can perform a sufficient function as a shift register.

In addition, the reset signal input to the flip-flop 1001_n in the last stage is characterized by being input through the seventh wiring 1017. Accordingly, a dummy flip-flop becomes unnecessary for the shift register of FIG. 10, so that a layout area can be reduced. However, a dummy flip-flop may be provided.

For the shift register of FIG. 10, the retrace period can be freely determined depending on timing of the signal input to the first wiring 1011.

The shift register of FIG. 10 can suppress a shift in threshold voltage of a transistor by employing the flip-flop described in this embodiment mode. In addition, the shift register of FIG. 10 can have a longer life, can improve drive capability, can suppress a malfunction, and can simplify a process.

Note that the shift register is not limited to the structure of FIG. 10 if a similar operation to FIG. 10 is achieved.

Figure 13:
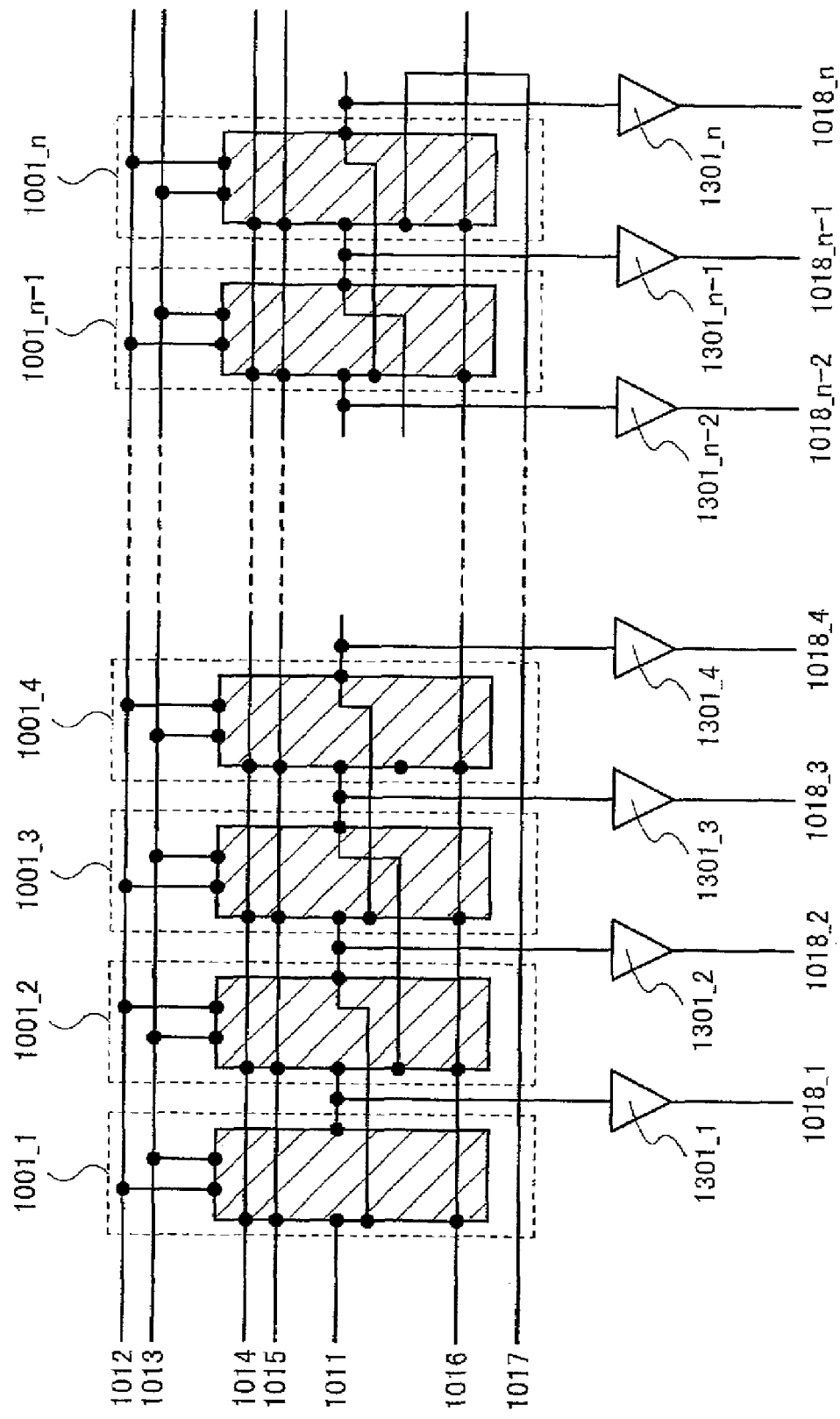
FIG. 13 is a diagram illustrating a structure of a shift register described in Embodiment Mode 1.

For example, output signals of the flip-flops may each be output through buffers as shown in FIG. 13. Because the flip-flops 1001_1 to 1001_n are connected to the eighth wirings 1018_1 to 1018_n through buffers 1301_1 to 1301_n, respectively, a shift register of FIG. 13 can have high drive capability. This is because if a large load is connected to each of the eighth wirings 1018_1 to 1018_n, a signal output through each of the eighth wirings 1018_1 to 1018_n is delayed or distorted. In other words, this is because the delay or distortion of the signal output through each of the eighth wirings 1018_1 to 1018_n does not affect the operation of the shift register. Note that components in common with those in FIG. 10 are denoted by common reference numerals, and the description is omitted.

Note that each of the buffers 1301_1 to 1301_n may be a logic circuit such as NAND or NOR, an operational amplifier, or a combination of these. In other words, it may be an inverter, an analog buffer, or the like. Further, each of the buffers 1301_1 to 1301_n is preferably formed of an n-channel transistor if each flip-flop is formed of an n-channel transistor. Furthermore, each of the buffers 1301_1 to 1301_n preferably has such a structure that enables a bootstrap operation. Moreover, a drive voltage (a potential difference between a positive power supply and a negative power supply) of each of the buffers 1301_1 to 1301_n is preferably higher than that of each of the flip-flops 1001_1 to 1001_n.

Examples of the buffers 1301_1 to 1301_n included in the shift register of FIG. 13 are described with reference to FIGS. 105A and 105B. In a buffer 8000 shown in FIG. 105A, inverters 8001a, 8001b, and 8001c are connected between wirings 8011 and 8012. Accordingly, an inverted signal of a signal input to the wiring 8011 is output through the wiring 8012. Note that the number of inverters connected between the wirings 8011 and 8012 is not limited. For example, if an even number of inverters are connected between the wirings 8011 and 8012, a signal with the same polarity as that of a signal input to the wiring 8011 is output through the wiring 8012. In addition, as shown in a buffer 8100 of FIG. 105B, inverters 8002a, 8002b, and 8002c connected in series and inverters 8003a, 8003b, and 8003c connected in series may be connected in parallel. In the buffer 8100 of FIG. 105B, since variation of in characteristics of transistors can be averaged, delay and distortion of the signal output through the wiring 8012 can be reduced. Further, outputs of the inverters 8002a and 8003a, and outputs of the inverters 8002b and 8003b may be connected to each other.

Figure 105A:
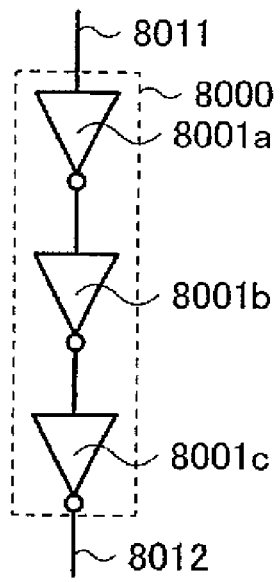
FIGS. 105A to 105D are diagrams illustrating structures of a buffer shown in FIG. 13.

In FIG. 105A, it is preferable to satisfy (W of a transistor included in the inverter 8001a)<(W of a transistor included in the inverter 8001b)<(W of a transistor included in the inverter 8001c). This is because drive capability of a flip-flop (specifically, a value of W/L of the transistor 101 in FIG. 1) can be small if W of the transistor included in the inverter 8001a is small; thus, a layout area of the shift register of this embodiment mode can be decreased. Similarly, in FIG. 105B, it is preferable to satisfy (W of a transistor included in the inverter 8002a)<(W of a transistor included in the inverter 8002b)

<(W of a transistor included in the inverter 8002c). Similarly, in FIG. 105B, it is preferable to satisfy (W of a transistor included in the inverter 8003a)<(W of a transistor included in the inverter 8003b)<(W of a transistor included in the inverter 8003c). Further, it is preferable to satisfy (W of the transistor included in the inverter 8002a)=(W of the transistor included in the inverter 8003a), (W of the transistor included in the inverter 8002b)=(W of the transistor included in the inverter 8003b), and (W of the transistor included in the inverter 8002c)=(W of the transistor included in the inverter 8003c).

Figure 105B:
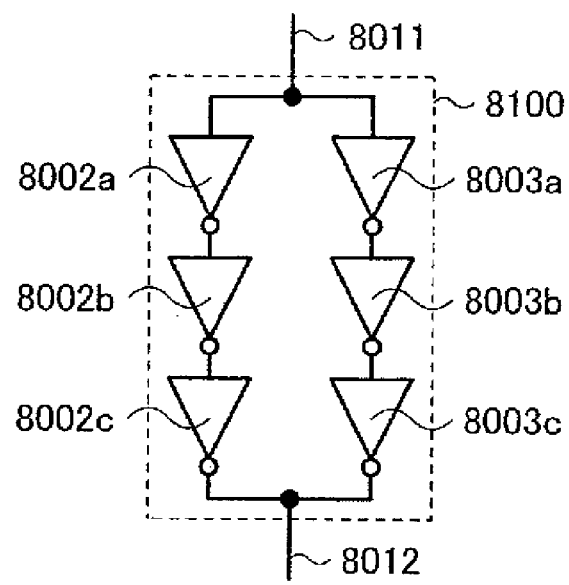
Figure 105C:
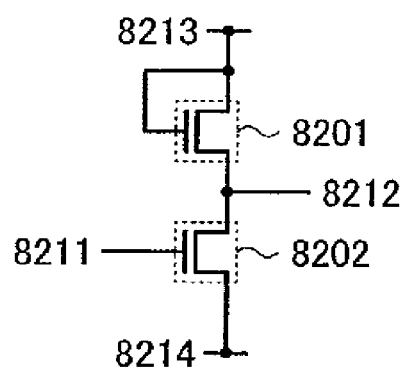

The inverters shown in FIGS. 105A and 105B are not particularly limited as long as they can output an inverted signal of an input signal. For example, as shown in FIG. 105C, an inverter may be formed of a first transistor 8201 and a second transistor 8202. A signal is input to a first wiring 8211, and a signal is output through a second wiring 8212. V1 is supplied to a third wiring 8213, and V2 is supplied to a fourth wiring 8214. When the H signal is input to the first wiring 8211, the inverter of FIG. 105C outputs a potential obtained by dividing V1−V2 by the first transistor 8201 and the second transistor 8202 ((W/L of the first transistor 8201)<(W/L of the second transistor 8202)) through the second wiring 8212. Further, when the L signal is input to the first wiring 8211, the inverter of FIG. 105C outputs V1−Vth(8201) (Vth(8201): a threshold voltage of the first transistor 8201) through the second wiring 8212. The first transistor 8201 may be any element having a resistance, such as a PN junction diode or simply a resistor.

Figure 105D:
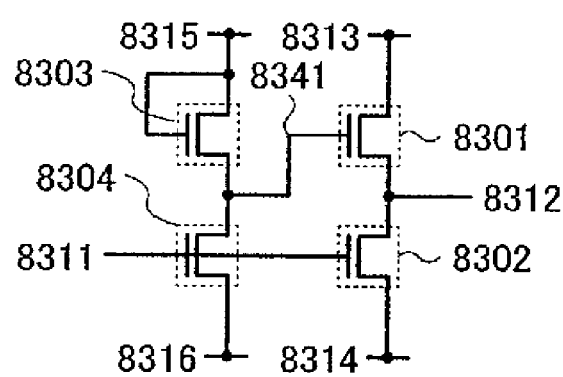
Figure 106A:
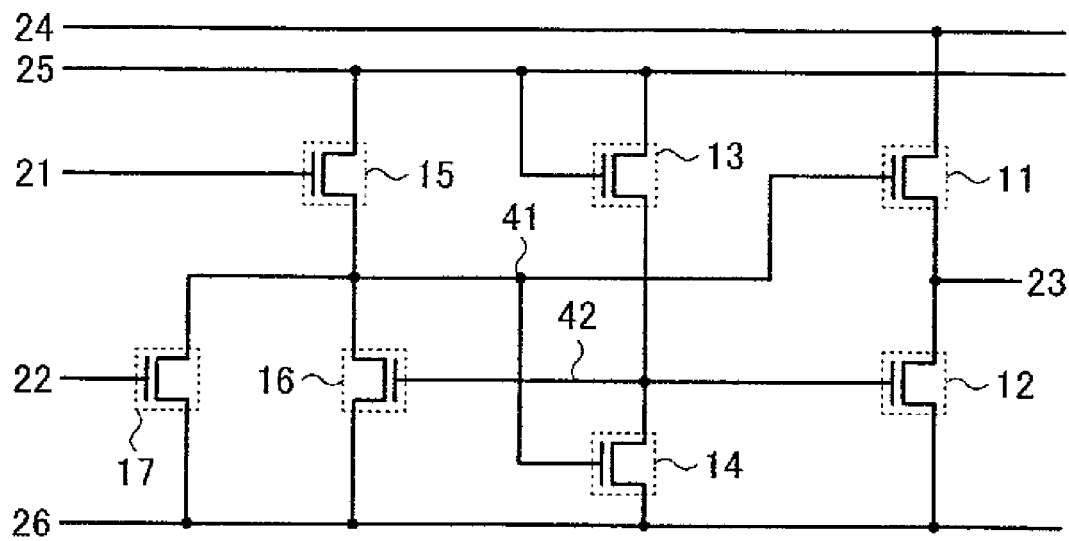
FIGS. 106A and 106B are diagrams illustrating a structure and a timing chart of conventional art.
Figure 106B:
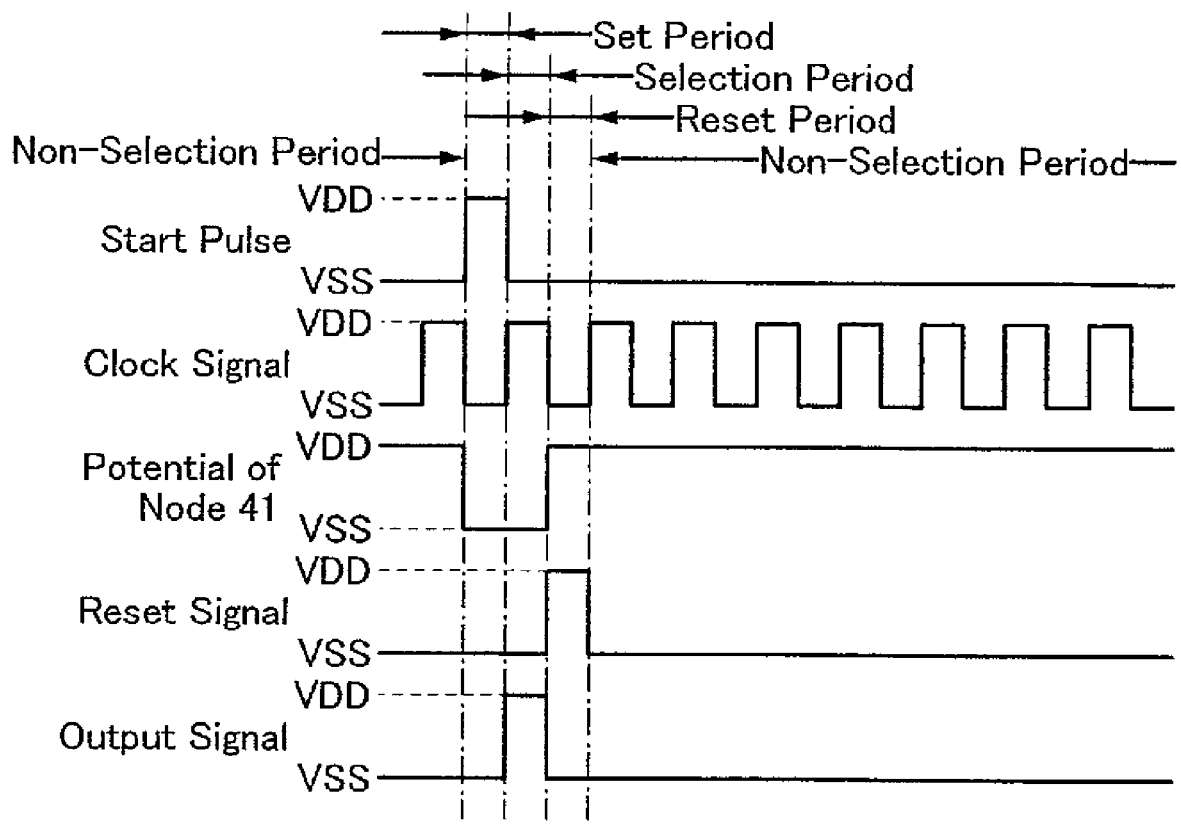

As shown in FIG. 105D, an inverter may be formed of a first transistor 8301, a second transistor 8302, a third transistor 8303, and a fourth transistor 8304. A signal is input to a first wiring 8311; a signal is output through a second wiring 8312; V1 is supplied to a third wiring 8313 and a fifth wiring 8315; and V2 is supplied to a fourth wiring 8314 and a sixth wiring 8316. When the H signal is input to the first wiring 8311, the inverter of FIG. 105D outputs V2 through the second wiring 8312. At this time, a potential of a node 8341 is at the L level, so that the first transistor 8301 is turned off. Further, when the L signal is input to the first wiring 8311, the inverter of FIG. 105D outputs V1 through the second wiring 8312. At this time, when the potential of the node 8341 becomes V1−Vth(8303) (Vth(8303): a threshold voltage of the third transistor 8303), the node 8341 is in a floating state, and the potential of the node 8341 becomes higher than V1+Vth(8301) (Vth(8301): a threshold voltage of the first transistor 8301) by a bootstrap operation. Thus, the first transistor 8301 is turned on. Further, a capacitor may be provided between a second electrode and a gate electrode of the first transistor 8301 because the first transistor 8301 functions as a bootstrap transistor.

Figure 26A:
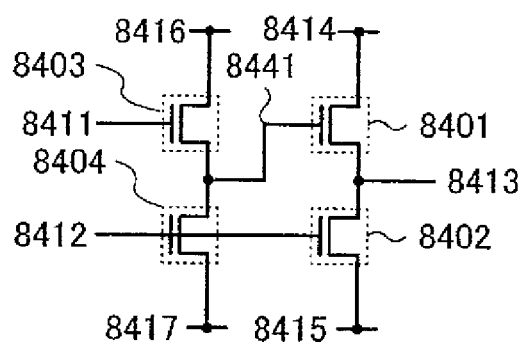
FIGS. 26A to 26C are diagrams illustrating structures of a buffer shown in FIG. 13.

As shown in FIG. 26A, an inverter may be formed of a first transistor 8401, a second transistor 8402, a third transistor 8403, and a fourth transistor 8404. The inverter of FIG. 26A is a two-input inverter and can perform a bootstrap operation. A signal is input to a first wiring 8411; an inverted signal is input to a second wiring 8412; a signal is output through a third wiring 8413; V1 is supplied to a fourth wiring 8414 and a sixth wiring 8416; and V2 is supplied to a fifth wiring 8415 and a seventh wiring 8417. When the L signal is input to the first wiring 8411 and the H signal is input to the second wiring 8412, the inverter of FIG. 26A outputs V2 through the third wiring 8413. At this time, a potential of a node 8441 is V2, so that the first transistor 8401 is turned off. Further, when the H signal is input to the first wiring 8411 and the L signal is input to the second wiring 8412, the inverter of FIG. 26A outputs V1 through the third wiring 8413. At this time, when the potential of the node 8441 becomes V1−Vth(8403) (Vth (8403): a threshold voltage of the third transistor 8403), the node 8441 is in a floating state, and the potential of the node 8441 becomes higher than V1+Vth(8401) (Vth(8401): a threshold voltage of the first transistor 8401) by a bootstrap operation. Thus, the first transistor 8401 is turned on. Further, a capacitor may be provided between a second electrode and a gate electrode of the first transistor 8401 because the first transistor 8401 functions as a bootstrap transistor. Furthermore, one of the first wiring 8411 and the second wiring 8412 is preferably connected to the third wiring 123 shown in FIG. 1, and the other is preferably connected to the node 142 shown in FIG. 1.

Figure 26B:
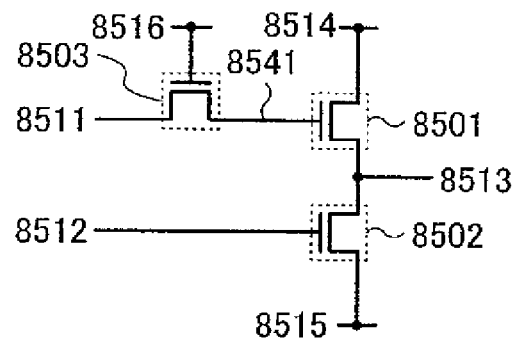

As shown in FIG. 26B, an inverter may be formed of a first transistor 8501, a second transistor 8502, and a third transistor 8503. The inverter of FIG. 26B is a two-input inverter and can perform a bootstrap operation. A signal is input to a first wiring 8511; an inverted signal is input to a second wiring 8512; a signal is output through a third wiring 8513; V1 is supplied to a fourth wiring 8514 and a sixth wiring 8516; and V2 is supplied to a fifth wiring 8515. When the L signal is input to the first wiring 8511 and the H signal is input to the second wiring 8512, the inverter of FIG. 26B outputs V2 through the third wiring 8513. At this time, a potential of a node 8541 is V2, so that the first transistor 8501 is turned off. Further, when the H signal is input to the first wiring 8511 and the L signal is input to the second wiring 8512, the inverter of FIG. 26B outputs V1 through the third wiring 8513. At this time, when the potential of the node 8541 becomes V1−Vth (8503) (Vth(8503): a threshold voltage of the third transistor 8503), the node 8541 is in a floating state, and the potential of the node 8541 becomes higher than V1+Vth(8501) (Vth (8501): a threshold voltage of the first transistor 8501) by a bootstrap operation. Thus, the first transistor 8501 is turned on. Further, a capacitor may be provided between a second electrode and a gate electrode of the first transistor 8501 because the first transistor 8501 functions as a bootstrap transistor. Furthermore, one of the first wiring 8511 and the second wiring 8512 is preferably connected to the third wiring 123 shown in FIG. 1, and the other is preferably connected to the node 142 shown in FIG. 1.

Figure 26C:
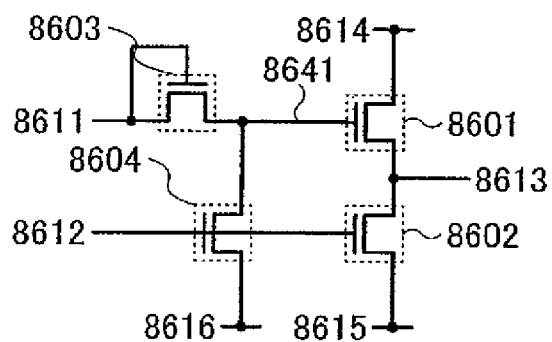

As shown in FIG. 26C, an inverter may be formed of a first transistor 8601, a second transistor 8602, a third transistor 8603, and a fourth transistor 8604. The inverter of FIG. 26C is a two-input inverter and can perform a bootstrap operation. A signal is input to a first wiring 8611; an inverted signal is input to a second wiring 8612; a signal is output through a third wiring 8613; V1 is supplied to a fourth wiring 8614; and V2 is supplied to a fifth wiring 8615 and a sixth wiring 8616. When the L signal is input to the first wiring 8611 and the H signal is input to the second wiring 8612, the inverter of FIG. 26C outputs V2 through the third wiring 8613. At this time, a potential of a node 8641 is V2, so that the first transistor 8601 is turned off. Further, when the H signal is input to the first wiring 8611 and the L signal is input to the second wiring 8612, the inverter of FIG. 26C outputs V1 through the third wiring 8613. At this time, when the potential of the node 8641 becomes V1−Vth(8603) (Vth(8603): a threshold voltage of the third transistor 8603), the node 8641 is in a floating state, and the potential of the node 8641 becomes higher than V1+Vth(8601) (Vth(8601): a threshold voltage of the first transistor 8601) by a bootstrap operation. Thus, the first transistor 8601 is turned on. Further, a capacitor may be provided between a second electrode and a gate electrode of the first transistor 8601 because the first transistor 8601 functions as a bootstrap transistor. Furthermore, one of the first wiring 8611 and the second wiring 8612 is preferably connected to the third wiring 123 shown in FIG. 1, and the other is preferably connected to the node 142 shown in FIG. 1.

Figure 14:
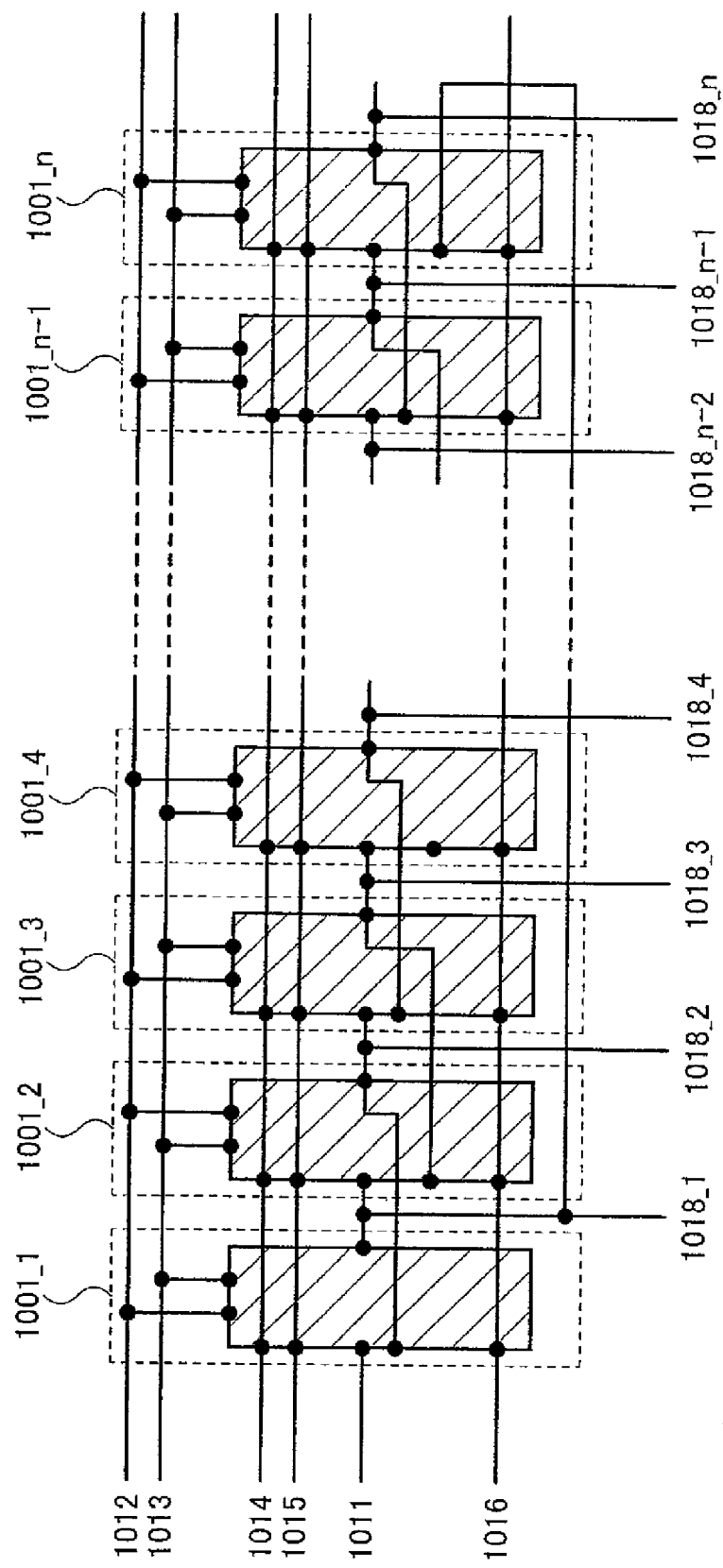
FIG. 14 is a diagram illustrating a structure of a shift register described in Embodiment Mode 1.
Figure 15:
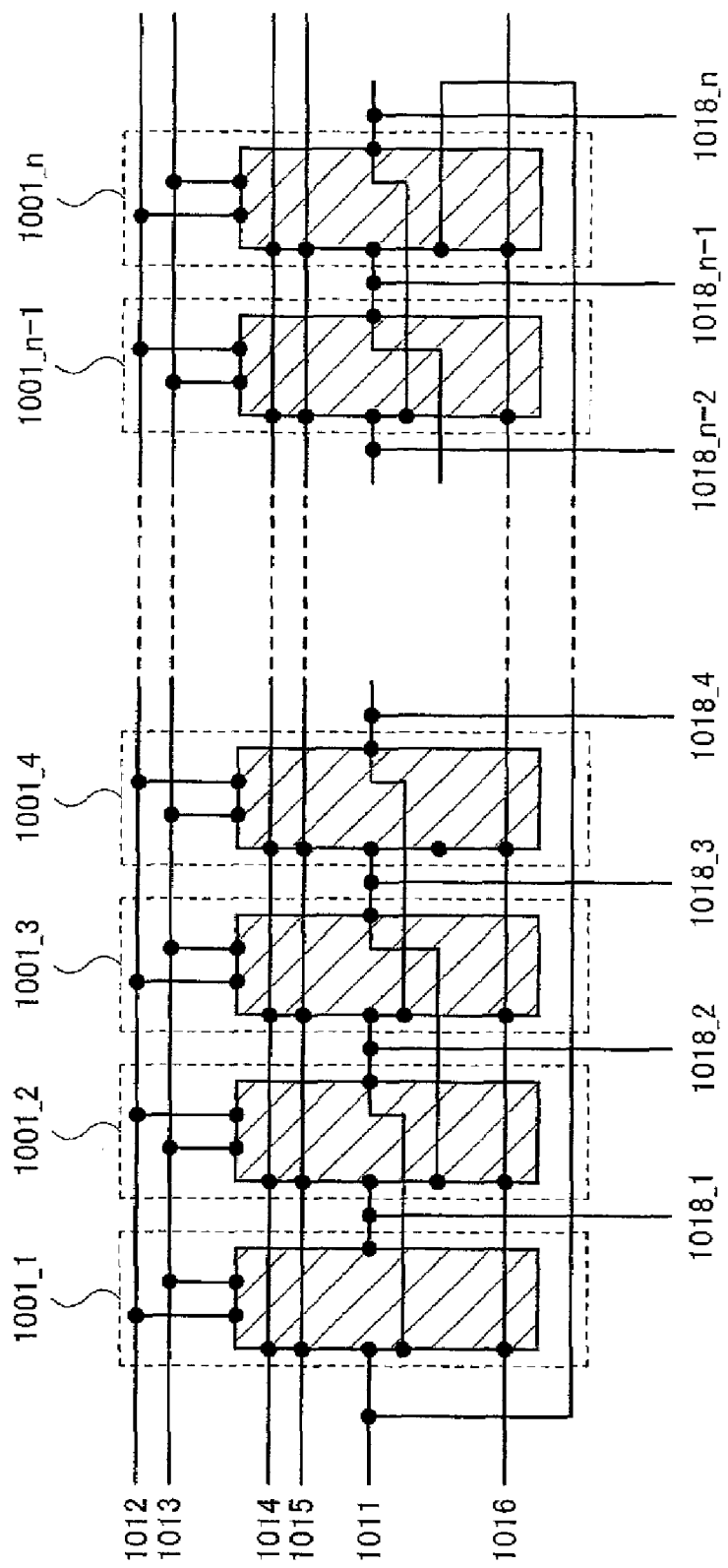
FIG. 15 is a diagram illustrating a structure of a shift register described in Embodiment Mode 1.
Figure 17:
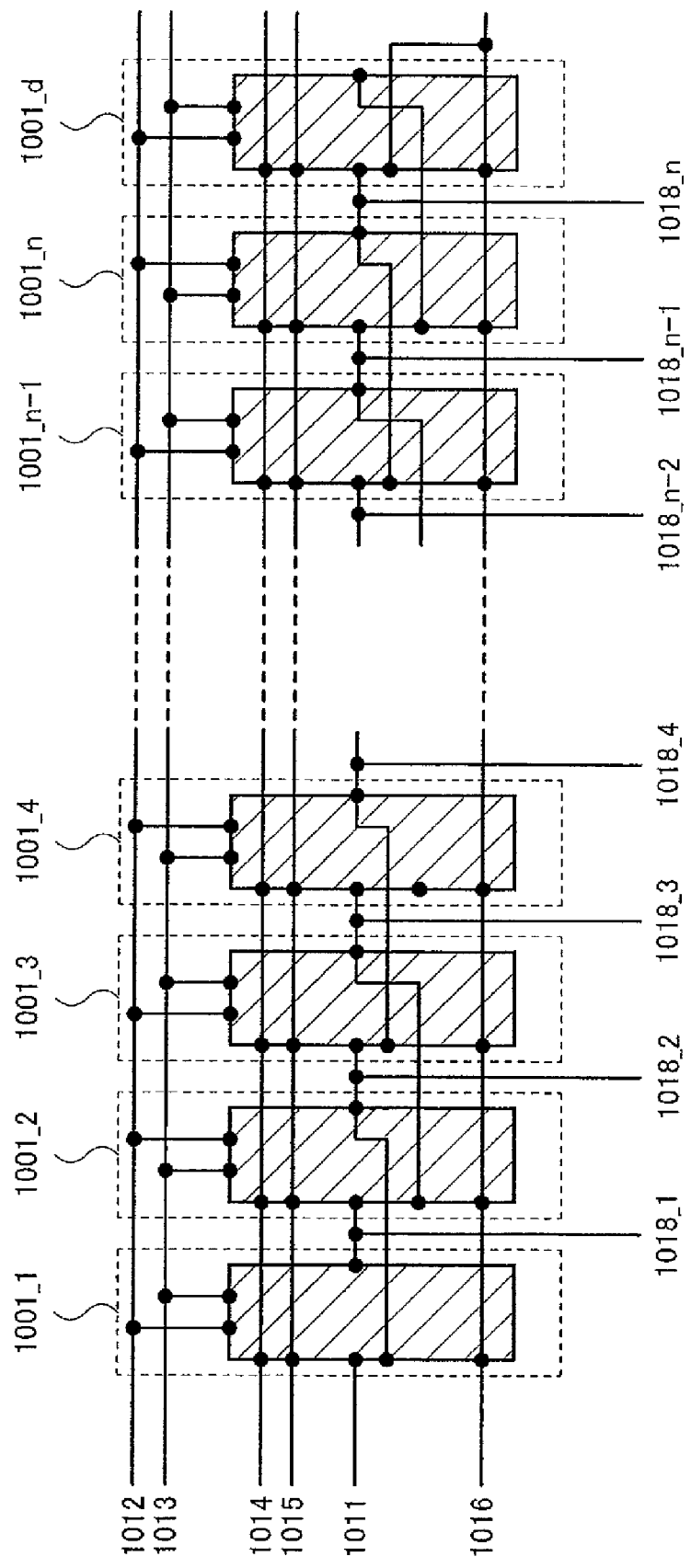
FIG. 17 is a diagram illustrating a structure of a shift register described in Embodiment Mode 1.

In another example, the reset signal input to the flip-flop 1001_n may be another input signal or output signal of the shift register. In other words, one wiring and one signal can be reduced by generation of the reset signal input to the flip-flop 1001_n in the shift register. For example, when the flip-flop 1001_n is in an even-numbered stage, it may be connected to the eighth wiring 1018_1 as shown in FIG. 14. In another example, when the flip-flop 1001_n is in an even-numbered stage, it may be connected to the first wiring 1011 as shown in FIG. 15. In another example, the reset signal input to the flip-flop 1001_n may be generated using a dummy flip-flop 1001_d as shown in FIG. 17.

The dummy flip-flop 1001_d may be a flip-flop similar to the flip-flop 1001_n−1. Note that the second wiring 122 shown in FIG. 1 of the dummy flip-flop 1001_d is connected to the sixth wiring 1016 in FIG. 17. Note that components in common with those in FIG. 10 are denoted by common reference numerals, and the description is omitted.

Next, a structure and a driving method of a display device including the aforementioned shift register of this embodiment mode are described. Note that a display device of this embodiment mode includes at least the flip-flop of this embodiment mode.

A structure of the display device of this embodiment mode is described with reference to FIG. 18. The display device in FIG. 18 includes a signal line driver circuit 1801, a scan line driver circuit 1802, and a pixel portion 1804. The pixel portion 1804 includes a plurality of signal lines S1 to Sm provided to extend from the signal line driver circuit 1801 in a column direction, a plurality of scan lines G1 to Gn provided to extend from the scan line driver circuit 1802 in a row direction, and a plurality of pixels 1803 arranged in matrix corresponding to the signal lines S1 to Sm and the scan lines G1 to Gn. Each pixel 1803 is connected to the signal line Sj (one of the signal lines S1 to Sm) and the scan line Gi (one of the scan lines G1 to Gn).

The shift register of this embodiment mode can be applied to the scan line driver circuit 1802. It is needless to say that the shift register of this embodiment mode can be also used as the signal line driver circuit 1801.

The scan lines G1 to Gn are connected to the eighth wirings 1018_1 to 1018_n shown in FIGS. 10, 13 to 15, and 17.

The signal lines and the scan lines may be simply referred to as wirings. The signal line driver circuit 1801 and the scan line driver circuit 1802 may each be referred to as a driver circuit.

The pixel 1803 includes at least a switching element, a capacitor, and a pixel electrode. Note that the pixel 1803 may include a plurality of switching elements or a plurality of capacitors. Further, a capacitor is not always needed. The pixel 1803 may include a transistor which operates in a saturation region. The pixel 1803 may include a display element such as a liquid crystal element or an EL element. As the switching element, a transistor or a PN junction diode can be used. When a transistor is used as the switching element, it preferably operates in a linear region. Further, when the scan line driver circuit 1802 includes only n-channel transistors, an n-channel transistor is preferably used as the switching element. When the scan line driver circuit 1802 includes only p-channel transistors, a p-channel transistor is preferably used as the switching element.

The scan line driver circuit 1802 and the pixel portion 1804 are formed over an insulating substrate 1805, and the signal line driver circuit 1801 is not formed over the insulating substrate 1805. The signal line driver circuit 1801 is formed on a single crystalline substrate, an SOI substrate, or over another insulating substrate which is different from the insulating substrate 1805. The signal line driver circuit 1801 is connected to the signal lines S1 to Sm through a printed wiring board such as an FPC. Note that the signal line driver circuit 1801 may be formed over the insulating substrate 1805, or a circuit forming part of the signal line driver circuit 1801 may be formed over the insulating substrate 1805.

The signal line driver circuit 1801 inputs a voltage or a current as a video signal to the signal lines S1 to Sm. Note that the video signal may be an analog signal or a digital signal. Positive and negative polarities of the video signal may be inverted for each frame (i.e., frame inversion driving), may be inverted for each row (i.e., gate line inversion driving), may be inverted for each column (i.e., source line inversion driving), or may be inverted for each row and column (i.e., dot inversion driving). Further, the video signal may be input to the signal lines S1 to Sm with dot sequential driving or line sequential driving. The signal line driver circuit 1801 may input not only the video signal but also a certain voltage such as precharge voltage to the signal lines S1 to Sm. A certain voltage such as precharge voltage is preferably input in each frame or in each gate selection period.

The scan line driver circuit 1802 inputs a signal to the scan lines G1 to Gn and selects (hereinafter also referred to as scans) the scan lines G1 to Gn sequentially from the first row. Then, the scan line driver circuit 1802 selects the plurality of pixels 1803 connected to the selected scan line. Here, one gate selection period refers to a period in which one scan line is selected, and a non-selection period refers to a period in which the scan line is not selected. A scan signal refers to a signal output to the scan line from the scan line driver circuit 1802. The maximum value of the scan signal is greater than the maximum value of the video signal or the maximum voltage of the signal line, and the minimum value of the scan signal is less than the minimum value of the video signal or the minimum voltage of the signal line.

When the pixel 1803 is selected, the video signal is input to the pixel 1803 from the signal line driver circuit 1801 through the signal line. When the pixel 1803 is not selected, the pixel 1803 maintains the video signal (a potential corresponding to the video signal) input in the selection period.

Although not shown, a plurality of potentials and a plurality of signals are supplied to the signal line driver circuit 1801 and the scan line driver circuit 1802.

Figure 18:
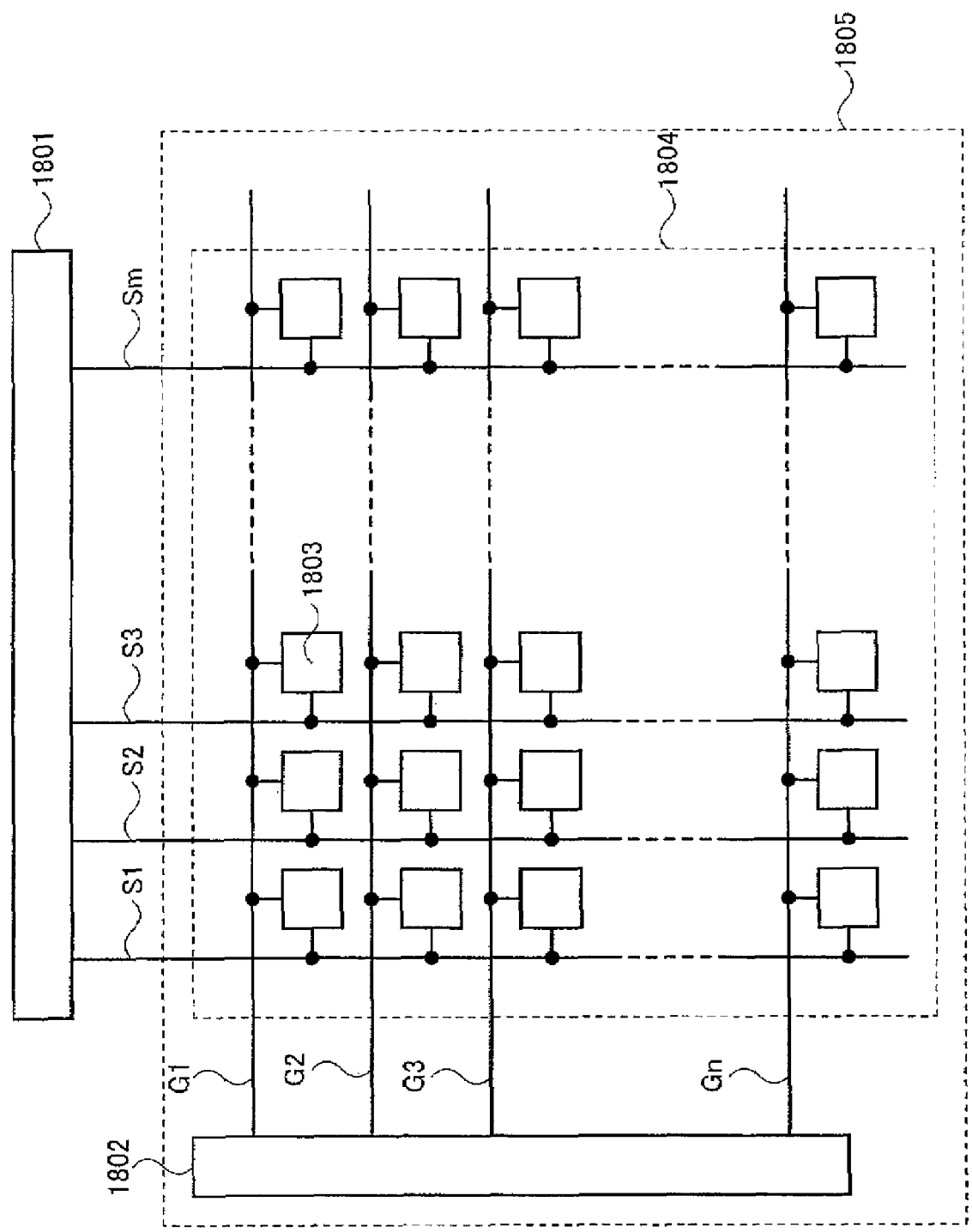
FIG. 18 is a diagram illustrating a structure of a display device described in Embodiment Mode 1.
Figure 19:
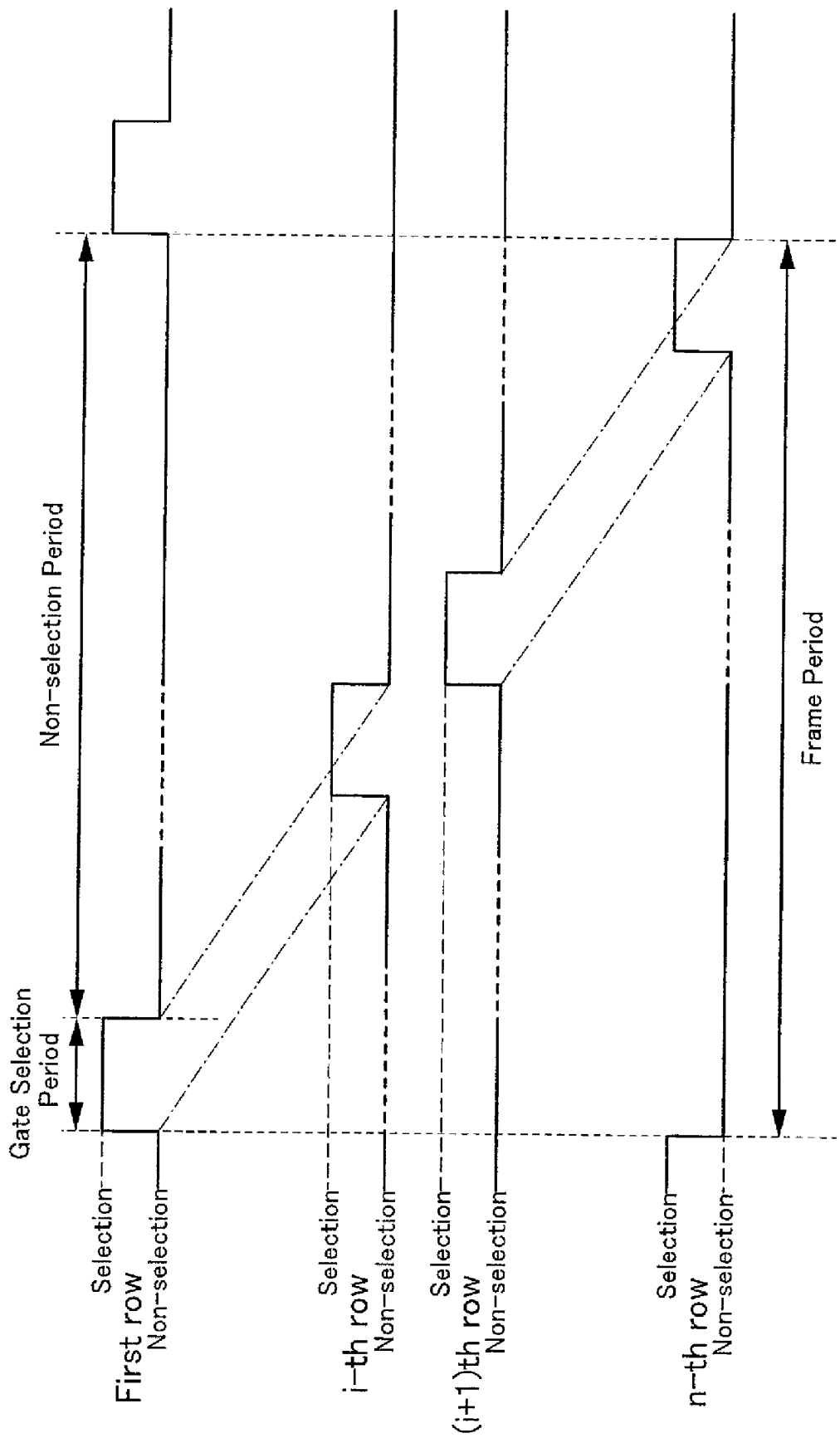
FIG. 19 is a timing chart illustrating a write operation of the display device shown in FIG. 18.

Next, an operation of the display device shown in FIG. 18 is described with reference to a timing chart of FIG. 19. FIG. 19 shows one frame period corresponding to a period for displaying an image for one screen. Although one frame period is not particularly limited, it is preferably $1/60$ seconds or less so that a person viewing an image does not perceive a flicker.

The timing chart of FIG. 19 shows each timing for selecting the scan line G1 in the first row, the scan line Gi in the i-th row, the scan line Gi+1 in the (i+1)th row, and the scan line Gn in the n-th row.

In FIG. 19, the scan line Gi in the i-th row is selected, for example, and the plurality of pixels 1803 connected to the scan line Gi are selected. Then, a video signal is input to each of the plurality of pixels 1803 connected to the scan line Gi, and each of the plurality of pixels 1803 maintains a potential corresponding to the video signal. After that, the scan line Gi in the i-th row is non-selected, the scan line Gi+1 in the (i+1)th row is selected, and the plurality of pixels 1803 connected to the scan line Gi+1 are selected. Then, a video signal is input to each of the plurality of pixels 1803 connected to the scan line Gi+1, and each of the plurality of pixels 1803 maintains a potential corresponding to the video signal. Thus, in one frame period, the scan lines G1 to Gn are sequentially selected, and the pixels 1803 connected to each scan line are also sequentially selected. A video signal is input to each of the plurality of pixels 1803 connected to each scan line, and each of the plurality of pixels 1803 maintains a potential corresponding to the video signal.

Accordingly, the display device of FIG. 18 can input video signals independently to all pixels, so that it can sufficiently operate as an active matrix display device.

Further, in the display device of FIG. 18, the shift register of this embodiment mode is used as the scan line driver circuit 1802, so that a shift in threshold voltage of a transistor can be suppressed. The display device of FIG. 18 can obtain a longer life, can improve drive capability, can suppress malfunction, and can simplify a process.

In the display device of FIG. 18, the signal line driver circuit 1801 which needs to operate at high speed is formed over a substrate different from that for the scan line driver circuit 1802 and the pixel portion 1804. Therefore, amorphous silicon can be used for semiconductor layers of transistors included in the scan line driver circuit 1802 and the pixels 1803. The display device of FIG. 18 achieves simplification of a manufacturing process, reduction in manufacturing cost, and improvement in yield. Further, the size of the display device of this embodiment mode can be increased. Even when polysilicon or single crystalline silicon is used for the semiconductor layer of the transistor, simplification of a manufacturing process can be realized.

When the signal line driver circuit 1801, the scan line driver circuit 1802, and the pixel portion 1804 are formed over the same substrate, polysilicon or single crystalline silicon is preferably used for the semiconductor layers of the transistors included in the scan line driver circuit 1802 and the pixels 1803.

The number, arrangement, and the like of the driver circuits are not limited to those shown in FIG. 18 as long as pixels can be selected and a video signal can be independently written to each pixel as shown in FIG. 18.

Figure 20:
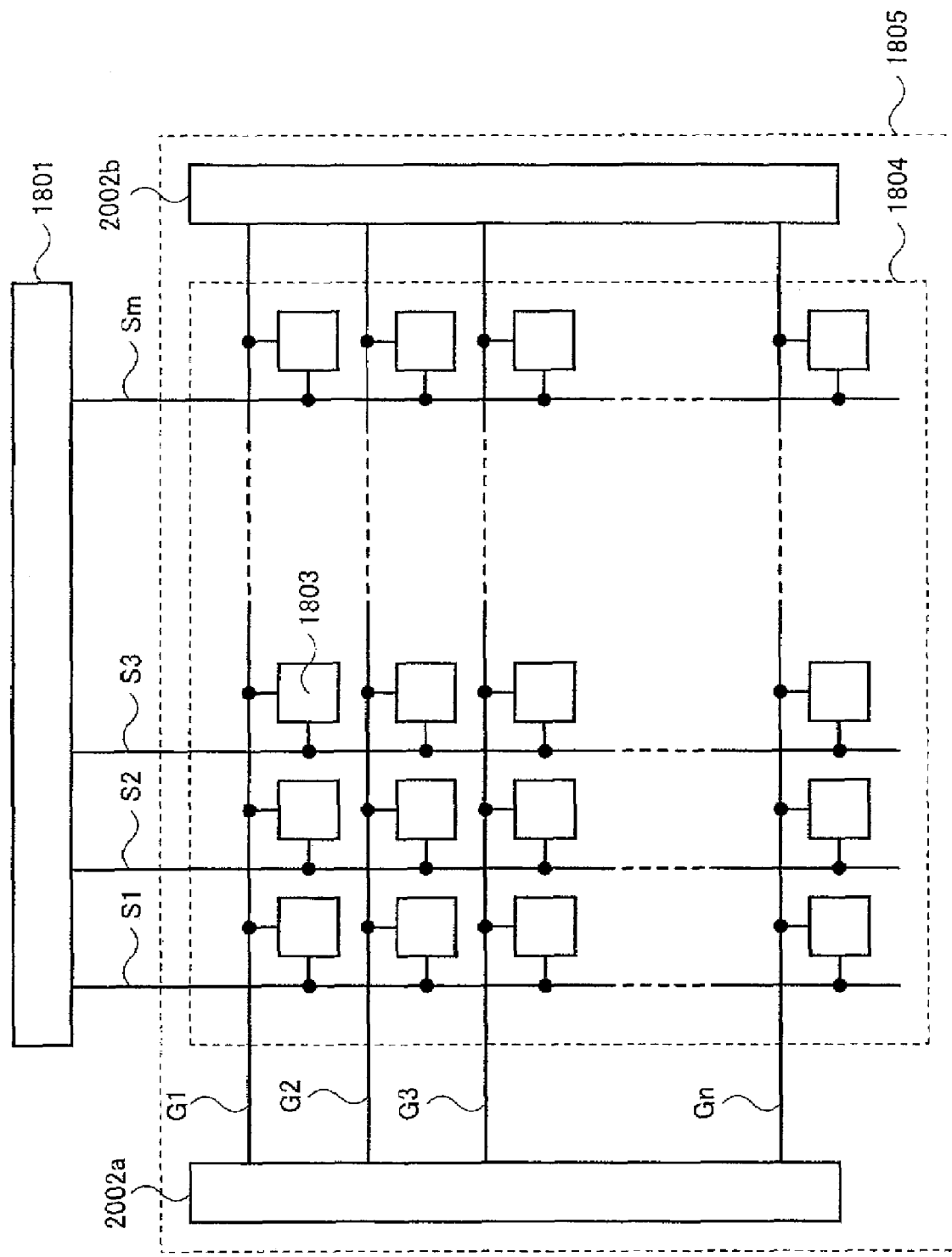
FIG. 20 is a diagram illustrating a structure of a display device described in Embodiment Mode 1.

For example, as shown in FIG. 20, the scan lines G1 to Gn may be scanned by a first scan line driver circuit 2002*a* and a second scan line driver circuit 2002*b*. The first scan line driver circuit 2002*a* and the second scan line driver circuit 2002*b* each have a structure similar to that of the scan line driver circuit 1802 shown in FIG. 18, and scan the scan lines G1 to Gn at the same timing. Further, the first scan line driver circuit 2002*a* and the second scan line driver circuit 2002*b* may be referred to as a first driver circuit and a second driver circuit.

Even if a defect is generated in one of the first scan line driver circuit 2002*a* and the second scan line driver circuit 2002*b*, the scan lines G1 to Gn can be scanned by the other of the first scan line driver circuit 2002*a* and the second scan line driver circuit 2002*b*; thus, the display device of FIG. 20 can have redundancy. In the display device of FIG. 20, a load (wiring resistance of the scan lines and parasitic capacitance of the scan lines) of the first scan line driver circuit 2002*a* and a load of the second scan line driver circuit 2002*b* can be reduced to half of that of FIG. 18. Thus, delay and distortion of signals input to the scan lines G1 to Gn (output signals of the first scan line driver circuit 2002*a* and the second scan line driver circuit 2002*b*) can be reduced. Further, since the loads of the first scan line driver circuit 2002*a* and the second scan line driver circuit 2002*b* can be reduced in the display device of FIG. 20, the scan lines G1 to Gn can be scanned with high speed. Furthermore, since the scan lines G1 to Gn can be scanned with high speed, increase in size or definition of a panel can be realized. The merits of the display device of FIG. 20 are more effective when amorphous silicon is used for the semiconductor layers of transistors included in the first scan line driver circuit 2002*a* and the second scan line driver circuit 2002*b*. Note that components in common with those of FIG. 18 are denoted by common reference numerals, and the description is omitted.

Figure 8:
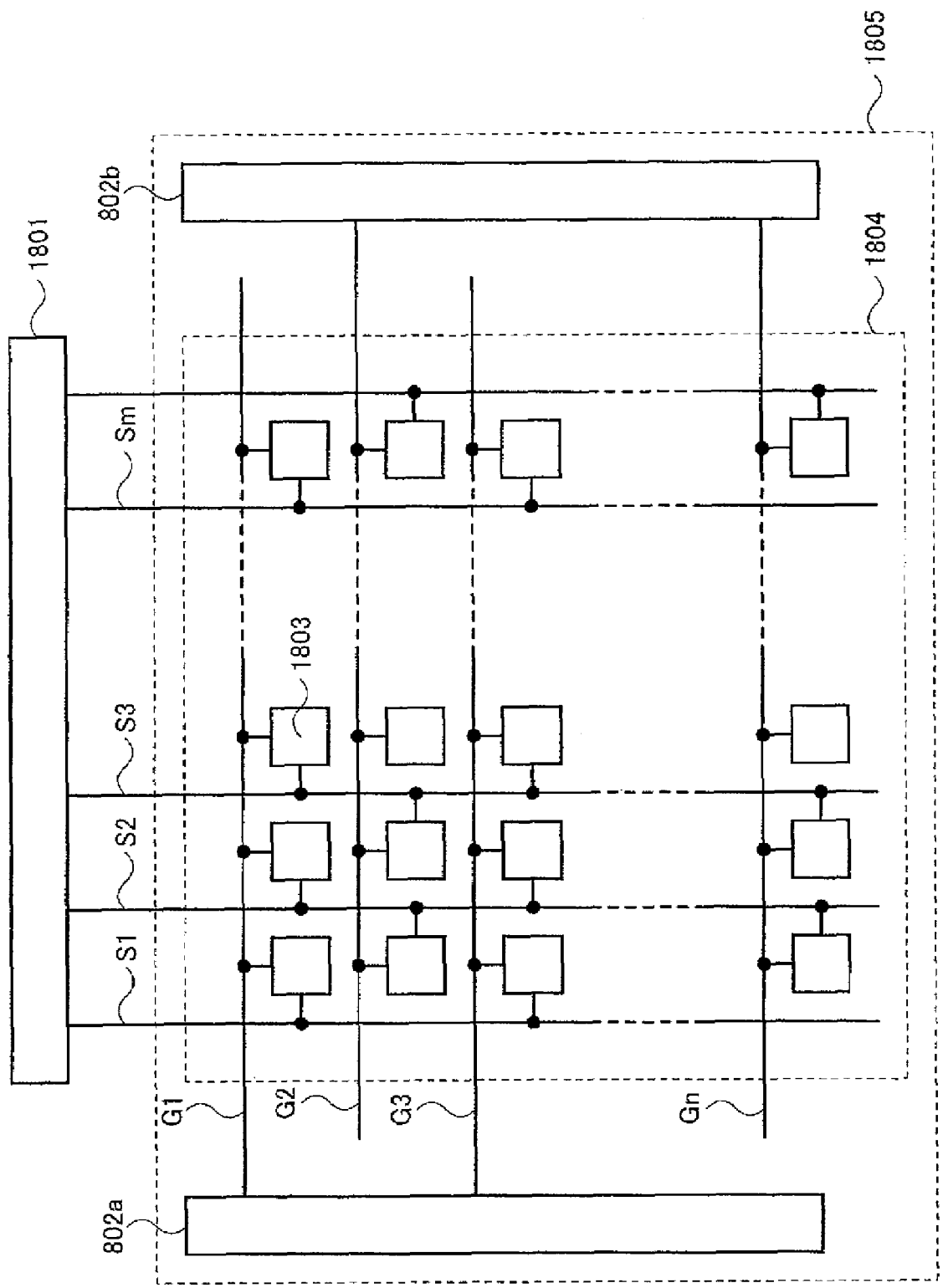
FIG. 8 is a diagram illustrating a structure of a display device described in Embodiment Mode 1.

As another example, FIG. 8 shows a display device in which a video signal can be written to pixels with high speed. In the display device of FIG. 8, the same video signal is input to the pixel 1803 in the i-th row and j-th column and to the pixel 1803 in the (i+1)th row and (j+1)th column. In the display device of FIG. 8, scan lines in odd-numbered stages among the scan lines G1 to Gn are scanned by a first scan line driver circuit 802*a*, and scan lines in even-numbered stages among the scan lines G1 to Gn are scanned by a second scan line driver circuit 802*b*. Further, the input of a start signal to the second scan line driver circuit 802*b* is delayed for ¼ cycle of a clock signal with respect to the input of a start signal to the first scan line driver circuit 802*a*.

The display device of FIG. 8 can perform dot inversion driving simply by inputting a video signal with positive polarity to every other signal line and inputting a video signal with negative polarity to the other signal lines during one frame period. Further, the display device of FIG. 8 can perform frame inversion driving by inverting polarity of the video signal input to each signal line in every frame period.

Figure 9:
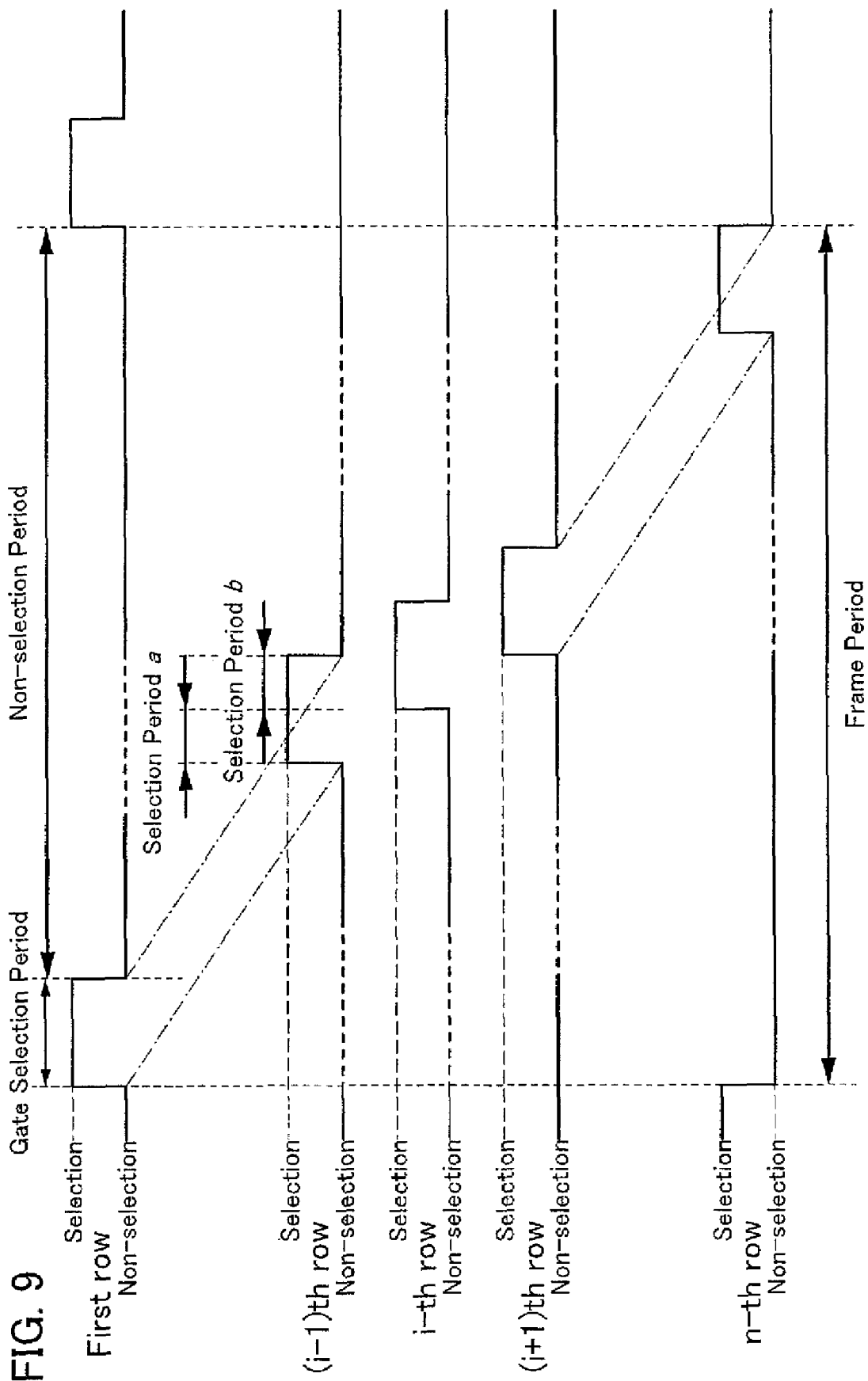
FIG. 9 is a timing chart illustrating a write operation of the display device shown in FIG. 8.

An operation of the display device of FIG. 8 is described with reference to a timing chart of FIG. 9. The timing chart of FIG. 9 shows each timing for selecting the scan line G1 in the first row, the scan line Gi−1 in the (i−1)th row, the scan line Gi in the i-th row, the scan line Gi+1 in the (i+1)th row, and the scan line Gn in the n-th row. Further, in the timing chart of FIG. 9, one selection period is divided into a selection period a and a selection period b. The case where the display device in FIG. 8 performs dot inversion driving and frame inversion driving is described with reference to the timing chart of FIG. 9.

In FIG. 9, the selection period a of the scan line Gi in the i-th row, for example, overlaps with the selection period b of the scan line Gi−1 in the (i−1)th row. The selection period b of the scan line Gi in the i-th row overlaps with the selection period a of the scan line Gi+1 in the (i+1)th row. Therefore, in the selection period a, a video signal similar to that input to the pixel 1803 in the (i−1)th row and (j+1)th column is input to the pixel 1803 in the i-th row and j-th column. Further, in the selection period b, a video signal similar to that input to the pixel 1803 in the i-th row and j-th column is input to the pixel 1803 in the (i+1)th row and (j+1)th column. Note that a video signal input to the pixel 1803 in the selection period b is an original video signal, and a video signal input to the pixel 1803 in the selection period a is a video signal for precharging the pixel 1803. Accordingly, in the selection period a, each pixel 1803 is precharged by the video signal input to the pixel 1803 in the (i−1)th row and (j+1)th column, and in the selection period b, an original video signal (in the i-th row and j-th column) is input to each pixel 1803.

Accordingly, since the video signal can be written to the pixel 1803 with high speed, increase in size or definition of the display device in FIG. 8 can be realized. Further, in the display device of FIG. 8, since the video signals with the same polarity are input to respective signal lines in one frame period, the amount of charging and discharging of each signal line is decreased, and reduction in power consumption can be realized. Further, since a load of an IC for supplying the video signal can be greatly decreased in the display device of FIG. 8, heat generation, power consumption, and the like of the IC can be reduced. Furthermore, driving frequency of the first scan line driver circuit 802*a* and the second scan line driver circuit 802*b* in the display device of FIG. 8 can be decreased to approximately half.

Note that, for the display device of this embodiment mode, various driving methods can be employed depending on a structure and a driving method of the pixel 1803. For example, in one frame period, the scan line driver circuit may scan the scan lines a plurality of times.

An additional wiring or the like may be provided in the display devices of FIGS. 8, 18, and 20 depending on a structure of the pixel 1803. For example, a power supply line maintained at a constant potential, a capacitor line, an additional scan line, or the like may be added. When an additional scan line is provided, an additional scan line driver circuit to which the shift register of this embodiment mode is applied may be provided as well. As another example, the pixel portion may be provided with a dummy scan line, signal line, power supply line, or capacitor line.

Although this embodiment mode has been described with reference to various drawings, the contents (or part of the contents) described in each drawing can be freely applied to, combined with, or replaced with the contents (or part of the contents) described in another drawing. Further, much more drawings can be formed by combining each part in the above-described drawings with another part.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in the drawings in this embodiment mode with part of another embodiment mode.

Note that this embodiment mode has described just examples of embodying, slightly transforming, modifying, improving, describing in detail, or applying the contents (or part of the contents) described in other embodiment modes, an example of related part thereof, or the like. Therefore, the contents described in other embodiment modes can be freely applied to, combined with, or replaced with the contents described in this embodiment mode.

Embodiment Mode 2

This embodiment mode describes structures and driving methods of a flip-flop different from those in Embodiment Mode 1, a driver circuit including the flip-flop, and a display device including the driver circuit. Note that components in common with those in Embodiment Mode 1 are denoted by common reference numerals, and detailed description of the same portions and portions having similar functions is omitted.

A flip-flop of this embodiment mode can have a structure similar to that of the flip-flop in Embodiment Mode 1. Thus, in this embodiment mode, description of the structure of the flip-flop is omitted. Note that timing for driving the flip-flop is different from that in Embodiment Mode 1.

The case where driving timing of this embodiment mode is applied to the flip-flop in FIG. 1 is described. The driving timing of this embodiment mode can be freely combined with each flip-flop in FIGS. 4A to 4D, 5A to 5D, 7A to 7C, and 21A to 21C as well. Further, the driving timing of this embodiment mode can be freely combined with the driving timing of Embodiment Mode 1 as well.

Figure 31:
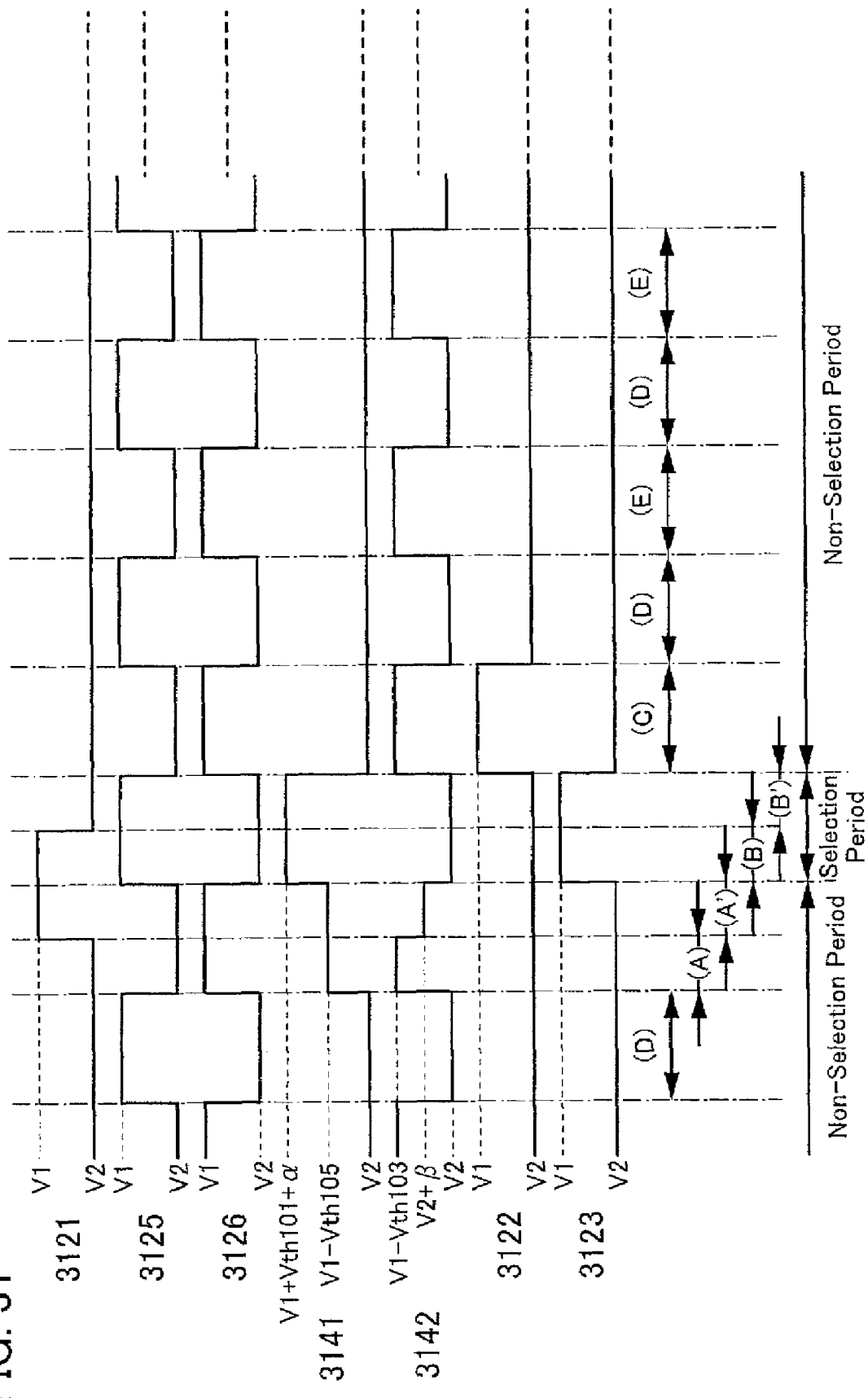
FIG. 31 is a timing chart illustrating an operation of a flip-flop described in Embodiment Mode 2.

An operation of the flip-flop of this embodiment mode is described with reference to the flip-flop in FIG. 1 and a timing chart of FIG. 31. The timing chart of FIG. 31 is described with an operation period divided into a selection period and a non-selection period. Further, the non-selection period is divided into a first non-selection period, a second non-selection period, a set period A, a set period A', and a reset period. Furthermore, the selection period is divided into a selection period B and a selection period B'. During an operation period in the non-selection period except for the set period A, the set period A', the selection period B, the selection period B', and the reset period, the first non-selection period and the second non-selection period are sequentially repeated.

Note that in FIG. 31, a signal 3121, a signal 3125, a signal 3126, a potential 3141, a potential 3142, a signal 3122, and a signal 3123 refer to a signal input to the first wiring 121, a signal input to the fifth wiring 125, a signal input to the sixth wiring 126, a potential of the node 141, a potential of the node 142, a signal input to the second wiring 122, and a signal output through the third wiring 123, respectively.

The signal 3121, the signal 3125, the signal 3126, the potential 3141, the potential 3142, the signal 3122, and the signal 3123 correspond to the signal 221, the signal 225, the signal 226, the potential 241, the potential 242, the signal 222, and the signal 223 shown in FIG. 2, respectively and have similar characteristics.

The flip-flop of this embodiment mode basically operates similarly to the flip-flop of Embodiment Mode 1. The flip-flop of this embodiment mode is different from the flip-flop of Embodiment Mode 1 in that timing at which the H signal is input to the first wiring 121 is delayed for ¼ cycle of a clock signal.

The operation of the flip-flop of this embodiment mode in the first non-selection period and the second non-selection period is similar to that of the flip-flop of Embodiment Mode 1 in the first non-selection period and the second non-selection period. The operation of the flip-flop of this embodiment mode in the set period A is similar to that in the second non-selection period. The operation of the flip-flop of this embodiment mode in the reset period is similar to that of the flip-flop of Embodiment Mode 1 in the reset period. The operation of the flip-flop of this embodiment mode in the selection period B and the selection period B' is similar to that of the flip-flop of Embodiment Mode 1 in the selection period. Note that the flip-flop of this embodiment mode is different from the flip-flop of Embodiment Mode 1 in that the H signal is input to the first wiring 121 in the selection period B. However, the input of the H signal to the first wiring 121 in the selection period B hardly affects the operation in this embodiment mode because the fifth transistor 105 remains off. Thus, the detailed description of the flip-flop of this embodiment mode in the set period A, the set period A', the selection period B, the selection period B', the reset period, the first non-selection period, and the second non-selection period is omitted.

The flip-flop of this embodiment mode can obtain advantageous effects similar to those of the flip-flop of Embodiment Mode 1.

Figure 32:
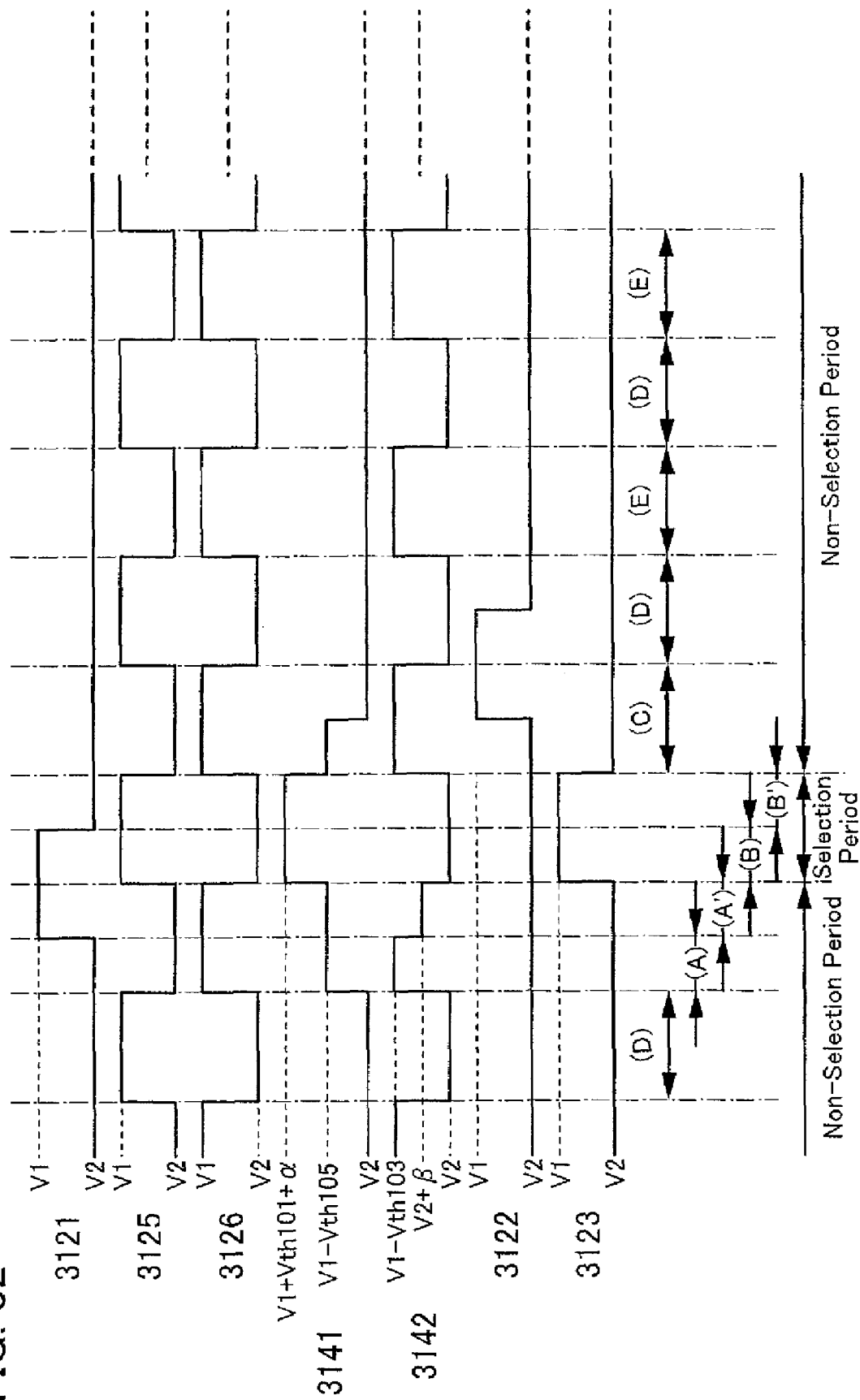
FIG. 32 is a timing chart illustrating an operation of a flip-flop described in Embodiment Mode 2.

Note that, by application of a timing chart shown in FIG. 32 to the flip-flop of this embodiment mode, fall time of output signal of the flip-flop of this embodiment mode can be shortened significantly. This is because the L signal can be input to the third wiring 123 through the first transistor 101 by delaying timing at which the signal 3122 (reset signal) becomes the H level.

Next, a structure and a driving method of a shift register including the aforementioned flip-flop of this embodiment mode are described.

A structure of a shift register of this embodiment mode is described with reference to FIG. 33. The shift register of FIG. 33 includes n flip-flops (flip-flops 3301_1 to 3301_n).

Figure 33:
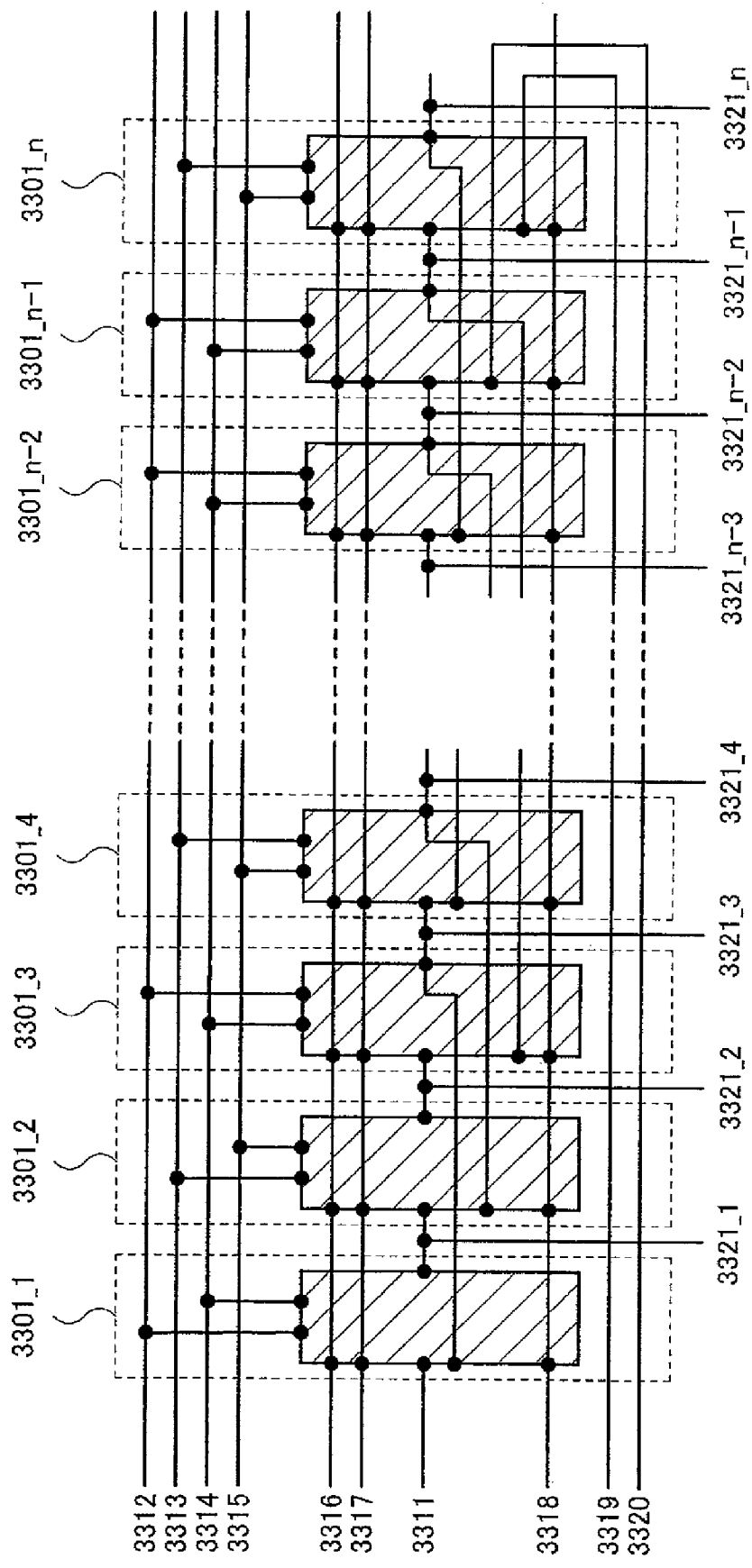
FIG. 33 is a diagram illustrating a structure of a shift register described in Embodiment Mode 2.

The connection relationship of the shift register in FIG. 33 is described. Of the flip-flops_i in the i-th row (the flip-flops 3301_1 to 3301_n) in the shift register of FIG. 33, the flip-flop 3301_4N−3 in the (i=4N−3)th stage (N is a natural number equal to or greater than 2) and the flip-flop 3301_4N−1 in the (i=4N−1)th stage (N is a natural number equal to or greater than 1) are connected to a second wiring 3312, a fourth wiring 3314, a sixth wiring 3316, a seventh wiring 3317, an eighth wiring 3318, an eleventh wiring 3321_i−1, an eleventh wiring 3321_i, and an eleventh wiring 3321_i+2. Note that the flip-flop 3301_1 in the (i=4N−3)th stage (N=1) is connected to a first wiring 3111, the second wiring 3312, the fourth wiring 3314, the sixth wiring 3316, the seventh wiring 33317, the eighth wiring 3318, an eleventh wiring 3321_1, and an eleventh wiring 3321_3. Further, the flip-flop 33014N−2 in the (i=4N−2)th stage (N is a natural number equal to or greater than 1) and the flip-flop 3301_4N in the (i=4N)th stage (N is a natural number equal to or greater than 1) are connected to a third wiring 3313, a fifth wiring 3315, the sixth wiring 3316, the seventh wiring 3317, the eighth wiring 3318, the eleventh wiring 3321_i−1, the eleventh wiring 3321_i, and the eleventh wiring 3321_i+2. The flip-flop 3301_n−1 in the (n−1)th stage is connected to the second wiring 3312, the fourth wiring 3314, the sixth wiring 3316, the seventh wiring 3317, the eighth wiring 3318, a tenth wiring 3320, an eleventh wiring 3321_n−2, and an eleventh wiring 3321_n−1. The flip-flop 3301_n in the n-th stage is connected to the third wiring 3313, the fifth wiring 3315, the sixth wiring 3316, the seventh wiring 3317, the eighth wiring 3318, a ninth wiring 3319, the eleventh wiring 3321_n−1, and an eleventh wiring 3321_n.

The first wiring 3311 is connected to the first wiring 121 shown in FIG. 1 of the flip-flop 3301_1. The second wiring 3312 is connected to the fifth wiring 125 shown in FIG. 1 of the flip-flop 3301_4N−3 and is connected to the sixth wiring 126 shown in FIG. 1 of the flip-flop 3301_4N−1. The third wiring 3313 is connected to the fifth wiring 125 shown in FIG. 1 of the flip-flop 3301_4N−2 and is connected to the sixth wiring 126 shown in FIG. 1 of the flip-flop 3301_4N. The fourth wiring 3314 is connected to the sixth wiring 126 shown in FIG. 1 of the flip-flop 3301_4N−3 and is connected to the fifth wiring 125 shown in FIG. 1 of the flip-flop 33014N−1. The fifth wiring 3315 is connected to the sixth wiring 126 shown in FIG. 1 of the flip-flop 3301_4N−2 and is connected to the fifth wiring 125 shown in FIG. 1 of the flip-flop 3301_4N. The sixth wiring 3316 is connected to the seventh wiring 127 shown in FIG. 1 of the flip-flops in all stages. The seventh wiring 3317 is connected to the eighth wiring 128 shown in FIG. 1 of the flip-flops in all stages. The eighth wiring 3318 is connected to the fourth wiring 124, the ninth wiring 129, the tenth wiring 130, and the eleventh wiring 131 shown in FIG. 1 of the flip-flops in all stages. The ninth wiring 3319 is connected to the second wiring 122 shown in FIG. 1 of the flip-flop 3301_n. The tenth wiring 3320 is connected to the second wiring 122 shown in FIG. 1 of the flip-flop 3301_n−1. The eleventh wiring 3321_i is connected to the second wiring 122 shown in FIG. 1 of the flip-flop 3301_i−2, the third wiring 123 shown in FIG. 1 of the flip-flop 3301_i, and the first wiring 121 shown in FIG. 1 of the flip-flop 3301_i+1. Note that the eleventh wiring 3321_1 is connected to the third wiring 123 shown in FIG. 1 of the flip-flop 3301_1 and the first wiring 121 shown in FIG. 1 of the flip-flop 3301_2. The eleventh wiring 3321_2 is connected to the third wiring 123 shown in FIG. 1 of the flip-flop 3301_2 and the first wiring 121 shown in FIG. 1 of the flip-flop 3301_3. The eleventh wiring 3321_n is connected to the third wiring 123 shown in FIG. 1 of the flip-flop 3301_n.

Note that the sixth wiring 3316 and the seventh wiring 3317 are each supplied with the potential V1, and the eighth wiring 3318 is supplied with the potential V2.

Note that signals are input to the first wiring 3311, the second wiring 3312, the third wiring 3313, the fourth wiring 3314, the fifth wiring 3315, the ninth wiring 3319, and the tenth wiring 3320. The signal input to the first wiring 3311 is a start signal; the signal input to the second wiring 3312 is a first clock signal; the signal input to the third wiring 3313 is a second clock signal; the signal input to the fourth wiring 3314 is a third clock signal; the signal input to the fifth wiring 3315 is a fourth clock signal; the signal input to the ninth wiring 3319 is a first reset signal; and the signal input to the tenth wiring 3320 is a second reset signal. In addition, each of the signals input to the first wiring 3311, the second wiring 3312, the third wiring 3313, the fourth wiring 3314, the fifth wiring 3315, the ninth wiring 3319, and the tenth wiring 3320 is a digital signal including an H signal with a potential of V1 and an L signal with a potential of V2.

Various signals, currents, or voltages may be input to the first to tenth wirings 3311 to 3320.

Signals are output through the eleventh wirings 3321_1 to 3321_n. For example, the signal output through the eleventh wiring 3321_i is an output signal of the flip-flop 3301_i. Further, the signal output through the eleventh wiring 3321_i is an input signal of the flip-flop 3301_i+1 and a reset signal of the flip-flop 3301_i−2.

Figure 35:
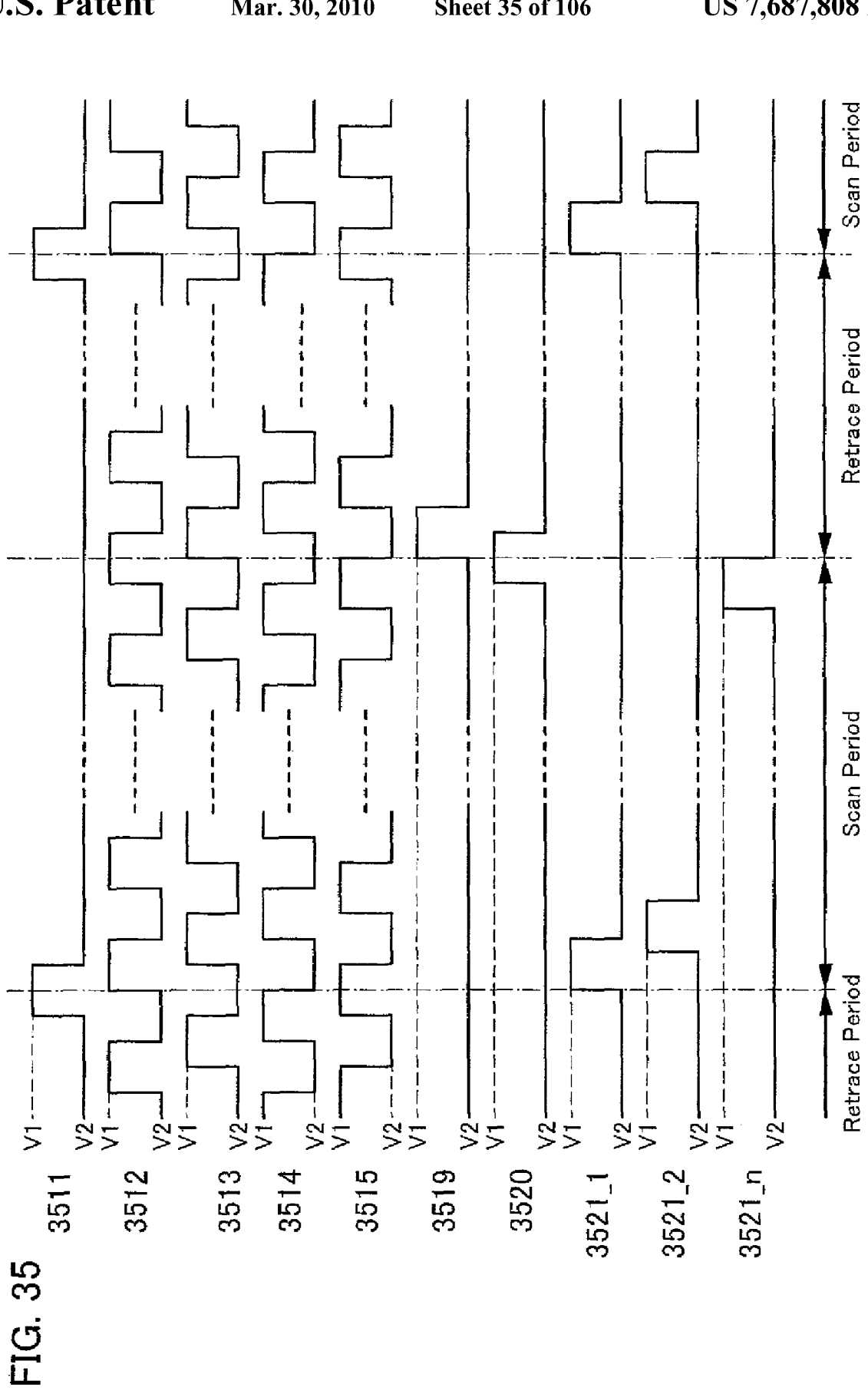
FIG. 35 is a timing chart illustrating an operation of the shift register shown in FIG. 33.

Next, the operation of the shift register shown in FIG. 33 is described with reference to a timing chart of FIG. 35 and a timing chart of FIG. 36. The timing chart of FIG. 35 is divided into a scan period and a retrace period. The scan period corresponds to a period from the time when output of a selection signal through the eleventh wiring 3311_1 starts to the time when output of a selection signal through the eleventh wiring 3311_n ends. The retrace period corresponds to a period from the time when output of the selection signal through the eleventh wiring 3311_n ends to the time when output of the selection signal through the eleventh wiring 3311_1 starts.

Note that FIG. 35 shows a signal 3511 input to the first wiring 3311, a signal 3512 input to the second wiring 3312, a signal 3513 input to the third wiring 3313, a signal 3514 input to the fourth wiring 3314, a signal 3515 input to the fifth wiring 3315, a signal 3519 input to the ninth wiring 3319, a signal 3520 input to the tenth wiring 3320, a signal 3521_1 output to the eleventh wiring 3321_1, and a signal 3521_n output to the eleventh wiring 3321_n. FIG. 36 shows a signal 3611 input to the first wiring 3311, a signal 3621_1 output to the eleventh wiring 3321_1, a signal 3621_i−1 output to the eleventh wiring 3321_i−1, a signal 3621_i output to the eleventh wiring 3321_i, a signal 3621_i+1 output to the eleventh wiring 3321_i+1, and a signal 3621_n output to the eleventh wiring 3321_n.

Figure 36:
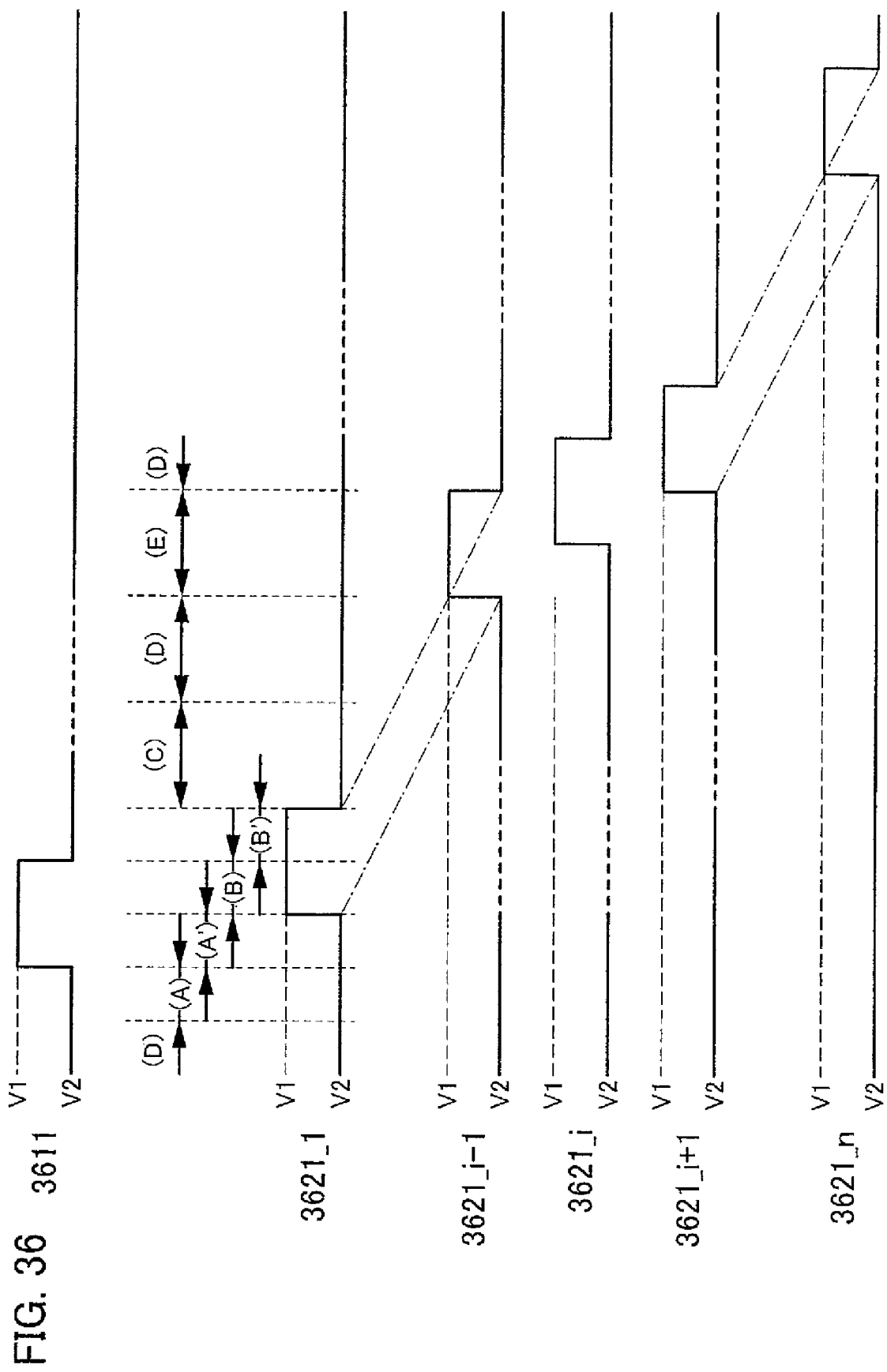
FIG. 36 is a timing chart illustrating an operation of the shift register shown in FIG. 33.

As shown in FIG. 36, if the flip-flop 3301_i−1, for example, is in the selection period B, the H signal is output through the eleventh wiring 3321_i−1. At this time, the flip-flop 3301_i is in the set period A'. Subsequently, the flip-flop 3301_i−1 is in the selection period B', and the H signal is output through the eleventh wiring 3321_i−1. At this time, the flip-flop 3301_i is in the selection period B. After that, the flip-flop 3301_i−1 is in the reset period, and the L signal is output through the eleventh wiring 3321_i−1. At this time, the flip-flop 3301_i is in the selection period B'. In other words, in the shift register of this embodiment mode, the H signal is output sequentially from the flip-flop 3301_i−1, and there is a period in which the selection period B' of the flip-flop 3301_i−1 overlaps with the selection period B of the flip-flop 3301_i.

Figure 34:
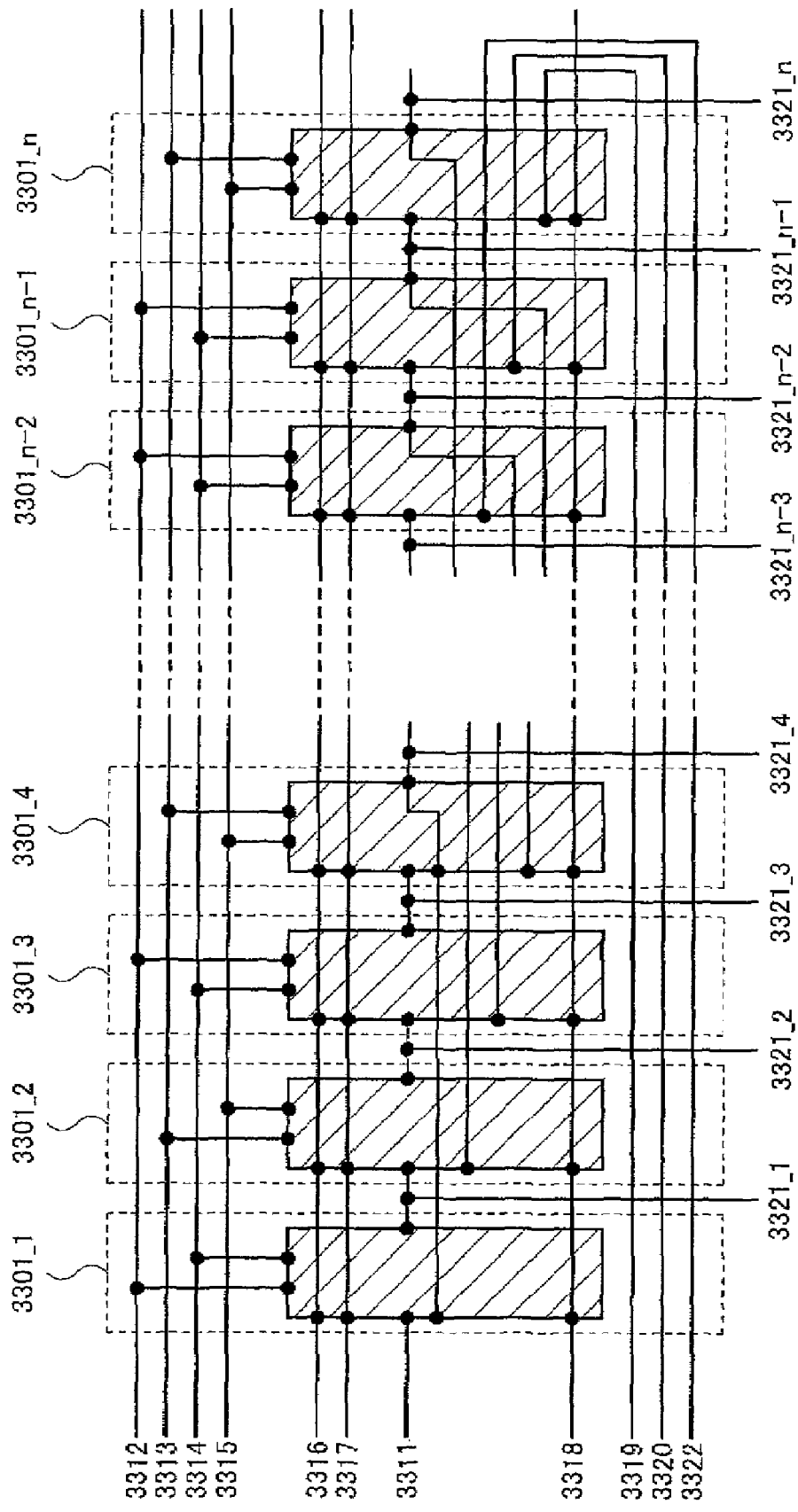
FIG. 34 is a diagram illustrating a structure of a shift register described in Embodiment Mode 2.

Note that when the timing chart of FIG. 32 is applied to the flip-flop of this specification, the shift register may have a structure as shown in FIG. 34. In the shift register of FIG. 34, the second wiring 122 shown in FIG. 1 of the flip-flop 3301_i in the i-th stage is connected to an eleventh wiring 3321_i+3. The second wiring 122 shown in FIG. 1 of the flip-flop 3301_n−2 is connected to a twelfth wiring 3322 to which a third reset signal is input. Note that components in common with FIG. 33 are denoted by common reference numerals, and the description is omitted.

The shift register of this embodiment mode, to which the flip-flop of this embodiment mode is applied, can achieve suppression of a shift in threshold voltage of a transistor, extension of life, improvement of drive capability, suppression of malfunction, simplification of a process, and the like.

The shift register of this embodiment mode can be freely combined with the shift register described in Embodiment Mode 1. For example, the shift register of this embodiment mode can be freely combined with the shift register of FIGS. 13, 14, 15, or 17. Specifically, in the shift register of this embodiment mode, buffers may be connected to the eleventh wirings 3321_1 to 3321_n, a reset signal may be generated inside, or a dummy flip-flop may be provided. As mentioned above, components in common with Embodiment Mode 1 are denoted by common reference numerals, and the description is omitted.

Next, a structure and a driving method of a display device including the aforementioned shift register of this embodiment mode are described. Note that a display device of this embodiment mode includes at least the flip-flop of this embodiment mode.

A structure of the display device of this embodiment mode is described with reference to FIG. 16. In the display device of FIG. 16, the scan lines G1 to Gn are scanned by a scan line driver circuit 1602. Further, in the display device of FIG. 16, the same video signal is input to the pixel 1803 in the i-th row and j-th column and to the pixel 1803 in the (i+1)th row and (j+1)th column. Note that components in common with those in FIG. 18 are denoted by common reference numerals, and the description is omitted.

Figure 16:
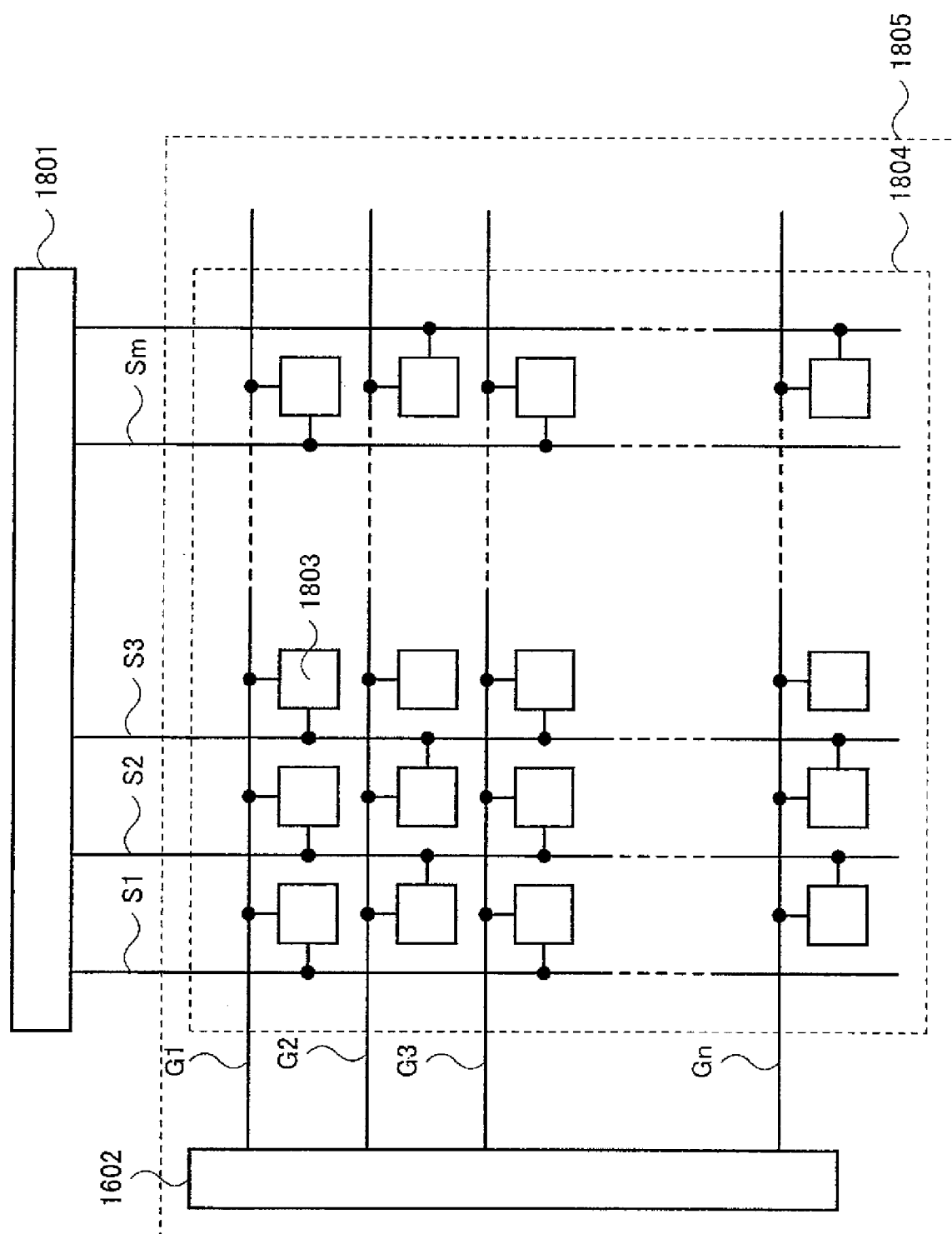
FIG. 16 is a diagram illustrating a structure of a display device described in Embodiment Mode 2.

When the shift register of this embodiment mode is applied to the scan line driver circuit 1602, the display device of FIG. 16 can operate similarly to the display device of FIG. 8 with one scan line driver circuit. Thus, the display device of FIG. 16 can provide advantageous effects similar to the display device of FIG. 8.

Figure 22:
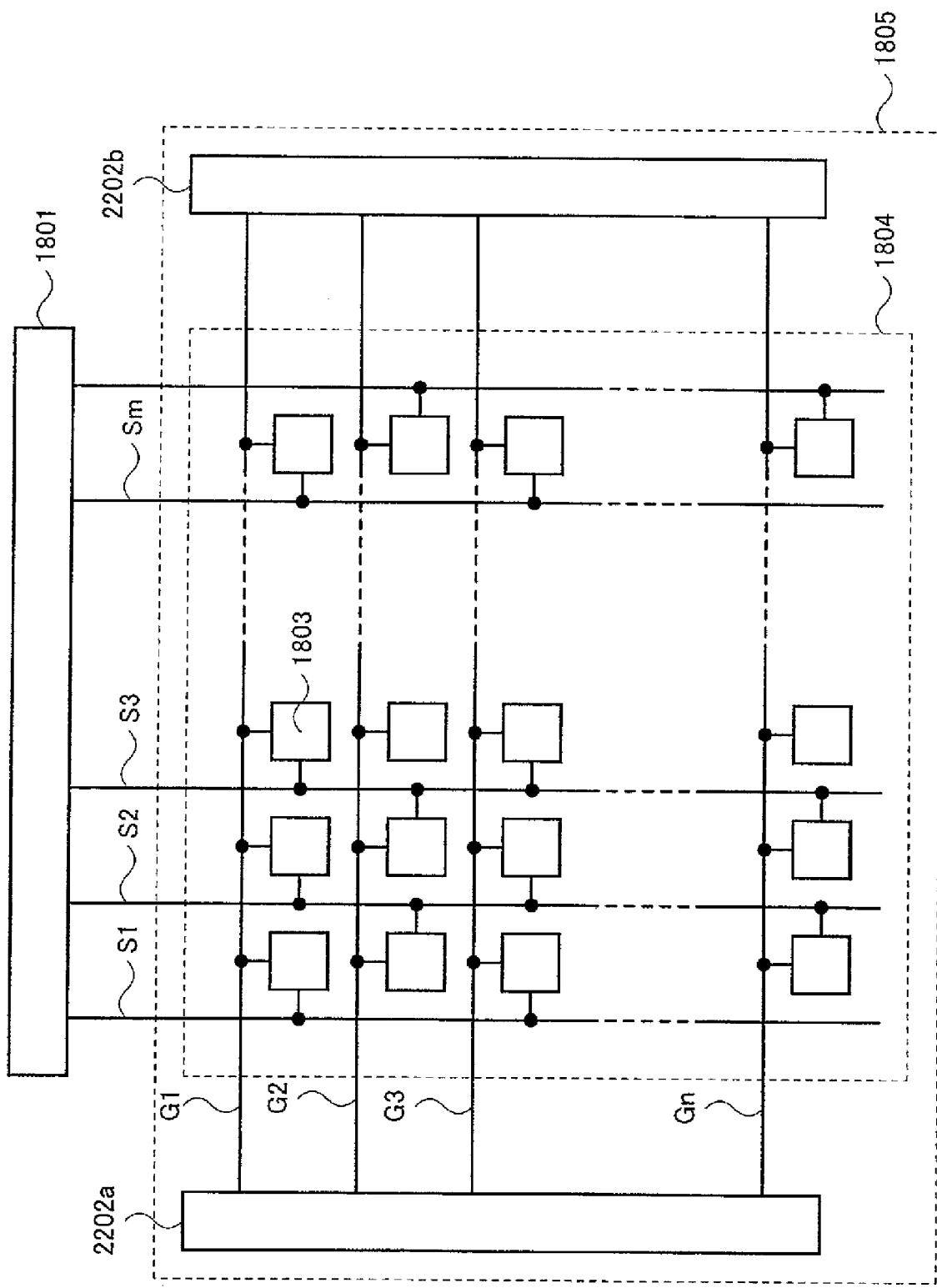
FIG. 22 is a diagram illustrating a structure of a display device described in Embodiment Mode 2.

Similarly to FIG. 20, the scan lines G1 to Gn may be scanned by a first scan line driver circuit 2202a and a second scan line driver circuit 2202b. Thus, advantageous effects similar to those of the display device of FIG. 20 can be obtained. FIG. 22 shows a structure in this case.

Although this embodiment mode has been described with reference to various drawings, the contents (or part of the contents) described in each drawing can be freely applied to, combined with, or replaced with the contents (or part of the contents) described in another drawing. Further, much more drawings can be formed by combining each part in the above-described drawings with another part.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in the drawings in this embodiment mode with part of another embodiment mode.

Note that this embodiment mode has described just examples of embodying, slightly transforming, modifying, improving, describing in detail, or applying the contents (or part of the contents) described in other embodiment modes, an example of related part thereof, or the like. Therefore, the contents described in other embodiment modes can be freely applied to, combined with, or replaced with the contents described in this embodiment mode.

Embodiment Mode 3

This embodiment mode describes structures and driving methods of a flip-flop different from those in Embodiment Modes 1 and 2, a driver circuit including the flip-flop, and a display device including the driver circuit. In the flip-flop of this embodiment mode, an output signal and a transfer signal of the flip-flop are output through different wirings by different transistors. Note that components in common with those of Embodiment Modes 1 and 2 are denoted by common reference numerals, and detailed description of the same portions and portions having similar functions is omitted.

A basic structure of the flip-flop of this embodiment mode is described with reference to FIG. 27. The flip-flop in FIG. 27 is similar to the flip-flop in FIG. 1 to which an eighth transistor 108 and a ninth transistor 109 are added.

Figure 27:
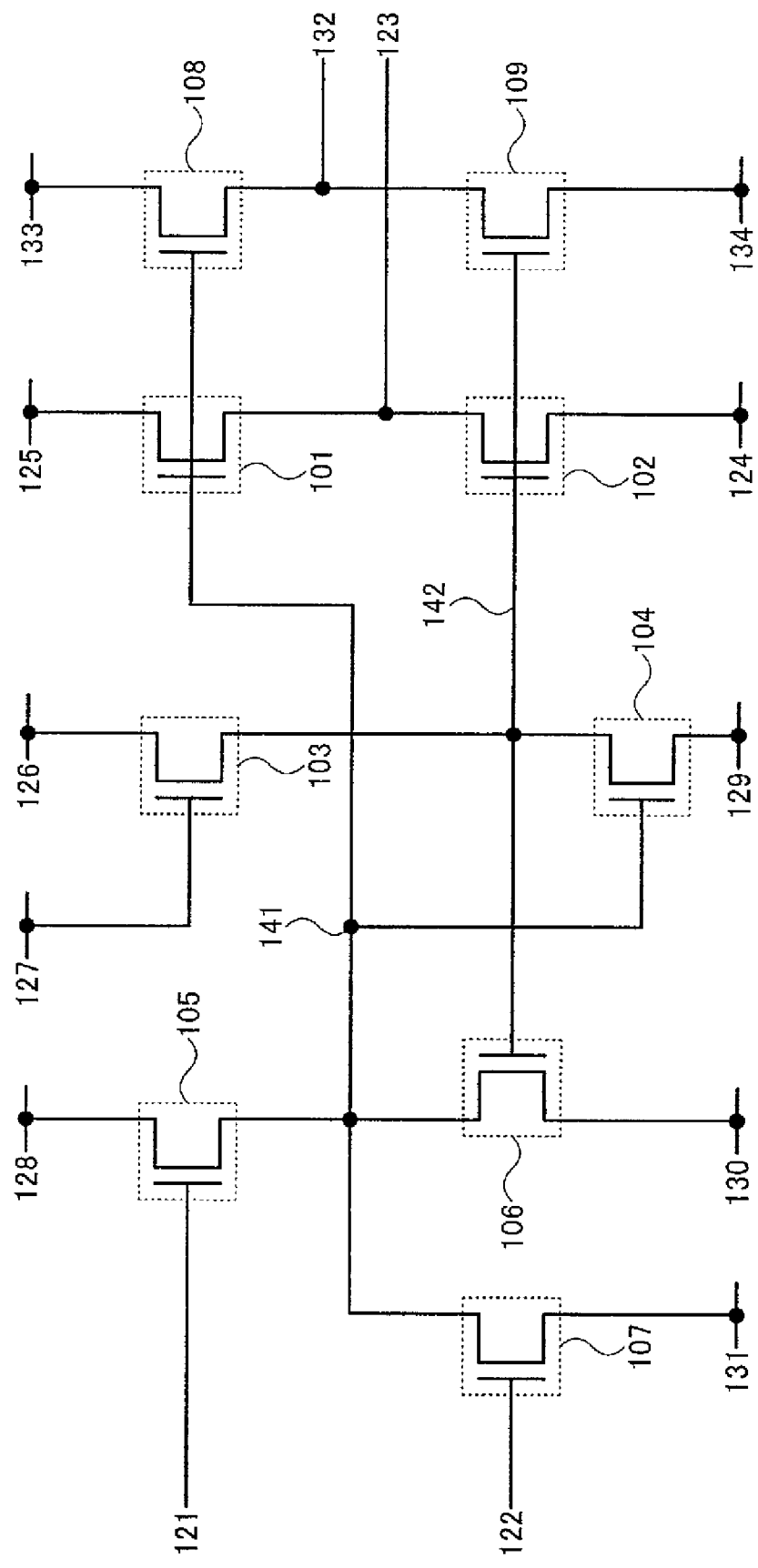
FIG. 27 is a diagram illustrating a structure of a flip-flop described in Embodiment Mode 3.

The connection relationship of the flip-flop in FIG. 27 is described. A first electrode of the eighth transistor 108 is connected to a thirteenth wiring 133, a second electrode of the eighth transistor 108 is connected to a twelfth wiring 132, and a gate electrode of the eighth transistor 108 is connected to the node 141. A first electrode of the ninth transistor 109 is connected to a fourteenth wiring 134, a second electrode of the ninth transistor 109 is connected to the twelfth wiring 132, and a gate electrode of the ninth transistor 109 is connected to the node 142. The other connection relationship is similar to FIG. 1.

The twelfth wiring 132 and the thirteenth wiring 133 may be referred to as a sixth signal line and a seventh signal line, respectively. The fourteenth wiring 134 may be referred to as a seventh power supply line.

Note that the fourteenth wiring 134 is supplied with V2.

A signal is input to the thirteenth wiring 133. The signal input to the thirteenth wiring 133 may be a similar signal to that input to the fifth wiring 125.

A signal is output through the twelfth wiring 132. As described in Embodiment Mode 1, a signal is also output through the third wiring 123.

Note that signals input to or potentials supplied to the first wiring 121, the second wiring 122, the fourth wiring 124, the fifth wiring 125, the sixth wiring 126, the seventh wiring 127, the eighth wiring 128, the ninth wiring 129, the tenth wiring 130, and the eleventh wiring 131 are similar to those of FIG. 1.

The flip-flop of FIG. 27 is described as the flip-flop in FIG. 1 to which the eighth transistor 108 and the ninth transistor 109 are added; however, the eighth transistor 108 and the ninth flip-flop 109 may be added to the flip-flop shown in FIGS. 4A to 4D, 5A to 5D, 7A to 7C, and 21A to 21C.

Figure 28:
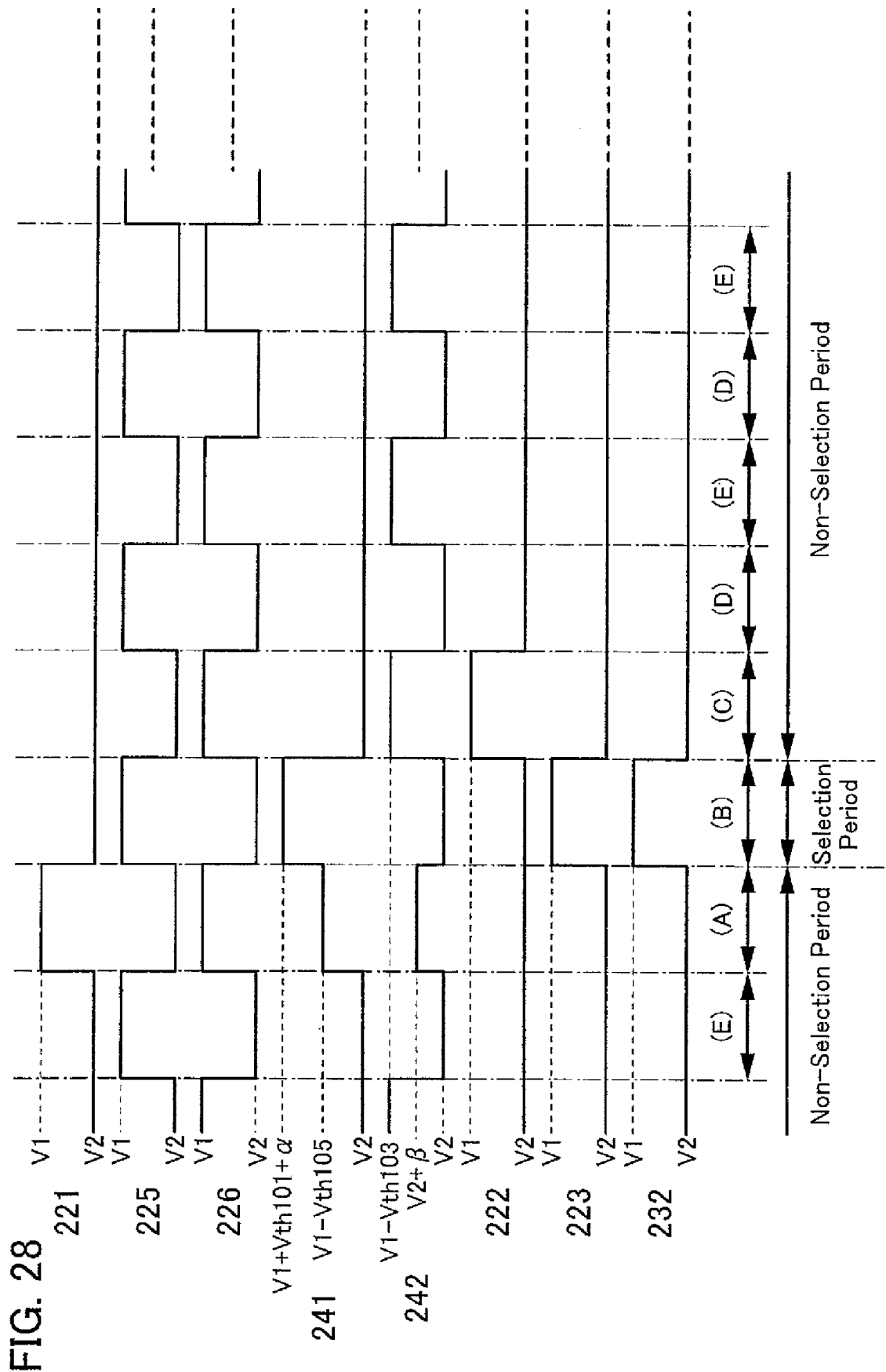
FIG. 28 is a timing chart illustrating an operation of the flip-flop shown in FIG. 27.

Next, an operation of the flip-flop shown in FIG. 27 is described with reference to a timing chart of FIG. 28. Portions in common with those in the timing chart of FIG. 2 are denoted by common reference numeral, and the description is omitted.

Note that a signal 232 refers to the signal output through the twelfth wiring 132. The signal 221, the signal 225, the signal 226, the potential 241, the potential 242, the signal 222, and the signal 223 are similar to those in FIG. 2. Note that the signal 221, the signal 225, the signal 226, the potential 241, the potential 242, the signal 222, and the signal 223 may be similar to those in FIGS. 6, 31, or 32.

In this embodiment mode, as described above, an output signal and a transfer signal of the flip-flop are output through different wirings by different transistors. In other words, in the flip-flop of FIG. 27, a signal is output through the third wiring 123 by the first transistor 101 and the second transistor 102, and a signal is output through the twelfth wiring 132 by the eighth transistor 108 and the ninth transistor 109. The eighth transistor 108 and the ninth transistor 109 are connected in the same manner as the first transistor 101 and the second transistor 102; thus, as shown in FIG. 28, the signal output through the twelfth wiring 132 (the signal 232) has approximately the same waveform as the signal output through the third wiring 123 (the signal 223). Here, the signal 232 is the output signal of the flip-flop, and the signal 223 is the transfer signal of the flip-flop. Note that the signal 223 may be used as the output signal of the flip-flop, and the signal 232 may be used as the transfer signal of the flip-flop.

The eighth transistor 108 and the ninth transistor 109 have functions similar to those of the first transistor 101 and the second transistor 102, respectively. Further, the eighth transistor 108 and the ninth transistor 109 may be referred to as a buffer portion.

Accordingly, even when a large load is connected to the twelfth wiring 132 and the signal 232 is delayed or distorted, malfunction of the flip-flop in FIG. 27 can be prevented. This is because the delay, distortion, or the like of the output signal does not affect the operation of the flip-flop in FIG. 27 when the output signal and the transfer signal of the flip-flop are output through different wirings by different transistors.

The flip-flop of this embodiment mode can provide advantageous effects similar to those of the flip-flops in Embodiment Modes 1 and 2.

Note that the operation timing described in Embodiment Mode 2 can be applied to the flip-flop of this embodiment mode.

A structure and a driving method of a shift register including the aforementioned flip-flop of this embodiment mode are described.

A structure of the shift register of this embodiment mode is described with reference to FIG. 29. The shift register of FIG. 29 includes n flip-flops (flip-flops 2901_1 to 2901_n).

The flip-flops 2901_1 to 2901_n, a first wiring 2911, a second wiring 2912, a third wiring 2913, a fourth wiring 2914, a fifth wiring 2915, a sixth wiring 2916, and a seventh wiring 2917 correspond to the flip-flops 1001_1 to 1001_n, the first wiring 1011, the second wiring 1012, the third wiring 1013, the fourth wiring 1014, the fifth wiring 1015, the sixth wiring 1016, and the seventh wiring 1017 of FIG. 10, respectively and similar signals or power supply voltages are input thereto. Eighth wirings 2918_1 to 2918_n and ninth wiring 2919_1 to 2919_n correspond to the tenth wirings 1018_1 to 1018_n.

Figure 29:
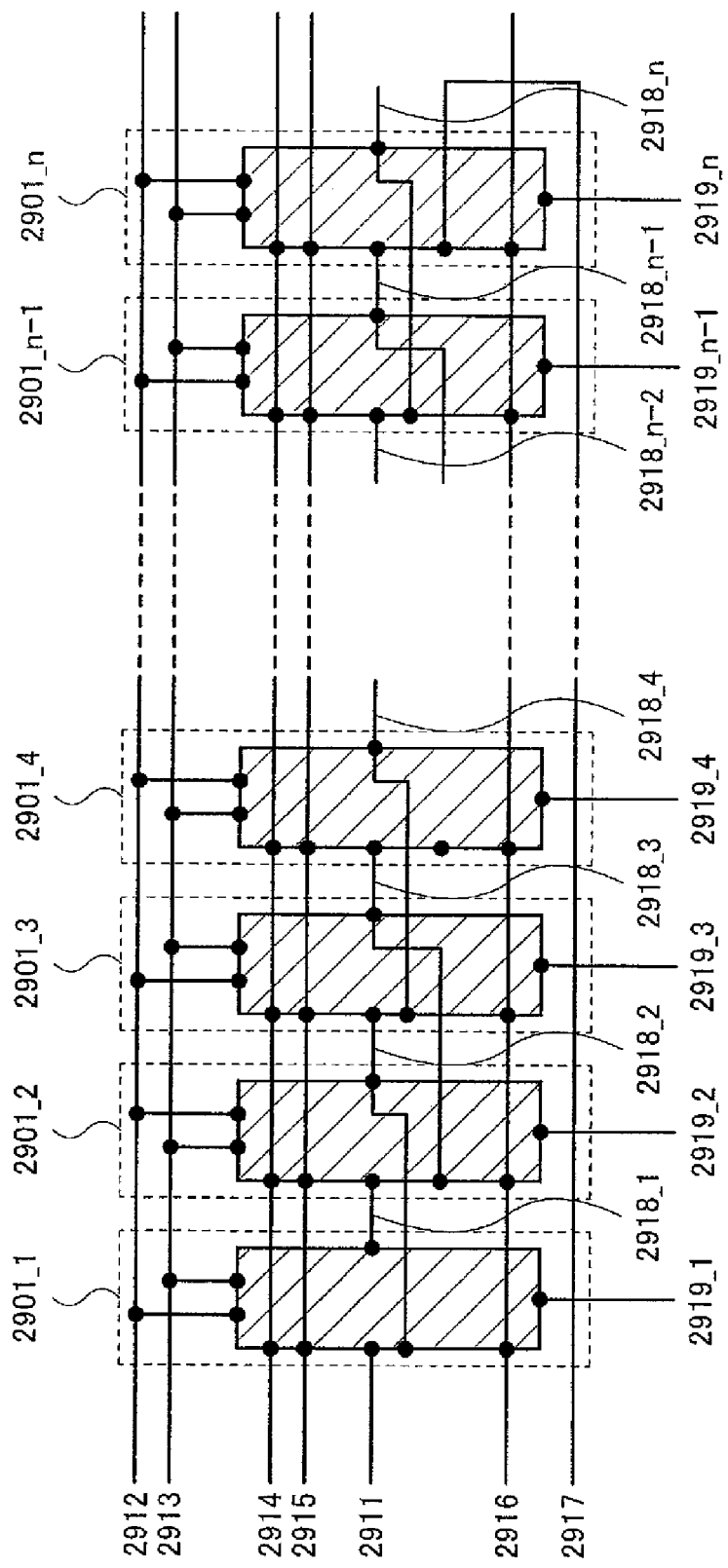
FIG. 29 is a diagram illustrating a structure of a shift register described in Embodiment Mode 3.
Figure 30:
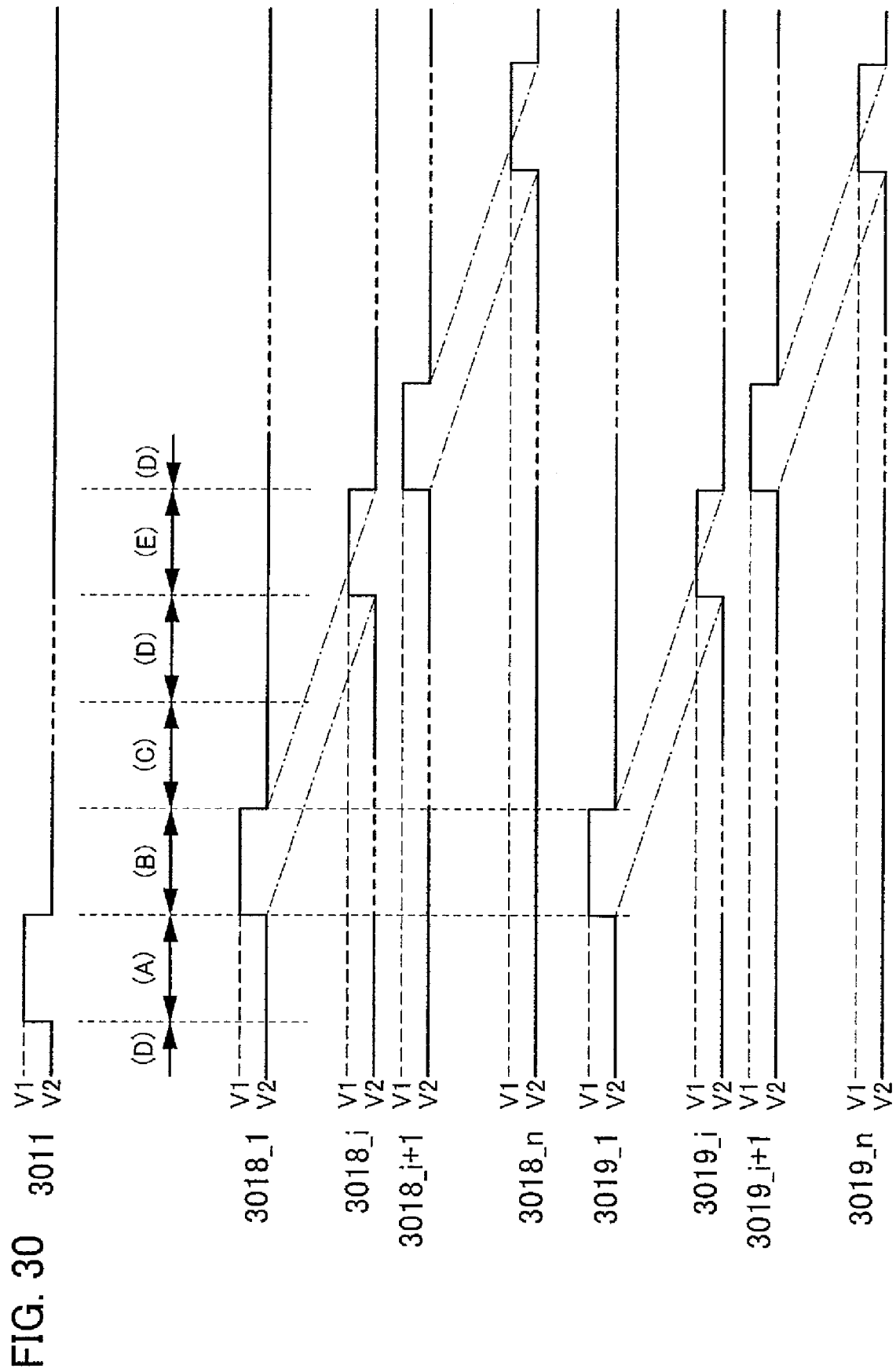
FIG. 30 is a timing chart illustrating an operation of the shift register shown in FIG. 29.

Next, an operation of the shift register in FIG. 29 is described with reference to a timing chart of FIG. 30.

The operation of the shift register in FIG. 29 is different from that of the shift register in FIG. 10 in that the output signal and the transfer signal are output through different wirings. Specifically, the output signals are output through the eighth wirings 2918_1 to 2918_n, and the transfer signals are output through the ninth wirings 2919_1 to 2919_n.

Even when a large load (e.g., resistor or capacitor) is connected to the ninth wirings 2919_1 to 2919_n, the shift register in FIG. 29 can operate without being affected by the load. Further, even when any of the ninth wirings 2919_1 to 2919_n is short-circuited with the power supply line or the signal line, the shift register in FIG. 29 can continue to operate normally. Accordingly, the shift register of FIG. 29 can achieve improvement of drive capability. This is because the transfer signal and the output signal of each flip-flop are separated in the shift register in FIG. 29.

Further, the shift register of FIG. 29 can obtain merits such as reduction in layout area, suppression of a shift in threshold voltage of a transistor, simplification of a process, manufacturing of a semiconductor device like a large-scale display device, and manufacturing of a semiconductor device like a long-life display panel, by employing the flip-flop of this embodiment mode.

Note that the shift register is not limited to the structure of FIG. 29 if a similar operation to FIG. 29 is achieved. For example, by combination with the shift register of FIGS. 13, 14, 15, or 17, a similar merit to FIGS. 13, 14, 15, or 17 can be obtained.

A structure and a driving method of a display device including the aforementioned shift register of this embodiment mode are described. Note that the display device of this embodiment mode includes at least the flip-flop of this embodiment mode.

As the display device of this embodiment mode, the display device of FIGS. 8, 16, 18, 20, or 22 can be used. Thus, the display device of this embodiment mode can obtain advantageous effects similar to the display devices described in Embodiment Modes 1 and 2.

Although this embodiment mode has been described with reference to various drawings, the contents (or part of the contents) described in each drawing can be freely applied to, combined with, or replaced with the contents (or part of the contents) described in another drawing. Further, much more drawings can be formed by combining each part in the above-described drawings with another part.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in the drawings in this embodiment mode with part of another embodiment mode.

Note that this embodiment mode has described just examples of embodying, slightly transforming, modifying, improving, describing in detail, or applying the contents (or part of the contents) described in other embodiment modes, an example of related part thereof, or the like. Therefore, the contents described in other embodiment modes can be freely applied to, combined with, or replaced with the contents described in this embodiment mode.

Embodiment Mode 4

This embodiment mode describes a case where a p-channel transistor is used as each transistor included in a flip-flop of this specification. In addition, it describes structures and driving methods of a driver circuit including the flip-flop and a display device including the driver circuit.

As the flip-flop of this embodiment mode, the case where the polarity of each transistor included in the flip-flop of FIG. 1 is changed to p-channel type is described. Thus, the flip-flop of this embodiment mode can obtain advantageous effects similar to those of the flip-flop in FIG. 1. Note that the polarity of each transistor included in each flip-flop shown in FIGS. 4A to 4D, 5A to 5D, 7A to 7C, 21A to 21C, and 27 may be changed to p-channel type. Note also that the flip-flop of this embodiment mode can be freely combined with the description in Embodiment Modes 1 to 3.

A basic structure of the flip-flop of this embodiment mode is described with reference to FIG. 23. The flip-flop shown in FIG. 23 includes first to seventh transistors 2301 to 2307. The first to seventh transistors 2301 to 2307 correspond to the first to seventh transistors 101 to 107 in FIG. 1, respectively. Note that each of the first to seventh transistors 2301 to 2307 is a p-channel transistor and becomes conductive when the absolute value of a gate-source voltage (|Vgs|) exceeds the absolute value of a threshold voltage (|Vth|) (when Vgs is below Vth).

Figure 23:
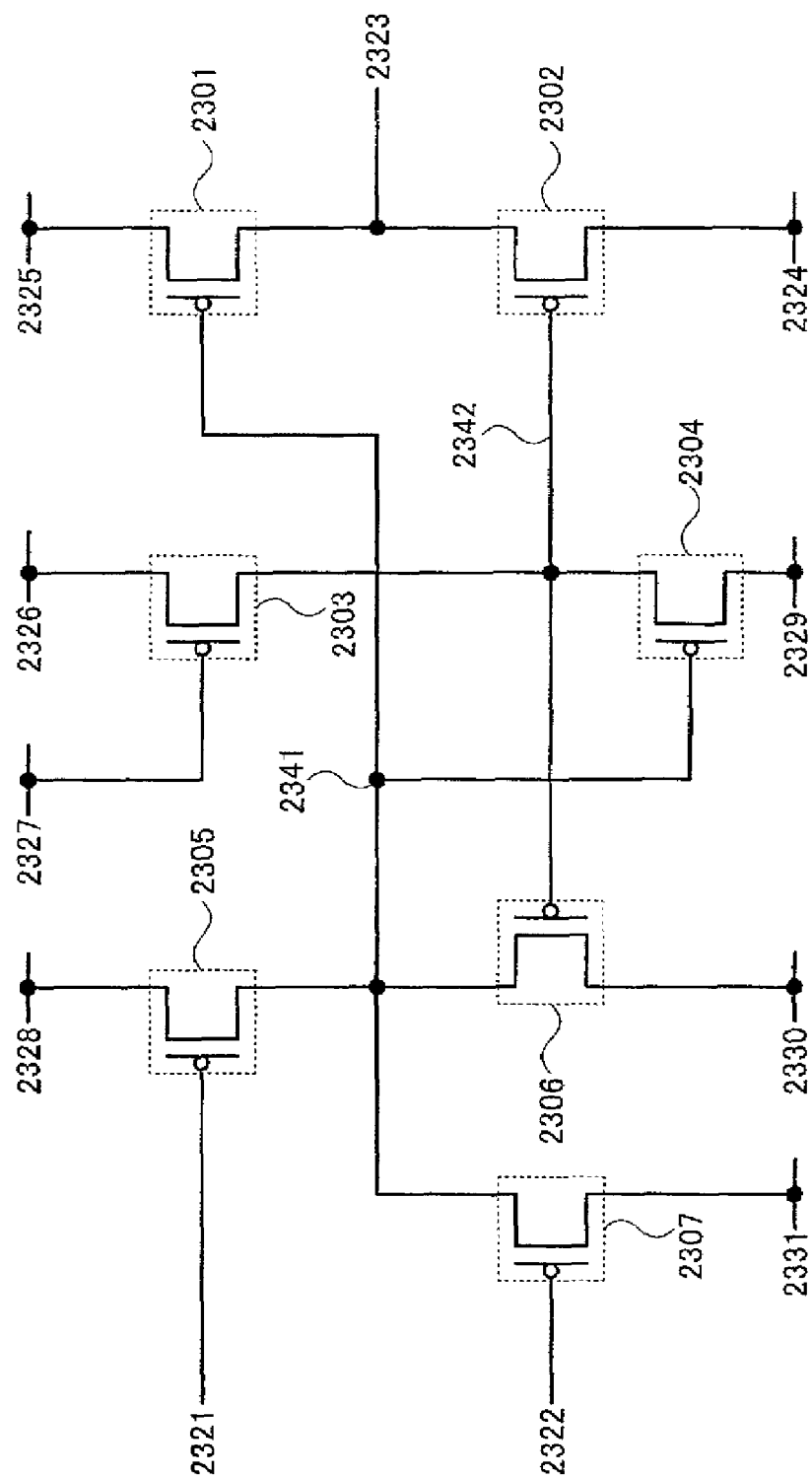
FIG. 23 is a diagram illustrating a structure of a flip-flop described in Embodiment Mode 4.

Note that the connection relationship of the flip-flop in FIG. 23 is similar to that in FIG. 1, so that the description is omitted.

Note that a connection portion of a gate electrode of the first transistor 2301, a gate electrode of the fourth transistor 2304, a second electrode of the fifth transistor 2305, a second electrode of the sixth transistor 2306, and a second electrode of the seventh transistor 2307 is referred to as a node 2341. A connection portion of a gate electrode of the second transistor 2302, a second electrode of the third transistor 2303, a second electrode of the fourth transistor 2304, and a gate electrode of the sixth transistor 2306 is referred to as a node 2342.

A fourth wiring 2324, a ninth wiring 2329, a tenth wiring 2330, and an eleventh wiring 2331 may be connected to each other or may be a single wiring. A seventh wiring 2327 and an eighth wiring 2328 may be connected to each other or may be a single wiring.

The fourth wiring 2324, the seventh wiring 2327, the eighth wiring 2328, the ninth wiring 2329, the tenth wiring 2330, and the eleventh wiring 2331 correspond to the fourth wiring 124, the seventh wiring 127, the eighth wiring 128, the ninth wiring 129, the tenth wiring 130, and the eleventh wiring 131 of FIG. 1, respectively. First to third wirings 2321 to 2323 and fifth and sixth wirings 2325 and 2326 correspond to the first to third wirings 121 to 123 and the fifth and sixth wirings 125 and 126 of FIG. 1, respectively. Note that the H level and the L level of signals input to, potentials supplied to, or a signal output through the first to eleventh wirings 2321 to 2331 are reversed with respect to the signals input to, potentials supplied to, or signal output through the first to eleventh wirings 121 to 131 of FIG. 1.

The seventh wiring 2327 and the eighth wiring 2328 are each supplied with the potential V2, and the fourth wiring 2324, the ninth wiring 2329, the tenth wiring 2330, and the eleventh wiring 2331 are each supplied with the potential V1.

Next, an operation of the flip-flop shown in FIG. 23 is described with reference to a timing chart of FIG. 24.

Figure 24:
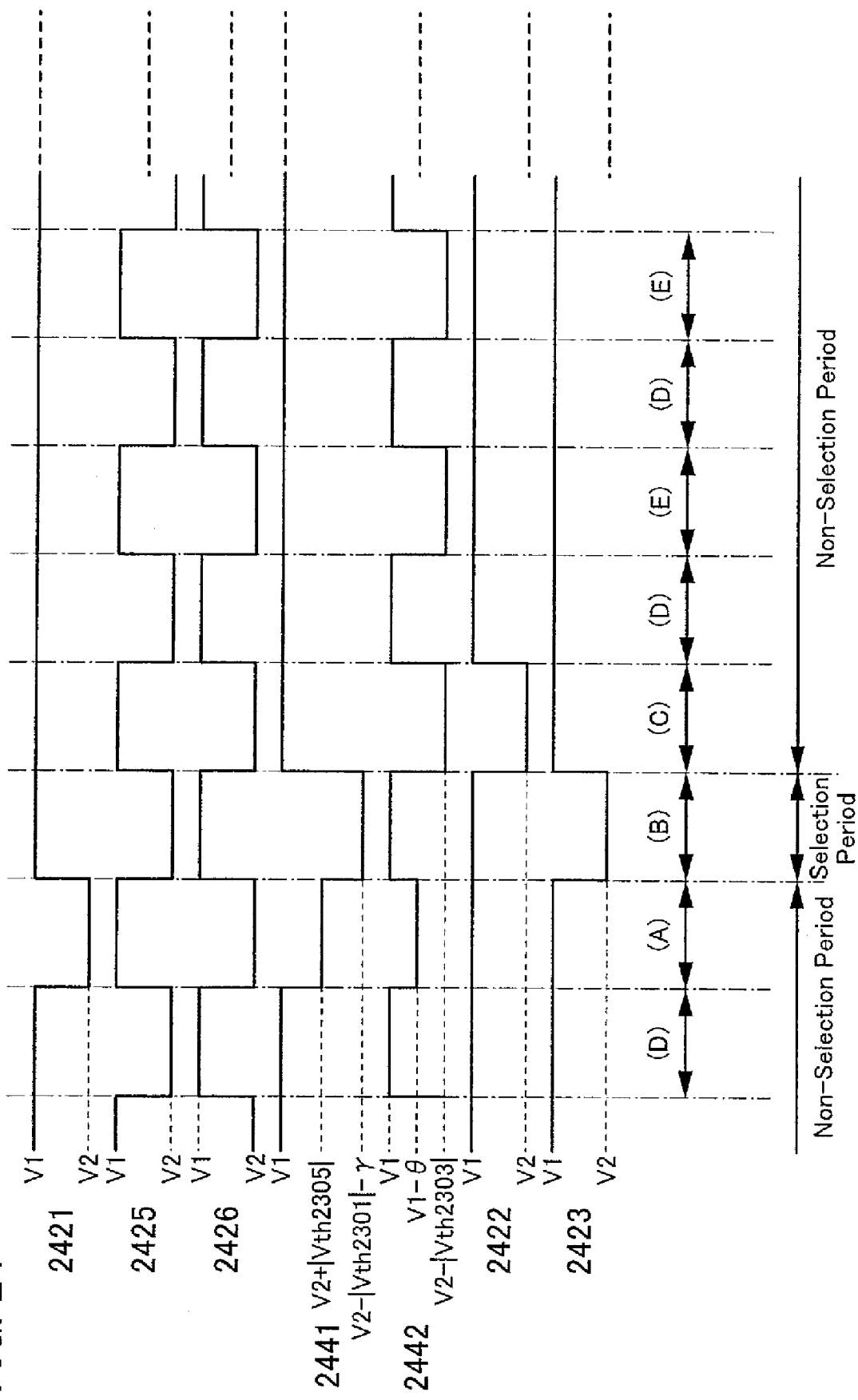
FIG. 24 is a timing chart illustrating an operation of the flip-flop shown in FIG. 23.

Note that the timing chart of FIG. 24 is similar to a timing chart with the H level and the L level reversed with respect to the timing chart of FIG. 2. A signal 2421, a signal 2425, a signal 2425, a potential 2441, a potential 2442, a signal 2422, and a signal 2423 correspond to the signal 221, the signal 225, the signal 226, the potential 241, the potential 242, the signal 222, and the signal 223 of FIG. 2.

Note that not only the timing chart with the H level and the L level reversed with respect to FIG. 2 but also timing charts with the H level and the L level reversed with respect to FIGS. 6, 28, 31, and 32 may be applied to the flip-flop of this embodiment mode.

First, an operation of the flip-flop in a set period denoted by (A) in FIG. 24 is described. The potential 2441 of the node 2341 is V2+|Vth2305| (Vth2305: a threshold voltage of the fifth transistor 2305). The node 2341 is in a floating state with its potential 2441 maintained at V2+|Vth2305|. At this time, the potential 2442 of the node 2342 is V1−θ (θ: a given positive number). Note that since the first transistor 2301 and the second transistor 2302 are turned on, the H signal is output through the third wiring 2323.

An operation of the flip-flop in a selection period denoted by (B) in FIG. 24 is described. The potential 2441 of the node 2341 becomes V2−|Vth2301|−γ (Vth2301: a threshold voltage of the first transistor 2301 and γ: a given positive number). Thus, the first transistor 2301 is turned on, and the L signal is output through the third wiring 2323. At this time, the potential 2442 of the second node 2342 becomes V1.

An operation of the flip-flop in a reset period denoted by (C) in FIG. 24 is described. The seventh transistor 2307 is turned on, so that the potential 2441 of the node 2341 becomes V1. Thus, the first transistor 2301 is turned off. At this time, the second transistor 2302 is turned on, so that the H signal is output through the third wiring 2323.

An operation of the flip-flop in a first non-selection period denoted by (D) in FIG. 24 is described. The potential 2442 of the node 2342 becomes V1, so that the second transistor 2302 and the sixth transistor 2306 are turned off. At this time, the node 2341 is in a floating state, so that the potential 2441 is maintained at V1.

An operation of the flip-flop in a second non-selection period denoted by (E) in FIG. 24 is described. The potential 2442 of the node 2342 becomes V2+|Vth2303|, so that the second transistor 2302 and the sixth transistor 2306 are turned on. Therefore, the node 2341 and the third wiring 2323 are supplied with V1.

Furthermore, the flip-flop of FIG. 23 can suppress shifts in threshold voltage of the second transistor 2302 and the sixth transistor 2306 because the second transistor 2302 and the sixth transistor 2306 are turned on only in the second non-selection period.

Note that the flip-flop of FIG. 23 can also suppress a shift in threshold voltage of the third transistor 2303 by supplying V2 to the gate electrode of the third transistor 2303 and inputting the second clock signal to the first electrode.

In addition, the flip-flop of FIG. 23 can suppress shifts in threshold voltage of the first transistor 2301, the fourth transistor 2304, the fifth transistor 2305, and the seventh transistor 2307 because the first transistor 2301, the fourth transistor 2304, the fifth transistor 2305, and the seventh transistor 2307 are not turned on in the first non-selection period and the second non-selection period.

Further, the flip-flop of FIG. 23 can reset the potential 2441 of the node 2341 and the potential of the third wiring 2323 to V1 by supplying V1 to the node 2341 and the third wiring 2323 in the second non-selection period even if the potential 2441 of the node 2341 and the potential of the third wiring 2323 fluctuate in the first non-selection period. Thus, the flip-flop of FIG. 23 can suppress malfunction of which cause is that the node 2341 and the third wiring 2323 are in a floating state and the potential 2441 of the node 2341 and the potential of the third wiring 2323 fluctuate.

Furthermore, because the flip-flop of FIG. 23 can suppress a shift in threshold voltage of a transistor, the flip-flop of FIG. 23 can suppress malfunction of which cause is a shift in threshold voltage of a transistor.

Moreover, in the flip-flop of FIG. 23, all of the first to seventh transistors 2301 to 2307 are p-channel transistors. Thus, the flip-flop of FIG. 23 can achieve simplification of a manufacturing process, reduction in manufacturing cost, and improvement in yield.

The arrangement, the number, and the like of the transistors are not limited to those in FIG. 23 as long as an operation similar to FIG. 23 is achieved. Thus, the flip-flop of FIG. 23 may be additionally provided with a transistor, another element (such as a resistor or a capacitor), a diode, a switch, various logic circuits, or the like.

Note that the shift register of this embodiment mode can be embodied by free combination of the flip-flop of this embodiment mode with any of the shift registers described in Embodiment Modes 1 to 3. For example, the shift register of this embodiment mode can be embodied by free combination of the flip-flop of this embodiment mode with any of the shift register of FIGS. 10, 13, 14, 15, 17, 29, 33, and 34. Note that the H level and the L level of the shift register of this embodiment mode are reversed with respect to the shift registers described in Embodiment Modes 1 to 3.

Note that a display device of this embodiment mode can be embodied by free combination of the shift register of this embodiment mode with any of the display devices described in Embodiment Modes 1 to 3. For example, the display device of this embodiment mode can be embodied by free combination of the shift register of this embodiment mode with any of the display devices of FIGS. 8, 16, 18, 20, and 22. Note that the H level and the L level of the display device of this embodiment mode are reversed with respect to the display devices described in Embodiment Modes 1 to 3.

Although this embodiment mode has been described with reference to various drawings, the contents (or part of the contents) described in each drawing can be freely applied to, combined with, or replaced with the contents (or part of the contents) described in another drawing. Further, much more drawings can be formed by combining each part in the above-described drawings with another part.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in the drawings in this embodiment mode with part of another embodiment mode.

Note that this embodiment mode has described just examples of embodying, slightly transforming, modifying, improving, describing in detail, or applying the contents (or part of the contents) described in other embodiment modes, an example of related part thereof, or the like. Therefore, the contents described in other embodiment modes can be freely applied to, combined with, or replaced with the contents described in this embodiment mode.

Embodiment Mode 5

This embodiment mode describes a signal line driver circuit included in each display device described in Embodiment Modes 1 to 4.

Figure 37:
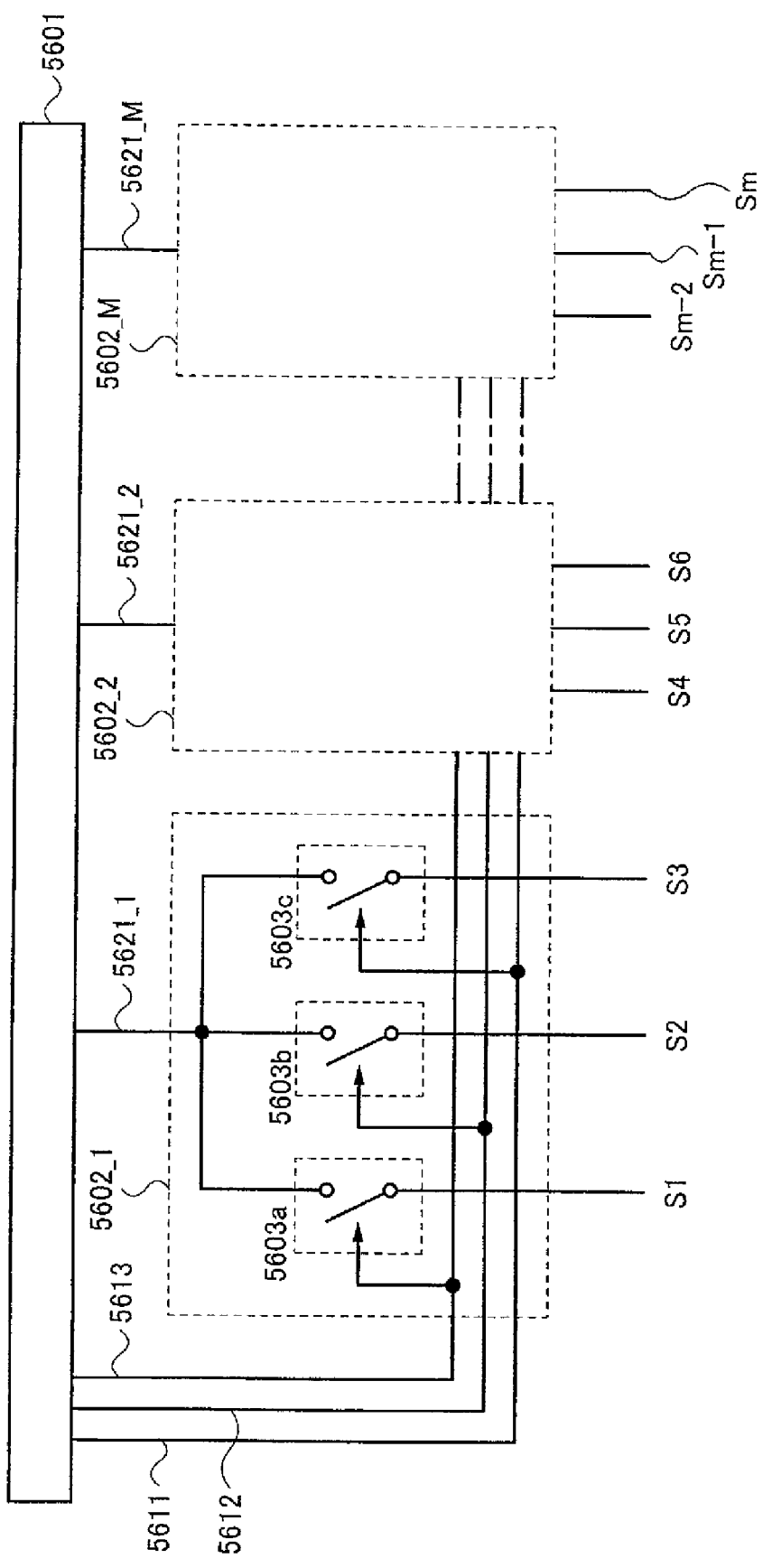
FIG. 37 is a diagram illustrating a structure of a signal line driver circuit described in Embodiment Mode 5.

A signal line driver circuit in FIG. 37 is described. The signal line driver circuit in FIG. 37 includes a driver IC 5601, switch groups 5602_1 to 5602_M, a first wiring 5611, a second wiring 5612, a third wiring 5613, and wirings 5621_1 to 5621_M. Each of the switch groups 5602_1 to 5602_M includes a first switch 5603*a*, a second switch 5603*b*, and a third switch 5603*c*.

The driver IC 5601 is connected to the first wiring 5611, the second wiring 5612, the third wiring 5613, and the wirings 5621_1 to 5621_M. Each of the switch groups 5602_1 to 5602_M is connected to the first wiring 5611, the second wiring 5612, the third wiring 5613, and one of the wirings 5621_1 to 5621_M corresponding to the switch groups 5602_1 to 5602_M respectively. Each of the wirings 5621_1 to 5621_M is connected to three signal lines through the first switch 5603*a*, the second switch 5603*b*, and the third switch 5603*c*. For example, the wiring 5621_J in the J-th column (one of the wirings 5621_1 to 5621_M) is connected to a signal line Sj−1, a signal line Sj, and a signal line Sj+1 through the first switch 5603*a*, the second switch 5603*b*, and the third switch 5603*c* included in the switch group 5602_J.

Note that a signal is input to each of the first wiring 5611, the second wiring 5612, and the third wiring 5613.

The driver IC 5601 is preferably formed using a single crystalline substrate or a glass substrate using a polycrystalline semiconductor. The switch groups 5602_1 to 5602_M are preferably formed over the same substrate as the pixel portion shown in Embodiment Mode 1. Therefore, the driver IC 5601 and the switch groups 5602_1 to 5602_M are preferably connected through an FPC or the like.

Figure 38:
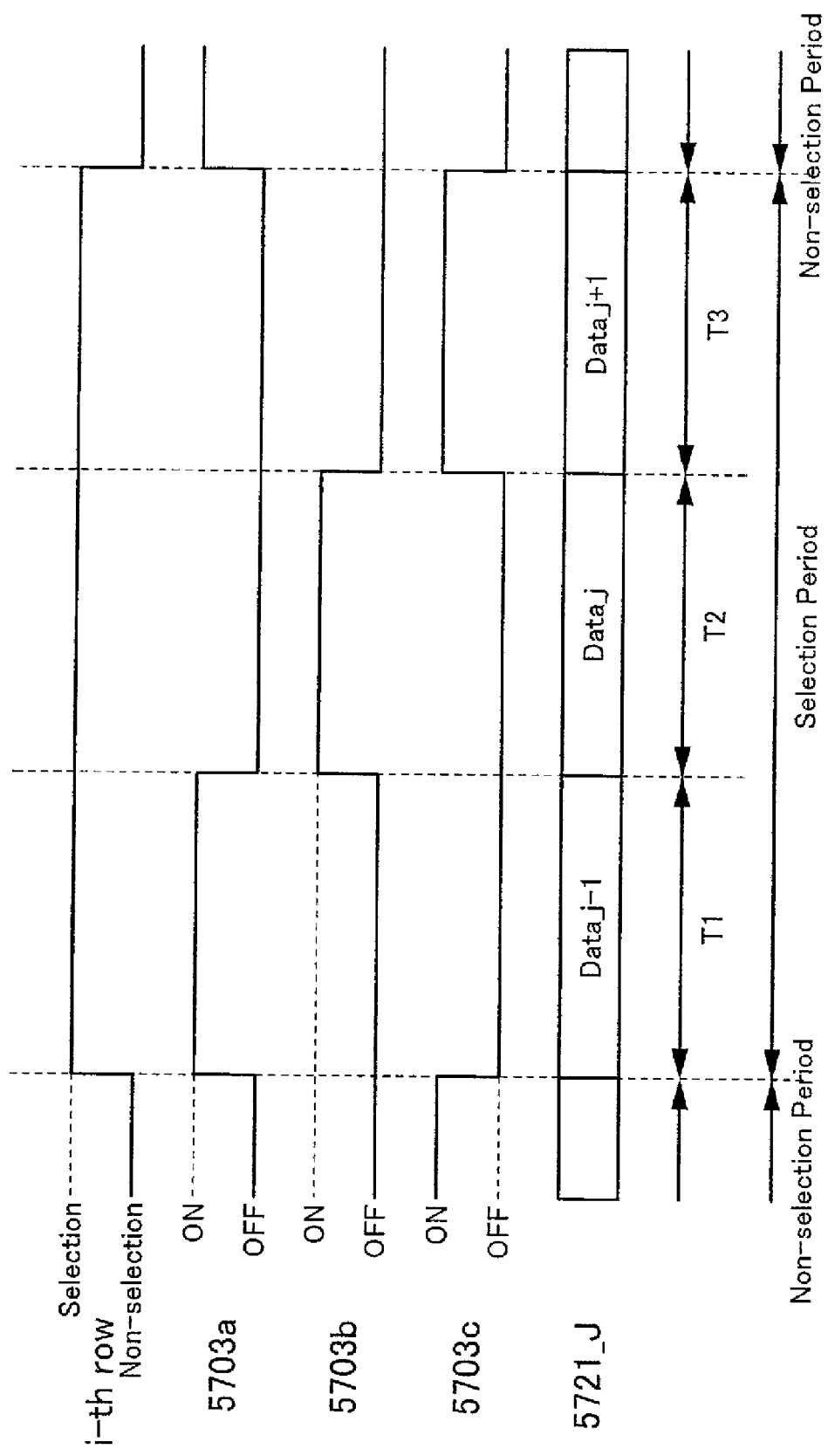
FIG. 38 is a timing chart illustrating an operation of the signal line driver circuit shown in FIG. 37.

Next, an operation of the signal line driver circuit in FIG. 37 is described with reference to a timing chart of FIG. 38. The timing chart of FIG. 38 shows a case where a scan line Gi in the i-th row is selected. A selection period of the scan line Gi in the i-th row is divided into a first sub-selection period T1, a second sub-selection period T2, and a third sub-selection period T3. The signal line driver circuit in FIG. 37 operates similarly to FIG. 38 even when a scan line in another row is selected.

The timing chart of FIG. 38 shows a case where the wiring 5621_J in the J-th column is connected to the signal line Sj−1, the signal line Sj, and the signal line Sj+1 through the first switch 5603*a*, the second switch 5603*b*, and the third switch 5603*c*.

The timing chart of FIG. 38 shows timing at which the scan line Gi in the i-th row is selected, timing 5703*a* at which the first switch 5603*a* is turned on or off, timing 5703*b* at which the second switch 5603*b* is turned on or off, timing 5703*c* at which the third switch 5603*c* is turned on or off, and a signal 5721_J input to the wiring 5621_J in the J-th column.

In the first sub-selection period T1, the second sub-selection period T2, and the third sub-selection period T3, different video signals are input to the wirings 5621_1 to 5621_M. For example, a video signal input to the wiring 5621_J in the first sub-selection period T1 is input to the signal line Sj−1; a video signal input to the wiring 5621_J in the second sub-selection period T2 is input to the signal line Sj, and a video signal input to the wiring 5621_J in the third sub-selection period T3 is input to the signal line Sj+1. The video signals input to the wiring 5621_J in the first sub-selection period T1, the second sub-selection period T2, and the third sub-selection period T3 are denoted by Dataj−1, Dataj, and Dataj+1, respectively.

As shown in FIG. 38, in the first sub-selection period T1, the first switch 5603*a* is turned on, and the second switch 5603*b* and the third switch 5603*c* are turned off. At this time, Dataj−1 input to the wiring 5621_J is input to the signal line Sj−1 through the first switch 5603*a*. In the second sub-selection period T2, the second switch 5603*b* is turned on, and the first switch 5603*a* and the third switch 5603*c* are turned off. At this time, Dataj input to the wiring 5621J is input to the signal line Sj through the second switch 5603*b*. In the third sub-selection period T3, the third switch 5603*c* is turned on, and the first switch 5603*a* and the second switch 5603*b* are turned off. At this time, Dataj+1 input to the wiring 5621_J is input to the signal line Sj+1 through the third switch 5603*c*.

As described above, in the signal line driver circuit of FIG. 37, one gate selection period is divided into three; thus, video signals can be input to three signal lines through one wiring 5621 in one gate selection period. Therefore, in the signal line driver circuit in FIG. 37, the number of connections between the substrate provided with the driver IC 5601 and the substrate provided with the pixel portion can be approximately one third of the number of signal lines. The number of connections is reduced to approximately one third of the number of signal lines; therefore, reliability, yield, and the like of the signal line driver circuit in FIG. 37 can be improved.

By applying the signal line driver circuit of this embodiment mode to each display device described in Embodiment Modes 1 to 4, the number of connections between the substrate provided with the pixel portion and an external substrate can be further reduced. Therefore, reliability and yield of the display device of this embodiment mode can be improved.

Next, a case where n-channel transistors are used as the first switch 5603a, the second switch 5603b, and the third switch 5603c is described with reference to FIG. 39. Note that components similar to those of FIG. 37 are denoted by the same reference numerals, and detailed description of the same portions and portions having similar functions is omitted.

A first transistor 5903a corresponds to the first switch 5603a. A second transistor 5903b corresponds to the second switch 5603b. A third transistor 5903c corresponds to the third switch 5603c.

For example, in the case of the switch group 5602_J, a first electrode of the first transistor 5903a is connected to the wiring 5621_J, a second electrode of the first transistor 5903a is connected to the signal line Sj−1, and a gate electrode of the first transistor 5903a is connected to the first wiring 5611. A first electrode of the second transistor 5903b is connected to the wiring 5621_J, a second electrode of the second transistor 5903b is connected to the signal line Sj, and a gate electrode of the second transistor 5903b is connected to the second wiring 5612. A first electrode of the third transistor 5903c is connected to the wiring 5621_J, a second electrode of the third transistor 5903c is connected to the signal line Sj+1, and a gate electrode of the third transistor 5903c is connected to the third wiring 5613.

The first transistor 5903a, the second transistor 5903b, and the third transistor 5903c each function as a switching transistor. Further, each of the first transistor 5903a, the second transistor 5903b, and the third transistor 5903c is turned on when a signal input to each gate electrode is at the H level, and is turned off when a signal input to each gate electrode is at the L level.

When n-channel transistors are used as the first switch 5603a, the second switch 5603b, and the third switch 5603c, amorphous silicon can be used for a semiconductor layer of each transistor; thus, simplification of a manufacturing process, reduction in manufacturing cost, and improvement in yield can be achieved. Further, a semiconductor device such as a large-scale display panel can be formed. Even when polysilicon or single crystalline silicon is used for the semiconductor layer of the transistor, simplification of a manufacturing process can also be realized.

Figure 39:
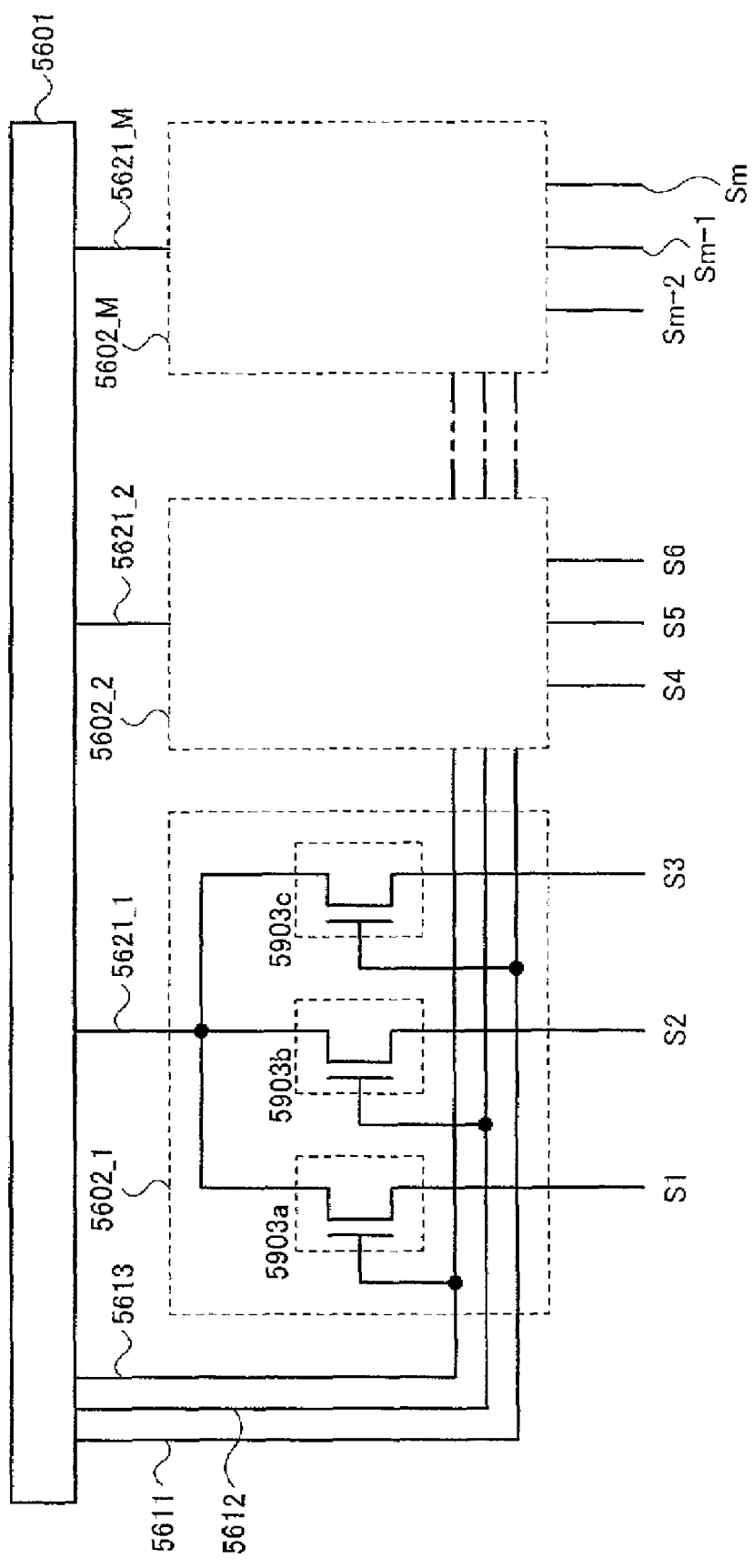
FIG. 39 is a diagram illustrating a structure of a signal line driver circuit described in Embodiment Mode 5.

In the signal line driver circuit of FIG. 39, n-channel transistors are used as the first transistor 5903a, the second transistor 5903b, and the third transistor 5903c; however, p-channel transistors may be used as the first transistor 5903a, the second transistor 5903b, and the third transistor 5903c. In that case, each transistor is turned on when a signal input to the gate electrode is at the L level, and is turned off when a signal input to the gate electrode is at the H level.

Note that the arrangement, the number, a driving method, and the like of switches are not limited as long as one gate selection period is divided into a plurality of sub-selection periods and video signals are input to a plurality of signal lines through one wiring in each of the plurality of sub-selection periods as shown in FIG. 37.

For example, when video signals are input to three or more signal lines through one wiring in each of three or more sub-selection periods, a switch and a wiring for controlling the switch may be additionally provided. Note that when one gate selection period is divided into four or more sub-selection periods, each sub-selection period becomes too short. Therefore, one gate selection period is preferably divided into two or three sub-selection periods.

Figure 40:
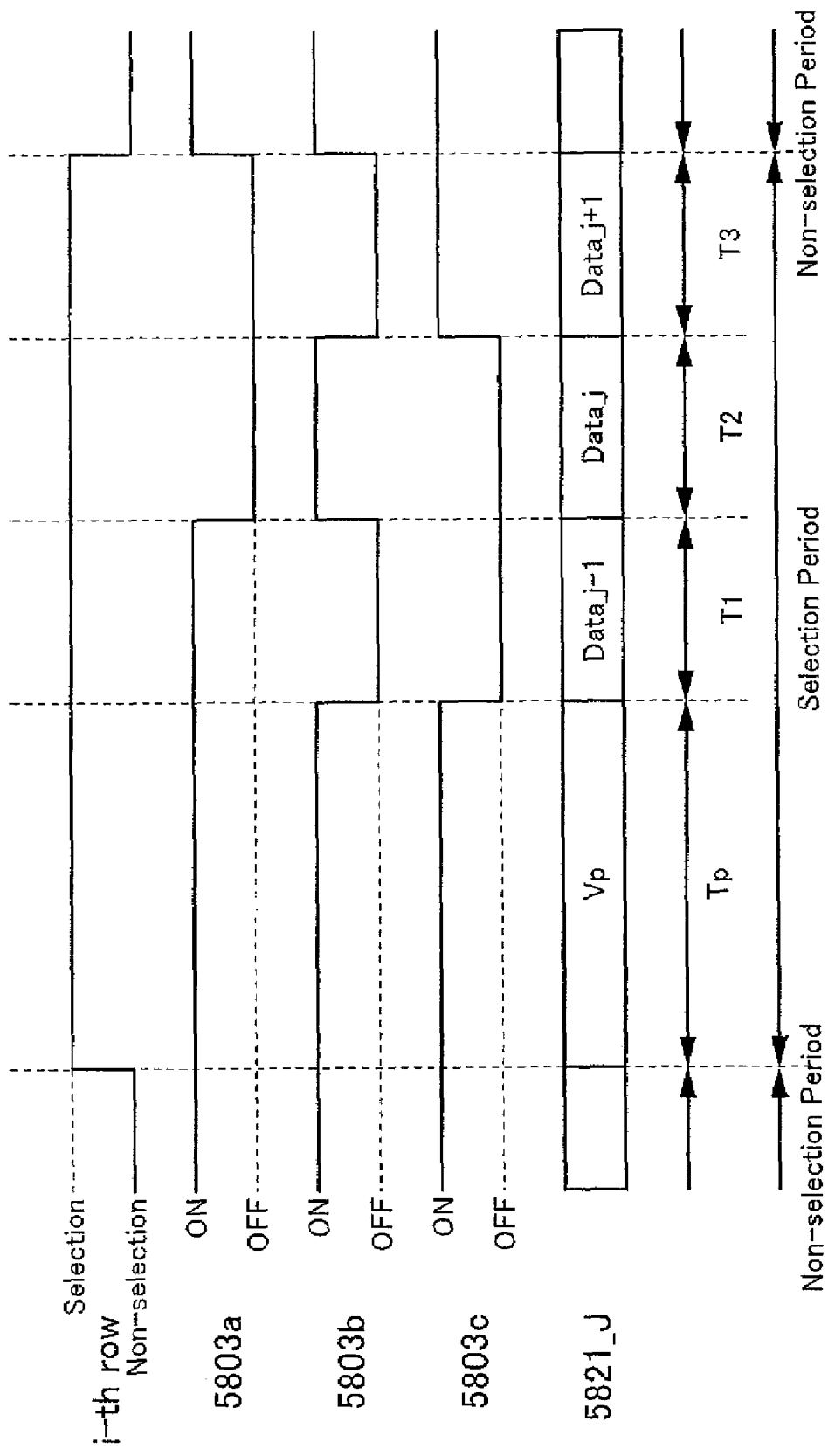
FIG. 40 is a timing chart illustrating an operation of the signal line driver circuit shown in FIG. 39.

As another example, as shown in a timing chart of FIG. 40, one gate selection period may be divided into a precharge period Tp, the first sub-selection period T1, the second sub-selection period T2, and the third sub-selection period T3. The timing chart of FIG. 40 shows timing at which the scan line Gi in the i-th row is selected, timing 5803a at which the first switch 5603a is turned on or off, timing 5803b at which the second switch 5603b is turned on or off, timing 5803c at which the third switch 5603c is turned on or off, and a signal 5821_J input to the wiring 5621_J in the J-th column. As shown in FIG. 40, the first switch 5603a, the second switch 5603b, and the third switch 5603c are tuned on in the precharge period Tp. At this time, a precharge voltage Vp input to the wiring 5621_J is input to each of the signal line Sj−1, the signal line Sj, and the signal line Sj+1 through the first switch 5603a, the second switch 5603b, and the third switch 5603c. In the first sub-selection period T1, the first switch 5603a is turned on, and the second switch 5603b and the third switch 5603c are turned off. At this time, Dataj−1 input to the wiring 5621_J is input to the signal line Sj−1 through the first switch 5603a. In the second sub-selection period T2, the second switch 5603b is turned on, and the first switch 5603a and the third switch 5603c are turned off. At this time, Dataj input to the wiring 5621_J is input to the signal line Sj through the second switch 5603b. In the third sub-selection period T3, the third switch 5603c is turned on, and the first switch 5603a and the second switch 5603b are turned off. At this time, Dataj+1 input to the wiring 5621_J is input to the signal line Sj+1 through the third switch 5603c.

As described above, in the signal line driver circuit of FIG. 37, to which the timing chart of FIG. 40 is applied, a signal line can be precharged by providing a precharge selection period before sub-selection periods. Thus, a video signal can be written to a pixel with high speed. Note that components similar to those in FIG. 38 are denoted by the same reference numerals, and detailed description of the same portions and portions having similar functions is omitted.

Figure 41:
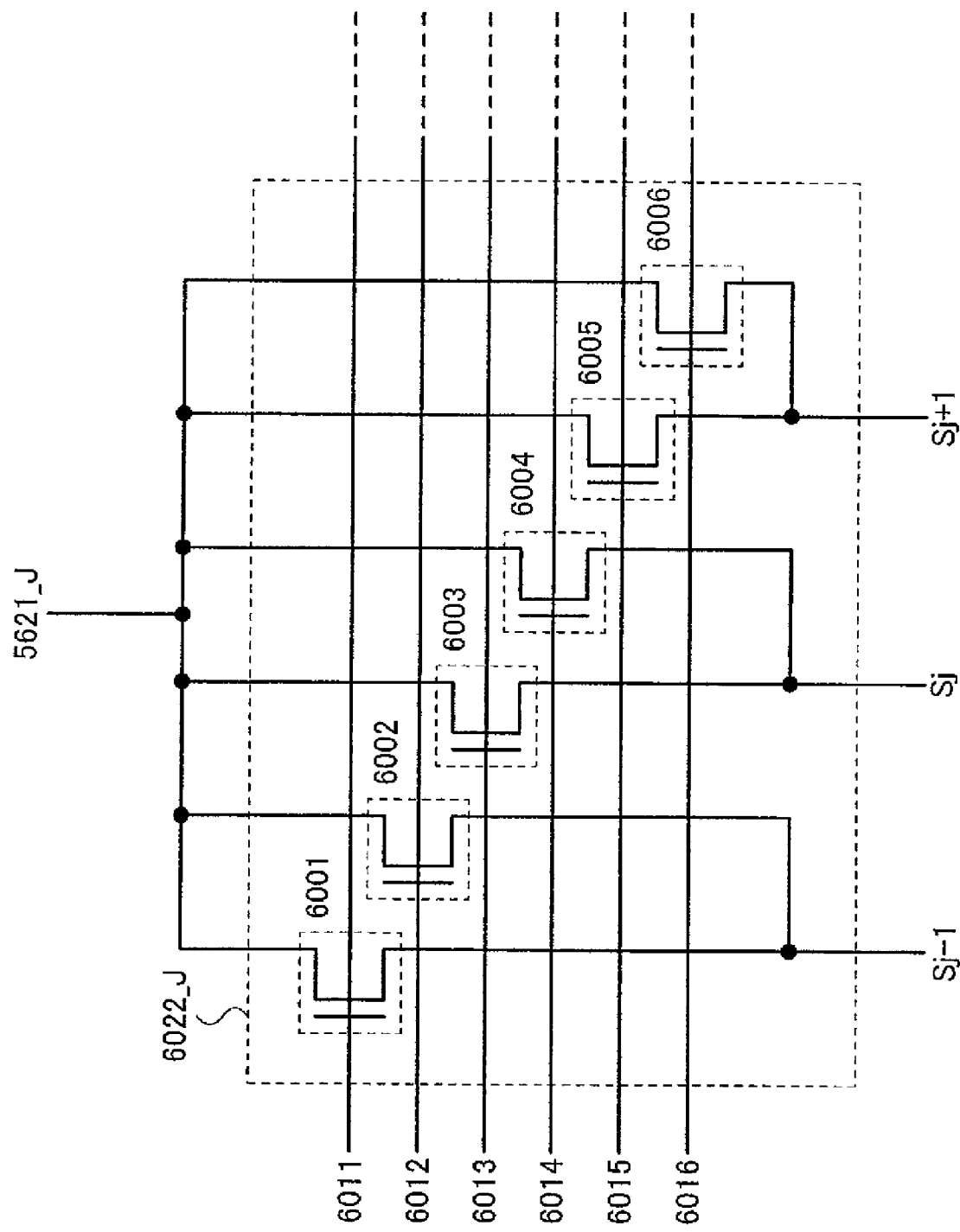
FIG. 41 is a diagram illustrating a structure of a signal line driver circuit described in Embodiment Mode 5.

Also in FIG. 41, one gate selection period can be divided into a plurality of sub-selection periods and video signals can be input to a plurality of signal lines through one wiring in each of the plurality of sub-selection periods as shown in FIG. 37. Note that FIG. 41 shows only a switch group 6022_J in the J-th column in a signal line driver circuit. The switch group 6022_J includes a first transistor 6001, a second transistor 6002, a third transistor 6003, a fourth transistor 6004, a fifth transistor 6005, and a sixth transistor 6006. The first transistor 6001, the second transistor 6002, the third transistor 6003, the fourth transistor 6004, the fifth transistor 6005, and the sixth transistor 6006 are n-channel transistors. The switch group 6022_J is connected to a first wiring 6011, a second wiring 6012, a third wiring 6013, a fourth wiring 6014, a fifth wiring 6015, a sixth wiring 6016, the wiring 5621_J, the signal line Sj−1, the signal line Sj, and the signal line Sj+1.

A first electrode of the first transistor 6001 is connected to the wiring 5621_J, a second electrode of the first transistor 6001 is connected to the signal line Sj−1, and a gate electrode of the first transistor 6001 is connected to the first wiring 6011. A first electrode of the second transistor 6002 is connected to the wiring 5621_J, a second electrode of the second transistor 6002 is connected to the signal line Sj−1, and a gate electrode of the second transistor 6002 is connected to the second wiring 6012. A first electrode of the third transistor 6003 is connected to the wiring 5621_J, a second electrode of the third transistor 6003 is connected to the signal line Sj, and a gate electrode of the third transistor 6003 is connected to the third wiring 6013. A first electrode of the fourth transistor 6004 is connected to the wiring 5621_J, a second electrode of the fourth transistor 6004 is connected to the signal line Sj, and a gate electrode of the fourth transistor 6004 is connected to the fourth wiring 6014. A first electrode of the fifth transistor 6005 is connected to the wiring 5621_J, a second electrode of the fifth transistor 6005 is connected to the signal line Sj+1, and a gate electrode of the fifth transistor 6005 is connected to the fifth wiring 6015. A first electrode of the sixth transistor 6006 is connected to the wiring 5621_J, a second electrode of the sixth transistor 6006 is connected to the signal line Sj+1, and a gate electrode of the sixth transistor 6006 is connected to the sixth wiring 6016.

The first transistor 6001, the second transistor 6002, the third transistor 6003, the fourth transistor 6004, the fifth transistor 6005, and the sixth transistor 6006 each function as a switching transistor. Further, each of first transistor 6001, the second transistor 6002, the third transistor 6003, the fourth transistor 6004, the fifth transistor 6005, and the sixth transistor 6006 is turned on when a signal input to each gate electrode is at the H level, and is turned off when a signal input to each gate electrode is at the L level.

The first wiring 6011 and the second wiring 6012 correspond to the first wiring 5611 in FIG. 39. The third wiring 6013 and the fourth wiring 6014 correspond to the second wiring 5612 in FIG. 39. The fifth wiring 6015 and the sixth wiring 6016 correspond to the third wiring 5613 in FIG. 39. Note that the first transistor 6001 and the second transistor 6002 correspond to the first transistor 5903a in FIG. 39. The third transistor 6003 and the fourth transistor 6004 correspond to the second transistor 5903b in FIG. 39. The fifth transistor 6005 and the sixth transistor 6006 correspond to the third transistor 5903c in FIG. 39.

In FIG. 41, in the first sub-selection period T1 shown in FIG. 38, one of the first transistor 6001 and the second transistor 6002 is turned on. In the second sub-selection period T2, one of the third transistor 6003 and the fourth transistor 6004 is turned on. In the third sub-selection period T3, one of the fifth transistor 6005 and the sixth transistor 6006 is turned on. Further, in the precharge period Tp shown in FIG. 40, either the first transistor 6001, the third transistor 6003, and the fifth transistor 6005 or the second transistor 6002, the fourth transistor 6004, and the sixth transistor 6006 are turned on.

Thus, in FIG. 41, since the on time of each transistor can be shortened, deterioration in characteristics of the transistor can be suppressed. This is because in the first sub-selection period T1 shown in FIG. 38, for example, the video signal can be input to the signal line Sj−1 when one of the first transistor 6001 and the second transistor 6002 is turned on. In the first sub-selection period T1 shown in FIG. 38, for example, when both the first transistor 6001 and the second transistor 6002 are turned on at the same time, the video signal can be input to the signal line Sj−1 with high speed.

FIG. 41 illustrates the case where two transistors are connected in parallel between the wiring 5621 and the signal line. However, the invention is not limited thereto, and three or more transistors may be connected in parallel between the wiring 5621 and the signal line. Accordingly, deterioration in characteristics of each transistor can be further suppressed.

Although this embodiment mode has been described with reference to various drawings, the contents (or part of the contents) described in each drawing can be freely applied to, combined with, or replaced with the contents (or part of the contents) described in another drawing. Further, much more drawings can be formed by combining each part in the above-described drawings with another part.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in the drawings in this embodiment mode with part of another embodiment mode.

Note that this embodiment mode has described just examples of embodying, slightly transforming, modifying, improving, describing in detail, or applying the contents (or part of the contents) described in other embodiment modes, an example of related part thereof, or the like. Therefore, the contents described in other embodiment modes can be freely applied to, combined with, or replaced with the contents described in this embodiment mode.

Embodiment Mode 6

This embodiment mode describes a structure for preventing a defect due to electrostatic discharge damage in each display device described in Embodiment Modes 1 to 4.

Note that electrostatic discharge damage refers to damage caused by a large current flow within a semiconductor device due to instant discharge of positive or negative charges stored in a human body or an object through an input/output terminal of the semiconductor device when in contact with the semiconductor device.

Figure 42A:
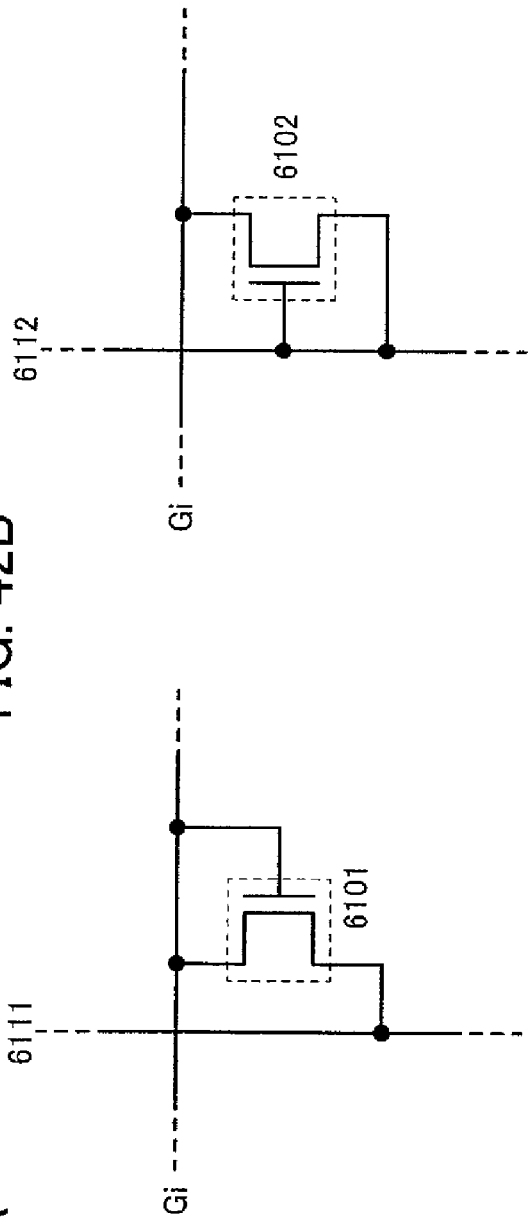

FIG. 42A shows a structure for preventing electrostatic discharge damage caused in a scan line by a protective diode. FIG. 42A shows a structure where the protective diode is provided between a wiring 6111 and the scan line. Although not shown, a plurality of pixels are connected to the scan line Gi in the i-th row. A transistor 6101 is used as the protective diode. The transistor 6101 is an n-channel transistor; however, a p-channel transistor may be used, and the polarity of the transistor 6101 may be the same as that of a transistor included in a scan line driver circuit or a pixel.

A single protective diode is provided here; however, a plurality of protective diodes may be arranged in series, in parallel, or in series-parallel.

A first electrode of the transistor 6101 is connected to the scan line Gi in the i-th row, a second electrode of the transistor 6101 is connected to the wiring 6111, and a gate electrode of the transistor 6101 is connected to the scan line Gi in the i-th row.

An operation of the structure in FIG. 42A is described. A certain potential is input to the wiring 6111, which is lower than the L level of a signal input to the scan line Gi in the i-th row. When positive or negative charges are not discharged to the scan line Gi in the i-th row, a potential of the scan line Gi in the i-th row is at the H level or the L level, so that the transistor 6101 is turned off. On the other hand, when negative charges are discharged to the scan line Gi in the i-th row, the potential of the scan line Gi in the i-th row decreases instantaneously. At this time, if the potential of the scan line Gi in the i-th row becomes lower than a value obtained by subtracting a threshold voltage of the transistor 6101 from a potential of the wiring 6111, the transistor 6101 is turned on, and thus a current flows to the wiring 6111 through the transistor 6101. Therefore, the structure shown in FIG. 42A can prevent a large current from flowing to the pixel, so that electrostatic discharge damage of the pixel can be prevented.

Figure 42B:
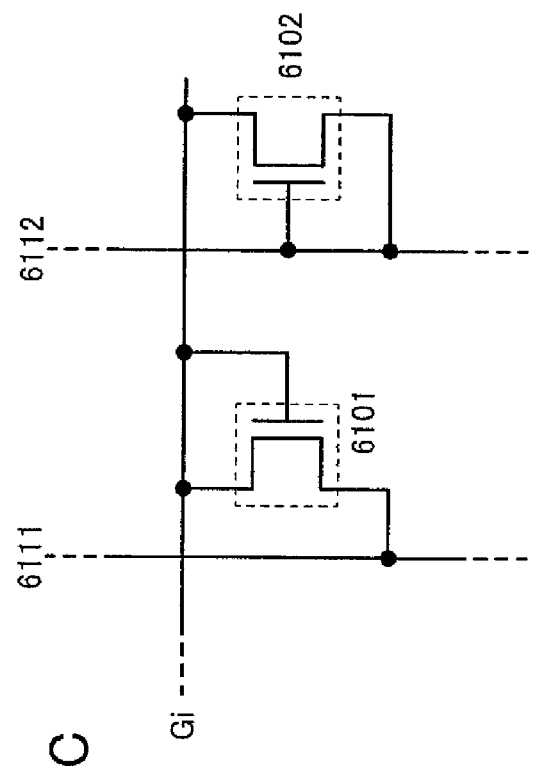

FIG. 42B shows a structure for preventing electrostatic discharge damage when positive charges are discharged to the scan line Gi in the i-th row. A transistor 6102 functioning as a protective diode is provided between a scan line and a wiring 6112. Note that a single protective diode is provided here; however, a plurality of protective diodes may be arranged in series, in parallel, or in series-parallel. The transistor 6102 is an n-channel transistor; however, a p-channel transistor may be used, and the polarity of the transistor 6102 may be the same as that of the transistor included in the scan line driver circuit or the pixel. A first electrode of the transistor 6102 is connected to the scan line Gi in the i-th row, a second electrode of the transistor 6102 is connected to the wiring 6112, and a gate electrode of the transistor 6102 is connected to the wiring 6112. Note that a potential higher than the H level of the signal input to the scan line Gi in the i-th row is input to the wiring 6112. Therefore, when charges are not discharged to the scan line Gi in the i-th row, the transistor 6102 is turned off. On the other hand, when positive charges are discharged to the scan line Gi in the i-th row, the potential of the scan line Gi in the i-th row increases instantaneously. At this time, if the potential of the scan line Gi in the i-th row becomes higher than the sum of a potential of the wiring 6112 and a threshold voltage of the transistor 6102, the transistor 6102 is turned on, and thus a current flows to the wiring 6112 through the transistor 6102. Therefore, the structure shown in FIG. 42B can prevent a large current from flowing to the pixel, so that electrostatic discharge damage of the pixel can be prevented.

As shown in FIG. 42C, with a structure which combines the structures in FIGS. 42A and 42B, electrostatic discharge damage of the pixel can be prevented even when positive or negative charges are discharged to the scan line Gi in the i-th row. Note that components similar to those in FIGS. 42A and 42B are denoted by common reference numerals, and detailed description of the same portions and portions having similar functions is omitted.

Figure 43A:
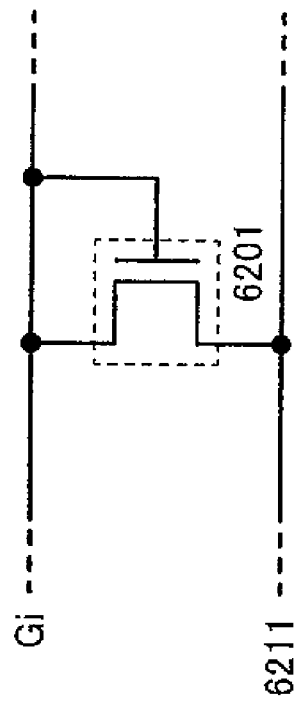

FIG. 43A shows a structure where a transistor 6201 functioning as a protective diode is connected between a scan line and a storage capacitor line. Note that a single protective diode is provided here; however, a plurality of protective diodes may be arranged in series, in parallel, or in series-parallel. The transistor 6201 is an n-channel transistor; however, a p-channel transistor may be used. The polarity of the transistor 6201 may be the same as that of the transistor included in the scan line driver circuit or the pixel. Note that a wiring 6211 functions as a storage capacitor line. A first electrode of the transistor 6201 is connected to the scan line Gi in the i-th row, a second electrode of the transistor 6201 is connected to the wiring 6211, and a gate electrode of the transistor 6201 is connected to the scan line Gi in the i-th row. Note that a potential lower than the L level of the signal input to the scan line Gi in the i-th row is input to the wiring 6211. Therefore, when charges are not discharged to the scan line Gi in the i-th row, the transistor 6210 is turned off. On the other hand, when negative charges are discharged to the scan line Gi in the i-th row, the potential of the scan line Gi in the i-th row decreases instantaneously. At this time, if the potential of the scan line Gi in the i-th row becomes lower than a value obtained by subtracting a threshold voltage of the transistor 6201 from a potential of the wiring 6211, the transistor 6201 is turned on, and thus a current flows to the wiring 6211 through the transistor 6201. Therefore, the structure shown in FIG. 43A can prevent a large current from flowing to the pixel, so that electrostatic discharge damage of the pixel can be prevented. Further, since the storage capacitor line is utilized for discharging charges in the structure shown in FIG. 43A, an additional wiring is not required to be provided.

FIG. 43B shows a structure for preventing electrostatic discharge damage when positive charges are discharged to the scan line Gi in the i-th row. Here, a potential higher than the H level of the signal input to the scan line Gi in the i-th row is input to the wiring 6211. Therefore, when charges are not discharged to the scan line Gi in the i-th row, a transistor 6202 is turned off. On the other hand, when positive charges are discharged to the scan line Gi in the i-th row, the potential of the scan line Gi in the i-th row increases instantaneously. At this time, if the potential of the scan line Gi in the i-th row becomes higher than the sum of a potential of the wiring 6211 and a threshold voltage of the transistor 6202, the transistor 6202 is turned on, and thus a current flows to the wiring 6211 through the transistor 6202. Therefore, the structure shown in FIG. 43B can prevent a large current from flowing to the pixel, so that electrostatic discharge damage of the pixel can be prevented. Further, because the storage capacitor line is utilized for discharging charges in the structure shown in FIG. 43B, an additional wiring is not needed to be provided. Note that components similar to those in FIG. 43A are denoted by common reference numerals, and detailed description of the same portions and portions having similar functions is omitted.

Figure 44C:
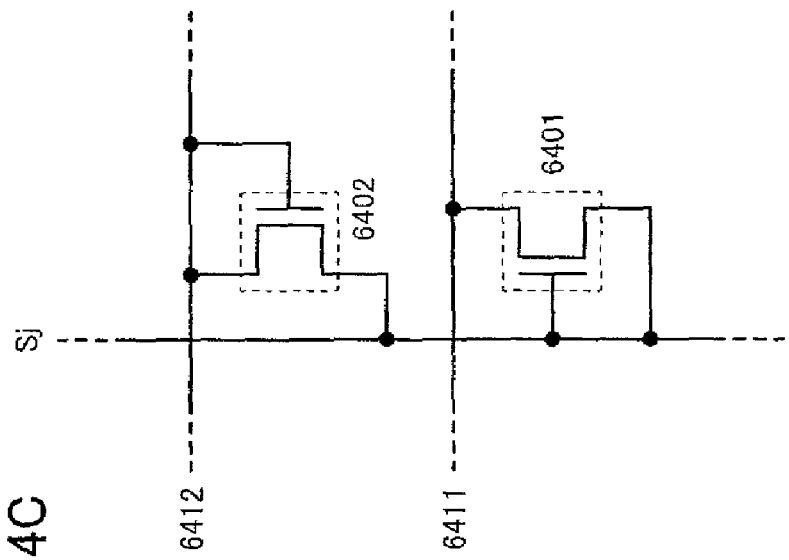
FIGS. 44A to 44C are diagrams illustrating structures of protective diodes described in Embodiment Mode 6.
Figure 44A:
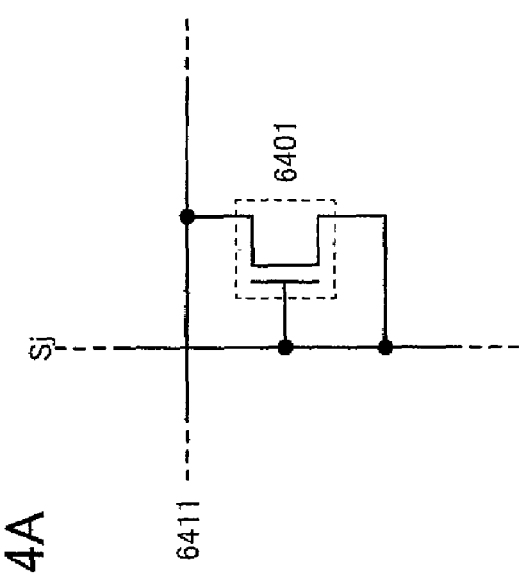

Next, FIG. 44A shows a structure for preventing electrostatic discharge damage caused in a signal line by a protective diode. FIG. 44A shows a structure where the protective diode is provided between a wiring 6411 and the signal line. Although not shown, a plurality of pixels are connected to the signal line Sj in the j-th column. A transistor 6401 is used as the protective diode. The transistor 6401 is an n-channel transistor; however, a p-channel transistor may be used. The polarity of the transistor 6401 may be the same as that of a transistor included in a signal line driver circuit or the pixel.

Note that a single protective diode is provided here; however, a plurality of protective diodes may be arranged in series, in parallel, or in series-parallel.

A first electrode of the transistor 6401 is connected to the signal line Sj in the j-th column, a second electrode of the transistor 6401 is connected to the wiring 6411, and a gate electrode of the transistor 6401 is connected to the signal line Sj in the j-th column.

An operation of the structure in FIG. 44A is described. A certain potential is input to the wiring 6411, which is lower than the least value of a video signal input to the signal line Sj in the j-th column. When positive or negative charges are not discharged to the signal line Sj in the j-th column, a potential of the signal line Sj in the j-th column is the same as that of the video signal, so that the transistor 6401 is turned off. On the other hand, when negative charges are discharged to the signal line Sj in the j-th column, the potential of the signal line Sj in the j-th column decreases instantaneously. At this time, if the potential of the signal line Sj in the j-th column becomes lower than a value obtained by subtracting a threshold voltage of the transistor 6401 from a potential of the wiring 6411, the transistor 6401 is turned on, and thus a current flows to the wiring 6411 through the transistor 6401. Therefore, the structure shown in FIG. 44A can prevent a large current from flowing to the pixel, so that electrostatic discharge damage of the pixel can be prevented.

Figure 44B:
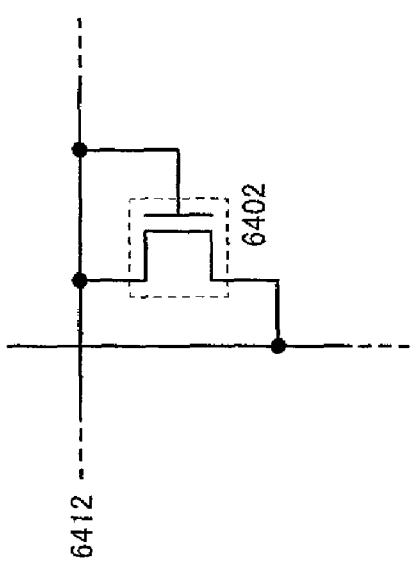

FIG. 44B shows a structure for preventing electrostatic discharge damage when positive charges are discharged to the signal line Sj in the j-th column. A transistor 6402 functioning as a protective diode is provided between the signal line and a wiring 6412. Note that a single protective diode is provided here; however, a plurality of protective diodes may be arranged in series, in parallel, or in series-parallel. The transistor 6402 is an n-channel transistor; however, a p-channel transistor may be used. The polarity of the transistor 6402 may be the same as that of the transistor included in the signal line driver circuit or the pixel. A first electrode of the transistor 6402 is connected to the signal line Sj in the j-th column, a second electrode of the transistor 6402 is connected to the wiring 6412, and a gate electrode of the transistor 6402 is connected to the wiring 6412. Note that a potential higher than the greatest value of a video signal input to the signal line Sj in the j-th column is input to the wiring 6412. Therefore, when charges are not discharged to the signal line Sj in the j-th column, the transistor 6402 is turned off. On the other hand, when positive charges are discharged to the signal line Sj in the j-th column, the potential of the signal line Sj in the j-th column increases instantaneously. At this time, if the potential of the signal line Sj in the j-th column is higher than the sum of a potential of the wiring 6412 and a threshold voltage of the transistor 6402, the transistor 6402 is turned on, and thus a current flows to the wiring 6412 through the transistor 6402. Therefore, the structure shown in FIG. 44B can prevent a large current from flowing to the pixel, so that electrostatic discharge damage of the pixel can be prevented.

As shown in FIG. 44C, with a structure which combines the structures in FIGS. 44A and 44B, electrostatic discharge damage of the pixel can be prevented even when either positive or negative charges are discharged to the signal line Sj in the j-th column. Note that components similar to those in FIGS. 44A and 44B are denoted by common reference numerals, and detailed description of the same portions and portions having similar functions is omitted.

This embodiment mode describes the structures for preventing electrostatic discharge damage of the pixel connected to the scan line and the signal line. However, the structure in this embodiment mode is not only used for preventing electrostatic discharge damage of the pixel connected to the scan line and the signal line. For example, when this embodiment mode is used for the wiring to which a signal or a potential is input, which is connected to the scan line driver circuit and the signal line driver circuit described in Embodiment Modes 1 to 4, electrostatic discharge damage of the scan line driver circuit and the signal line driver circuit can be prevented.

Although this embodiment mode has been described with reference to various drawings, the contents (or part of the contents) described in each drawing can be freely applied to, combined with, or replaced with the contents (or part of the contents) described in another drawing. Further, much more drawings can be formed by combining each part in the above-described drawings with another part.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in the drawings in this embodiment mode with part of another embodiment mode.

Note that this embodiment mode has described just examples of embodying, slightly transforming, modifying, improving, describing in detail, or applying the contents (or part of the contents) described in other embodiment modes, an example of related part thereof, or the like. Therefore, the contents described in other embodiment modes can be freely applied to, combined with, or replaced with the contents described in this embodiment mode.

Embodiment Mode 7

This embodiment mode describes another structure of a display device which can be applied to each display device described in Embodiment Modes 1 to 4.

Figure 45A:
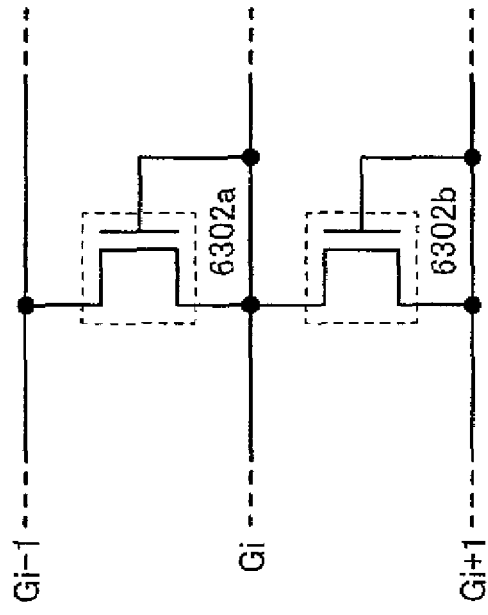
FIGS. 45A to 45C are diagrams illustrating structures of a display device described in Embodiment Mode 7.

FIG. 45A shows a structure where a diode-connected transistor is provided between a scan line and another scan line. FIG. 45A shows a structure where a diode-connected transistor 6301a is provided between the scan line Gi−1 in the (i−1)th row and the scan line Gi in the i-th row, and a diode-connected transistor 6301b is provided between the scan line Gi in the i-th row and the scan line Gi+1 in the (i+1)th row. Note that the transistors 6301a and 6301b are n-channel transistors; however, p-channel transistors may be used. The polarity of the transistors 6301a and 6301b may be the same as that of a transistor included in a scan line driver circuit or a pixel.

Note that FIG. 45A typically shows the scan line Gi−1 in the (i−1)th row, the scan line Gi in the i-th row, and the scan line Gi+1 in the (i+1)th row, but a diode-connected transistor is similarly provided between other scan lines.

A first electrode of the transistor 6301a is connected to the scan line Gi in the i-th row, a second electrode of the transistor 6301a is connected to the scan line Gi−1 in the (i−1)th row, and a gate electrode of the transistor 6301a is connected to the scan line Gi−1 in the (i−1)th row. A first electrode of the transistor 6301b is connected to the scan line Gi+1 in the (i+1)th row, a second electrode of the transistor 6301b is connected to the scan line Gi in the i-th row, and a gate electrode of the transistor 6301b is connected to the scan line Gi in the i-th row.

An operation of the structure in FIG. 45A is described. In each scan line driver circuit described in Embodiment Modes 1 to 4, the scan line Gi−1 in the (i−1)th row, the scan line Gi in the i-th row, and the scan line Gi+1 in the (i+1)th row are maintained at the L level in the non-selection period. Therefore, the transistors 6301a and 6301b are turned off. However, when the potential of the scan line Gi in the i-th row is increased due to noise or the like, a pixel is selected by the scan line Gi in the i-th row and a wrong video signal is written to the pixel. By providing the diode-connected transistor between the scan lines as shown in FIG. 45A, writing of a wrong video signal to the pixel can be prevented. This is because when the potential of the scan line Gi in the i-th row is increased to be equal to or higher than the sum of a potential of the scan line Gi−1 in the (i−1)th row and a threshold voltage of the transistor 6301a, the transistor 6301a is turned on and the potential of the scan line Gi in the i-th row is decreased; thus, a pixel is not selected by the scan line Gi in the i-th row.

The structure of FIG. 45A is particularly advantageous when a scan line driver circuit and a pixel portion are formed over the same substrate, because in the scan line driver circuit including only n-channel transistors or only p-channel transistors, a scan line is sometimes in a floating state and noise is easily generated in the scan line.

Figure 45C:
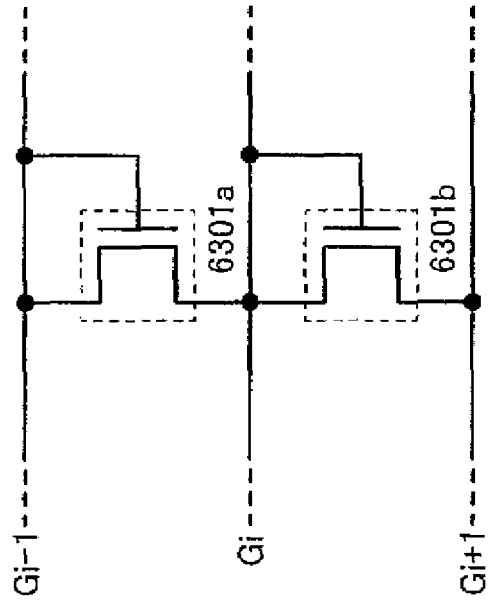
Figure 45B:
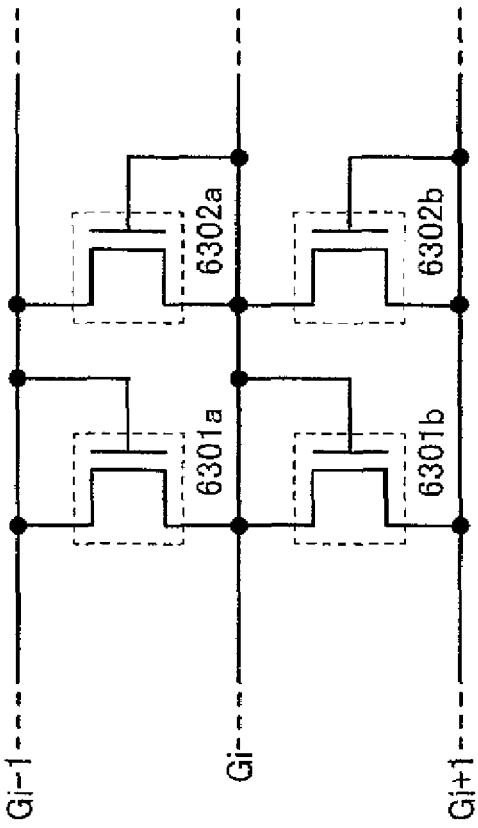

FIG. 45B shows a structure where the direction of the diode-connected transistors provided between the scan lines is reversed with respect to that in FIG. 45A. Note that transistors 6302a and 6302b are n-channel transistors; however, p-channel transistors may be used. The polarity of the transistors 6302a and 6302b may be the same as that of the transistor included in the scan line driver circuit or the pixel. In FIG. 45B, a first electrode of the transistor 6302a is connected to the scan line Gi in the i-th row, a second electrode of the transistor 6302a is connected to the scan line Gi−1 in the (i−1)th row, and a gate electrode of the transistor 6302a is connected to the scan line Gi in the i-th row. A first electrode of the transistor 6302b is connected to the scan line Gi+1 in the (i+1)th row, a second electrode of the transistor 6302b is connected to the scan line Gi in the i-th row, and a gate electrode of the transistor 6302b is connected to the scan line Gi+1 in the (i+1)th row. In FIG. 45B, similarly to FIG. 44A, when the potential of the scan line Gi in the i-th row is increased to be equal to or higher than the sum of the potential of the scan line Gi+1 in the (i+1)th row and a threshold voltage of the transistor 6302b, the transistor 6302b is turned on and the potential of the scan line Gi in the i-th row is decreased. Thus, a pixel is not selected by the scan line Gi in the i-th row, and writing of a wrong video signal to the pixel can be prevented.

As shown in FIG. 45C, with a structure which combines the structures in FIGS. 45A and 45B, even when the potential of the scan line Gi in the i-th row is increased, the transistors 6301a and 6301b are tuned on, so that the potential of the scan line Gi in the i-th row is decreased. Note that in FIG. 45C, since a current flows through two transistors, larger noise can be removed. Note that components similar to those in FIGS. 45A and 45B are denoted by common reference numerals, and detailed description of the same portions and portions having similar functions is omitted.

Note that when a diode-connected transistor is provided between the scan line and the storage capacitor line as shown in FIGS. 43A and 43B, advantageous effects similar to FIGS. 45A, 45B, and 45C can be obtained.

Although this embodiment mode has been described with reference to various drawings, the contents (or part of the contents) described in each drawing can be freely applied to, combined with, or replaced with the contents (or part of the contents) described in another drawing. Further, much more drawings can be formed by combining each part in the above-described drawings with another part.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in the drawings in this embodiment mode with part of another embodiment mode.

Note that this embodiment mode has described just examples of embodying, slightly transforming, modifying, improving, describing in detail, or applying the contents (or part of the contents) described in other embodiment modes, an example of related part thereof, or the like. Therefore, the contents described in other embodiment modes can be freely applied to, combined with, or replaced with the contents described in this embodiment mode.

Embodiment Mode 8

Embodiment Mode 8 will describe a structure of a transistor and a method for manufacturing the transistor.

Figure 46A:
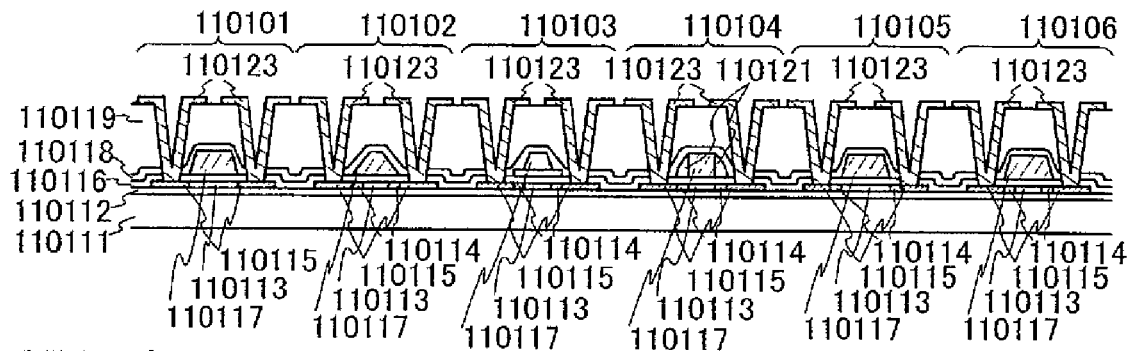
FIGS. 46A to 46G are diagrams illustrating a process for manufacturing a semiconductor device according to the present invention.
Figure 46B:
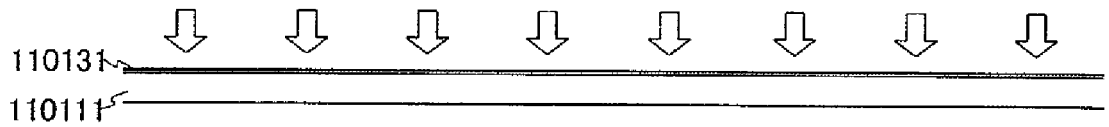
Figure 46C:
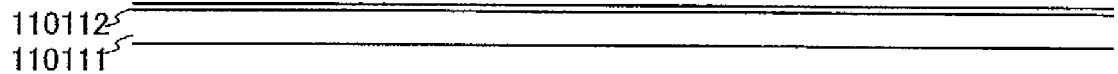
Figure 46D:
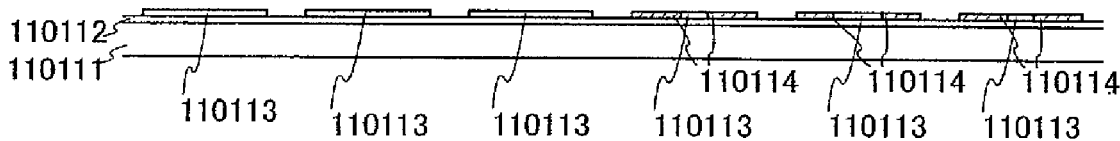
Figure 46E:
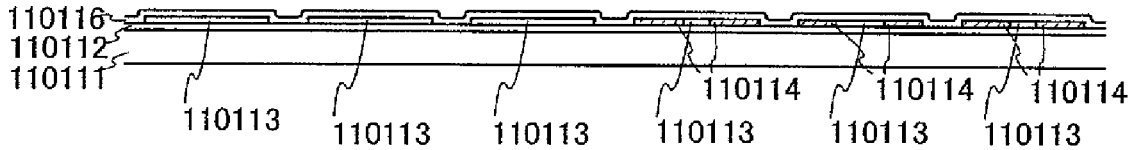
Figure 46F:
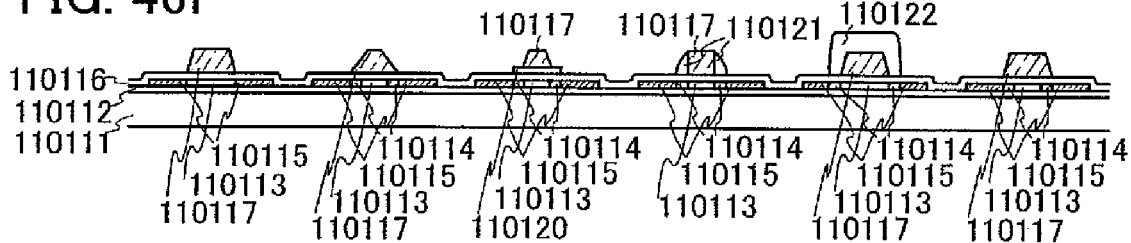
Figure 46G:
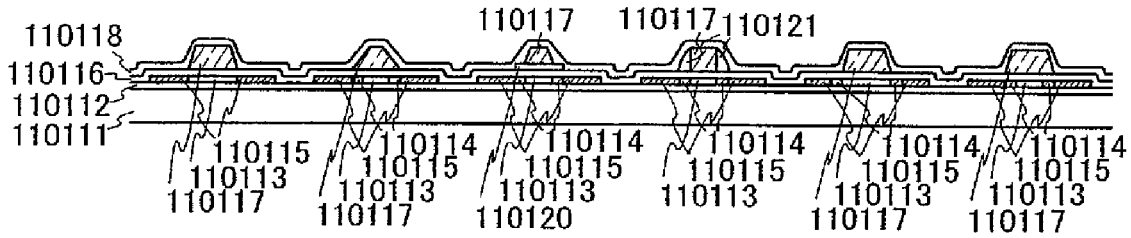

FIGS. 46A to 46G illustrate a structure of a transistor and a method for manufacturing the transistor. FIG. 46A illustrates a structural example of the transistor. FIGS. 46B to 46G exemplify the manufacturing method of the transistor.

The structure and the manufacturing method of a transistor are not limited to those illustrated in FIGS. 46A to 46G, and various structures and manufacturing methods can be employed.

A structural example of a transistor is described with reference to FIG. 46A. FIG. 46A is a cross-sectional view of plural transistors having different structures. In FIG. 46A, the plural transistors having different structures are arranged to be apposed; however, this arrangement is made for describing the structures of the transistors, and it is unnecessary to appose the transistors actually as shown in FIG. 46A, and the transistors can be disposed as necessary.

Then, layers constituting a transistor are each described.

A substrate 110111 can be a glass substrate such as a barium borosilicate glass or an alumino borosilicate glass, a quartz substrate, a ceramic substrate or a metal substrate including stainless steel, for example. Besides these, a substrate formed of a synthetic resin having flexibility such as acrylic or plastic represented by polyethylene terephthalate (PET), polyethylene naphthalate (PEN), and polyethersulfone (PES) can be also used. By using such a flexible substrate, a bendable semiconductor device can be manufactured. A flexible substrate has no significant restrictions on an area and a shape of a substrate to be used, and thus, as the substrate 110111, for example, a rectangular substrate with a side of one meter or more is used, the productivity can be significantly improved. This merit is greatly advantageous as compared to the case of using a circular silicon substrate.

An insulating film 110112 serves as a base film. The insulating film 110112 is provided to prevent alkali metal such as Na or alkaline earth metal from the substrate 110111 from adversely affecting characteristics of a semiconductor element. The insulating film 110112 can have a single-layer structure or a stacked-layer structure of an insulating film(s) containing oxygen or nitrogen, such as silicon oxide ($SiO_x$), silicon nitride ($SiN_x$), silicon oxynitride ($SiO_xN_y$, x>y), or silicon nitride oxide ($SiN_xO_y$, x>y). For example, when the insulating film 110112 is provided to have a two-layer structure, it is preferable that a silicon nitride oxide film be used as a first insulating film and a silicon oxynitride film be used as a second insulating film. When the insulating film 110112 is provided to have a three-layer structure, it is preferable that a silicon oxynitride film be used as a first insulating film, a silicon nitride oxide film be used as a second insulating film, and a silicon oxynitride film be used as a third insulating film.

Semiconductor layers 110113, 110114, and 110115 can be formed using an amorphous semiconductor or a semi-amorphous semiconductor (SAS). Alternatively, a polycrystalline semiconductor layer may be used. SAS is a semiconductor having an intermediate structure between amorphous and crystalline (including single crystal and polycrystalline) structures and having a third state which is stable in free energy. Moreover, SAS includes a crystalline region with a short range order and lattice distortion. A crystalline region of 0.5 nm to 20 nm can be observed in at least part of a SAS film. When silicon is contained as a main component, Raman spectrum shifts to a wave number side lower than 520 $cm^{-3}$. The diffraction peaks of (111) and (220) which are thought to be derived from a silicon crystalline lattice are observed by X-ray diffraction. SAS contains hydrogen or halogen of at least 1 atomic % or more to terminate dangling bonds. SAS is formed by glow discharge decomposition (plasma CVD) of a material gas. When silicon is contained as a main component, as the material gas, $Si_2H_6$, $SiH_2Cl_2$, $SiHCl_3$, $SiCl_4$, $SiF_4$, or the like can be used in addition to $SiH_4$. Further, $GeF_4$ may be mixed. Alternatively, the material gas may be diluted with $H_2$, or $H_2$ and one or more kinds of rare gas elements selected from He, Ar, Kr, and Ne. A dilution ratio may be in the range of 2 to 1000 times, pressure may be in the range of approximately 0.1 to 133 Pa, a power supply frequency may be 1 MHz to 120 MHz, preferably 13 MHz to 60 MHz, and a substrate heating temperature may be 300° C. or lower. A concentration of impurities in atmospheric components such as oxygen, nitrogen, and carbon is preferably $1×10^{20}$ cm$^{-3}$ or less as impurity elements in the film. In particular, an oxygen concentration is $5×10^{19}$/cm$^3$ or less, preferably $1×10^{19}$/cm$^3$ or less. Here, an amorphous semiconductor film is formed using a material containing silicon (Si) as its main component (e.g., $Si_xGe_{1-x}$) by a sputtering method, an LPCVD method, a plasma CVD method, or the like. Then, the amorphous semiconductor film is crystallized by a crystallization method such as a laser crystallization method, a thermal crystallization method using RTA or an annealing furnace, or a thermal crystallization method using a metal element which promotes crystallization.

An insulating film 110116 can have a single-layer structure or a stacked-layer structure of an insulating film(s) containing oxygen or nitrogen, such as silicon oxide ($SiO_x$), silicon nitride ($SiN_x$), silicon oxynitride ($SiO_xN_y$, x>y), or silicon nitride oxide ($SiN_xO_y$, x>y).

A gate electrode 110117 can have a single-layer structure of a conductive film or a stacked-layer structure of two or three conductive films. As a material for the gate electrode 110117, a conductive film can be used. For example, a film of an element such as tantalum (Ta), titanium (Ti), molybdenum (Mo), tungsten (W), chromium (Cr), or silicon (Si); a nitride film containing the element (typically, a tantalum nitride film, a tungsten nitride film, or a titanium nitride film); an alloy film of a combination of the elements (typically, a Mo—W alloy or a Mo—Ta alloy); a silicide film containing the element (typically, a tungsten silicide film or a titanium silicide film); and the like can be used. Note that the aforementioned film, nitride film, alloy film, silicide film, or the like can have a single-layer structure or a stacked-layer structure.

An insulating film 110118 can have a single-layer structure or a stacked-layer structure of an insulating film containing oxygen or nitrogen, such as silicon oxide ($SiO_x$), silicon nitride ($SiN_x$), silicon oxynitride ($SiO_xN_y$, x>y), or silicon nitride oxide $SiN_xO_y$, x>y); or a film containing carbon, such as DLC (Diamond-Like Carbon), by a sputtering method, a plasma CVD method, or the like.

An insulating film 110119 can have a single-layer structure or a stacked-layer structure of a siloxane resin; an insulating film containing oxygen or nitrogen, such as silicon oxide ($SiO_x$), silicon nitride ($SiN_x$), silicon oxynitride ($SiO_xN_y$, x>y), or silicon nitride oxide ($SiN_xO_y$, x>y); a film containing carbon, such as DLC (Diamond-Like Carbon); or an organic material such as epoxy, polyimide, polyamide, polyvinyl phenol, benzocyclobutene, or acrylic. Note that the siloxane resin corresponds to a resin having Si—O—Si bonds. Siloxane includes a skeleton structure of a bond of silicon (Si) and oxygen (O). As a substituent, an organic group containing at least hydrogen (such as an alkyl group or an aryl group) is used. Alternatively, a fluoro group, or a fluoro group and an organic group containing at least hydrogen can be used as a substituent. Note that the insulating film 110119 can be provided to cover the gate electrode 110117 directly without provision of the insulating film 110118.

As a conductive film 110123, a film of an element such as Al, Ni, C, W, Mo, Ti, Pt, Cu, Ta, Au, or Mn, a nitride film containing the element, an alloy film of a combination of the elements, a silicide film containing the element, or the like can be used. For example, as an alloy containing some of such elements, an Al alloy containing C and Ti, an Al alloy containing Ni, an Al alloy containing C and Ni, an Al alloy containing C and Mn, or the like can be used. In the case of a stacked-layer structure, for example, a structure can be such that Al is interposed between Mo, Ti, or the like; thus, resistance of Al to heat or chemical reaction can be improved.

Next, characteristics of each structure is described with reference to the cross-sectional view of the plurality of transistors each having a different structure in FIG. 46A.

Reference numeral 110101 denotes a single drain transistor. Since it can be formed by a simple method, it is advantageous in low manufacturing cost and high yield. Here, the semiconductor layers 110113 and 110115 each have different concentrations of impurities, and the semiconductor layer 110113 is used as a channel region and the semiconductor layer 110115 is used as source region and a drain region. By controlling the amount of impurities in this manner, resistivity of the semiconductor layer can be controlled. An electrical connection state between the semiconductor layer and the conductive film 110123 can be closer to ohmic contact. Note that as a method of separately forming the semiconductor layers each including different amount of impurities, a method where impurities are added to the semiconductor layers using the gate electrode 110117 as a mask can be used.

Reference numeral 110102 denotes a transistor in which the gate electrode 110117 has a taper angle of certain degrees or more (which is equal to or larger than 45° to smaller than 95°, more preferably, equal to or larger than 60° to smaller than 95°, or may be smaller than 45°). Since it can be formed by a simple method, it is advantageous in low manufacturing cost and high yield. Here, the semiconductor layers 110113, 110114, and 110115 each have different concentration of impurities, and the semiconductor layers 110113, 110114, and 110115 are used as a channel region, a lightly doped drain (LDD) region, and a source region and a drain region, respectively. By controlling the amount of impurities in this manner, resistivity of the semiconductor layer can be controlled. An electrical connection state between the semiconductor layer and the conductive film 110123 can be closer to ohmic contact. Since the transistor includes the LDD region, high electric field is hardly applied in the transistor, so that deterioration of the element due to hot carriers can be suppressed. Note that as a method of separately forming the semiconductor layers each having different amount of impurities, a method where impurities are added to the semiconductor layers using the gate electrode 110117 as a mask can be used. In the transistor 110102, since the gate electrode 110117 has a taper angle of certain degrees or more, gradient of the concentration of impurities added to the semiconductor layer through the gate electrode 110117 can be provided, and the LDD region can be easily formed.

Reference numeral 110103 denotes a transistor in which the gate electrode 110117 includes at least two layers and a lower gate electrode is longer than an upper gate electrode. In this specification, the shape of the upper gate electrode and the lower gate electrode is referred to as a hat shape. When the gate electrode 110117 has such a hat shape, an LDD region can be formed without addition of a photomask. Note that a structure where the LDD region overlaps with the gate electrode 110117, like the transistor 110103, is particularly called a GOLD (Gate Overlapped LDD) structure. As a method of forming the gate electrode 110117 with such a hat shape, the following method may be used.

First, when the gate electrode 110117 is patterned, the lower and upper gate electrodes are etched by dry etching so that side surfaces thereof are inclined (tapered). Then, the upper gate electrode is processed by anisotropic etching so that the inclination thereof becomes almost perpendicular. Thus, the gate electrode is formed such that the cross section is hat-shaped. Then, doping of impurity elements is conducted twice, so that the semiconductor layer 110113 used as a channel region, the semiconductor layers 110114 used as LDD regions, and the semiconductor layers 110115 used as a source region and a drain region are formed.

Note that a portion of the LDD region, which overlaps with the gate electrode 110117, is referred to as an Lov region, and a portion of the LDD region, which does not overlap with the gate electrode 110117, is referred to as an Loff region. The Loff region is highly effective in suppressing an off-current value, whereas it is not very effective in preventing deterioration in an on-current value due to hot carriers by relieving an electric field in the vicinity of the drain. On the other hand, the Lov region is highly effective in preventing deterioration in the on-current value by relieving the electric field in the vicinity of the drain, whereas it is not very effective in suppressing the off-current value. Thus, it is preferable to form a transistor having a suitable structure for characteristics required for each of the various circuits. For example, when the semiconductor device is used for a display device, a transistor having an Loff region is preferably used as a pixel transistor in order to suppress the off-current value. On the other hand, as a transistor in a peripheral circuit, a transistor having an Lov region is preferably used in order to prevent deterioration in the on-current value by relieving the electric field in the vicinity of the drain.

Reference numeral 110104 denotes a transistor including a sidewall 110121 in contact with a side surface of the gate electrode 110117. When the transistor includes the sidewall 110121, a region overlapping with the sidewall 110121 can be formed as an LDD region.

Reference numeral 110105 denotes a transistor in which an LDD (Loff) region is formed by doping the semiconductor layer with use of a mask. Thus, the LDD region can surely be formed, and an off-current value of the transistor can be reduced.

Reference numeral 110106 denotes a transistor in which an LDD (Lov) region is formed by doping the semiconductor layer with use of a mask. Thus, the LDD region can surely be formed, and deterioration in an on-current value can be prevented by relieving the electric field in the vicinity of the drain of the transistor.

Next, an example of a manufacturing method of a transistor is described with reference to FIGS. 46B to 46G.

Note that a structure and a manufacturing method of a transistor are not limited to those in FIGS. 46A to 46G, and various structures and manufacturing methods can be used.

In this embodiment mode, a surface of the substrate 110111, the insulating film 110112, the semiconductor layer 110113, the semiconductor layer 110114, the semiconductor layer 110115, the insulating film 110116, the insulating film 110118, or the insulating film 110119 is oxidized or nitrided by plasma treatment, so that the semiconductor layer or the insulating film can be oxidized or nitrided. By oxidizing or nitriding the semiconductor layer or the insulating film by plasma treatment in such a manner, a surface of the semiconductor layer or the insulating film cab be modified, and the insulating film can be formed to be denser than an insulating film formed by a CVD method or a sputtering method; thus, a defect such as a pinhole can be suppressed, and characteristics and the like of the semiconductor device can be improved.

Note that silicon oxide ($SiO_x$) or silicon nitride ($SiN_x$) can be used for the sidewall 110121. As a method of forming the sidewall 110121 on the side surface of the gate electrode 110117, a method in which the gate electrode 110117 is formed, then, a silicon oxide ($SiO_x$) film or a silicon nitride ($SiN_x$) film is formed, and then, the silicon oxide ($SiO_x$) film or the silicon nitride ($SiN_x$) film is etched by anisotropic etching can be used, for example. Thus, the silicon oxide ($SiO_x$) film or the silicon nitride ($SiN_x$) film remains only on the side surface of the gate electrode 110117, so that the sidewall 110121 can be formed on the side surface of the gate electrode 110117.

Figure 50:
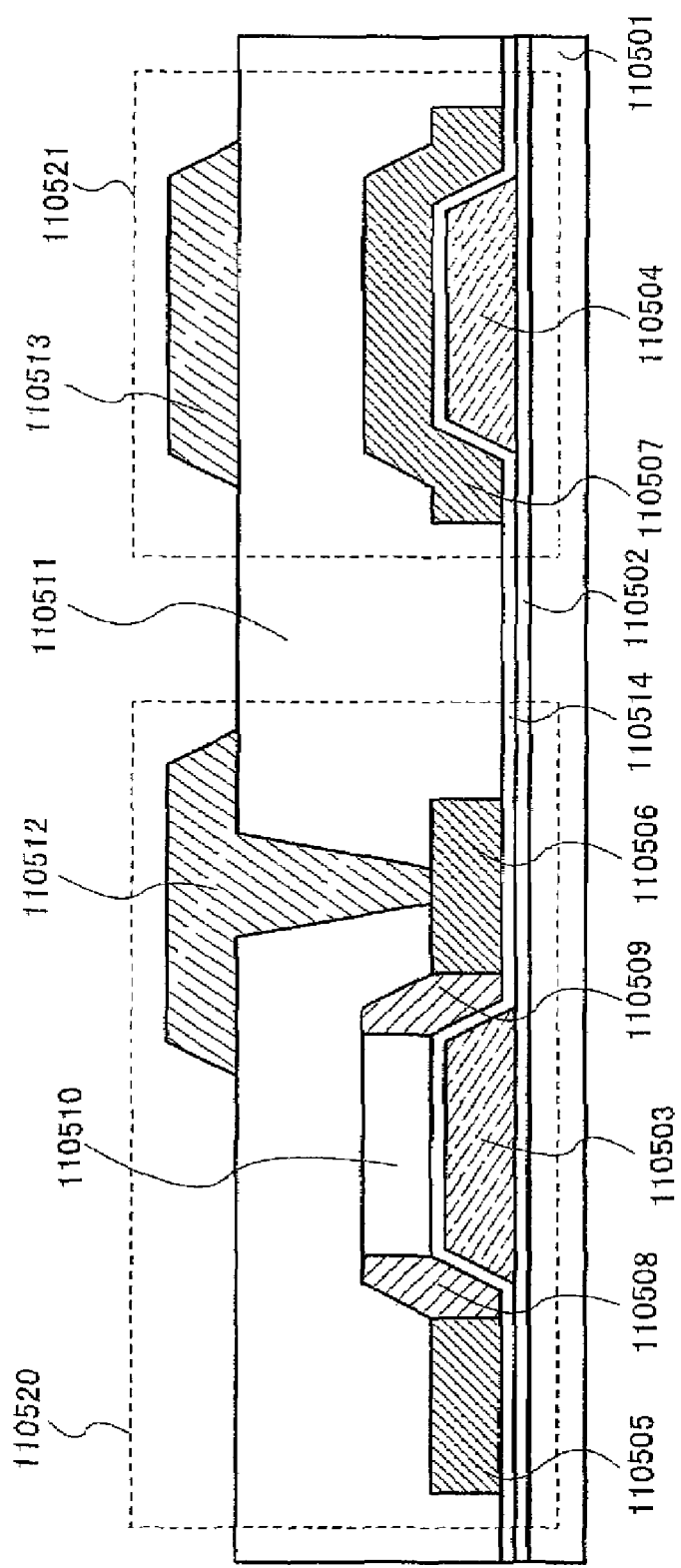
FIG. 50 is a diagram illustrating a structure of a semiconductor device according to the present invention.

FIG. 50 illustrates cross-sectional structures of a bottom gate transistor and a capacitor.

A first insulating film (an insulating film 110502) is formed entirely over a substrate 110501. However, the present invention is not limited to this. The first insulating film (the insulating film 110502) is not necessarily formed in some cases. The first insulating film can prevent impurities from the substrate from adversely affecting a semiconductor layer and changing a property of a transistor. In other words, the first insulating film serves as a base film. Therefore, a highly reliable transistor can be manufactured. As the first insulating film, a single layer or a stacked layer of a silicon oxide film, a silicon nitride film, and/or a silicon oxynitride ($SiO_xN_y$) film can be used.

A first conductive layer (a conductive layer 110503 and a conductive layer 110504) is formed over the first insulating film. The conductive layer 110503 includes a portion which acts as a gate electrode of a transistor 110520. The conductive layer 110504 includes a portion which acts as a first electrode of a capacitor 110521. As the first conductive layer, Ti, Mo, Ta, Cr, W, Al, Nd, Cu, Ag, Au, Pt, Nb, Si, Zn, Fe, Ba, Ge, or an alloy of these elements can be used. Alternatively, a stacked layer including any of these (including an alloy thereof) can be used.

A second insulating film (an insulating film 110514) is formed to cover at least the first conductive layer. The second insulating film serves as a gate insulating film. As the second insulating film, a single layer or a stacked layer of a silicon oxide film, a silicon nitride film, and/or a silicon oxynitride ($SiO_xN_y$) film can be used.

As a portion of the second insulating film which is in contact with the semiconductor layer, a silicon oxide film is preferably used. This is because the trap levels at the interface between the semiconductor layer and the second insulating film can be reduced.

A semiconductor layer is formed in a portion over the second insulating film which overlaps with the first conductive layer by a photolithography method, an inkjet method, a printing method, or the like. A portion of the semiconductor layer extends to a portion in which the second insulating film and the first conductive layer are not overlapped and which is over the second insulating film. The semiconductor layer includes a channel region (a channel region 110510), an LDD region (an LDD region 110508, an LDD region 110509), and an impurity region (an impurity region 110505, an impurity region 110506, an impurity region 110507). The channel region 110510 serves as a channel region of the transistor 110520. The LDD regions 110508 and 110509 serve as LDD regions of the transistor 110520. Note that the LDD regions 110508 and 110509 are not necessarily formed. The impurity region 110505 includes a portion which acts as one of a source electrode and a drain electrode of the transistor 110520. The impurity region 110506 includes a portion which acts as the other one of a source electrode and a drain electrode of the transistor 110520. The impurity region 110507 includes a portion which acts as a second electrode of the capacitor 110521.

A third insulating film (an insulating film 110511) is formed entirely. A contact hole is selectively formed in part of the third insulating film. The insulating film 110511 has a function of an interlayer insulating film. As the third insulating film, an inorganic material (e.g., silicon oxide ($SiO_x$), silicon nitride, or silicon oxynitride), an organic compound material having a low dielectric constant (e.g., a photosensitive or nonphotosensitive organic resin material), or the like can be used. Alternatively, a material including siloxane may be used. Siloxane is a material in which a skeleton structure is formed by a bond of silicon (Si) and oxygen (O). As a substituent, an organic group including at least hydrogen (e.g., an alkyl group or an aryl group) is used. As the substituent, a fluoro group may also be used. Alternatively, the organic group including at least hydrogen and the fluoro group may be used as the substituent.

A second conductive layer (a conductive layer 110512 and a conductive layer 110513) is formed over the third insulating film. The conductive layer 110512 is connected to the other of the source electrode and the drain electrode of the transistor 110520 through the contact hole formed in the third insulating film. Therefore, the conductive layer 110512 includes a portion which acts as the other one of the source electrode and the drain electrode of the transistor 110520. When the conductive layer 110513 is electrically connected to the conductive layer 110504, the conductive layer 110513 includes a portion which acts as a first electrode of the capacitor 110521. Alternatively, when the conductive layer 110513 is electrically connected to the impurity region 110507, the conductive layer 110513 includes a portion which acts as a second electrode of the capacitor 110521. Alternatively, when the conductive layer 110513 is not connected to the conductive layer 110504 and the impurity region 110507, another capacitor is formed other than the capacitor 110521. In this capacitor, the conductive layer 110513, the impurity region 110507, and the insulating layer 110511 are used as a first electrode, a second electrode, and an insulating layer, respectively. Note that as the second conductive layer, Ti, Mo, Ta, Cr, W, Al, Nd, Cu, Ag, Au, Pt, Nb, Si, Zn, Fe, Ba, Ge or an alloy of these elements can be used. Further, a stacked layer including any of these (including an alloy thereof) can be used.

In steps after forming the second conductive layer, various insulating films or various conductive films may be formed.

Next, structure of a transistor using amorphous silicon (a-Si:H) or microcrystal silicon as a semiconductor layer of the transistor and a capacitor are described.

Figure 47:
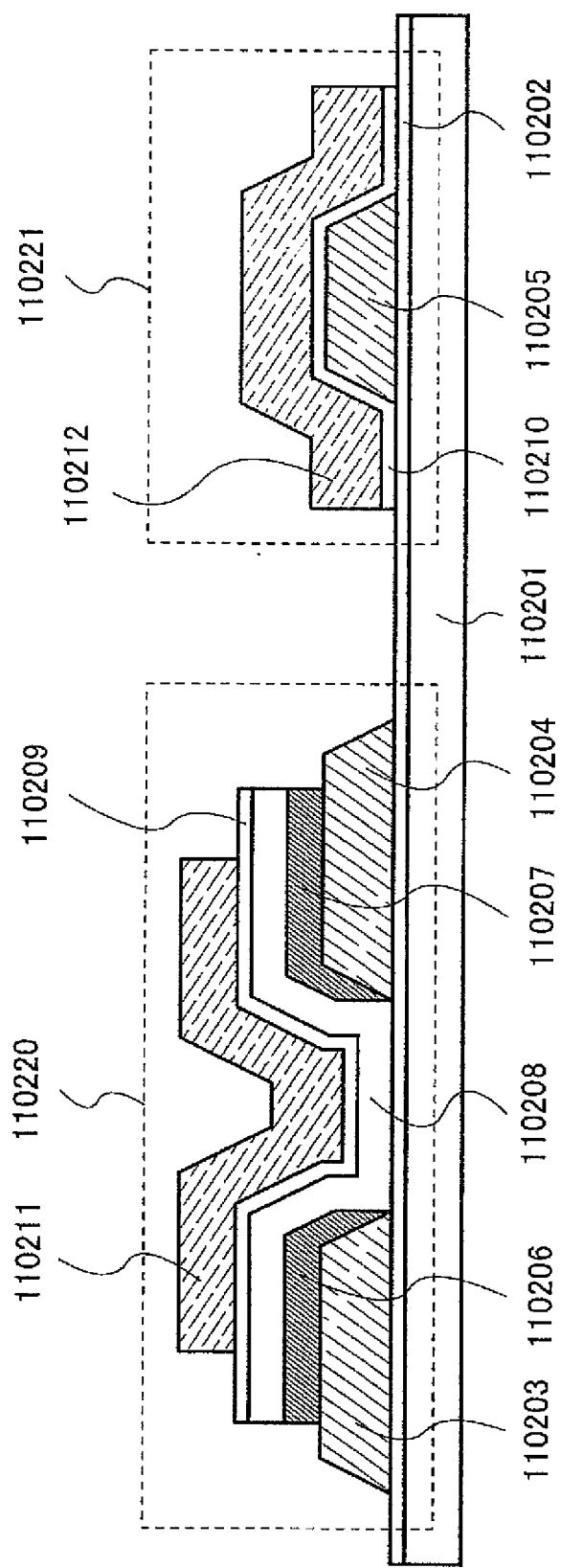
FIG. 47 is a diagram illustrating a structure of a semiconductor device according to the present invention.

FIG. 47 illustrates cross-sectional structures of a top gate transistor and a capacitor.

A first insulating film (an insulating film 110202) is formed entirely over a substrate 110201. The first insulating film can prevent impurities from the substrate from adversely affecting a semiconductor layer and changing a property of a transistor. In other words, the first insulating film serves as a base film. Therefore, a highly reliable transistor can be manufactured. As the first insulating film, a single layer or a stacked layer of a silicon oxide film, a silicon nitride film, and/or a silicon oxynitride ($SiO_xN_y$) film can be used.

The first insulating film is not necessarily formed. If the first insulating film is not formed, the number of steps can be reduced, and the manufacturing cost can be reduced. Since the structure can be simplified, the yield can be increased.

A first conductive layer (a conductive layer 110203, a conductive layer 110204, and a conductive layer 110205) is formed over the first insulating film. The conductive layer 110203 includes a portion which acts as one of a source electrode and a drain electrode of a transistor 110220. The conductive layer 110204 includes a portion which acts as the other one of a source electrode and a drain electrode of the transistor 110220. The conductive layer 110205 includes a portion which acts as a first electrode of a capacitor 110221. As the first conductive layer, Ti, Mo, Ta, Cr, W, Al, Nd, Cu, Ag, Au, Pt, Nb, Si, Zn, Fe, Ba, Ge or an alloy of these elements can be used. Further, a stacked layer including any of these (including an alloy thereof) can be used.

Over the conductive layer 110203 and the conductive layer 110204, a first semiconductor layer (a semiconductor layer 110206 and a semiconductor layer 110207) is formed. The semiconductor layer 110206 includes a portion which acts as one of a source region and a drain region. The semiconductor layer 110207 includes a portion which acts as the other one of the source region and the drain region. As the first semiconductor layer, silicon including phosphorus or the like can be used.

A second semiconductor layer (a semiconductor layer 110208) is formed in a portion which is between the conductive layer 110203 and the conductive layer 110204 and over the first insulating film. A part of the semiconductor layer 110208 extends to a portion over the conductive layer 110203 and the conductive layer 110204. The semiconductor layer 110208 includes a portion which acts as a channel region of the transistor 110220. As the second semiconductor layer, a semiconductor layer having non-crystallinity such as amorphous silicon (a-Si:H), or a semiconductor layer such as microcrystal semiconductor (μ-Si:H) can be used.

A second insulating film (an insulating film 110209 and an insulating film 110210) is formed to cover at least the semiconductor layer 110208 and the conductive layer 110205. The second insulating film serves as a gate insulating film. As the second insulating film, a single layer or a stacked layer of a silicon oxide film, a silicon nitride film, and/or a silicon oxynitride ($SiO_xN_y$) film can be used.

As the second insulating film which is in contact with the second semiconductor layer, a silicon oxide film is preferably used. This is because the trap levels at the interface between the second semiconductor layer and the second insulating film can be reduced.

A second conductive layer (a conductive layer 110211 and a conductive layer 110212) is formed over the second insulating film. The conductive layer 110211 includes a portion which acts as a gate electrode of the transistor 110220. The conductive layer 110212 serves as a second electrode or a wiring of the capacitor 110221. As the second conductive layer, Ti, Mo, Ta, Cr, W, Al, Nd, Cu, Ag, Au, Pt, Nb, Si, Zn, Fe, Ba, Ge, or an alloy of these elements can be used. Further, a stacked layer including any of these (including an alloy thereof) can be used.

In steps after forming the second conductive layer, various insulating films or various conductive films may be formed.

Figure 48:
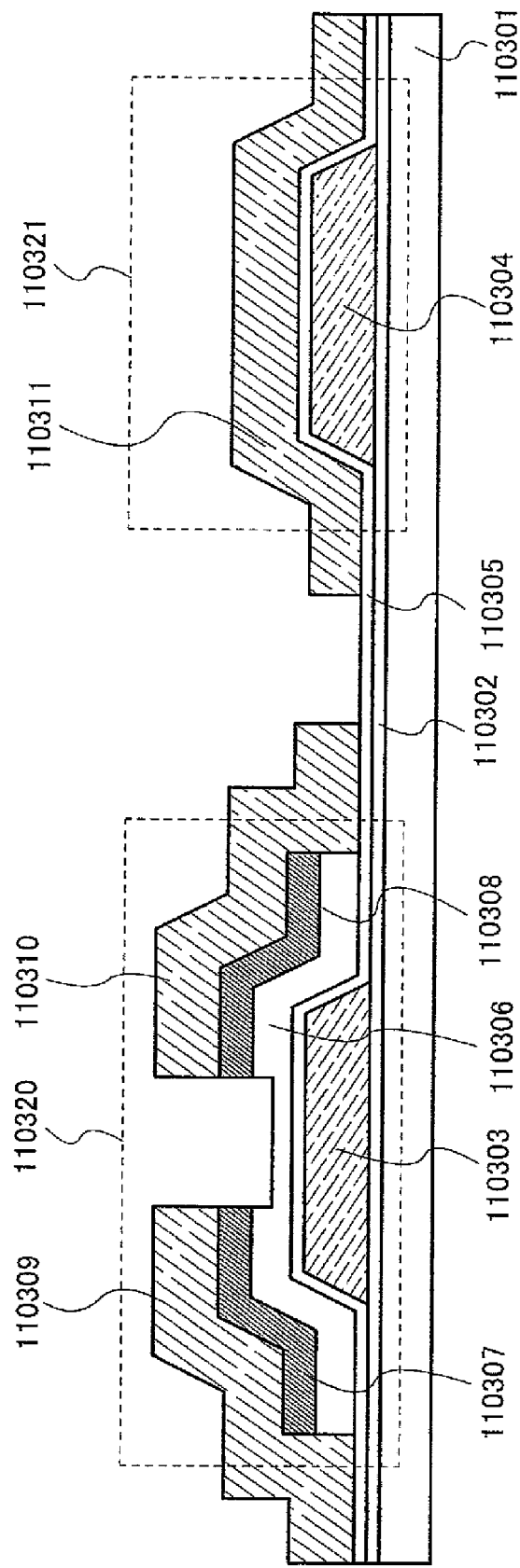
FIG. 48 is a diagram illustrating a structure of a semiconductor device according to the present invention.

FIG. 48 illustrates cross-sectional structures of an inverted staggered (bottom gate) transistor and a capacitor. In particular, the transistor illustrated in FIG. 48 is a channel etch type transistor.

A first insulating film (an insulating film 110302) is formed entirely over a substrate 110301. The first insulating film can prevent impurities from the substrate from adversely affecting a semiconductor layer and changing a property of the transistor. In other words, the first insulating film serves as a base film. Therefore, a highly reliable transistor can be manufactured. As the first insulating film, a single layer or a stacked layer of a silicon oxide film, a silicon nitride film, and/or a silicon oxynitride film ($SiO_xN_y$) can be used.

The first insulating film is not necessarily formed. If the first insulating film is not formed, the number of steps can be reduced, and the manufacturing cost can be reduced. Since the structure can be simplified, the yield can be increased.

A first conductive layer (a conductive layer 110303 and a conductive layer 110304) is formed over the first insulating film. The conductive layer 110303 includes a portion which acts as a gate electrode of a transistor 110320. The conductive layer 110304 includes a portion which acts as a first electrode of a capacitor 110321. As the first conductive layer, Ti, Mo, Ta, Cr, W, Al, Nd, Cu, Ag, Au, Pt, Nb, Si, Zn, Fe, Ba, Ge, or an alloy of these elements can be used. Further, a stacked layer including any of these (including an alloy thereof) can be used.

A second insulating film (an insulating film 110305) is formed to cover at least the first conductive layer. The second insulating film serves also as a gate insulating film. As the second insulating film, a single layer or a stacked layer of a silicon oxide film, a silicon nitride film, and/or a silicon oxynitride ($SiO_xN_y$) film can be used.

As the second insulating film which is in contact with the semiconductor layer, a silicon oxide film is preferably used. This is because the trap levels at the interface between the semiconductor layer and the second insulating film can be reduced.

A first semiconductor layer (a semiconductor layer 110306) is formed in a portion over the second insulating film which overlaps with the first conductive layer by a photolithography method, an inkjet method, a printing method, or the like. A portion of the semiconductor layer 110306 extends to a portion in which the second insulating film and the first conductive layer are not overlapped. The semiconductor layer 110306 includes a portion which acts as a channel region of the transistor 110320. As the semiconductor layer 110306, a semiconductor layer having non-crystallinity such as amorphous silicon (a-Si:H), or a semiconductor layer such as microcrystal semiconductor (μ-Si:H) can be used.

In a portion over the first semiconductor layer, a second semiconductor layer (a semiconductor layer 110307 and a semiconductor layer 110308) is formed. The semiconductor layer 110307 includes a portion which acts as one of a source region and a drain region. The semiconductor layer 110308 includes a portion which acts as the other one of the source region and the drain region. As the second semiconductor layer, silicon including phosphorus or the like can be used.

A second conductive layer (a conductive layer 110309, a conductive layer 110310, and a conductive layer 110311) is formed over the second semiconductor layer and the second insulating film. The conductive layer 110309 includes a portion which acts as one of a source electrode and a drain electrode of the transistor 110320. The conductive layer 110310 includes a portion which acts as the other one of the source electrode and the drain electrode of the transistor 110320. The conductive layer 110311 includes a portion which acts as a second electrode of the capacitor 110321. Note that as the second conductive layer, Ti, Mo, Ta, Cr, W, Al, Nd, Cu, Ag, Au, Pt, Nb, Si, Zn, Fe, Ba, Ge, or an alloy of these elements can be used. Further, a stacked layer including any of these (including an alloy thereof) can be used.

In steps after forming the second conductive layer, various insulating films or various conductive films may be formed.

A process of forming a channel etch type transistor is described as an example. The first semiconductor layer and the second semiconductor layer can be formed using the same mask. Specifically, the first semiconductor layer and the second semiconductor layer are formed sequentially. The first semiconductor layer and the second semiconductor layer are formed using the same mask.

A process of forming a channel etch type transistor is described as another example. Without using a new mask, a channel region of a transistor can be formed. Specifically, after forming the second conductive layer, a part of the second semiconductor layer is removed using the second conductive layer as a mask. Alternatively, a portion of the second semiconductor layer is removed by using the same mask as the second conductive layer. The first semiconductor layer below the removed second semiconductor layer becomes a channel region of the transistor.

Figure 49:
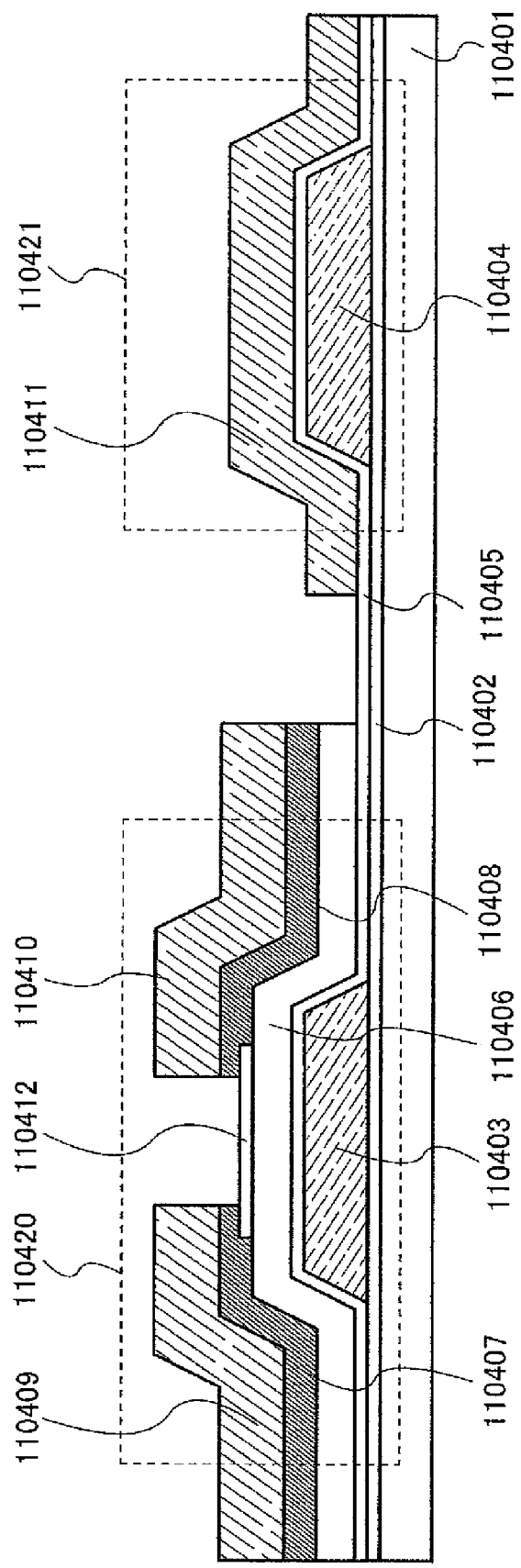
FIG. 49 is a diagram illustrating a structure of a semiconductor device according to the present invention.

FIG. 49 illustrates cross-sectional structures of an inverted staggered (a bottom gate) transistor and a capacitor. In particular, the transistor illustrated in FIG. 49 is a channel protection (channel stop) type transistor.

A first insulating film (an insulating film 110402) is formed entirely over a substrate 110401. The first insulating film can prevent impurities from the substrate from adversely affecting a semiconductor layer and changing a property of a transistor. In other words, the first insulating film serves as a base film. Therefore, a highly reliable transistor can be manufactured. As the first insulating film, a single layer or a stacked layer of a silicon oxide film, a silicon nitride film, and/or a silicon oxynitride ($SiO_xN_y$) film can be used.

The first insulating film is not necessarily formed. If the first insulating film is not formed, the number of steps can be reduced, and the manufacturing cost can be reduced. Since the structure can be simplified, the yield can be increased.

A first conductive layer (a conductive layer 110403 and a conductive layer 110404) is formed over the first insulating film. The conductive layer 110403 includes a portion which acts as a gate electrode of a transistor 110420. The conductive layer 110404 includes a portion which acts as a first electrode of a capacitor 110421. As the first conductive layer, Ti, Mo, Ta, Cr, W, Al, Nd, Cu, Ag, Au, Pt, Nb, Si, Zn, Fe, Ba, Ge, or an alloy of these elements can be used. Further, a stacked layer including any of these (including an alloy thereof) can be used.

A second insulating film (an insulating film 110405) is formed to cover at least the first conductive layer. The second insulating film serves as a gate insulating film. As the second insulating film, a single layer or a stacked layer of a silicon oxide film, a silicon nitride film, and/or a silicon oxynitride ($SiO_xN_y$) film can be used.

As the second insulating film which is in contact with the semiconductor layer, a silicon oxide film is preferably used. This is because the trap levels at the interface between the semiconductor layer and the second insulating film can be reduced.

A first semiconductor layer (a semiconductor layer 110406) is formed in a portion over the second insulating film which overlaps with the first conductive layer, by a photolithography method, an inkjet method, a printing method, or the like. A portion of the semiconductor layer 110406 extends to a portion in which the second insulating film and the first conductive layer are not overlapped. The semiconductor layer 110406 includes a portion which acts as a channel region of the transistor 110420. As the semiconductor layer 110406, a semiconductor layer having non-crystallinity such as amorphous silicon, or a semiconductor layer such as microcrystal semiconductor can be used.

A third insulating film (an insulating film 110412) is formed in a portion over the first semiconductor layer. The insulating film 110412 has a function of preventing the channel region of the transistor 110420 from being etched. In other words, the insulating film 110412 serves as a channel protection film (channel stop film). As the third insulating film, a single layer or a stacked layer of a silicon oxide film, a silicon nitride film, and/or a silicon oxynitride ($SiO_xN_y$) film can be used.

In a portion over the first semiconductor layer and a portion over the third insulating film, a second semiconductor layer (a semiconductor layer 110407 and a semiconductor layer 110408) is formed. The semiconductor layer 110407 includes a portion which acts as one of a source region and a drain region. The semiconductor layer 110408 includes a portion which acts as the other one of the source region and the drain region. As the second semiconductor layer, silicon including phosphorus or the like can be used.

A second conductive layer (a conductive layer 110409, a conductive layer 110410, and a conductive layer 110411) is formed over the second semiconductor layer. The conductive layer 110409 includes a portion which acts as one of a source electrode and a drain electrode of the transistor 110420. The conductive layer 110410 includes a portion which acts as the other one of the source electrode and the drain electrode of the transistor 110420. The conductive layer 110411 includes a portion which acts as a second electrode of the capacitor 110421. Note that as the second conductive layer, Ti, Mo, Ta, Cr, W, Al, Nd, Cu, Ag, Au, Pt, Nb, Si, Zn, Fe, Ba, Ge, or an alloy of these elements can be used. Further, a stacked layer including any of these (including an alloy thereof) can be used.

In steps after forming the second conductive layer, various insulating films or various conductive films may be formed.

The structures and manufacturing methods of transistors have been described above. Such wirings, electrodes, conductive layers, conductive films, terminals, vias, plugs, and the like are formed using one or more elements selected from the group consisting of aluminum (Al), tantalum (Ta), titanium (Ti), molybdenum (Mo), tungsten (W), neodymium (Nd), chromium (Cr), nickel (Ni), platinum (Pt), gold (Au), silver (Ag), copper (Cu), magnesium (Mg), scandium (Sc), cobalt (Co), zinc (Zn), niobium (Nb), silicon (Si), phosphorus (P), boron (B), arsenic (As), gallium (Ga), indium (In), tin (Sn), and oxygen (O); a compound or an alloy material including one or more of the elements in the group (for example, indium tin oxide (ITO), indium zinc oxide (IZO), indium tin oxide including silicon oxide (ITSO), zinc oxide (ZnO), tin oxide (SnO), cadmium tin oxide, aluminum neodymium (Al—Nd), magnesium silver (Mg—Ag), molybdenum-niobium (Mo—Nb), or the like); a substance in which these compounds are combined; or the like. Alternatively, such wirings, electrodes, conductive layers, conductive films, terminals, vias, plugs, and the like are preferably formed using a substance including such compounds, a compound of silicon and one or more of the elements selected from the group (silicide) (e.g., aluminum silicon, molybdenum silicon, nickel silicide); or a compound of nitrogen and one or more of the elements selected from the group (e.g., titanium nitride, tantalum nitride, molybdenum nitride).

Note that silicon (Si) may include an n-type impurity (such as phosphorus) or a p-type impurity (such as boron). The impurity contained in silicon can increase the conductivity or enables the same performance as normal conductors. Thus, such silicon can be utilized easily as wirings or electrodes.

Silicon can be any of various types of silicon such as single crystal silicon, polycrystal silicon, or microcrystal silicon. Alternatively, silicon having no crystallinity such as amorphous silicon can be used. By using single crystal silicon or polycrystal silicon, resistance of a wiring, an electrode, a conductive layer, a conductive film, or a terminal can be reduced. By using amorphous silicon or microcrystalline silicon, a wiring or the like can be formed by a simple process.

In addition, aluminum or silver has high conductivity, and thus can reduce a signal delay. Since aluminum or silver can be easily etched, aluminum or silver can be easily patterned and processed minutely.

Further, copper also has high conductivity, and thus can reduce a signal delay. In using copper, a stacked structure is preferably employed to enhance adhesiveness.

Molybdenum and titanium are also preferable materials. This is because even if molybdenum or titanium is in contact with an oxide of a semiconductor (ITO, IZO, or the like) or silicon, molybdenum or titanium does not cause defects. Further, molybdenum or titanium is easily etched and has high-heat resistance.

Tungsten is preferable since tungsten has high-heat resistance.

Neodymium is also preferable, since neodymium has an advantage of high heat resistance. In particular, an alloy of neodymium and aluminum is used to increase heat resistance, thereby almost preventing hillocks of aluminum.

Moreover, silicon is preferable since silicon can be formed at the same time as a semiconductor layer included in a transistor, and has high-heat resistance.

Since ITO, IZO, ITSO, zinc oxide (ZnO), silicon (Si), tin oxide (SnO), and cadmium tin oxide have light-transmitting properties, they can be used as a portion which allows light to pass through. For example, ITO, IZO, ITSO, zinc oxide (ZnO), silicon (Si), tin oxide (SnO), or cadmium tin oxide can be used for a pixel electrode and/or a common electrode.

Note that IZO is preferable since IZO is easily etched and processed. In etching IZO, almost no residues of IZO are left. Thus, when a pixel electrode is formed using IZO, defects (such as short-circuiting or orientation disorder) of a liquid crystal element or a light-emitting element can be reduced.

Such wirings, electrodes, conductive layers, conductive films, terminals, vias, plugs, or the like may have a single-layer structure or a multilayer structure. By adopting a single-layer structure, a manufacturing process of such wirings, electrodes, conductive layers, conductive films, or terminals can be simplified; the number of days for a process can be reduced; and cost can be reduced. Alternatively, by employing a multilayer structure, an advantage of each material is taken and a disadvantage thereof is reduced so that a wiring, an electrode, or the like with high performance can be formed. For example, a low-resistant material (such as aluminum) is included in a multilayer structure, thereby reducing the resistance of such wirings. As another example, when a low heat-resistant material is interposed between high heat-resistant materials to form a stacked-layer structure, heat resistance of wirings, electrodes, or the like can be increased, utilizing advantages of such low heat-resistance materials. For example, a layer including aluminum is preferably interposed between layers including molybdenum, titanium, or neodymium as a stacked structure.

If wirings or electrodes are in direct contact with each other, an adverse effect is caused to each other in some cases. For example, one of wirings or electrodes is mixed into a material of the other of the wirings or electrodes and changes the property, and thus, a desired function cannot be obtained. As another example, in forming a high-resistant portion, there is a problem in that it cannot be formed normally. In such a case, a reactive material is preferably sandwiched by or covered with a non-reactive material in a stacked structure. For example, when ITO is connected to aluminum, an alloy of titanium, molybdenum, and neodymium is preferably disposed between the ITO and the aluminum. As another example, when silicon is connected to aluminum, an alloy of titanium, molybdenum, and neodymium is preferably disposed between the silicon and the aluminum.

Note that the term "wiring" indicates a portion including a conductor. The shape of such a wiring may be linear; but not limited to, such a wiring may be short. Therefore, electrodes are included in such wirings.

Note that a carbon nanotube may be used for wirings, electrodes, conductive layers, conductive films, terminals, vias, plugs, or the like. Since the carbon nanotube has a light-transmitting property, it can be used for a portion which allows light to pass thorough. For example, the carbon nanotube can be used for a pixel electrode and/or a common electrode.

Although this embodiment mode has been described with reference to various drawings, the contents (or part of the contents) described in each drawing can be freely applied to, combined with, or replaced with the contents (or part of the contents) described in another drawing. Further, much more drawings can be formed by combining each part in the above-described drawings with another part.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in the drawings in this embodiment mode with part of another embodiment mode.

Note that this embodiment mode has described just examples of embodying, slightly transforming, modifying, improving, describing in detail, or applying the contents (or part of the contents) described in other embodiment modes, an example of related part thereof, or the like. Therefore, the contents described in other embodiment modes can be freely applied to, combined with, or replaced with the contents described in this embodiment mode.

Embodiment Mode 9

Embodiment Mode 9 will describe a configuration of a display device.

Figure 53A:
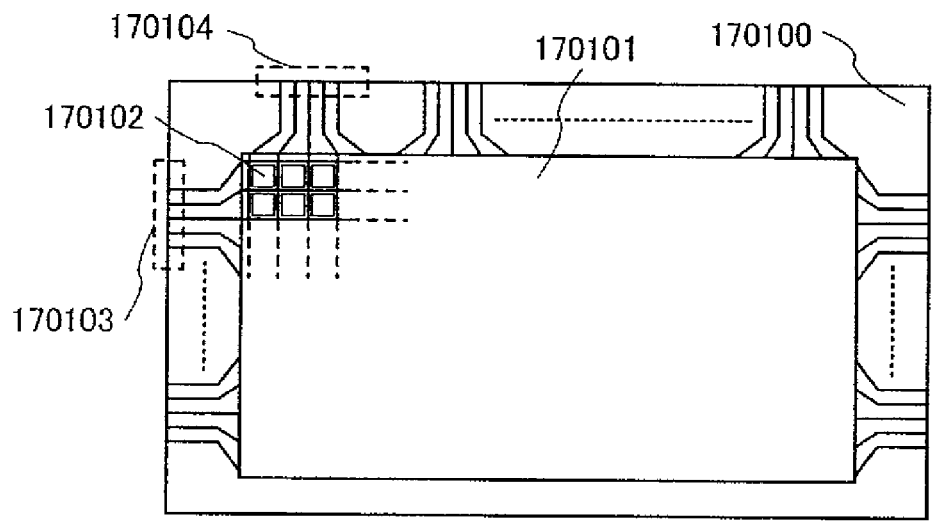
FIGS. 53A to 53C are diagrams illustrating structures of display devices of/with/using a semiconductor device according to the present invention.

FIG. 53A illustrates a configuration of a display device. FIG. 53A is a top view of the display device.

A pixel portion 170101, a scan line side input terminal 170103, and a signal line side input terminal 170104 are formed over a substrate 170100, scan lines extend in a row direction from the scan line side input terminal 170103, and signal lines extend in a column direction from the signal line side input terminal 170104 over the substrate 170100. Pixels 170102 are disposed in matrix and each pixel 170102 is disposed at an intersection portion of the scan line and the signal line in the pixel portion 170101.

The case in which signals are input from an external driver circuit has been described above. However, the present invention is not limited to this case, and an IC chip can be mounted on a display device.

Figure 54A:
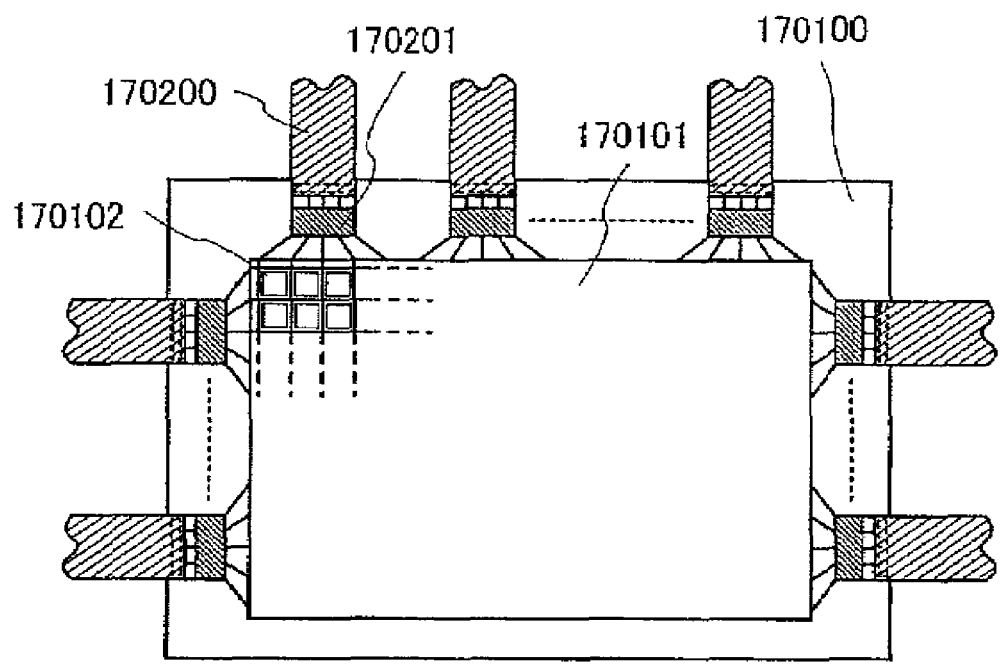
FIGS. 54A and 54B are diagrams illustrating peripheral circuit structures of a semiconductor device according to the present invention.

For example, as shown in FIG. 54A, an IC chip 170201 can be mounted on a substrate 170100 by a COG (chip on glass) method. In this case, inspection can be conducted before mounting the IC chip 170201 on the substrate 170100 to increase the yield of the display device. Further, the reliability can also be increased. In addition, the same portions as those in FIG. 53A are denoted by the same reference numerals and the description thereof is omitted.

Figure 54B:
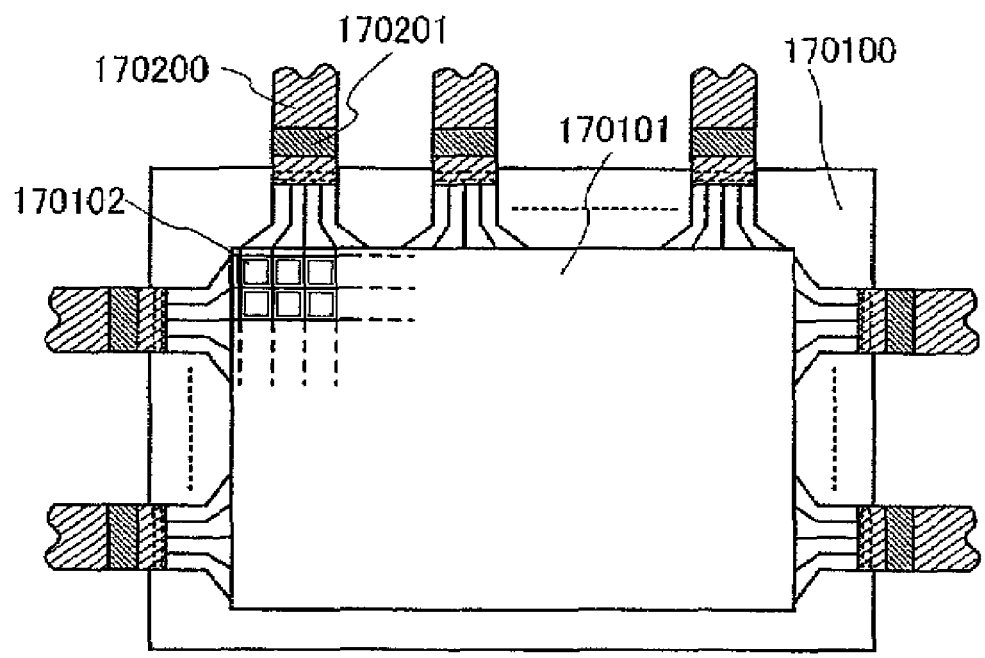

As another example, as shown in FIG. 54B, an IC chip 170201 can be mounted on an FPC (flexible printed circuit) 170200 by a TAB (tape automated bonding) method. In this case, inspection can be conducted before mounting the IC chip 170201 on the FPC 170200 to increase the yield of the display device. Further, the reliability can also be increased. In addition, the same portions as those in FIG. 53A are denoted by the same reference numerals and the description thereof is omitted.

As well as the IC chip can be mounted on the substrate 170100, a driver circuit can be formed on the substrate 170100.

Figure 53B:
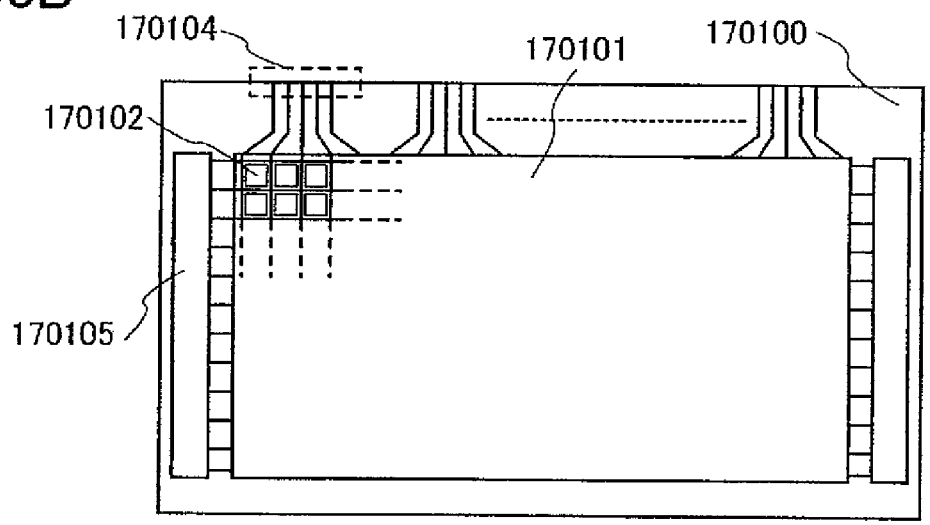

For example, as shown in FIG. 53B, a scan line driver circuit 170105 can be formed on a substrate 170100. In this case, the number of components can be reduced to decrease the manufacturing cost. The number of connection points with circuit components can be reduced to enhance the reliability. Since the driving frequency of the scan line driver circuit 170105 is low, the scan line driver circuit 170105 can be easily formed using amorphous silicon or microcrystal silicon as a semiconductor layer of a transistor. In addition, an IC chip for outputting a signal to the signal line may be mounted on the substrate 170100 by a COG method. Alternatively, an FPC on which an IC chip for outputting a signal to a signal line is mounted by a TAB method may be disposed on the substrate 170100. In addition, an IC chip for controlling the scan line driver circuit 170105 may be mounted on the substrate 170100 by a COG method. Alternatively, an FPC on which an IC chip for controlling the scan line driver circuit 170105 is mounted by a TAB method may be disposed on the substrate 170100. In addition, the same portions as those in FIG. 53A are denoted by the same reference numerals and the description thereof is omitted.

Figure 53C:
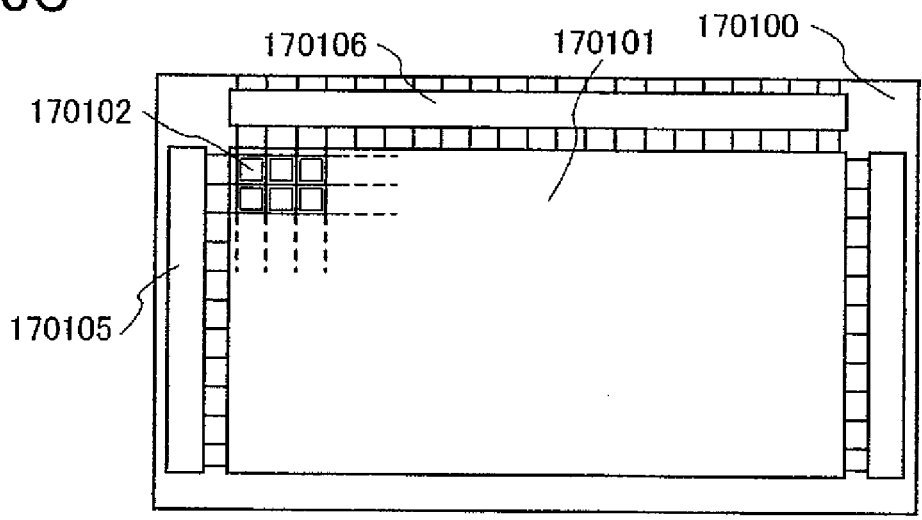

As another example, as shown in FIG. 53C, the scan line driver circuit 170105 and a signal line driver circuit 170106 can be formed on the substrate 170100. Thus, the number of components can be reduced to decrease the manufacturing cost. The number of connection points with circuit components can be reduced to enhance the reliability. In addition, an IC chip for controlling the scan line driver circuit 170105 may be mounted on the substrate 170100 by a COG method. Alternatively, an FPC on which an IC chip for controlling the scan line driver circuit 170105 is mounted by a TAB method may be disposed on the substrate 170100. An IC chip for controlling the signal line driver circuit 170106 may be mounted on the substrate 170100 by a COG method. Alternatively, an IC chip for controlling the signal line driver circuit 170106 may be mounted on the substrate 170100 by a TAB method. In addition, the same portions as those in FIG. 53A are denoted by the same reference numerals and the description thereof is omitted.

Although this embodiment mode has been described with reference to various drawings, the contents (or part of the contents) described in each drawing can be freely applied to, combined with, or replaced with the contents (or part of the contents) described in another drawing. Further, much more drawings can be formed by combining each part in the above-described drawings with another part.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in the drawings in this embodiment mode with part of another embodiment mode.

Note that this embodiment mode has described just examples of embodying, slightly transforming, modifying, improving, describing in detail, or applying the contents (or part of the contents) described in other embodiment modes, an example of related part thereof, or the like. Therefore, the contents described in other embodiment modes can be freely applied to, combined with, or replaced with the contents described in this embodiment mode.

Embodiment Mode 10

Embodiment Mode 10 will describe a method for driving a display device. In particular, a method for driving a liquid crystal display device is described.

A liquid crystal display panel which can be used for the liquid crystal display device described in this embodiment mode has a structure in which a liquid crystal material is sandwiched between two substrates. Each of the two substrates is provided with an electrode for controlling an electric field applied to the liquid crystal material. A liquid crystal material corresponds to a material optical and electrical properties of which are changed by an electric field applied from outside. Therefore, a liquid crystal panel corresponds to a device in which desired optical and electrical properties can be obtained by controlling voltage applied to the liquid crystal material using the electrode provided for each of the two substrates. In addition, a plurality of electrodes are disposed in a planar manner, each of the electrodes corresponds to a pixel, and voltages applied to the pixels are individually controlled. Therefore, a liquid crystal display panel which can display a clear image can be obtained.

Here, response time of the liquid crystal material with respect to a change in electric field depends on a gap between the two substrates (a cell gap) and a type of the liquid crystal material, and is generally several milliseconds to several ten milliseconds. Further, in the case where the amount of change in electric field is small, the response time of the liquid crystal material is further lengthened. This characteristic causes a defect in image display such as an after image, persistence of vision, or decrease in contrast when the liquid crystal panel displays a moving image. In particular, when a half tone is changed into another half tone (change in electric field is small), the above-described defect becomes noticeable.

Meanwhile, as a particular problem of a liquid crystal panel using an active matrix method, fluctuation in writing voltage due to constant electric charge driving is given. Constant electric charge driving in this embodiment mode is described below.

A pixel circuit using an active matrix method includes a switch which controls writing and a capacitor which holds an electric charge. A method for driving the pixel circuit using the active matrix method corresponds to a method in which predetermined voltage is written in a pixel circuit with a switch turned on, and the switch is turned off immediately after that, and an electric charge in the pixel circuit is held (a hold state). At the time of hold state, exchange of the electric charges between inside and outside of the pixel circuit is not performed (a constant electric charge). Usually, the length of a period during which the switch is turned off is approximately several hundreds times (by the number of scan lines) longer than that of a period during which the switch is turned on. Therefore, it may be considered that the switch of the pixel circuit be almost always turned off. As described above, constant electric charge driving in this embodiment mode corresponds to a driving method in which a pixel circuit is in a hold state in almost all periods in driving a liquid crystal panel.

Next, electrical properties of the liquid crystal material are described. The liquid crystal material changes its dielectric constant as well as optical properties when an electric field applied from outside is changed. That is, when each pixel of the liquid crystal panel is regarded as a capacitor (a liquid crystal element) sandwiched between two electrodes, the capacitor corresponds to a capacitor which changes its capacitance in accordance with voltage applied. This phenomenon is called dynamic capacitance.

When a capacitor which changes its capacitance in accordance with voltage applied in this manner is driven by constant electric charge driving, the following problem occurs. If capacitance of a liquid crystal element is changed in a hold state in which an electric charge is not transferred, voltage to be applied is also changed. This can be understood from the fact that the amount of electric charges is constant in a relational expression of (the amount of electric charges)=(capacitance)×(applied voltage).

Figure 51A:
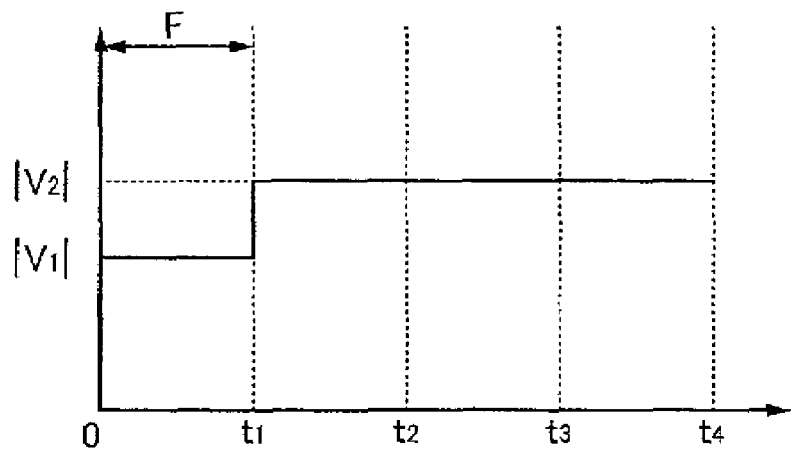
FIGS. 51A to 51C are diagrams illustrating a method for driving a semiconductor device according to the present invention.
Figure 51B:
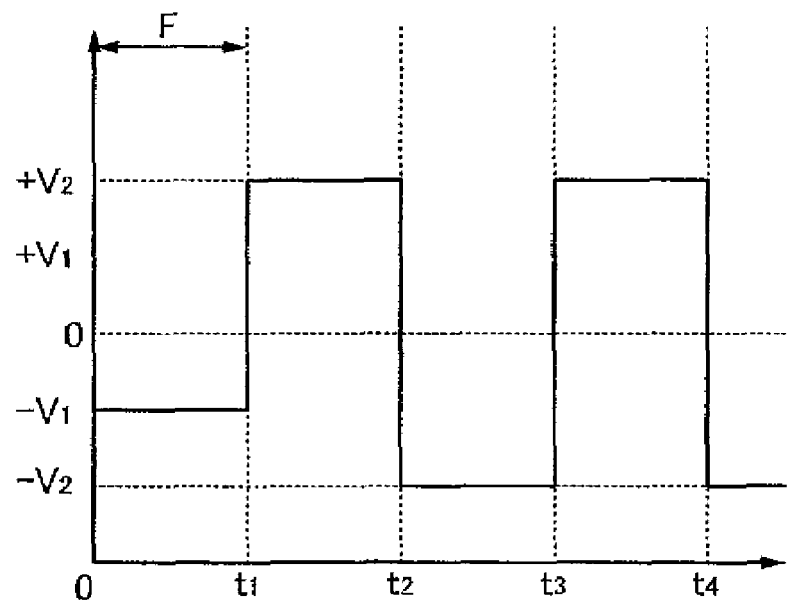
Figure 51C:
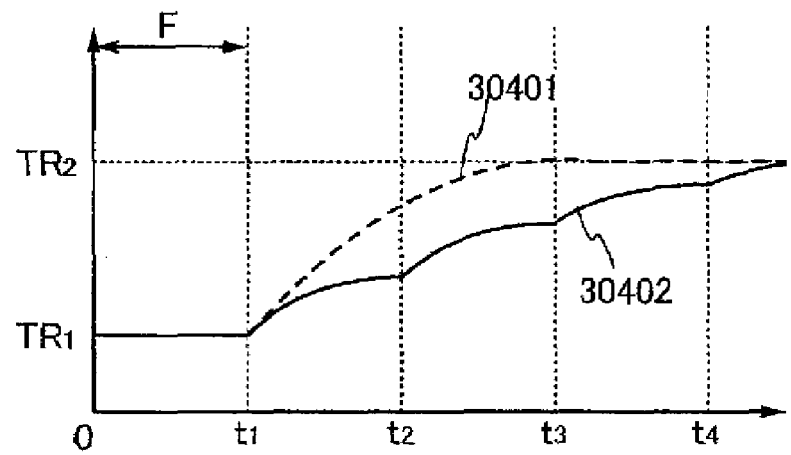

For the above reasons, voltage at the time of a hold state is changed from voltage at the time of writing because constant electric charge driving is performed in a liquid crystal panel using an active matrix method. Accordingly, change in transmittivity of the liquid crystal element is different from change in transmittivity of a liquid crystal element in a driving method which does not take a hold state. FIGS. 51A to 51C show this state. FIG. 51A illustrates an example of controlling voltage written in a pixel circuit in the case where time is represented by the horizontal axis and the absolute value of the voltage is represented by the vertical axis. FIG. 51B illustrates an example of controlling voltage written in the pixel circuit in the case where time is represented by the horizontal axis and the voltage is represented by the vertical axis. FIG. 51C illustrates a change in transmittivity of the liquid crystal element over time in the case where the voltage shown in FIG. 51A or 51B is written in the pixel circuit when time is represented by the horizontal axis and the transmittivity of the liquid crystal element is represented by the vertical axis. In each of FIGS. 51A to 51C, a period F refers to a period for rewriting the voltage, and time for rewriting the voltage is denoted by $t_1$, $t_2$, $t_3$, and $t_4$.

Here, writing voltage corresponding to image data input to the liquid crystal display device corresponds to $|V_1|$ in rewriting at the time of 0 and corresponds to $|V_2|$ in rewriting at the time of $t_1$, $t_2$, $t_3$, and $t_4$ (see FIG. 51A).

Note that polarity of the writing voltage corresponding to image data input to the liquid crystal display device may be switched periodically (inversion driving: see FIG. 51B). Since DC voltage can be prevented from being applied to a liquid crystal as much as possible by using this method, burn-in or the like caused by deterioration of the liquid crystal element can be prevented. Note also that a period of switching the polarity (an inversion period) may be the same as a period of rewriting voltage. In this case, generation of flickers caused by inversion driving can be reduced because the inversion period is short. Further, the inversion period may be a period which is integral times of the period of rewriting voltage. In this case, power consumption can be reduced because the inversion period is long and the frequency of changing the polarity and that of writing voltage can be decreased.

FIG. 51C illustrates a change in transmittivity of the liquid crystal element over time in the case where voltage as shown in FIGS. 51A or 51B is applied to the liquid crystal element. Here, transmittivity of the liquid crystal element after the voltage $|V_1|$ is applied to the liquid crystal element and after sufficient time passes corresponds to $TR_1$. Similarly, transmittivity of the liquid crystal element after the voltage $|V_2|$ is applied to the liquid crystal element and after sufficient time passes corresponds to $TR_2$. When the voltage applied to the liquid crystal element is changed from $|V_1|$ to $|V_2|$ at the time of $t_1$, transmittivity of the liquid crystal element does not immediately become $TR_2$ as shown by a dashed line 30401 but slowly changes. For example, when the period of rewriting voltage is the same as a frame period of a video signal of 60 Hz (16.7 milliseconds), it takes about several frames for transmittivity to be changed to $TR_2$.

Note that a smooth change in transmittivity over time as shown in the dashed line 30401 corresponds to a change in transmittivity over time when the voltage $|V_2|$ is accurately applied to the liquid crystal element. In an actual liquid crystal panel, for example, a liquid crystal panel using an active matrix method, transmittivity of the liquid crystal element does not change over time as shown by the dashed line 30401 but changes gradually over time as shown by a solid line 30402 because voltage at the time of a hold state is changed from voltage at the time of writing due to constant electric charge driving. This is because the voltage is changed due to constant electric charge driving, so that it is impossible to reach intended voltage only by single writing. Accordingly, the response time of the liquid crystal element becomes further longer in appearance than original response time (the dashed line 30401), so that a noticeable defect in image display such as an after image, persistence of vision, or decrease in contrast occurs.

Figure 52A:
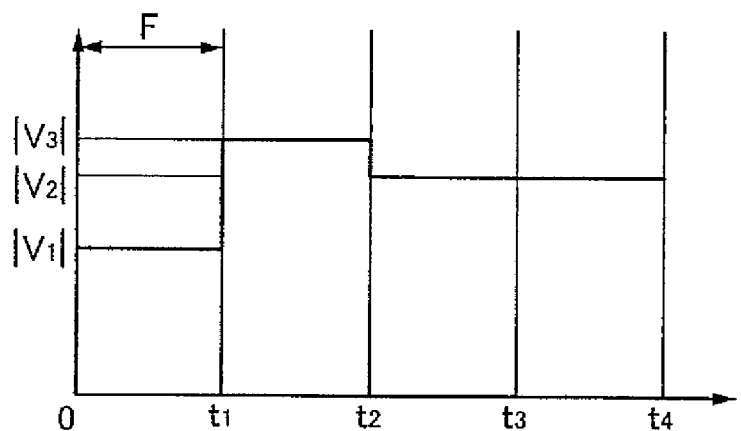
FIGS. 52A to 52C are diagrams illustrating a method for driving a semiconductor device according to the present invention.
Figure 52B:
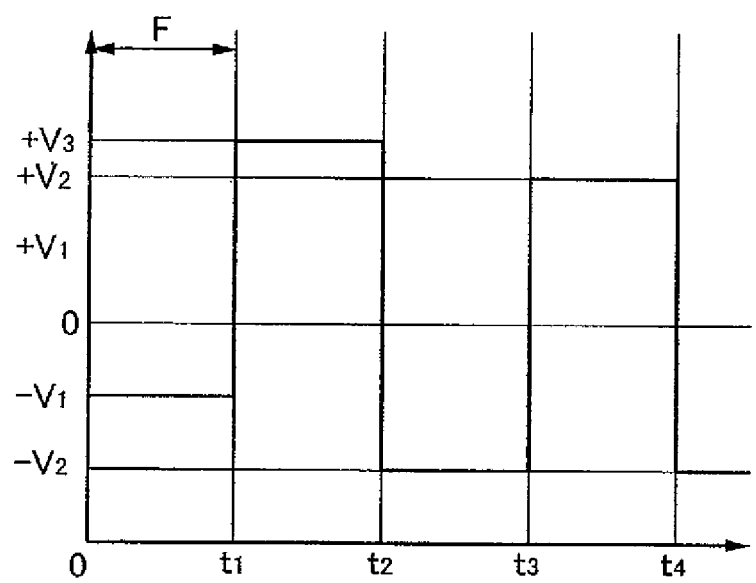
Figure 52C:
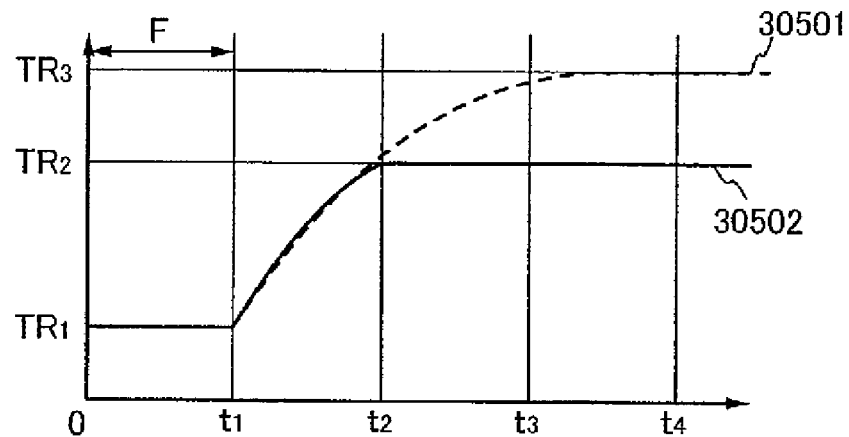

By using overdriving, it is possible to solve at the same time, problems of the long length of original response time of the liquid crystal element and the phenomenon in which the response time in appearance becomes further longer because of shortage of writing by dynamic capacitance and constant electric charge driving. FIGS. 52A to 52C show this state. FIG. 52A illustrates an example of controlling voltage written in a pixel circuit in the case where time is represented by the horizontal axis and the absolute value of the voltage is represented by the vertical axis. FIG. 52B illustrates an example of controlling voltage written in the pixel circuit in the case where time is represented by the horizontal axis and the voltage is represented by the vertical axis. FIG. 52C illustrates a change in transmittivity of the liquid crystal element over time in the case where the voltage shown in FIGS. 52A or 52B is written in the pixel circuit when time is represented by the horizontal axis and the transmittivity of the liquid crystal element is represented by the vertical axis. In each of FIGS. 52A to 52C, a period F refers to a period for rewriting the voltage, and time for rewriting the voltage is denoted by $t_1$, $t_2$, $t_3$, and $t_4$.

Here, writing voltage corresponding to image data input to the liquid crystal display device corresponds to $|V_1|$ in rewriting at the time of 0, corresponds to $|V_3|$ in rewriting at the time of $t_1$, and corresponds to $|V_3|$ in writing at the time of $t_2$, $t_3$, and $t_4$ (see FIG. 52A).

Note that polarity of the writing voltage corresponding to image data input to the liquid crystal display device may be switched periodically (inversion driving: see FIG. 52B). Since DC voltage can be prevented from being applied to a liquid crystal as much as possible by using this method, burn-in or the like caused by deterioration of the liquid crystal element can be prevented. Note also that a cycle of switching the polarity (an inversion cycle) may be the same as a cycle of rewriting voltage. In this case, generation of flickers caused by inversion driving can be reduced because the inversion period is short. Further, the inversion period may be a period which is integral times of the period of rewriting voltage. In this case, power consumption can be reduced because the inversion period is long and the frequency of changing the polarity and that of writing voltage can be decreased.

FIG. 52C illustrates a change in transmittivity of the liquid crystal element over time in the case where voltage as shown in FIGS. 52A or 52B is applied to the liquid crystal element. Here, transmittivity of the liquid crystal element after the voltage $|V_1|$ is applied to the liquid crystal element and after sufficient time passes corresponds to $TR_1$. Similarly, transmittivity of the liquid crystal element after the voltage $|V_2|$ is applied to the liquid crystal element and after sufficient time passes corresponds to $TR_2$. Similarly, transmittivity of the liquid crystal element after the voltage $|V_3|$ is applied to the liquid crystal element and after sufficient time passes corresponds to $TR_3$. When the voltage applied to the liquid crystal element is changed from $|V_1|$ to $|V_3|$ at the time of $t_1$, transmittivity of the liquid crystal element tends to be changed to $TR_3$ in several frames as shown by a dashed line 30501.

However, application of the voltage $|V_3|$ is terminated at the time $t_2$ and the voltage $|V_2|$ is applied after the time $t_2$. Therefore, transmittivity of the liquid crystal element does not become as shown by the dashed line 30501 but becomes as shown by a solid line 30502. Here, it is preferable that a value of the voltage $|V_3|$ be set so that transmittivity is approximately $TR_2$ at the time of $t_2$. Here, the voltage $|V_3|$ is also referred to as overdriving voltage.

That is, the response time of the liquid crystal element can be controlled to some extent by changing $|V_3|$ which is the overdriving voltage. This is because the response time of the liquid crystal element is changed in accordance with the intensity of an electric field. Specifically, the response time of the liquid crystal element becomes shorter as the electric field becomes stronger, and the response time of the liquid crystal element becomes longer as the electric field becomes weaker.

Note that it is preferable that the overdriving voltage $|V_3|$ be changed in accordance with the amount of change in the voltage, i.e., the voltage $|V_1|$ and the voltage $|V_2|$ which provide intended transmittivities $TR_1$ and $TR_2$. This is because optimum response time can be always obtained by changing the overdriving voltage $|V_3|$ in accordance with change in the response time of the liquid crystal element, even when the response time of the liquid crystal element is changed by the amount of change in the voltage.

Note also that it is preferable that the overdriving voltage $|V_3|$ be changed in accordance with a mode of the liquid crystal element such as a TN-mode, a VA-mode, an IPS-mode, or an OCB-mode. This is because optimum response time can be always obtained by changing the overdriving voltage $|V_3|$ in accordance with change in the response time of the liquid crystal element, even when the response time of the liquid crystal element varies depending on the mode of the liquid crystal element.

Note also that the voltage rewriting period F may be the same as a frame period of an input signal. In this case, a liquid crystal display device with low manufacturing cost can be obtained because a peripheral driver circuit of the liquid crystal display device can be simplified.

Note also that the voltage rewriting period F may be shorter than the frame period of the input signal. For example, the voltage rewriting period F may be a half (½) of the frame period of the input signal, one third (⅓) of the frame period of the input signal, or shorter than one third (⅓) of the frame period of the input signal. It is effective to combine this method with a countermeasure against deterioration in quality of a moving image caused by hold driving of the liquid crystal display device, such as black frame insertion driving, backlight blinking, backlight scanning, or intermediate image insertion driving by motion compensation. That is, short response time of the liquid crystal element is required for the countermeasure against deterioration in quality of a moving image caused by hold driving of the liquid crystal display device, and the response time of the liquid crystal element can be shortened relatively easily by using the overdriving described in this embodiment mode. Although the response time of the liquid crystal element can be essentially shortened by a cell gap, a liquid crystal material, a mode of the liquid crystal element, or the like, it is technically difficult to shorten the response time of the liquid crystal element. Therefore, it is very important to use a method for shortening the response time of the liquid crystal element by a driving method such as overdriving.

Note also that the voltage rewriting period F may be longer than the frame period of the input signal. For example, the voltage rewriting period F may be twice as long as the frame period of the input signal, three times as long as the frame period of the input signal, or longer than three times. It is effective to combine this method with a unit (a circuit) which determines whether voltage is rewritten or not for a long period. That is, when the voltage is not rewritten for a long period, an operation of the circuit can be stopped during the period, without performing a rewriting operation itself of the voltage. Therefore, a liquid crystal display device which consumes less power can be obtained.

Next, a specific method for changing the overdriving voltage $|V_3|$ in accordance with the voltage $|V_1|$ and the voltage $|V_2|$ which provide intended transmittivity $TR_1$ and $TR_2$ is described.

An overdriving circuit corresponds to a circuit for appropriately controlling the overdriving voltage $|V_3|$ in accordance with the voltage $|V_1|$ and the voltage $|V_2|$ which provide intended transmittivity $TR_1$ and $TR_2$. Therefore, signals input to the overdriving circuit are a signal which is related to the voltage $|V_{11}|$ which provides intended transmittivity $TR_1$ and a signal which is related to the voltage $|V_2|$ which provides intended transmittivity $TR_2$, and a signal output from the overdriving circuit is a signal which is related to the overdriving voltage $|V_3|$. Here, each of these signals may have an analog voltage value such as the voltage applied to the liquid crystal element (e.g., $|V_1|$, $|V_2|$, or $|V_3|$) or may be a digital signal for supplying the voltage applied to the liquid crystal element. Here, description is made regarding the signal which is related to the overdriving circuit as a digital signal.

Figure 88A:
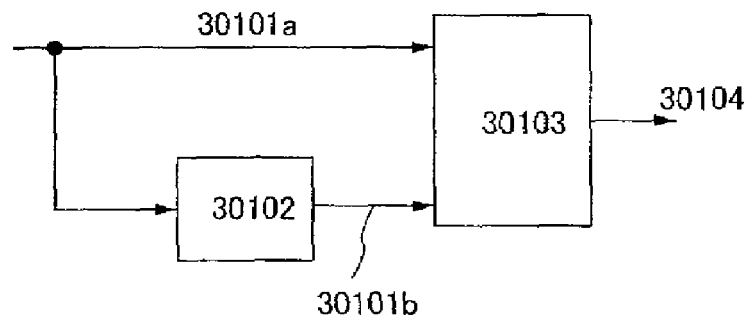
FIGS. 88A to 88E are diagrams illustrating a method for manufacturing a semiconductor device according to the present invention.

First, an overall structure of the overdriving circuit is described with reference to FIG. 88A. Here, input video signals 30101a and 30101b are used as signals for controlling the overdriving voltage. As a result of processing these signals, an output video signal 30104 is to be output as a signal which supplies the overdriving voltage.

Here, since the voltage $|V_1|$ and the voltage $|V_2|$ which provide intended transmittivity $TR_1$ and $TR_2$ are video signals in adjacent frames, it is preferable that the input video signals 30101a and 30101b be similarly video signals in adjacent frames. In order to obtain such signals, the input video signal 30101a is input to a delay circuit 30102 in FIG. 88A and a signal which is consequently output can be used as the input video signal 30101b. An example of the delay circuit 30102 is a memory. That is, the input video signal 30101a is stored in the memory in order to delay the input video signal 30101a for one frame; a signal stored in the previous frame is taken out from the memory as the input video signal 30101b at the same time; and the input video signal 30101a and the input video signal 30101b are concurrently input to a correction circuit 30103. Accordingly, the video signals in adjacent frames can be handled. By inputting the video signals in adjacent frames to the correction circuit 30103, the output video signal 30104 can be obtained. Note that a memory which can be used as the delay circuit 30102 in order to delay the input video signal 30101a for one frame is a memory having capacity for storing a video signal for one frame (i.e., a frame memory). Thus, the memory can have a function as a delay circuit without excess and deficiency of memory capacity.

Next, the delay circuit 30102 structured mainly for reducing memory capacity is described. Since memory capacity can be reduced by using such a circuit as the delay circuit 30102, manufacturing cost can be reduced.

Figure 88B:
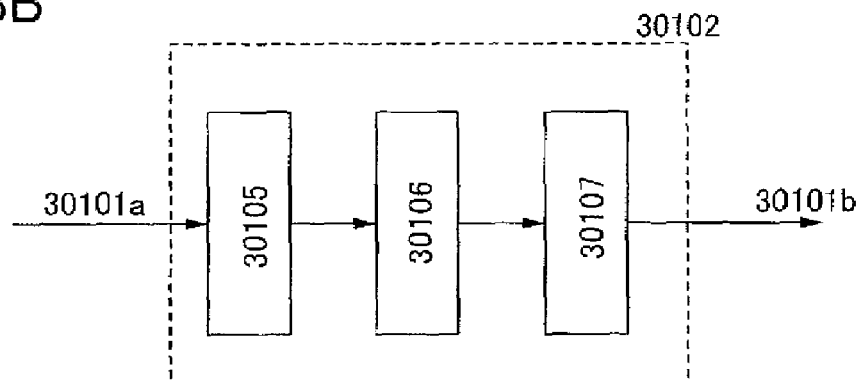

Specifically, a delay circuit as shown in FIG. 88B can be used as the delay circuit 30102 having such characteristics. The delay circuit 30102 shown in FIG. 88B includes an encoder 30105, a memory 30106, and a decoder 30107.

Operations of the delay circuit 30102 shown in FIG. 88B are as follows. First, the encoder 30105 performs compression processing before the input video signal 30101a is stored in the memory 30106. Thus, the size of data to be stored in the memory 30106 can be reduced. Accordingly, memory capacity can be reduced, so that manufacturing cost can also be reduced. Then, a compressed video signal is transferred to the decoder 30107, where decompression processing is performed. Thus, the previous signal which has been compressed by the encoder 30105 can be restored. Here, compression/decompression processing which is performed by the encoder 30105 and the decoder 30107 may be reversible processing. Thus, since the video signal does not deteriorate even after compression/decompression processing is performed, memory capacity can be reduced without causing deterioration of the quality of an image to be finally displayed by a device. Further, compression/decompression processing which is performed by the encoder 30105 and the decoder 30107 may be irreversible processing. Thus, since the data size of the compressed video signal can be made extremely small, memory capacity can be significantly reduced.

Note that as a method for reducing memory capacity, various methods can be used as well as the above-described method. A method in which color information included in a video signal is reduced (e.g., color reduction from 2.6 hundred thousand colors to 65 thousand colors is performed) or the number of data is reduced (e.g., resolution is decreased) without performing image compression by an encoder, or the like can be used.

Figure 88C:
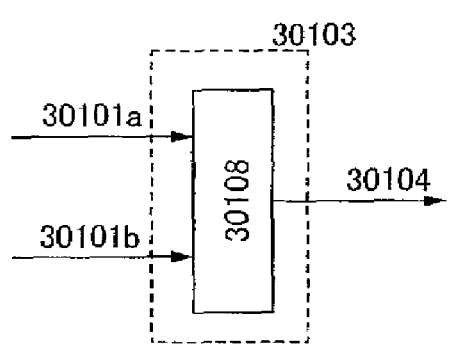

Next, specific examples of the correction circuit 30103 are described with reference to FIGS. 88C to 88E. The correction circuit 30103 corresponds to a circuit for outputting an output video signal having a certain value from two input video signals. Here, when the relationship between the two input video signals and the output video signal is non-linear and it is difficult to calculate the relationship by simple operation, a look-up table (an LUT) may be used as the correction circuit 30103. Since the relationship between the two input video signals and the output video signal is calculated in advance by measurement for an LUT, the output video signal corresponding to the two input video signals can be calculated only by referring to the LUT (see FIG. 88C). By using a LUT 30108 as the correction circuit 30103, the correction circuit 30103 can be realized without performing complicated circuit design or the like.

Here, since the LUT 30108 is one of memories, it is preferable to reduce memory capacity as much as possible in order to reduce manufacturing cost. A possible example of the correction circuit 30103 for realizing reduction in memory capacity is a circuit shown in FIG. 88D. The correction circuit 30103 shown in FIG. 88D includes an LUT 30109 and an adder 30110. The LUT 30109 stores differential data between the input video signal 30101a and the output video signal 30104 to be output. That is, the output video signal 30104 can be obtained by taking out corresponding differential data from the LUT 30109 based on the input video signal 30101a and the input video signal 30101b and adding the taken differential data and the input video signal 30101a by the adder 30110. Note that when data stored in the LUT 30109 is differential data, memory capacity of the LUT 30109 can be reduced. This is because data size of differential data is smaller than that of the output video signal 30104, so that memory capacity necessary for the LUT 30109 can be decreased.

In addition, when the output video signal can be calculated by simple operation such as four arithmetic operations of the two input video signals, the correction circuit 30103 can be realized by combination of simple circuits such as an adder, a subtracter, or a multiplier. Accordingly, it becomes unnecessary to use an LUT, so that manufacturing cost can be significantly reduced. An example of such a circuit is a circuit shown in FIG. 88E. The correction circuit 30103 shown in FIG. 88E includes a subtracter 30111, a multiplier 30112, and an adder 30113. First, difference between the input video signal 30101a and the input video signal 30101b is calculated by the subtracter 30111. After that, a differential value is multiplied by an appropriate coefficient by using the multiplier 10112. Then, by adding the differential value multiplied by the appropriate coefficient to the input video signal 30101a by the adder 30113, the output video signal 30104 can be obtained. By using such a circuit, it becomes unnecessary to use the LUT. Therefore, manufacturing cost can be significantly reduced.

Figure 88E:
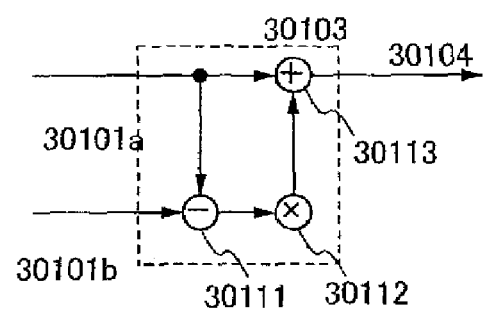
Figure 88D:
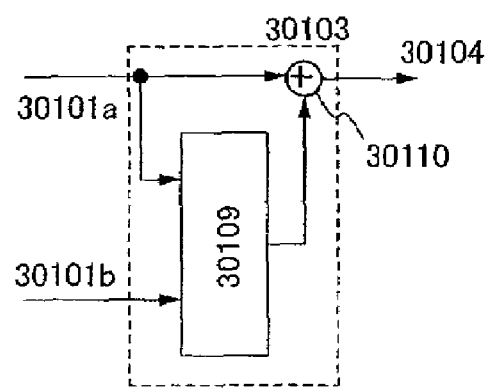

Note that by using the correction circuit 30103 shown in FIG. 88E under a certain condition, inappropriate output of the output video signal 30104 can be prevented. The condition is that the output video signal 30104 which supplies the overdriving voltage and a differential value between the input video signals 30101a and 30101b have linearity. In addition, the slope of this linearity corresponds to a coefficient to be multiplied by the multiplier 30112. That is, it is preferable that the correction circuit 30103 shown in FIG. 88E be used for a liquid crystal element having such a property. An example of a liquid crystal element having such a property is an IPS-mode liquid crystal element in which response time has little grayscale dependency. For example, by using the correction circuit 30103 shown in FIG. 88E for an IPS-mode liquid crystal element in this manner, manufacturing cost can be significantly reduced and an overdriving circuit which can prevent output of the inappropriate output video signal 30104 can be provided.

Operations which are similar to those of the circuits shown in FIGS. 88A to 88E may be realized by software processing. As for the memory used for the delay circuit, another memory included in the liquid crystal display device, a memory included in a device which transmits an image to be displayed on the liquid crystal display device (e.g., a video card or the like included in a personal computer or a device equivalent to the personal computer) can be used for example. Thus, not only can manufacturing cost be reduced, but the extent of overdriving, use conditions, or the like can be selected in accordance with user's preference.

Figure 89A:
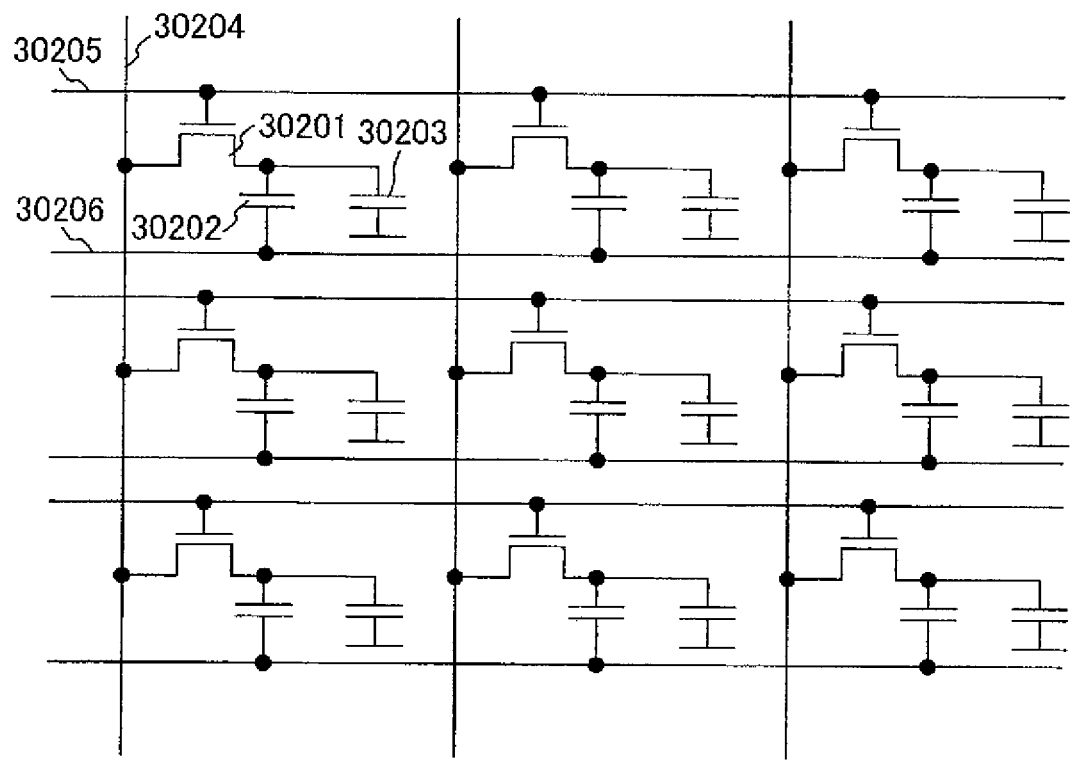
FIGS. 89A and 89B are diagrams illustrating a method for driving a semiconductor device according to the present invention.

Next, driving for controlling a potential of a common line is described with reference to FIGS. 89A and 89B. FIG. 89A illustrates a plurality of pixel circuits in which one common line is provided with respect to one scan line in a display device using a display element which has capacitive properties like a liquid crystal element. Each of the pixel circuits shown in FIG. 89A includes a transistor 30201, an auxiliary capacitor 30202, a display element 30203, a video signal line 30204, a scan line 30205, and a common line 30206.

A gate electrode of the transistor 30201 is electrically connected to the scan line 30205; one of a source electrode and a drain electrode of the transistor 30201 is electrically connected to the video signal line 30204; and the other of the source electrode and the drain electrode of the transistor 30201 is electrically connected to one of electrodes of the auxiliary capacitor 30202 and one of electrodes of the display element 30203. In addition, the other of the electrodes of the auxiliary capacitor 30202 is electrically connected to the common line 30206.

First, in each of pixels selected by the scan line 30205, voltage corresponding to a video signal is applied to the display element 30203 and the auxiliary capacitor 30202 through the video signal line 30204 because the transistor 30201 is turned on. At this time, when the video signal is a signal which makes all pixels connected to the common line 30206 display the lowest grayscale or when the video signal is a signal which makes all of the pixels connected to the common line 30206 display the highest grayscale, it is not necessary that the video signal be written to each pixel through the video signal line 30204. Instead of writing the video signal through the video signal line 30204, voltage applied to the display element 30203 can be changed by changing a potential of the common line 30206.

Figure 89B:
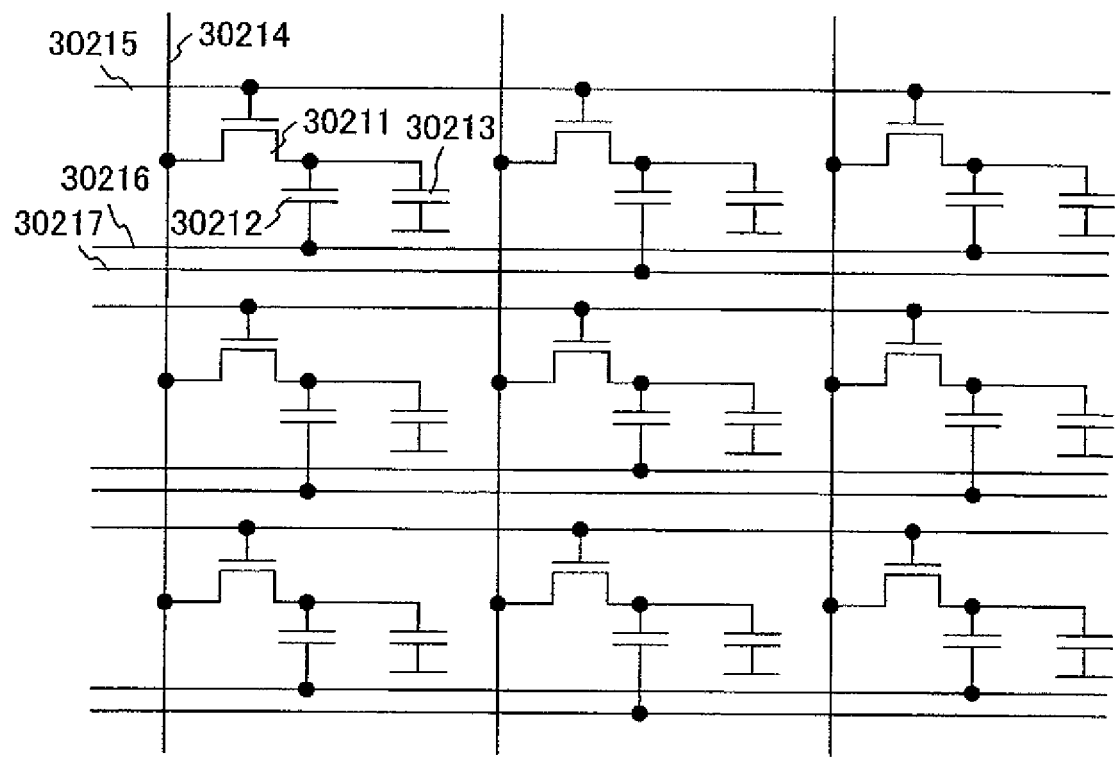

Next, FIG. 89B illustrates a plurality of pixel circuits in which two common lines are provided with respect to one scan line in a display device using a display element which has capacitive properties like a liquid crystal element. Each of the pixel circuits illustrated in FIG. 89B includes a transistor 30211, an auxiliary capacitor 30212, a display element 30213, a video signal line 30214, a scan line 30215, a first common line 30216, and a second common line 30217.

A gate electrode of the transistor 30211 is electrically connected to the scan line 30215; one of a source electrode and a drain electrode of the transistor 30211 is electrically connected to the video signal line 30214; and the other of the source electrode and the drain electrode of the transistor 30211 is electrically connected to one of electrodes of the auxiliary capacitor 30212 and one of electrodes of the display element 30213. In addition, the other of the electrodes of the auxiliary capacitor 30212 is electrically connected to the first common line 30216. Further, in a pixel which is adjacent to the pixel, the other of the electrodes of the auxiliary capacitor 30212 is electrically connected to the second common line 30217.

In the display device shown in FIG. 89B, the number of pixel circuits which are electrically connected to one common line is smaller. Therefore, by changing a potential of the first common line 30216 or the second common line 30217 instead of writing a video signal through the video signal line 30214, frequency of changing voltage applied to the display element 30213 is significantly increased. In addition, source inversion driving or dot inversion driving can be performed. By performing source inversion driving or dot inversion driving, reliability of the element can be improved and a flicker can be suppressed.

Figure 90A:
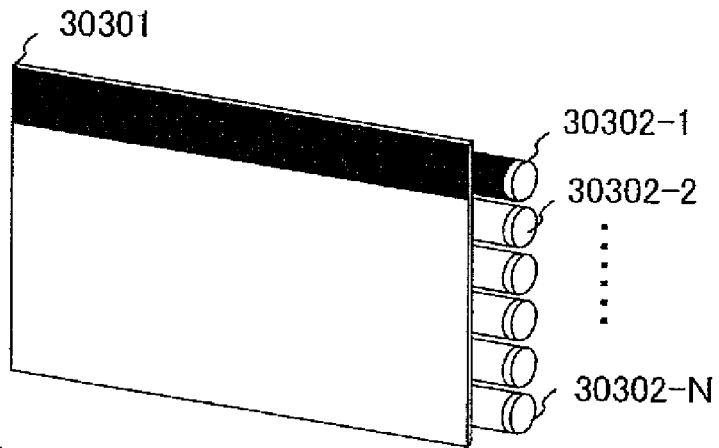
FIGS. 90A to 90C are diagrams illustrating a method for driving a semiconductor device according to the present invention.
Figure 90B:
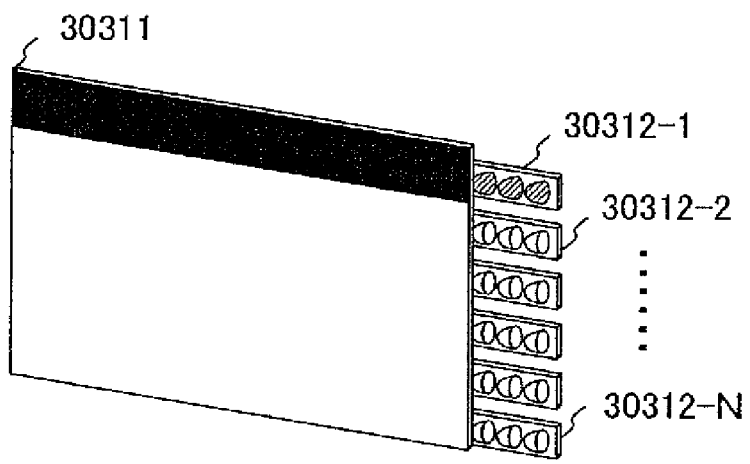

Next, a scanning backlight is described with reference to FIGS. 90A to 90C. FIG. 90A is a view showing a scanning backlight in which cold cathode tubes are apposed. The scanning backlight shown in FIG. 90A includes a diffusion plate 30301 and N pieces of cold cathode tubes 30302-1 to 30302-N. The N pieces of the cold cathode tubes 30302-1 to 30302-N are apposed behind the diffusion plate 30301, so that the N pieces of the cold cathode tubes 30302-1 to 30302-N can be scanned while luminances thereof are changed.

Change in luminance of each of the cold cathode tubes in scanning is described with reference to FIG. 90C. First, luminance of the cold cathode tube 30302-1 is changed for a certain period. After that, luminance of the cold cathode tube 30302-2 which is provided adjacent to the cold cathode tube 30302-1 is changed for the same length of period. In this manner, luminance is changed sequentially from the cold cathode tube 30302-1 to the cold cathode tube 30302-N. Although luminance which is changed for a certain period is set to be lower than original luminance in FIG. 90C, it may also be higher than original luminance. In addition, although scanning is performed from the cold cathode tube 30302-1 to the cold cathode tube 30302-N, scanning may alternatively be performed from the cold cathode tube 30302-N to the cold cathode tube 30302-1, which is in a reversed order.

Figure 90C:
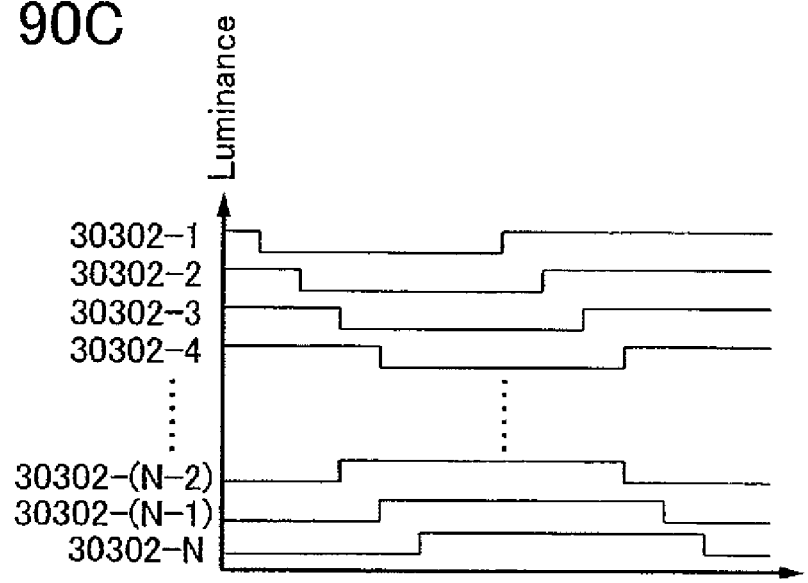

By performing driving as in FIG. 90C, average luminance of the backlight can be decreased. Therefore, power consumption of the backlight, which makes up a major part of power consumption of the liquid crystal display device, can be reduced.

Note that an LED may be used as a light source of the scanning backlight. The scanning backlight in that case is as shown in FIG. 90B. The scanning backlight shown in FIG. 90B includes a diffusion plate 30311 and light sources 30312-1 to 30312-N in each of which LEDs are apposed. When an LED is used as the light source of the scanning backlight, there is an advantage in that the backlight can be thin and lightweight. In addition, there is another advantage in that a color reproduction range can be widened. Further, since the LEDs which are apposed in each of the light sources 30312-1 to 30312-N can be similarly scanned, a dot-scanning backlight can also be obtained. By using the dot-scanning backlight, image quality of a moving image can be further improved.

Note that when the LED is used as the light source of the backlight, driving can be performed by changing luminance as shown in FIG. 90C.

Figure 91A:
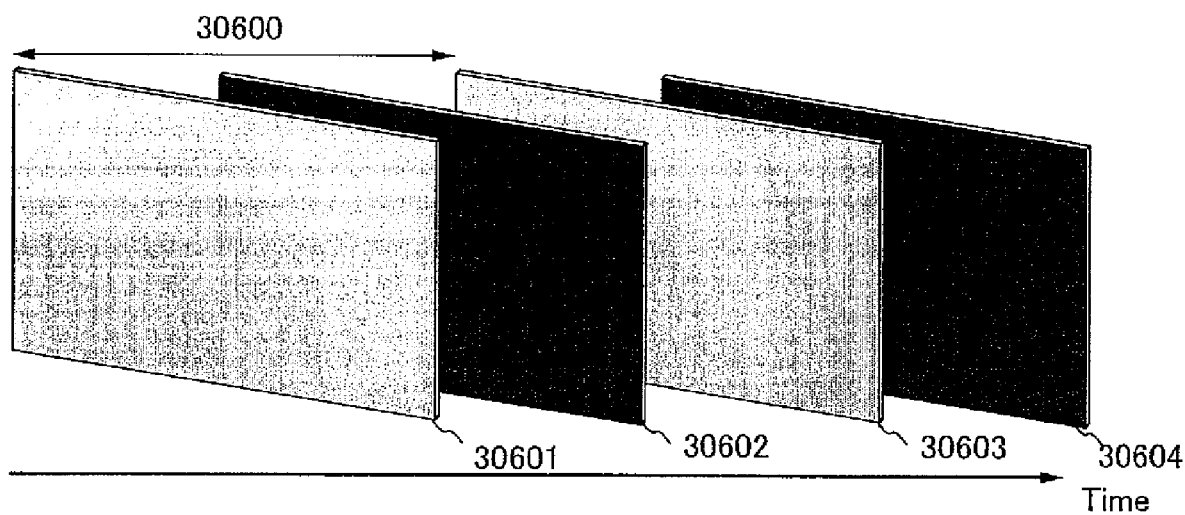
FIGS. 91A and 91B are diagrams illustrating a method for driving a semiconductor device according to the present invention.

Next, high frequency driving is described with reference to FIGS. 91A and 91B. FIG. 91A is a view in which one image and one intermediate image are displayed in one frame period 30600. Reference numeral 30601 denotes an image of the frame; 30602 denotes an intermediate image of the frame; 30603 denotes an image of the next frame; and 30604 denotes an intermediate image of the next frame.

The intermediate image 30602 of the frame may be an image which is made based on video signals of the frame and the next frame. Alternatively, the intermediate image 30602 of the frame may be an image which is made from the image 30601 of the frame. Further alternatively, the intermediate image 30602 of the frame may be a black image. Thus, image quality of a moving image of a hold-type display device can be improved. When one image and one intermediate image are displayed in the one frame period 30600, there is an advantage in that consistency with a frame rate of the video signal can be easily obtained and an image processing circuit is not complicated.

Figure 91B:
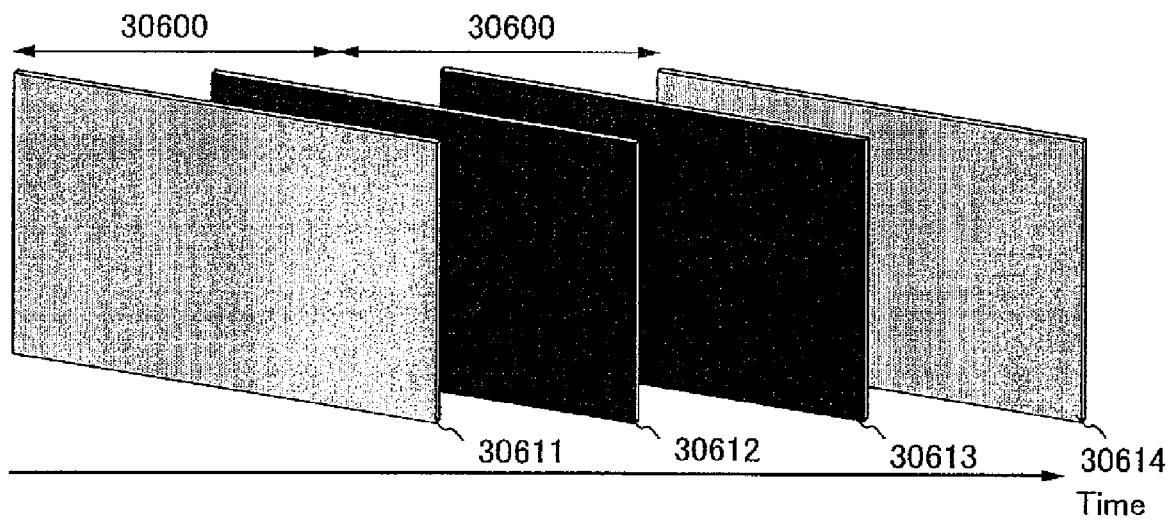

FIG. 91B is a view in which one image and two intermediate images are displayed in a period with two successive one frame periods 30600 (i.e., two frame periods). Reference numeral 30611 denotes an image of the frame; 30612 denotes an intermediate image of the frame; 30613 denotes an intermediate image of the next frame; and 30614 denotes an image of a frame after next.

Each of the intermediate image 30612 of the frame and the intermediate image 30613 of the next frame may be an image which is made based on video signals of the frame, the next frame, and the frame after next. Alternatively, each of the intermediate image 30612 of the frame and the intermediate image 30613 of the next frame may be a black image. When one image and two intermediate images are displayed in the two frame periods, there is an advantage in that operating frequency of a peripheral driver circuit does not need to be so high to effectively improve image quality of a moving image.

Although this embodiment mode has been described with reference to various drawings, the contents (Or part of the contents) described in each drawing can be freely applied to, combined with, or replaced with the contents (or part of contents) described in another drawing. Further, much more drawings can be formed by combining each part in the above-described drawings with another part.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in the drawings in this embodiment mode with part of another embodiment mode.

Note that this embodiment mode has described just examples of embodying, slightly transforming, modifying, improving, describing in detail, or applying the contents (or part of the contents) described in other embodiment modes, an example of related part thereof, or the like. Therefore, the contents described in other embodiment modes can be freely applied to, combined with, or replaced with the contents described in this embodiment mode.

Embodiment Mode 11

Embodiment Mode 11 will describe a peripheral portion of a liquid crystal panel.

Figure 55:
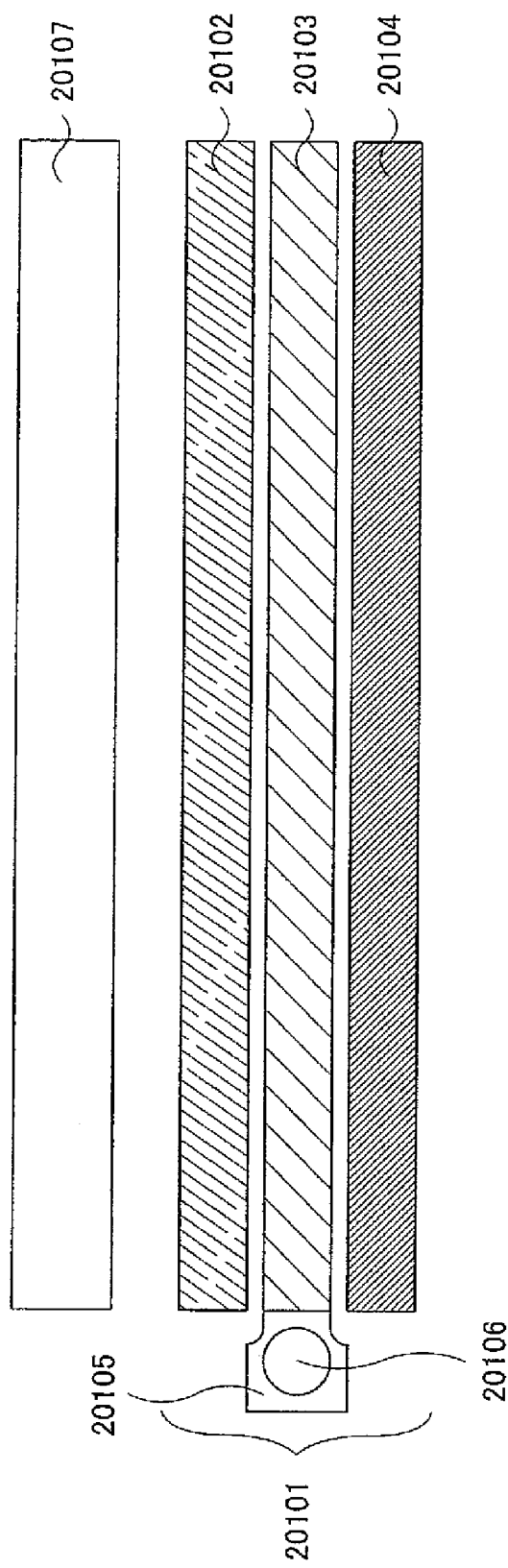
FIG. 55 is a diagram illustrating peripheral components of a semiconductor device according to the present invention.

FIG. 55 illustrates an example of a liquid crystal display device including a so-called edge-light type backlight unit 20101 and a liquid crystal panel 20107. An edge-light type corresponds to a type in which a light source is provided at an end portion of a backlight unit and fluorescence of the light source is emitted from the entire light-emitting surface. The edge-light type backlight unit 20101 is thin and can save power.

The backlight unit 20101 includes a diffusion plate 20102, a light guide plate 20103, a reflection plate 20104, a lamp reflector 20105, and a light source 20106.

The light source 20106 has a function of emitting light as necessary. For example, as the light source 20106, a cold cathode tube, a hot cathode tube, a light-emitting diode, an inorganic EL element, an organic EL element, or the like can be used.

FIGS. 56A to 56D each illustrate a detailed structure of the edge-light type backlight unit. Note that description of a diffusion plate, a light guide plate, a reflection plate, and the like is omitted.

Figure 56A:
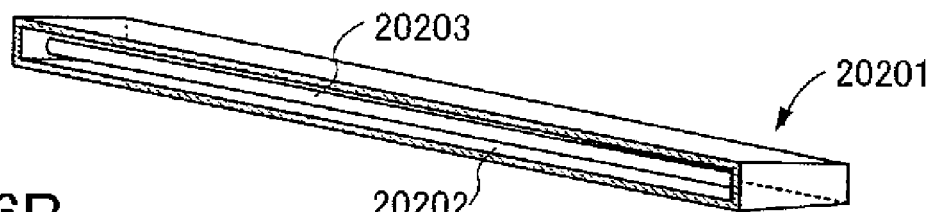
FIGS. 56A to 56D are diagrams illustrating peripheral components of a semiconductor device according to the present invention.

A backlight unit 20201 shown in FIG. 56A has a structure in which a cold cathode tube 20203 is used as a light source. In addition, a lamp reflector 20202 is provided to efficiently reflect light from the cold cathode tube 20203. Such a structure is often used for a large-scale display device because luminance from the cold cathode tube 20203 is high.

Figure 56B:
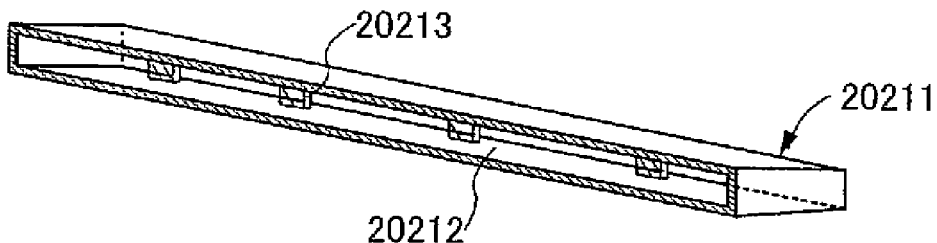

A backlight unit 20211 shown in FIG. 56B has a structure in which light-emitting diodes (LEDs) 20213 are used as light sources. For example, the light-emitting diodes (LEDs) 20213 which emit white light are provided with a predetermined interval therebetween. In addition, a lamp reflector 20212 is provided to efficiently reflect light from the light-emitting diodes (LEDs) 20213.

Figure 56C:
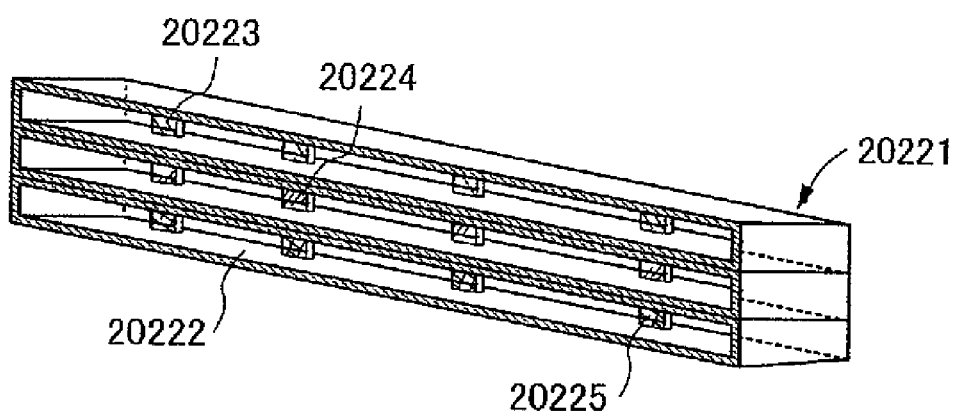

A backlight unit 20221 shown in FIG. 56C has a structure in which light-emitting diodes (LEDs) 20223, light-emitting diodes (LEDs) 20224, and light-emitting diodes (LEDs) 20225 of R, G, and B are used as light sources. The light-emitting diodes (LEDs) 20223, the light-emitting diodes (LEDs) 20224, and the light-emitting diodes (LEDs) 20225 of R, Q and B are each provided with a predetermined interval therebetween. By using the light-emitting diodes (LEDs) 20223, the light-emitting diodes (LEDs) 20224, and the light-emitting diodes (LEDs) 20225 of R, G and B, color reproductivity can be improved. In addition, a lamp reflector 20222 is provided to efficiently reflect light from the light-emitting diodes.

Figure 56D:
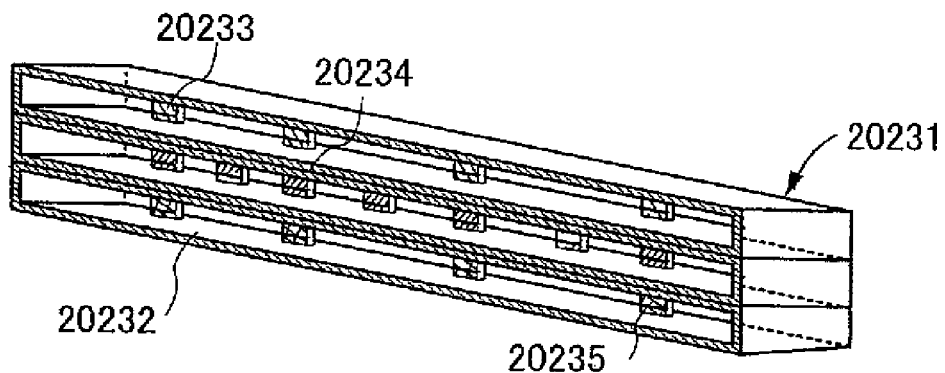

A backlight unit 20231 shown in FIG. 56D has a structure in which light-emitting diodes (LEDs) 20233, light-emitting diodes (LEDs) 20234, and light-emitting diodes (LEDs) 20235 of R, G, and B are used as light sources. For example, among the light-emitting diodes (LEDs) 20233, the light-emitting diodes (LEDs) 20234, and the light-emitting diodes (LEDs) 20235 of R, Q and B, the light-emitting diodes of a color with low emission intensity (e.g., green) are provided more than other light-emitting diodes. By using the light-emitting diodes (LEDs) 20233, the light-emitting diodes (LEDs) 20234, and the light-emitting diodes (LEDs) 20235 of R, G, and B, color reproductivity can be improved. In addition, a lamp reflector 20232 is provided to efficiently reflect light from the light-emitting diodes.

Figure 59:
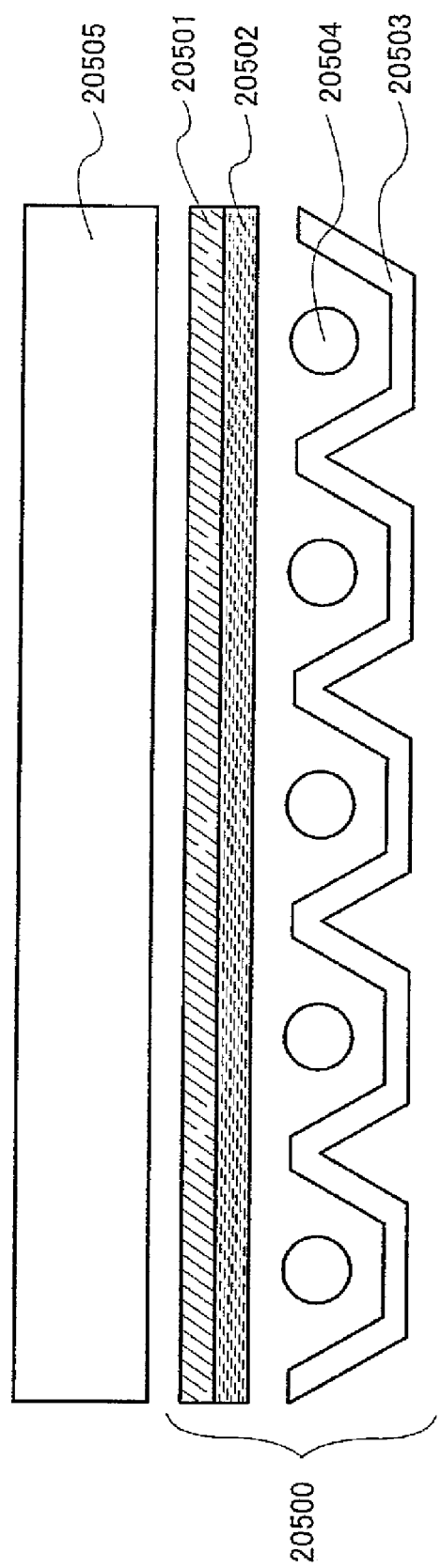
FIG. 59 is a diagram illustrating peripheral components of a semiconductor device according to the present invention.

FIG. 59 illustrates an example of a liquid crystal display device including a so-called direct-type backlight unit and a liquid crystal panel. A direct-type corresponds to a type in which a light source is provided directly below a light-emitting surface and fluorescence of the light source is emitted from the entire light-emitting surface. The direct-type backlight unit can efficiently utilize emitted light quantity.

A backlight unit 20500 includes a diffusion plate 20501, a light-shielding plate 20502, a lamp reflector 20503, a light source 20504, and a liquid crystal panel 20505.

The light source 20504 has a function of emitting light as necessary. For example, as the light source 20504, a cold cathode tube, a hot cathode tube, a light-emitting diode, an inorganic EL element, an organic EL element, or the like can be used.

Figure 57:
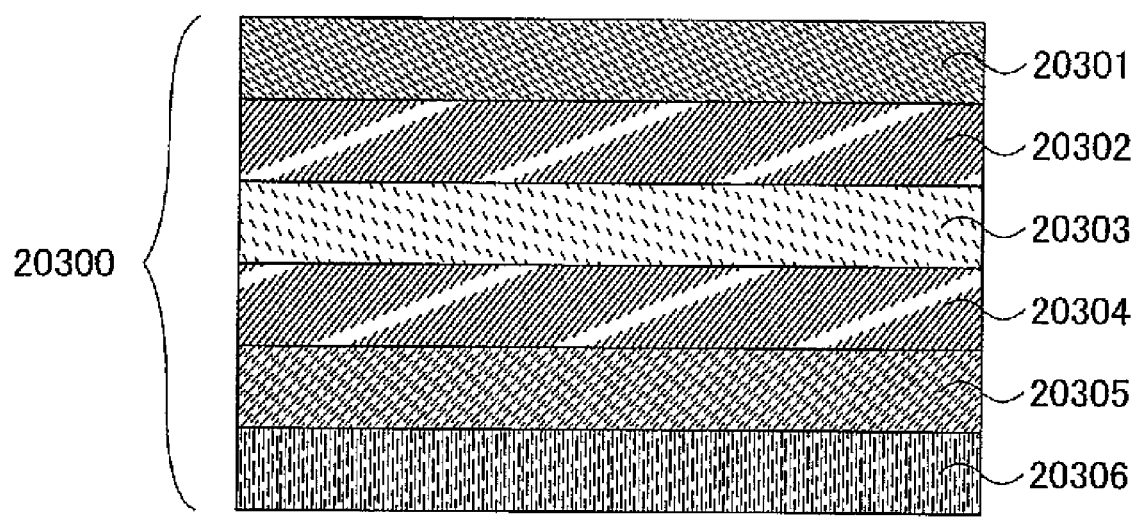
FIG. 57 is a diagram illustrating a peripheral component of a semiconductor device according to the present invention.

FIG. 57 is a view showing an example of a structure of a polarizing plate (also referred to as a polarizing film).

A polarizing film 20300 includes a protective film 20301, a substrate film 20302, a PVA polarizing film 20303, a substrate film 20304, an adhesive layer 20305, and a release film 20306.

When the PVA polarizing film 20303 is sandwiched between films serving as substrates (the substrate film 20302 and the substrate film 20304), reliability can be improved. Note that the PVA polarizing film 20303 may be sandwiched between triacetylcellulose (TAC) films with high transparency and high durability. Note also that each of the substrate films and the TAC films function as protective films of a polarizer included in the PVA polarizing film 20303.

The adhesive layer 20305 which is to be attached to a glass substrate of the liquid crystal panel is attached to one of the substrate films (the substrate film 20304). Note that the adhesive layer 20305 is formed by applying an adhesive to one of the substrate films (the substrate film 20304). The adhesive layer 20305 is provided with the release film 20306 (a separate film).

The other of the substrate films (the substrate film 20302) is provided with the protective film 20301.

A hard coating scattering layer (an anti-glare layer) may be provided on a surface of the polarizing film 20300. Since the surface of the hard coating scattering layer has minute unevenness formed by AG treatment and has an anti-glare function which scatters external light, reflection of external light in the liquid crystal panel and surface reflection can be prevented.

Note also that a plurality of optical thin film layers having different refractive indexes may be layered on the surface of the polarizing film 20300 (also referred to as anti-reflection treatment or AR treatment). The plurality of layered optical thin film layers having different refractive indexes can reduce reflectivity on the surface by an interference effect of light.

Figure 58A:
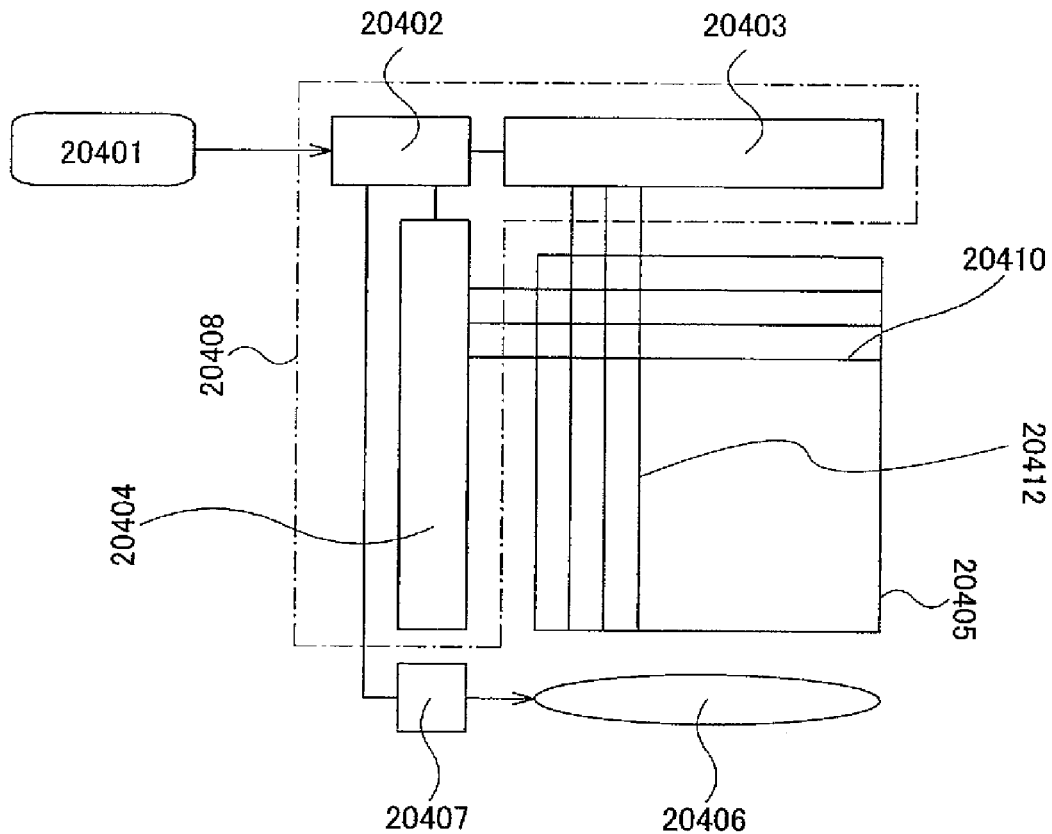
FIGS. 58A to 58C are diagrams illustrating peripheral circuit structures of a semiconductor device according to the present invention.
Figure 58B:
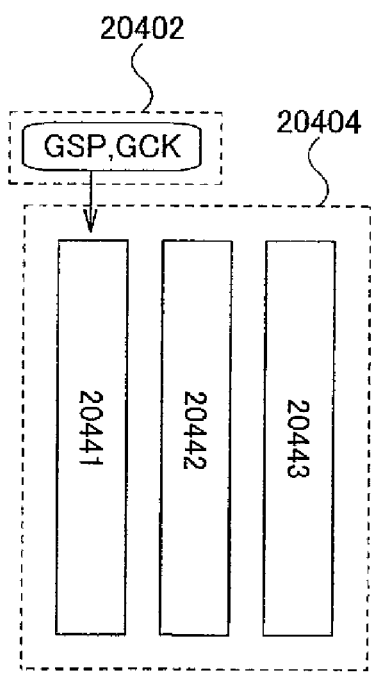
Figure 58C:
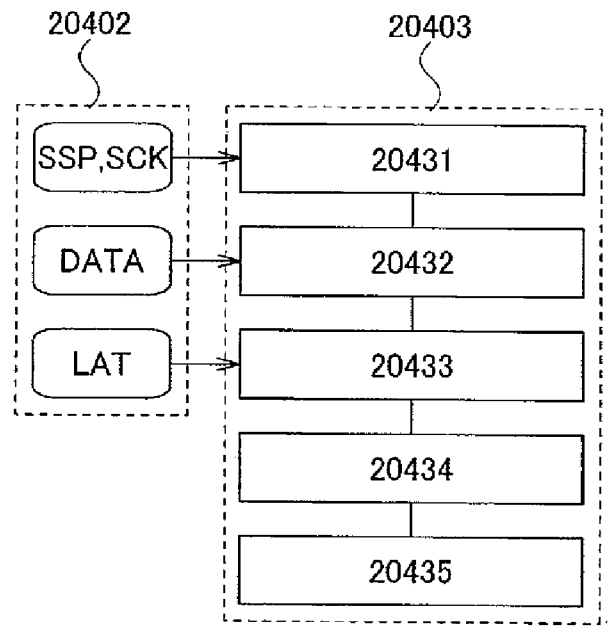

FIGS. 58A to 58C are diagrams each illustrating an example of a system block of the liquid crystal display device.

In a pixel portion 20405, signal lines 20412 which are extended from a signal line driver circuit 20403 are provided. In the pixel portion 20405, scan lines 20410 which are extended from a scan line driver circuit 20404 are also provided. In addition, a plurality of pixels are disposed in matrix at intersection portions of the signal lines 20412 and the scan lines 20410. Note that each of the plurality of pixels includes a switching element. Therefore, voltage for controlling inclination of liquid crystal molecules can be individually input to each of the plurality of pixels. A structure in which a switching element is provided at each intersection portion in this manner is referred to as an active matrix type. Note also that the present invention is not limited to such an active matrix type and a structure of a passive matrix type may be used. Since the passive matrix type does not have a switching element in each pixel, a process is simple.

A driver circuit portion 20408 includes a control circuit 20402, the signal line driver circuit 20403, and the scan line driver circuit 20404. A video signal 20401 is input to the control circuit 20402. The control circuit 20402 controls the signal line driver circuit 20403 and the scan line driver circuit 20404 in accordance with the video signal 20401. Therefore, the control circuit 20402 inputs a control signal to each of the signal line driver circuit 20403 and the scan line driver circuit 20404. Then, the signal line driver circuit 20403 inputs a video signal to each of the signal lines 20412 and the scan line driver circuit 20404 inputs a scan signal to each of the scan lines 20410. Then, the switching element included in the pixel is selected in accordance with the scan signal and the video signal is input to a pixel electrode of the pixel.

Note that the control circuit 20402 also controls a power source 20407 in accordance with the video signal 20401. The power source 20407 includes a unit for supplying power to a lighting unit 20406. As the lighting unit 20406, an edge-light type backlight unit or a direct-type backlight unit can be used. Note also that a front light may be used as the lighting unit 20406. A front light corresponds to a plate-like lighting unit including a luminous body and a light guiding body, which is attached to the front surface side of a pixel portion and illuminates the whole area. By using such a lighting unit, the pixel portion can be uniformly illuminated with low power consumption.

As shown in FIG. 58B, the scan line driver circuit 20404 includes circuits functioning as a shift register 20441, a level shifter 20442, and a buffer 20443. A signal such as a gate start pulse (GSP) or a gate clock signal (GCK) is input to the shift register 20441.

As shown in FIG. 58C, the signal line driver circuit 20403 includes circuits functioning as a shift register 20431, a first latch 20432, a second latch 20433, a level shifter 20434, and a buffer 20435. The circuit functioning as the buffer 20435 corresponds to a circuit which has a function of amplifying a weak signal and includes an operational amplifier or the like. A signal such as a start pulse (SSP) is input to the level shifter 20434 and data (DATA) such as a video signal is input to the first latch 20432. A latch (LAT) signal can be temporally held in the second latch 20433 and is concurrently input to the pixel portion 20405. This is referred to as line-sequential driving. Therefore, when a pixel performs not line sequential driving but dot-sequential driving, the second latch can be omitted.

Note that in this embodiment mode, various types of liquid crystal panels can be used. For example, a structure in which a liquid crystal layer is sealed between two substrates can be used as a liquid crystal panel. A transistor, a capacitor, a pixel electrode, an alignment film, or the like is formed over one of the substrates. A polarizing plate, a retardation plate, or a prism sheet may be provided on the surface opposite to a top surface of the one of the substrates. A color filter, a black matrix, an opposite electrode, an alignment film, or the like is provided on the other of the substrates. Note that a polarizing plate or a retardation plate may be provided on the surface opposite to a top surface of the other of the substrates. Note also that the color filter and the black matrix may be formed on the top surface of the one of the substrates. Note also that three-dimensional display can be performed by providing a slit (a grid) on the top surface side of the one of the substrates or the surface opposite to the top surface side of the one of the substrates.

Note also that each of the polarizing plate, the retardation plate, and the prism sheet can be provided between the two substrates. Alternatively, each of the polarizing plate, the retardation plate, and the prism sheet can be attached to or unified with one of the two substrates.

Although this embodiment mode has been described with reference to various drawings, the contents (or part of the contents) described in each drawing can be freely applied to, combined with, or replaced with the contents (or part of the contents) described in another drawing. Further, much more drawings can be formed by combining each part in the above-described drawings with another part.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in the drawings in this embodiment mode with part of another embodiment mode.

Note that this embodiment mode has described just examples of embodying, slightly transforming, modifying, improving, describing in detail, or applying the contents (or part of the contents) described in other embodiment modes, an example of related part thereof, or the like. Therefore, the contents described in other embodiment modes can be freely applied to, combined with, or replaced with the contents described in this embodiment mode.

Embodiment Mode 12

Embodiment Mode 12 will describe a pixel structure and an operation of a pixel which can be applied to a liquid crystal display device.

Note that in this embodiment mode, as an operation mode of a liquid crystal element, a TN (Twisted Nematic) mode, an IPS (In-Plane-Switching) mode, an FFS (Fringe Field Switching) mode, an MVA (Multi-domain Vertical Alignment) mode, a PVA (Patterned Vertical Alignment) mode, an ASM (Axially Symmetric aligned Micro-cell) mode, an OCB (Optical Compensated Birefringence) mode, an FLC (Ferroelectric Liquid Crystal) mode, an AFLC (AntiFerroelectric Liquid Crystal) mode, or the like can be used.

Figure 60A:
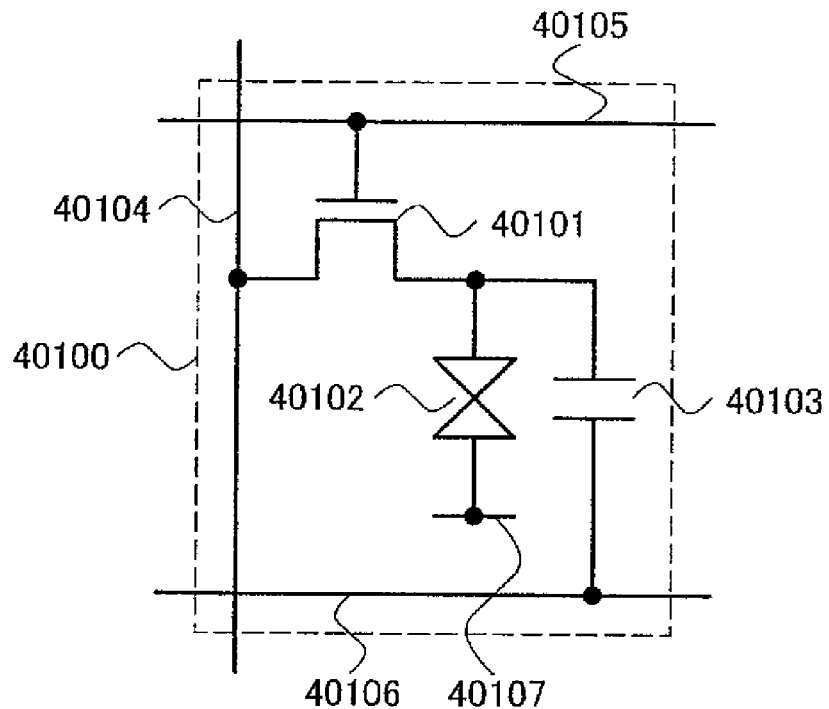
FIGS. 60A and 60B are diagrams illustrating a panel circuit structure of a semiconductor device according to the present invention.

FIG. 60A is a diagram showing an example of a pixel structure which can be applied to the liquid crystal display device.

A pixel 40100 includes a transistor 40101, a liquid crystal element 40102, and a capacitor 40103. A gate of the transistor 40101 is connected to a wiring 40105. A first terminal of the transistor 40101 is connected to a wiring 40104. A second terminal of the transistor 40101 is connected to a first electrode of the liquid crystal element 40102 and a first electrode of the capacitor 40103. A second electrode of the liquid crystal element 40102 corresponds to an opposite electrode 40107. A second electrode of the capacitor 40103 is connected to a wiring 40106.

The wiring 40104 functions as a signal line. The wiring 40105 functions as a scan line. The wiring 40106 functions as a capacitor line. The transistor 40101 functions as a switch. The capacitor 40103 functions as a storage capacitor.

The transistor 40101 may function as a switch, and the transistor 40101 may be a p-channel transistor or an n-channel transistor.

Figure 60B:
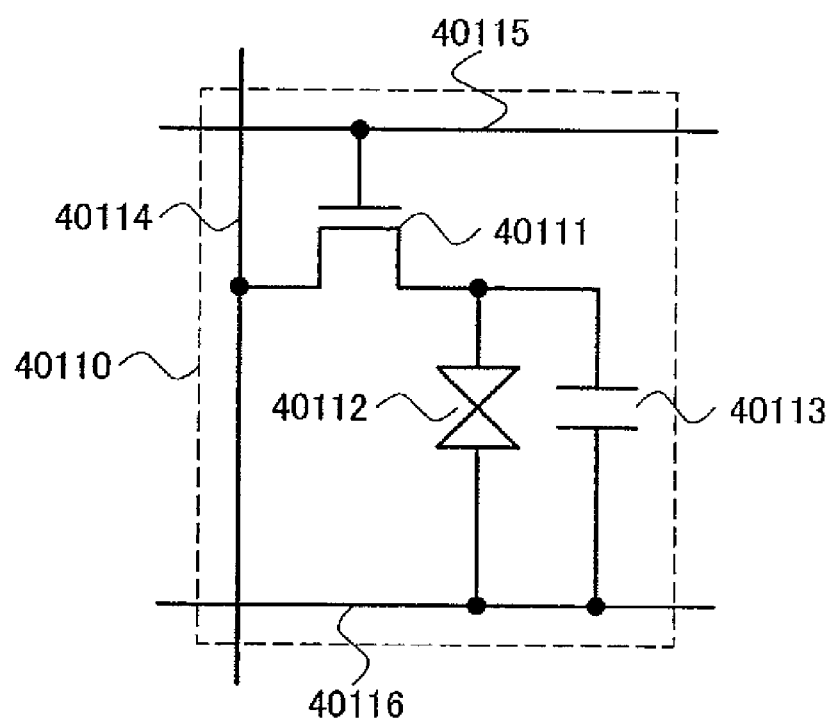

FIG. 60B illustrates an example of a pixel structure which can be applied to the liquid crystal display device. In particular, FIG. 60B is a diagram showing an example of a pixel structure which can be applied to a liquid crystal display device suitable for a lateral electric field-mode (including an IPS-mode and an FFS-mode).

A pixel 40110 includes a transistor 40111, a liquid crystal element 40112, and a capacitor 40113. A gate of the transistor 40111 is connected to a wiring 40115. A first terminal of the transistor 40111 is connected to a wiring 40114. A second terminal of the transistor 40111 is connected to a first electrode of the liquid crystal element 40112 and a first electrode of the capacitor 40113. A second electrode of the liquid crystal element 40112 is connected to a wiring 40116. A second electrode of the capacitor 40113 is connected to the wiring 40116.

The wiring 40114 functions as a signal line. The wiring 40115 functions as a scan line. The wiring 40116 functions as a capacitor line. The transistor 40111 functions as a switch. The capacitor 40113 functions as a storage capacitor.

The transistor 40111 may function as a switch, and the transistor 40111 may be a p-channel transistor or an n-channel transistor.

Figure 61:
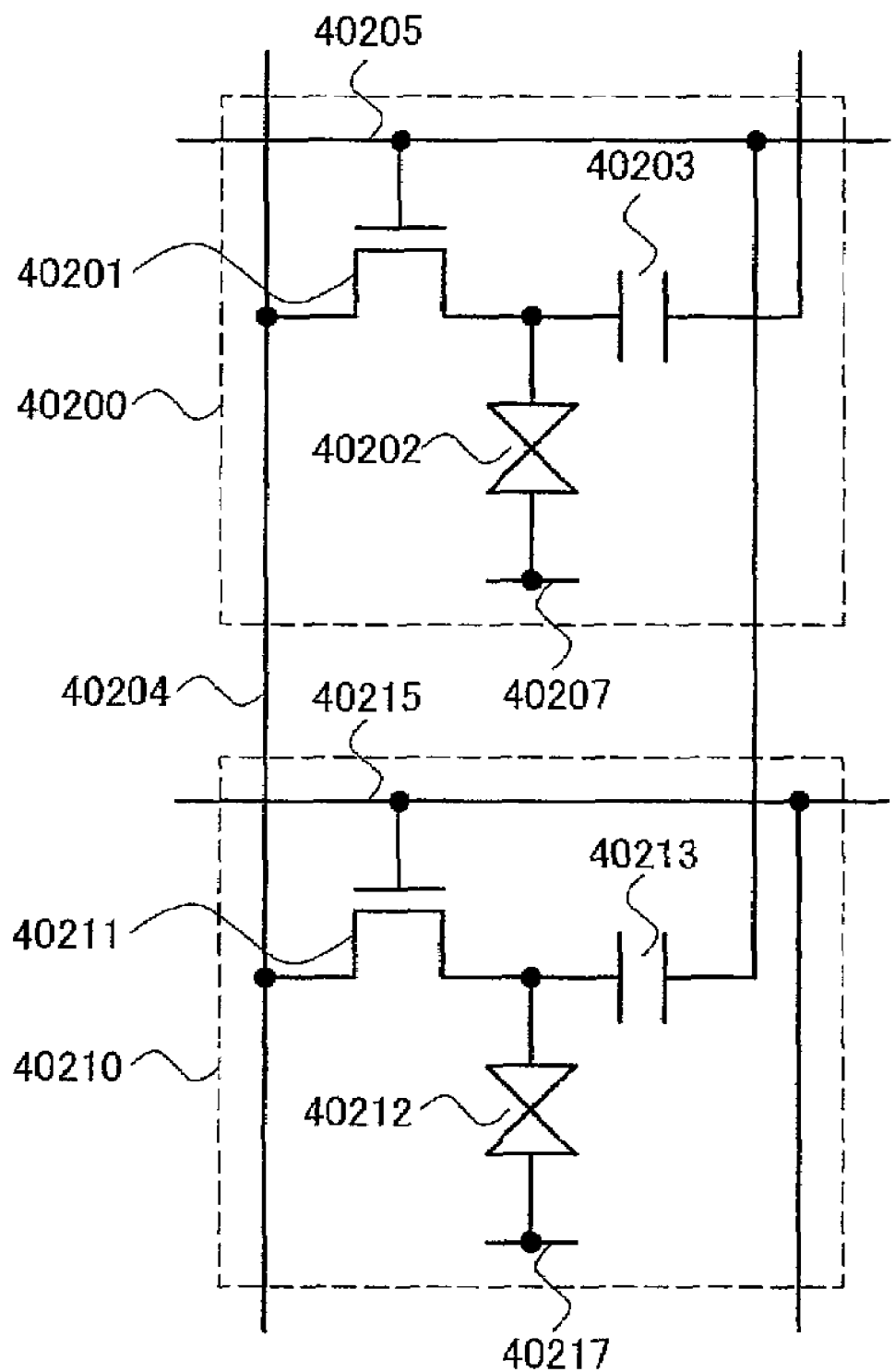
FIG. 61 is a diagram illustrating a panel circuit structure of a semiconductor device according to the present invention.

FIG. 61 illustrates an example of a pixel structure which can be applied to the liquid crystal display device. In particular, FIG. 61 illustrates an example of a pixel structure with which an aperture ratio of a pixel can be increased by reducing the number of wirings.

FIG. 61 illustrates two pixels which are provided in the same column direction (a pixel 40200 and a pixel 40210). For example, when the pixel 40200 is provided at the N-th row, the pixel 40210 is provided at the (N+1)th row.

The pixel 40200 includes a transistor 40201, a liquid crystal element 40202, and a capacitor 40203. A gate of the transistor 40201 is connected to a wiring 40205. A first terminal of the transistor 40201 is connected to a wiring 40204. A second terminal of the transistor 40201 is connected to a first electrode of the liquid crystal element 40202 and a first electrode of the capacitor 40203. A second electrode of the liquid crystal element 40202 corresponds to an opposite electrode 40207. A second electrode of the capacitor 40203 is connected to the same wiring as a gate of a transistor of the previous row.

The pixel 40210 includes a transistor 40211, a liquid crystal element 40212, and a capacitor 40213. A gate of the transistor 40211 is connected to a wiring 40215. A first terminal of the transistor 40211 is connected to the wiring 40204. A second terminal of the transistor 40211 is connected to a first electrode of the liquid crystal element 40212 and a first electrode of the capacitor 40213. A second electrode of the liquid crystal element 40212 corresponds to an opposite electrode 40217. A second electrode of the capacitor 40213 is connected to the same wiring (the wiring 40205) as the gate of the transistor of the previous row.

The wiring 40204 functions as a signal line. The wiring 40205 functions as a scan line of the N-th row. The wiring 40205 also functions as a capacitor line of the (N+1)th row. The transistor 40201 functions as a switch. The capacitor 40203 functions as a storage capacitor.

The wiring 40215 functions as a scan line of the (N+1)th row. The wiring 40215 also functions as a capacitor line of an (N+2)th row. The transistor 40211 functions as a switch. The capacitor 40213 functions as a storage capacitor.

Each of the transistor 40201 and the transistor 40211 may function as a switch, and each of the transistor 40201 and the transistor 40211 may be a p-channel transistor or an n-channel transistor.

Figure 62:
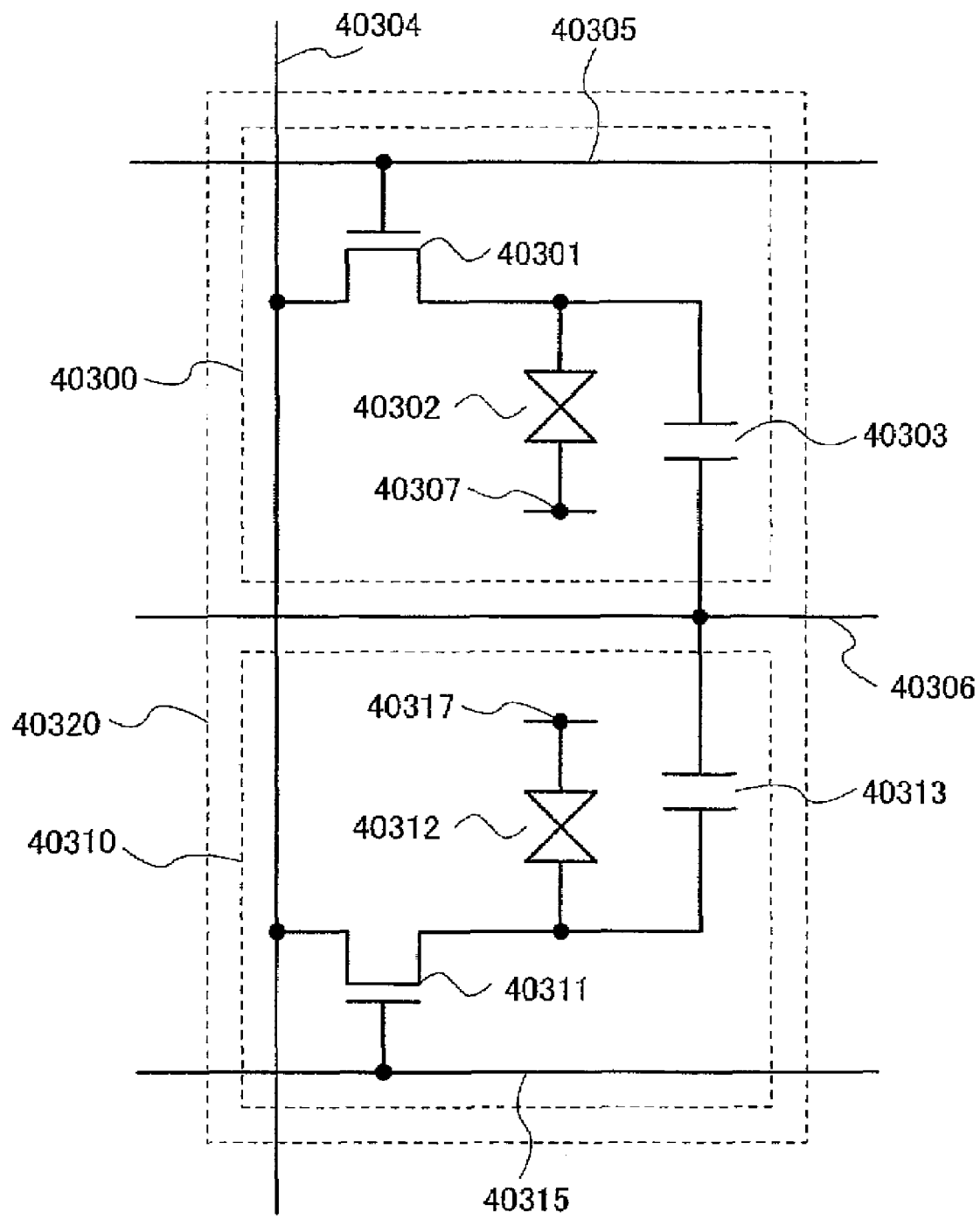
FIG. 62 is a diagram illustrating a panel circuit structure of a semiconductor device according to the present invention.

FIG. 62 illustrates an example of a pixel structure which can be applied to the liquid crystal display device. In particular, FIG. 62 illustrates an example of a pixel structure with which a viewing angle can be improved by using a subpixel.

A pixel 40320 includes a subpixel 50300 and a subpixel 40310. Although a case where the pixel 40320 includes two subpixels is described, the pixel 40320 may include three or more subpixels.

The subpixel 40300 includes a transistor 40301, a liquid crystal element 40302, and a capacitor 40303. A gate of the transistor 40301 is connected to a wiring 40305. A first terminal of the transistor 40301 is connected to a wiring 40304. A second terminal of the transistor 40301 is connected to a first electrode of the liquid crystal element 40302 and a first electrode of the capacitor 40303. A second electrode of the liquid crystal element 40302 corresponds to an opposite electrode 40307. A second electrode of the capacitor 40303 is connected to a wiring 40306.

The subpixel 40310 includes a transistor 40311, a liquid crystal element 40312, and a capacitor 40313. A gate of the transistor 40311 is connected to a wiring 40315. A first terminal of the transistor 40311 is connected to the wiring 40304. A second terminal of the transistor 40311 is connected to a first electrode of the liquid crystal element 40312 and a first electrode of the capacitor 40313. A second electrode of the liquid crystal element 40312 corresponds to an opposite electrode 40317. A second electrode of the capacitor 40313 is connected to the wiring 40306.

The wiring 40304 functions as a signal line. The wiring 40305 functions as a scan line. The wiring 40315 functions as a signal line. The wiring 40306 functions as a capacitor line. The transistor 40301 functions as a switch. The transistor 40311 functions as a switch. The capacitor 40303 functions as a storage capacitor. The capacitor 40313 functions as a storage capacitor.

The transistor 40301 may function as a switch, and the transistor 40301 may be a p-channel transistor or an n-channel transistor. The transistor 40311 may function as a switch, and the transistor 40311 may be a p-channel transistor or an n-channel transistor.

A video signal input to the subpixel 40300 may be a value which is different from that of a video signal input to the subpixel 40310. In this case, the viewing angle can be widened because alignment of liquid crystal molecules of the liquid crystal element 40302 and alignment of liquid crystal molecules of the liquid crystal element 40312 can be varied from each other.

Although this embodiment mode has been described with reference to various drawings, the contents (or part of the contents) described in each drawing can be freely applied to, combined with, or replaced with the contents (or part of the contents) described in another drawing. Further, much more drawings can be formed by combining each part in the above-described drawings with another part.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in the drawings in this embodiment mode with part of another embodiment mode.

Note that this embodiment mode has described just examples of embodying, slightly transforming, modifying, improving, describing in detail, or applying the contents (or part of the contents) described in other embodiment modes, an example of related part thereof, or the like. Therefore, the contents described in other embodiment modes can be freely applied to, combined with, or replaced with the contents described in this embodiment mode.

Embodiment Mode 13

This embodiment mode describes various liquid crystal modes.

First, various liquid crystal modes are described with reference to cross-sectional views.

Figure 63A:
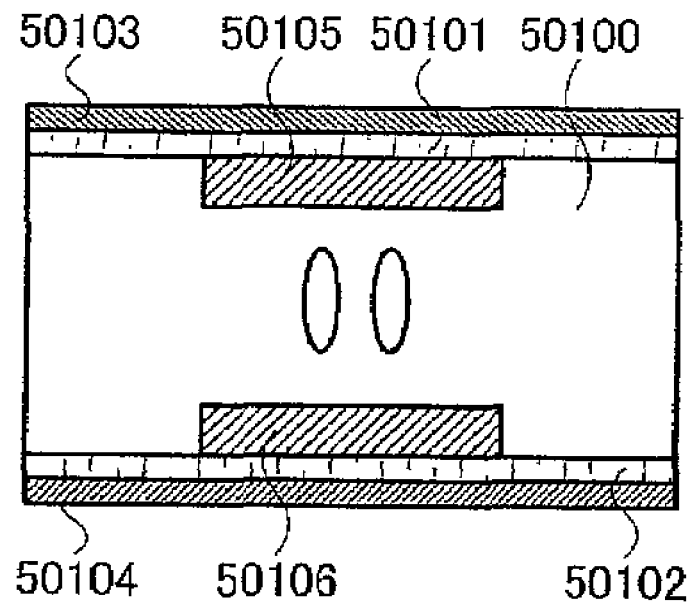
FIGS. 63A and 63B are cross-sectional views of display elements of a semiconductor device according to the present invention.
Figure 63B:
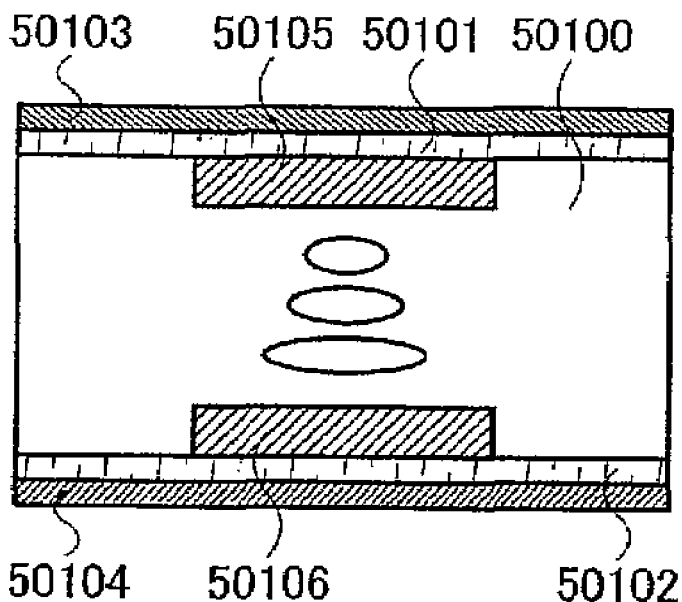

FIGS. 63A and 63B are schematic views of cross sections of a TN mode.

A liquid crystal layer 50100 is sandwiched between a first substrate 50101 and a second substrate 50102 which are arranged to be opposite to each other. A first electrode 50105 is formed on a top surface of the first substrate 50101. A second electrode 50106 is formed on a top surface of the second substrate 50102. A first polarizing plate 50103 is provided on the first substrate 50101 on a side opposite to the liquid crystal layer 50100. A second polarizing plate 50104 is provided on the second substrate 50102 on a side opposite to the liquid crystal layer 50100. Note that the first polarizing plate 50103 and the second polarizing plate 50104 are arranged so as to be in a cross nicol state.

The first polarizing plate 50103 may be provided on the top surface of the first substrate 50101, that is, between the first substrate 50101 and the liquid crystal layer 50100. The second polarizing plate 50104 may be provided on the top surface of the second substrate 50102, that is, between the second substrate 50102 and the liquid crystal layer 50100.

It is only necessary that at least one of the first electrode 50105 and the second electrode 50106 have light-transmitting properties (a transmissive or reflective liquid crystal display device). Alternatively, both the first electrode 50105 and the second electrode 50106 may have light-transmitting properties, and part of one of the electrodes may have reflectivity (a transflective liquid crystal display device).

FIG. 63A is a schematic view of a cross section in the case where voltage is applied to the first electrode 50105 and the second electrode 50106 (referred to as a vertical electric field mode).

FIG. 63B is a schematic view of a cross section in the case where voltage is not applied to the first electrode 50105 and the second electrode 50106.

Figure 64A:
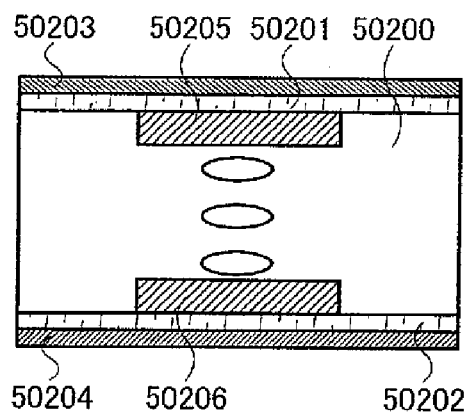
FIGS. 64A to 64D are cross-sectional views of display elements of a semiconductor device according to the present invention.
Figure 64B:
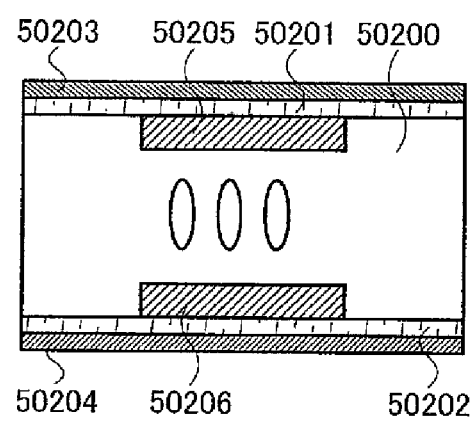

FIGS. 64A and 64B are schematic views of cross sections of a VA mode. In the VA mode, liquid crystal molecules are aligned such that they are vertical to a substrate when there is no electric field.

A liquid crystal layer 50200 is sandwiched between a first substrate 50201 and a second substrate 50202 which are arranged to be opposite to each other. A first electrode 50205 is formed on a top surface of the first substrate 50201. A second electrode 50206 is formed on a top surface of the second substrate 50202. A first polarizing plate 50203 is provided on the first substrate 50201 on a side opposite to the liquid crystal layer 50200. A second polarizing plate 50204 is provided on the second substrate 50202 on a side opposite to the liquid crystal layer 50200. Note that the first polarizing plate 50203 and the second polarizing plate 50204 are arranged so as to be in a cross nicol state.

The first polarizing plate 50203 may be provided on the top surface of the first substrate 50201, that is, between the first substrate 50201 and the liquid crystal layer 50200. The second polarizing plate 50204 may be provided on the top surface of the second substrate 50202, that is, between the second substrate 50202 and the liquid crystal layer 50200.

It is only necessary that at least one of the first electrode 50205 and the second electrode 50206 have light-transmitting properties (a transmissive or reflective liquid crystal display device). Alternatively, both the first electrode 50205 and the second electrode 50206 may have light-transmitting properties, and part of one of the electrodes may have reflectivity (a transflective liquid crystal display device).

FIG. 64A is a schematic view of a cross section in the case where voltage is applied to the first electrode 50205 and the second electrode 50206 (referred to as a vertical electric field mode).

FIG. 64B is a schematic view of a cross section in the case where voltage is not applied to the first electrode 50205 and the second electrode 50206.

Figure 64C:
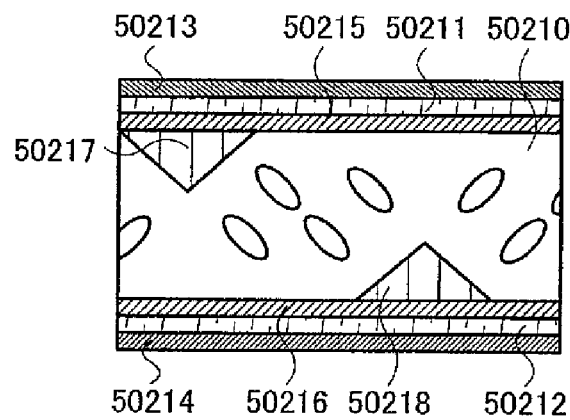
Figure 64D:
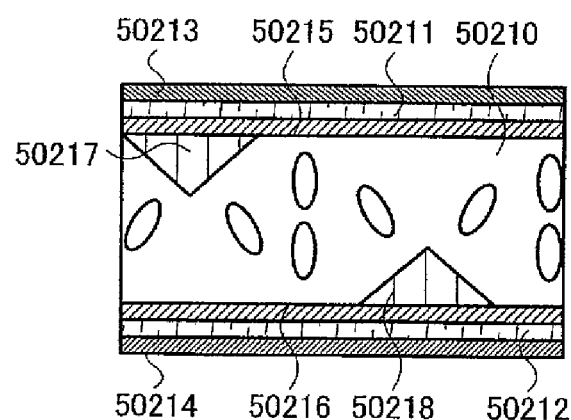

FIGS. 64C and 64D are schematic views of cross sections of an MVA mode. In the MVA mode, viewing angle dependency of each portion is compensated by each other.

A liquid crystal layer 50210 is sandwiched between a first substrate 50211 and a second substrate 50212 which are arranged to be opposite to each other. A first electrode 50215 is formed on a top surface of the first substrate 50211. A second electrode 50216 is formed on a top surface of the second substrate 50212. A first projection 50217 for controlling alignment is formed on the first electrode 50215. A second projection 50218 for controlling alignment is formed over the second electrode 50216. A first polarizing plate 50213 is provided on the first substrate 50211 on a side opposite to the liquid crystal layer 50210. A second polarizing plate 50214 is provided on the second substrate 50212 on a side opposite to the liquid crystal layer 50210. Note that the first polarizing plate 50213 and the second polarizing plate 50214 are arranged so as to be in a cross nicol state.

The first polarizing plate 50213 may be provided on the top surface of the first substrate 50211, that is, between the first substrate 50211 and the liquid crystal layer 50210. The second polarizing plate 50214 may be provided on the top surface of the second substrate 50212, that is, between the second substrate 50212 and the liquid crystal layer 50210.

It is only necessary that at least one of the first electrode 50215 and the second electrode 50216 have light-transmitting properties (a transmissive or reflective liquid crystal display device). Alternatively, both the first electrode 50215 and the second electrode 50216 may have light-transmitting properties, and part of one of the electrodes may have reflectivity (a transflective liquid crystal display device).

FIG. 64C is a schematic view of a cross section in the case where voltage is applied to the first electrode 50215 and the second electrode 50216 (referred to as a vertical electric field mode).

FIG. 64D is a schematic view of a cross section in the case where voltage is not applied to the first electrode 50215 and the second electrode 50216.

Figure 65A:
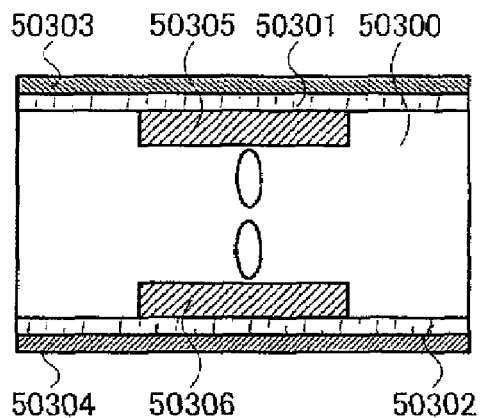
FIGS. 65A to 65D are cross-sectional views of display elements of a semiconductor device according to the present invention.
Figure 65B:
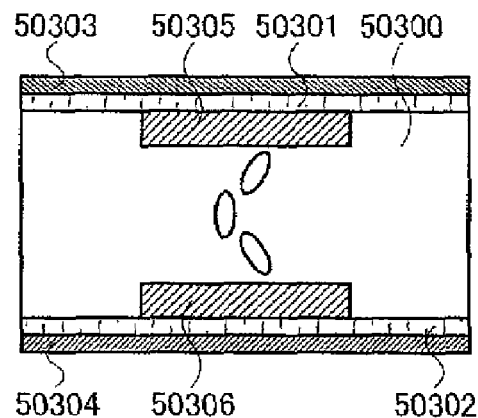

FIGS. 65A and 65B are schematic views of cross sections of an OCB mode. In the OCB mode, viewing angle dependency is low because alignment of liquid crystal molecules in a liquid crystal layer can be optically compensated. This state of the liquid crystal molecules is referred to as bend alignment.

A liquid crystal layer 50300 is sandwiched between a first substrate 50301 and a second substrate 50302 which are arranged to be opposite to each other. A first electrode 50305 is formed on a top surface of the first substrate 50301. A second electrode 50306 is formed on a top surface of the second substrate 50302. A first polarizing plate 50303 is provided on the first substrate 50301 on a side opposite to the liquid crystal layer 50300. A second polarizing plate 50304 is provided on the second substrate 50302 on a side opposite to the liquid crystal layer 50300. Note that the first polarizing plate 50303 and the second polarizing plate 50304 are arranged so as to be in a cross nicol state.

The first polarizing plate 50303 may be provided on the top surface of the first substrate 50301, that is, between the first substrate 50301 and the liquid crystal layer 50300. The second polarizing plate 50304 may be provided on the top surface of the second substrate 50302, that is, between the second substrate 50302 and the liquid crystal layer 50300.

It is only necessary that at least one of the first electrode 50305 and the second electrode 50306 have light-transmitting properties (a transmissive or reflective liquid crystal display device). Alternatively, both the first electrode 50305 and the second electrode 50306 may have light-transmitting properties, and part of one of the electrodes may have reflectivity (a transflective liquid crystal display device).

FIG. 65A is a schematic view of a cross section in the case where voltage is applied to the first electrode 50305 and the second electrode 50306 (referred to as a vertical electric field mode).

FIG. 65B is a schematic view of a cross section in the case where voltage is not applied to the first electrode 50305 and the second electrode 50306.

Figure 65C:
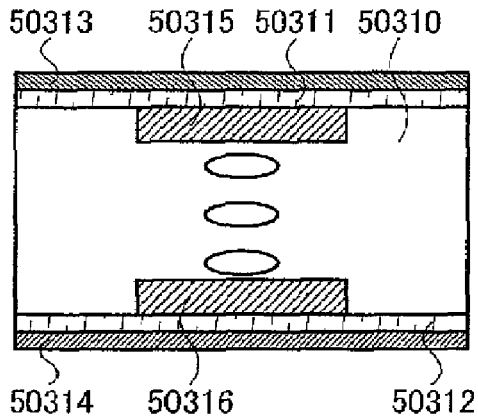
Figure 65D:
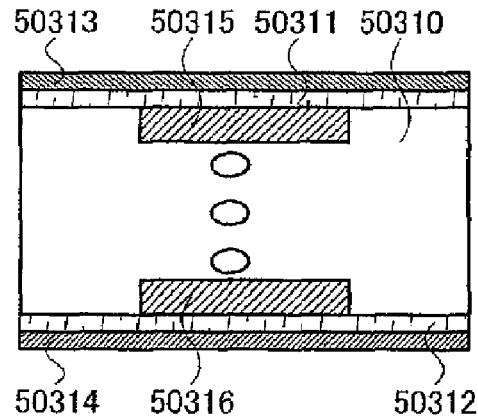

FIGS. 65C and 65D are schematic views of cross sections of an FLC mode or an AFLC mode.

A liquid crystal layer 50310 is sandwiched between a first substrate 50311 and a second substrate 50312 which are arranged to be opposite to each other. A first electrode 50315 is formed on a top surface of the first substrate 50311. A second electrode 50316 is formed on a top surface of the second substrate 50312. A first polarizing plate 50313 is provided on the first substrate 50311 on a side opposite to the liquid crystal layer 50310. A second polarizing plate 50314 is provided on the second substrate 50312 on a side opposite to the liquid crystal layer 50310. Note that the first polarizing plate 50313 and the second polarizing plate 50314 are arranged so as to be in a cross nicol state.

The first polarizing plate 50313 may be provided on the top surface of the first substrate 50311, that is, between the first substrate 50311 and the liquid crystal layer 50310. The second polarizing plate 50314 may be provided on the top surface of the second substrate 50312, that is, between the second substrate 50312 and the liquid crystal layer 50310.

It is only necessary that at least one of the first electrode 50315 and the second electrode 50316 have light-transmitting properties (a transmissive or reflective liquid crystal display device). Alternatively, both the first electrode 50315 and the second electrode 50316 may have light-transmitting properties, and part of one of the electrodes may have reflectivity (a transflective liquid crystal display device).

FIG. 65C is a schematic view of a cross section in the case where voltage is applied to the first electrode 50315 and the second electrode 50316 (referred to as a vertical electric field mode).

FIG. 65D is a schematic view of a cross section in the case where voltage is not applied to the first electrode 50315 and the second electrode 50316.

Figure 66A:
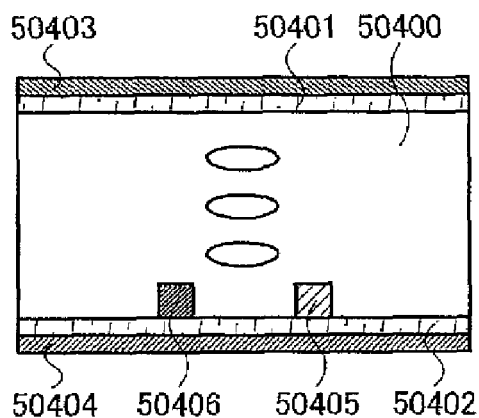
FIGS. 66A to 66D are cross-sectional views of display elements of a semiconductor device according to the present invention.
Figure 66B:
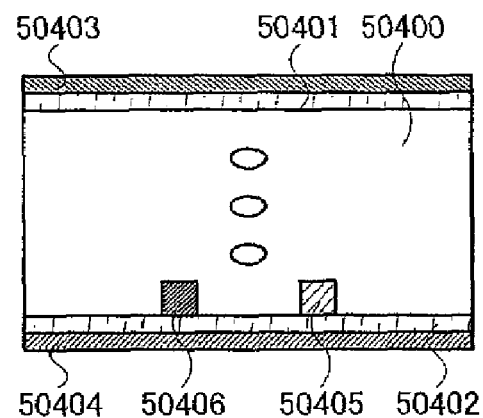

FIGS. 66A and 66B are schematic views of cross sections of an IPS mode. In the IPS mode, alignment of liquid crystal molecules in a liquid crystal layer can be optically compensated, the liquid crystal molecules are constantly rotated in a plane parallel to a substrate, and a horizontal electric field method in which electrodes are provided only on one substrate is used.

A liquid crystal layer 50400 is sandwiched between a first substrate 50401 and a second substrate 50402 which are arranged to be opposite to each other. A first electrode 50405 and a second electrode 50406 are formed on a top surface of the second substrate 50402. A first polarizing plate 50403 is provided on the first substrate 50401 on a side opposite to the liquid crystal layer 50400. A second polarizing plate 50404 is provided on a surface of the second substrate 50402, which does not face the liquid crystal layer 50400. Note that the first polarizing plate 50403 and the second polarizing plate 50404 are arranged so as to be in a cross nicol state.

The first polarizing plate 50403 may be provided on the top surface of the first substrate 50401, that is, between the first substrate 50401 and the liquid crystal layer 50400. The second polarizing plate 50404 may be provided on the top surface of the second substrate 50402, that is, may be provided between the second substrate 50402 and the liquid crystal layer 50400.

It is only necessary that at least one of the first electrode 50405 and the second electrode 50406 have light-transmitting properties (a transmissive or reflective liquid crystal display device). Alternatively, both the first electrode 50405 and the second electrode 50406 may have light-transmitting properties, and part of one of the electrodes may have reflectivity (a transflective liquid crystal display device).

FIG. 66A is a schematic view of a cross section in the case where voltage is applied to the first electrode 50405 and the second electrode 50406 (referred to as a vertical electric field mode).

FIG. 66B is a schematic view of a cross section in the case where voltage is not applied to the first electrode 50405 and the second electrode 50406.

Figure 66C:
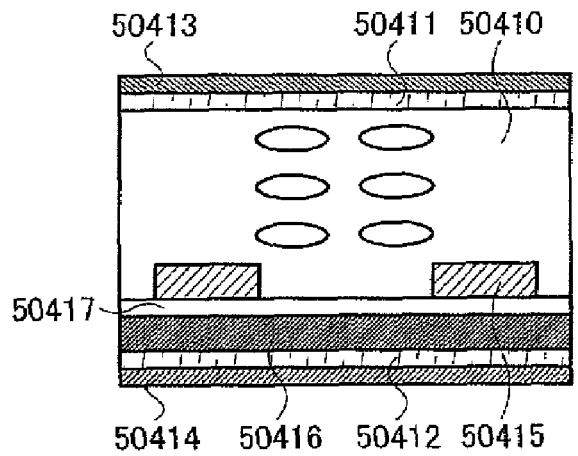
Figure 66D:
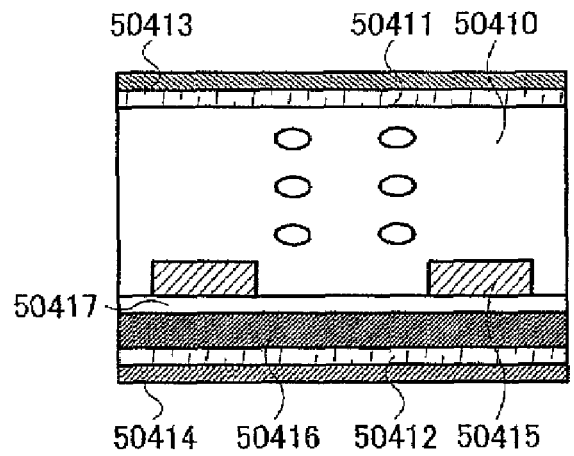

FIGS. 66C and 66D are schematic views of cross sections of an FFS mode. In the FFS mode, alignment of liquid crystal molecules in a liquid crystal layer can be optically compensated, the liquid crystal molecules are constantly rotated in a plane parallel to a substrate, and a horizontal electric field method in which electrodes are provided only on one substrate is used.

A liquid crystal layer 50410 is sandwiched between a first substrate 50411 and a second substrate 50412 which are arranged to be opposite to each other. A second electrode 50416 is formed on a top surface of the second substrate 50412. An insulating film 50417 is formed on a top surface of the second electrode 50416. A first electrode 50415 is formed over the insulating film 50417. A first polarizing plate 50413 is provided on the first substrate 50411 on a side opposite to the liquid crystal layer 50410. A second polarizing plate 50414 is provided on the second substrate 50412 on a side opposite to the liquid crystal layer 50410. Note that the first polarizing plate 50413 and the second polarizing plate 50414 are arranged so as to be in a cross nicol state.

The first polarizing plate 50413 may be provided on the top surface of the first substrate 50411, that is, between the first substrate 50411 and the liquid crystal layer 50410. The second polarizing plate 50414 may be provided on the top surface of the second substrate 50412, that is, may be provided between the second substrate 50412 and the liquid crystal layer 50410.

It is only necessary that at least one of the first electrode 50415 and the second electrode 50416 have light-transmitting properties (a transmissive or reflective liquid crystal display device). Alternatively, both the first electrode 50415 and the second electrode 50416 may have light-transmitting properties, and part of one of the electrodes may have reflectivity (a transflective liquid crystal display device).

FIG. 66C is a schematic view of a cross section in the case where voltage is applied to the first electrode 50415 and the second electrode 50416 (referred to as a vertical electric field mode).

FIG. 66D is a schematic view of a cross section in the case where voltage is not applied to the first electrode 50415 and the second electrode 50416.

Although this embodiment mode has been described with reference to various drawings, the contents (or part of the contents) described in each drawing can be freely applied to, combined with, or replaced with the contents (or part of the contents) described in another drawing. Further, much more drawings can be formed by combining each part in the above-described drawings with another part.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in the drawings in this embodiment mode with part of another embodiment mode.

Note that this embodiment mode has described just examples of embodying, slightly transforming, modifying, improving, describing in detail, or applying the contents (or part of the contents) described in other embodiment modes, an example of related part thereof, or the like. Therefore, the contents described in other embodiment modes can be freely applied to, combined with, or replaced with the contents described in this embodiment mode.

Embodiment Mode 14

This embodiment mode describes a pixel structure of a display device. In particular, it describes a pixel structure of a liquid crystal display device.

Pixel structures in the case where each liquid crystal mode and a transistor are combined are described with reference to cross-sectional views of pixels.

As the transistor, a thin film transistor (TFT) including a non-single crystalline semiconductor layer typified by amorphous silicon, polycrystalline silicon, microcrystalline (also referred to as semi-amorphous) silicon, or the like can be used.

The transistor can have a top-gate structure, a bottom-gate structure, or the like. Note that the bottom-gate transistor can be a channel-etched transistor, a channel-protective transistor, or the like.

Figure 67:
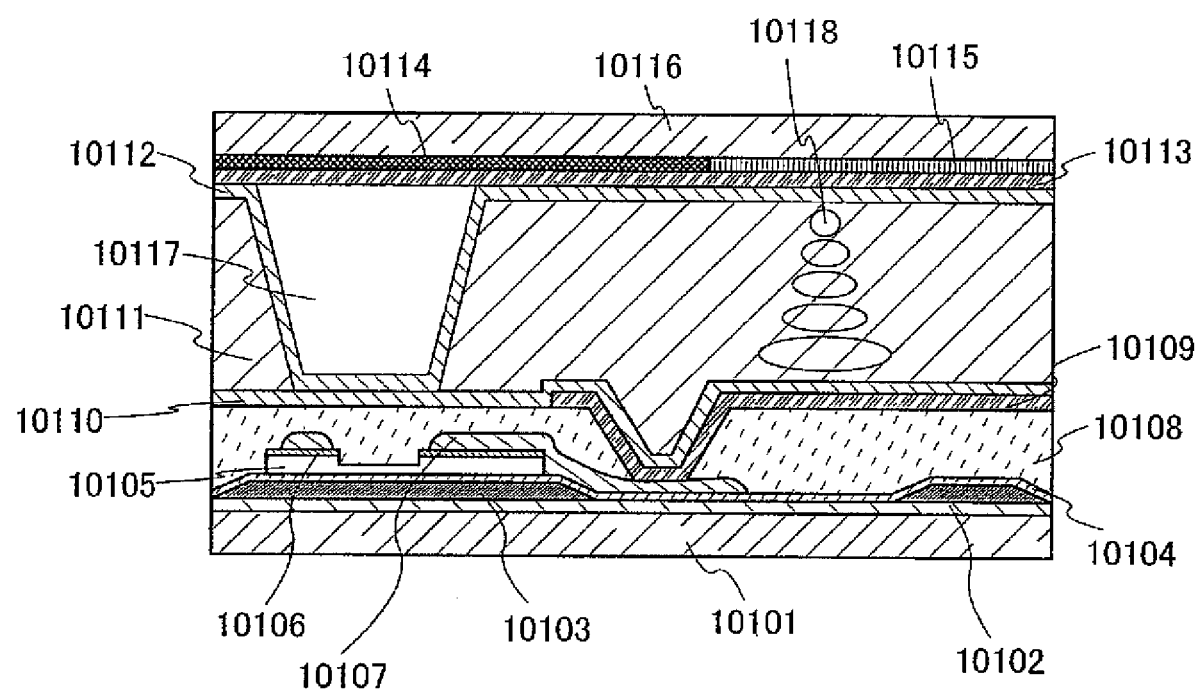
FIG. 67 is a cross-sectional view of a pixel of a semiconductor device according to the present invention.

FIG. 67 shows an example of a cross-sectional view of a pixel in the case where a TN mode and a transistor are combined. A liquid crystal 10111 having liquid crystal molecules 10118 is sandwiched between a first substrate 10101 and a second substrate 10116. The first substrate 10101 is provided with a transistor, a pixel electrode, an alignment film, and the like. The second substrate 10116 is provided with a light-blocking film 10114, a color filter 10115, an opposite electrode, an alignment film, and the like. In addition, a spacer 10117 is provided between the first substrate 10101 and the second substrate 10116. By applying the pixel structure shown in FIG. 67 to a liquid crystal display device, a liquid crystal display device can be formed at low cost.

Figure 68A:
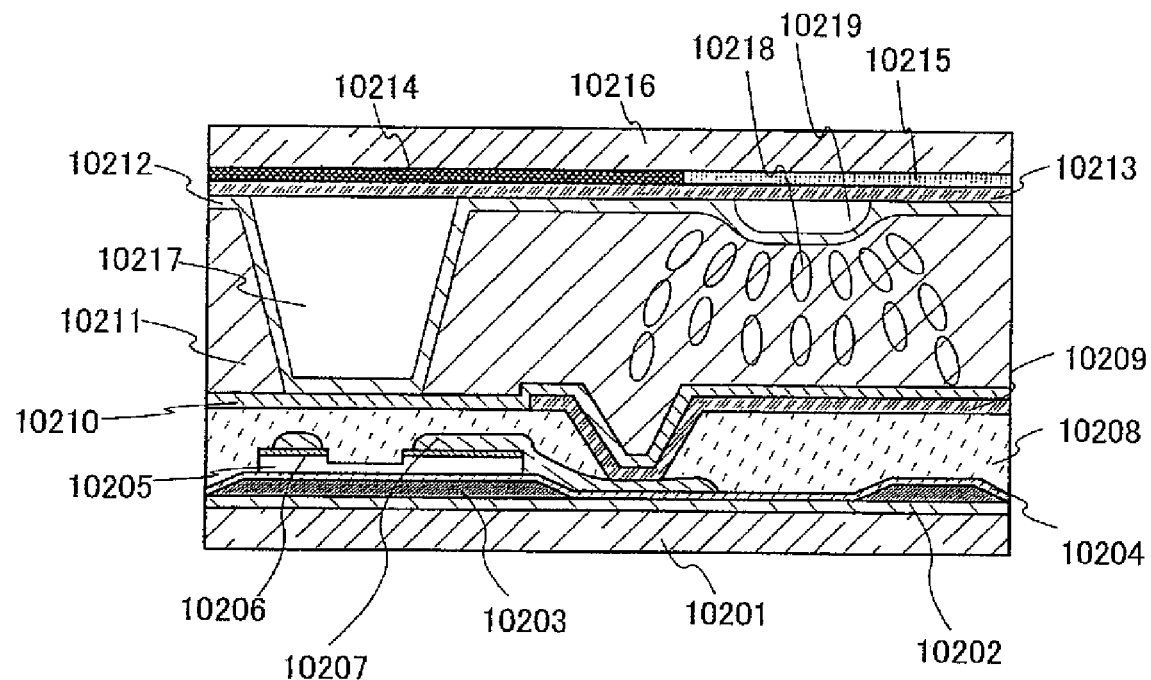
FIGS. 68A and 68B are cross-sectional views of pixels of a semiconductor device according to the present invention.

FIG. 68A shows an example of a cross-sectional view of a pixel in the case where an MVA (Multi-domain Vertical Alignment) mode and a transistor are combined. A liquid crystal 10211 having liquid crystal molecules 10218 is sandwiched between a first substrate 10201 and a second substrate 10216. The first substrate 10201 is provided with a transistor, a pixel electrode, an alignment film, and the like. The second substrate 10216 is provided with a light-blocking film 10214, a color filter 10215, an opposite electrode, a projection 10219 for alignment control, an alignment film, and the like. In addition, a spacer 10217 is provided between the first substrate 10201 and the second substrate 10216. By applying the pixel structure shown in FIG. 68A to a liquid crystal display device, a liquid crystal display device having a wide viewing angle, high response speed, and high contrast can be obtained.

Figure 68B:
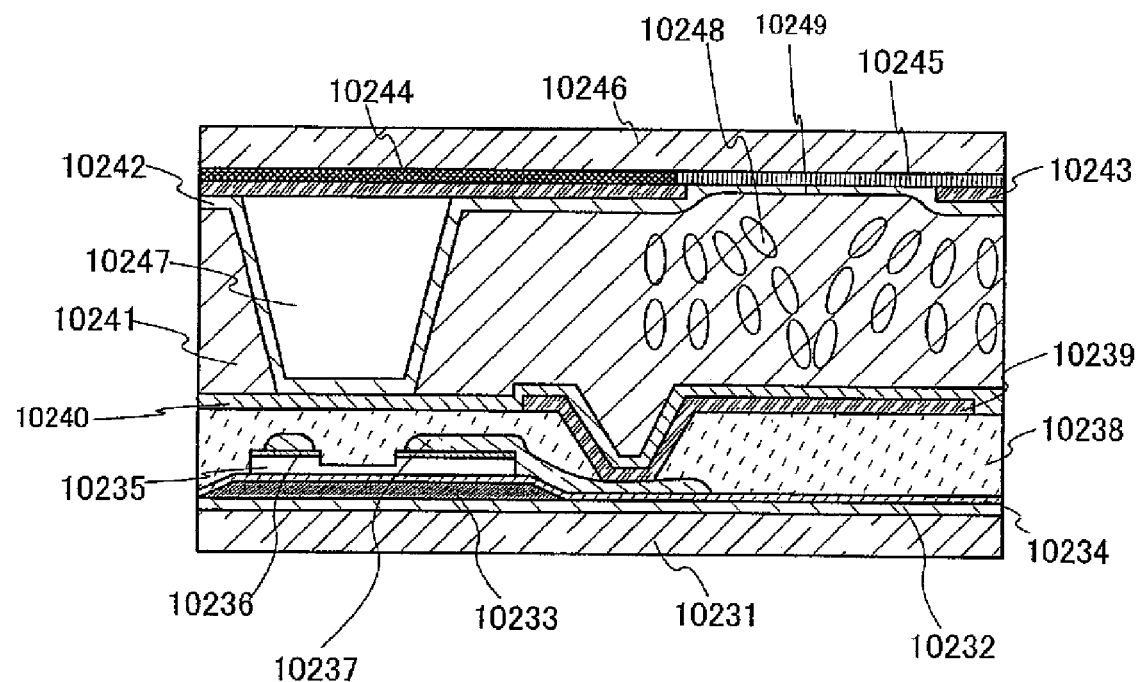

FIG. 68B shows an example of a cross-sectional view of a pixel in the case where a PVA (Patterned Vertical Alignment) mode and a transistor are combined. A liquid crystal 10241 having liquid crystal molecules 10248 is sandwiched between a first substrate 10231 and a second substrate 10246. The first substrate 10231 is provided with a transistor, a pixel electrode, an alignment film, and the like. The second substrate 10246 is provided with a light-blocking film 10244, a color filter 10245, an opposite electrode, an alignment film, and the like. Note that the pixel electrode includes an electrode notch portion 10249. In addition, a spacer 10247 is provided between the first substrate 10231 and the second substrate 10246. By applying the pixel structure shown in FIG. 68B to a liquid crystal display device, a liquid crystal display device having a wide viewing angle, high response speed, and high contrast can be obtained.

Figure 69A:
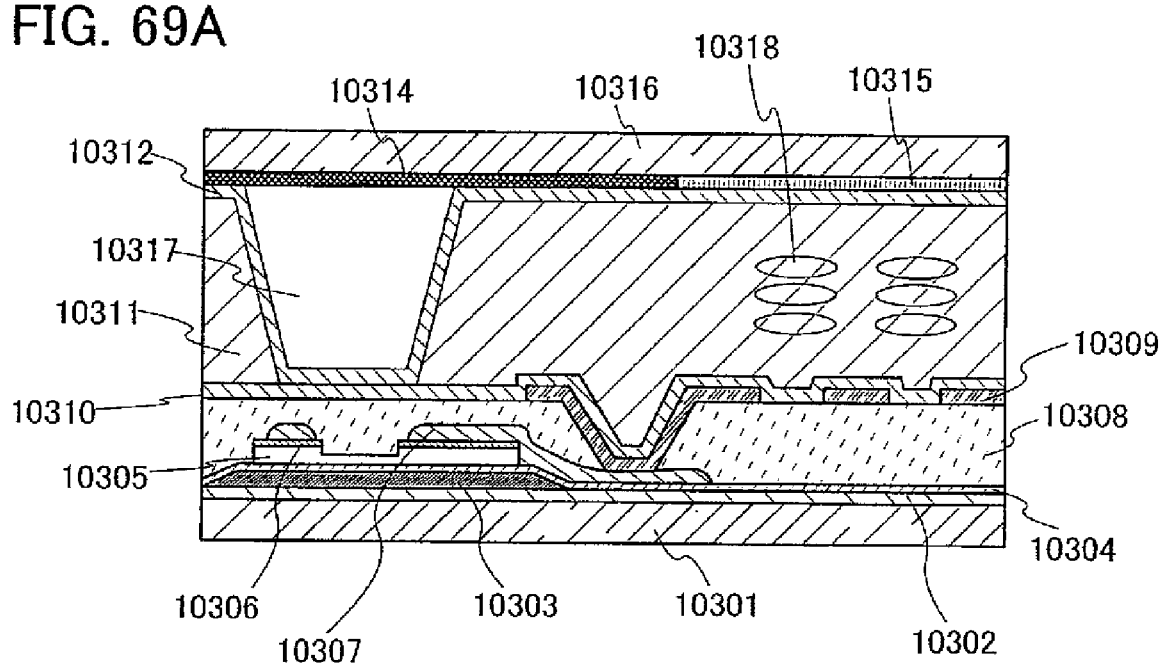
FIGS. 69A and 69B are cross-sectional views of pixels of a semiconductor device according to the present invention.

FIG. 69A shows an example of a cross-sectional view of a pixel in the case where an IPS (In-Plane-Switching) mode and a transistor are combined. A liquid crystal 10311 having liquid crystal molecules 10318 is sandwiched between a first substrate 10301 and a second substrate 10316. The first substrate 10301 is provided with a transistor, a pixel electrode, a common electrode, an alignment film, and the like. The second substrate 10316 is provided with a light-blocking film 10314, a color filter 10315, an alignment film, and the like. In addition, a spacer 10317 is provided between the first substrate 10301 and the second substrate 10316. By applying the pixel structure shown in FIG. 69A to a liquid crystal display device, a liquid crystal display device having a wide viewing angle and response speed with low dependency on gray scale in principle can be obtained.

Figure 69B:
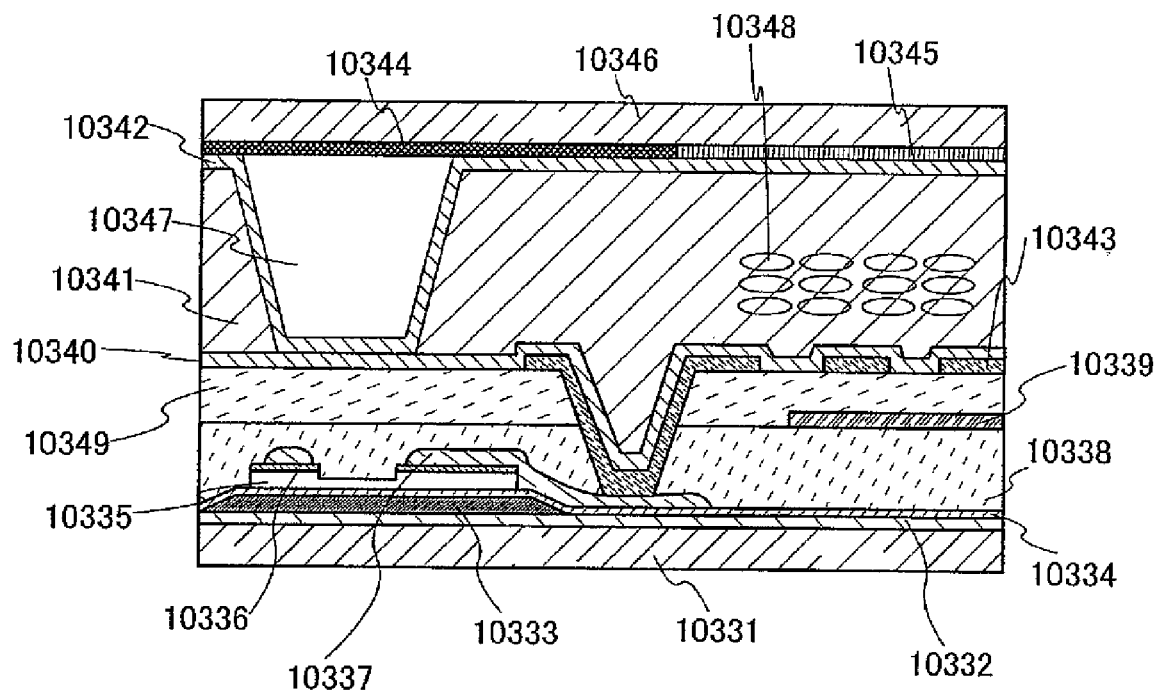

FIG. 69B shows an example of a cross-sectional view of a pixel in the case where an FFS (Fringe Field Switching) mode and a transistor are combined. A liquid crystal 10341 having liquid crystal molecules 10348 is sandwiched between a first substrate 10331 and a second substrate 10346. The first substrate 10331 is provided with a transistor, a pixel electrode, a common electrode, an alignment film, and the like. The second substrate 10346 is provided with a light-blocking film 10344, a color filter 10345, an alignment film, and the like. In addition, a spacer 10347 is provided between the first substrate 10331 and the second substrate 10346. By applying the pixel structure shown in FIG. 69B to a liquid crystal display device, a liquid crystal display device having a wide viewing angle and response speed with low dependency on gray scale in principle can be obtained.

Here, materials which can be used for conductive layers or insulating films are described.

As a first insulating film 10102 in FIG. 67, a first insulating film 10202 in FIG. 68A, a first insulating film 10232 in FIG. 68B, a first insulating film 10302 in FIG. 69A, and a first insulating film 10332 in FIG. 69B, an insulating film such as a silicon oxide film, a silicon nitride film, or a silicon oxynitride ($SiO_xN_y$) film can be used. Alternatively, an insulating film having a stacked-layer structure in which two or more of a silicon oxide film, a silicon nitride film, a silicon oxynitride ($SiO_xN_y$) film, and the like are combined can be used.

As a first conductive layer 10103 in FIG. 67, a first conductive layer 10203 in FIG. 68A, a first conductive layer 10233 in FIG. 68B, a first conductive layer 10303 in FIG. 69A, and a first conductive layer 10333 in FIG. 69B, Mo, Ti, Al, Nd, Cr, or the like can be used. Alternatively, a stacked-layer structure in which two or more of Mo, Ti, Al, Nd, Cr, and the like are combined can be used.

As a second insulating film 10104 in FIG. 67, a second insulating film 10204 in FIG. 68A, a second insulating film 10234 in FIG. 68B, a second insulating film 10304 in FIG. 69A, and a second insulating film 10334 in FIG. 69B, a thermal oxide film, a silicon oxide film, a silicon nitride film, a silicon oxynitride film, or the like can be used. Alternatively, a stacked-layer structure in which two or more of a thermal oxide film, a silicon oxide film, a silicon nitride film, a silicon oxynitride film, and the like are combined can be used. Note that a silicon oxide film is preferably used for a portion in contact with a semiconductor layer. This is because a trap level at an interface with the semiconductor layer is decreased when a silicon oxide film is used. Note also that a silicon nitride film is preferably used for a portion in contact with Mo. This is because a silicon nitride film does not oxidize Mo.

As a first semiconductor layer 10105 in FIG. 67, a first semiconductor layer 10205 in FIG. 68A, a first semiconductor layer 10235 in FIG. 68B, a first semiconductor layer 10305 in FIG. 69A, and a first semiconductor layer 10335 in FIG. 69B, silicon, silicon germanium (SiGe), or the like can be used.

As a second semiconductor layer 10106 in FIG. 67, a second semiconductor layer 10206 in FIG. 68A, a second semiconductor layer 10236 in FIG. 68B, a second semiconductor layer 10306 in FIG. 69A, and a second semiconductor layer 10336 in FIG. 69B, silicon including phosphorus or the like can be used, for example.

As a light-transmitting material used for a second conductive layer 10107, a third conductive layer 10109, and a fourth conductive layer 10113 in FIG. 67; a second conductive layer 10207, a third conductive layer 10209, and a fourth conductive layer 10213 in FIG. 68A; a second conductive layer 10237, a third conductive layer 10239, and a fourth conductive layer 10243 in FIG. 68B; a second conductive layer 10307 and a third conductive layer 10309 in FIG. 69A; and a second conductive layer 10337, a third conductive layer 10339, and a fourth conductive layer 10343 in FIG. 69B, an indium tin oxide (ITO) film formed by mixing tin oxide into indium oxide, an indium tin silicon oxide (ITSO) film formed by mixing silicon oxide into indium tin oxide (ITO), an indium zinc oxide (IZO) film formed by mixing zinc oxide into indium oxide, a zinc oxide film, a tin oxide film, or the like can be used. Note that IZO is a light-transmitting conductive material formed by sputtering using a target in which zinc oxide (ZnO) of 2 to 20 wt % is mixed into ITO.

As a reflective material used for the second conductive layer 10107 and the third conductive layer 10109 in FIG. 67; the second conductive layer 10207 and the third conductive layer 10209 in FIG. 68A; the second conductive layer 10237 and the third conductive layer 10239 in FIG. 68B; the second conductive layer 10307 and the third conductive layer 10309 in FIG. 69A; and the second conductive layer 10337, the third conductive layer 10339, and the fourth conductive layer 10343 in FIG. 68B, Ti, Mo, Ta, Cr, W, Al, or the like can be used. Alternatively, a two-layer structure in which Al and Ti, Mo, Ta, Cr, or W are stacked, or a three-layer structure in which Al is interposed between metals such as Ti, Mo, Ta, Cr, and W may be used.

As the third insulating film 10108 in FIG. 67, the third insulating film 10208 in FIG. 68A, the third insulating film 10238 in FIG. 68B, the third conductive layer 10239 in FIG. 68B, the third insulating film 10308 in FIG. 69A, and the third insulating film 10338 and the fourth insulating film 10349 in FIG. 69B, an inorganic material (e.g., silicon oxide, silicon nitride, or silicon oxynitride), an organic compound material having a low dielectric constant (e.g., a photosensitive or nonphotosensitive organic resin material), or the like can be used. Alternatively, a material including siloxane can be used. Note that siloxane is a material in which a skeleton structure is formed by a bond of silicon (Si) and oxygen (O). As a substitute, an organic group containing at least hydrogen (such as an alkyl group or an aryl group) is used. Alternatively, a fluoro group, or a fluoro group and an organic group containing at least hydrogen may be used as a substituent.

As a first alignment film 10110 and a second alignment film 10112 in FIG. 67; a first alignment film 10210 and a second alignment film 10212 in FIG. 68A; a first alignment film 10240 and a second alignment film 10242 in FIG. 68B; a first alignment film 10310 and a second alignment film 10312 in FIG. 69A; and a first alignment film 10340 and a second alignment film 10342 in FIG. 69B, a film of a high molecular compound such as polyimide can be used.

Next, the pixel structure in the case where each liquid crystal mode and the transistor are combined is described with reference to a top plan view (a layout diagram) of the pixel.

Note that as the liquid crystal mode, a TN (Twisted Nematic) mode, an IPS (In-Plane-Switching) mode, an FFS (Fringe Field Switching) mode, an MVA (Multi-domain Vertical Alignment) mode, a PVA (Patterned Vertical Alignment) mode, an ASM (Axially Symmetric aligned Micro-cell) mode, an OCB (Optical Compensated Birefringence) mode, an FLC (Ferroelectric Liquid Crystal) mode, an AFLC (Anti-Ferroelectric Liquid Crystal) mode, or the like can be used.

Figure 70:
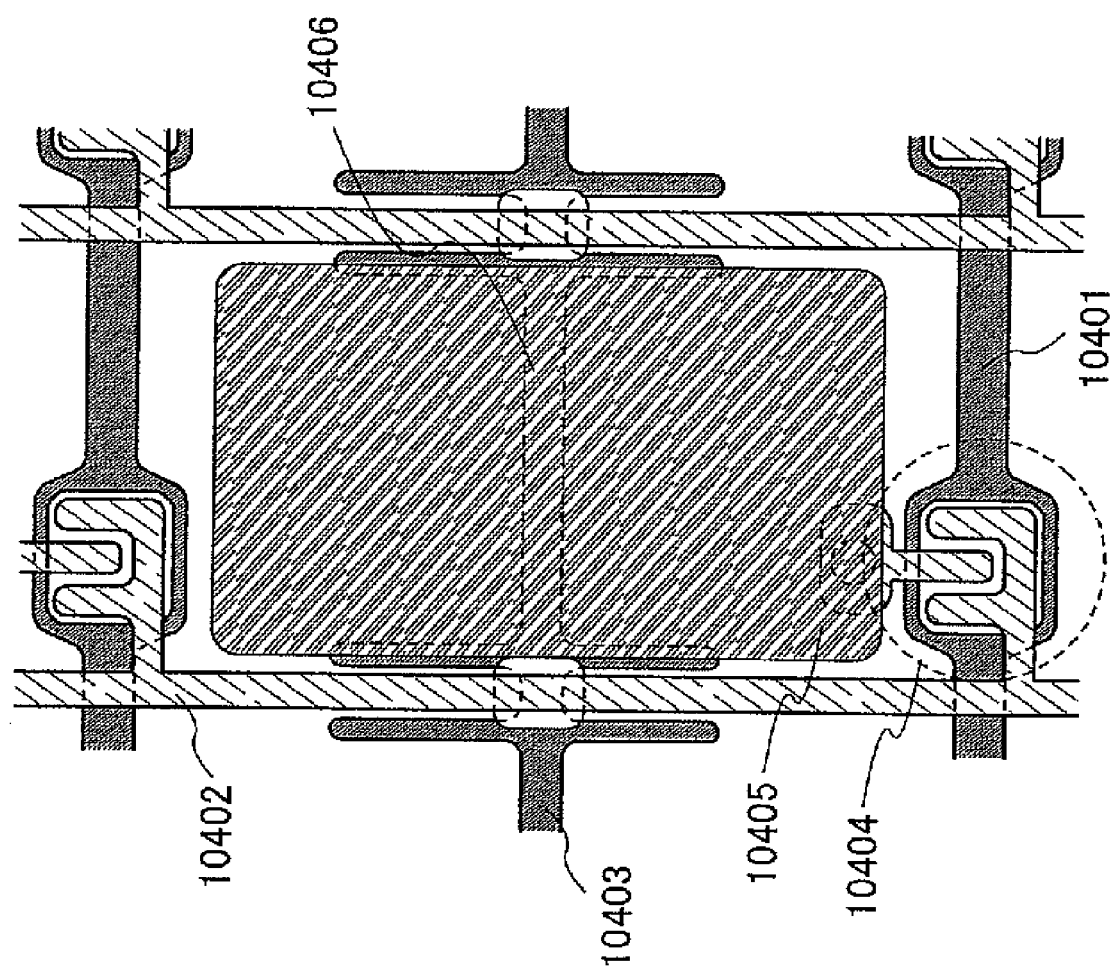
FIG. 70 is a pixel layout example of a semiconductor device according to the present invention.

FIG. 70 shows an example of a top plan view of a pixel in the case where a TN mode and a transistor are combined. By applying the pixel structure shown in FIG. 70 to a liquid crystal display device, a liquid crystal display device can be formed at low cost.

The pixel shown in FIG. 70 includes a scan line 10401, a video signal line 10402, a capacitor line 10403, a transistor 10404, a pixel electrode 10405, and a pixel capacitor 10406.

Figure 71A:
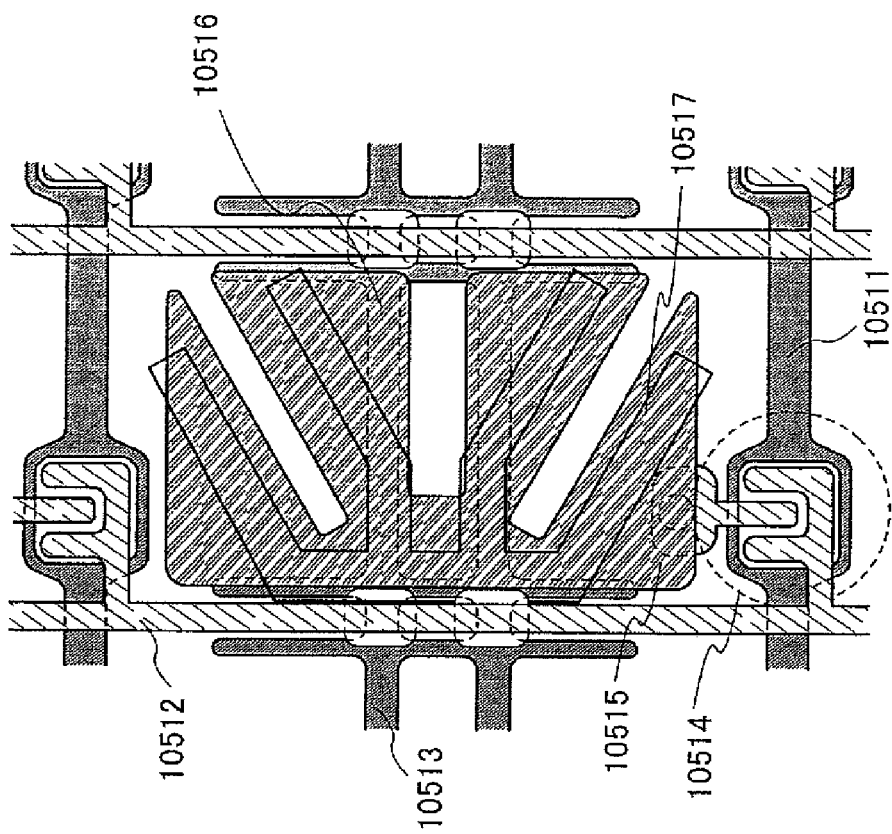
FIGS. 71A and 71B are pixel layout examples of a semiconductor device according to the present invention.

FIG. 71A shows an example of a top plan view of a pixel in the case where an MVA mode and a transistor are combined. By applying the pixel structure shown in FIG. 71A to a liquid crystal display device, a liquid crystal display device having a wide viewing angle, high response speed, and high contrast can be obtained.

The pixel shown in FIG. 71A includes a scan line 10501, a video signal line 10502, a capacitor line 10503, a transistor 10504, a pixel electrode 10505, a pixel capacitor 10506, and a projection 10507 for alignment control.

Figure 71B:
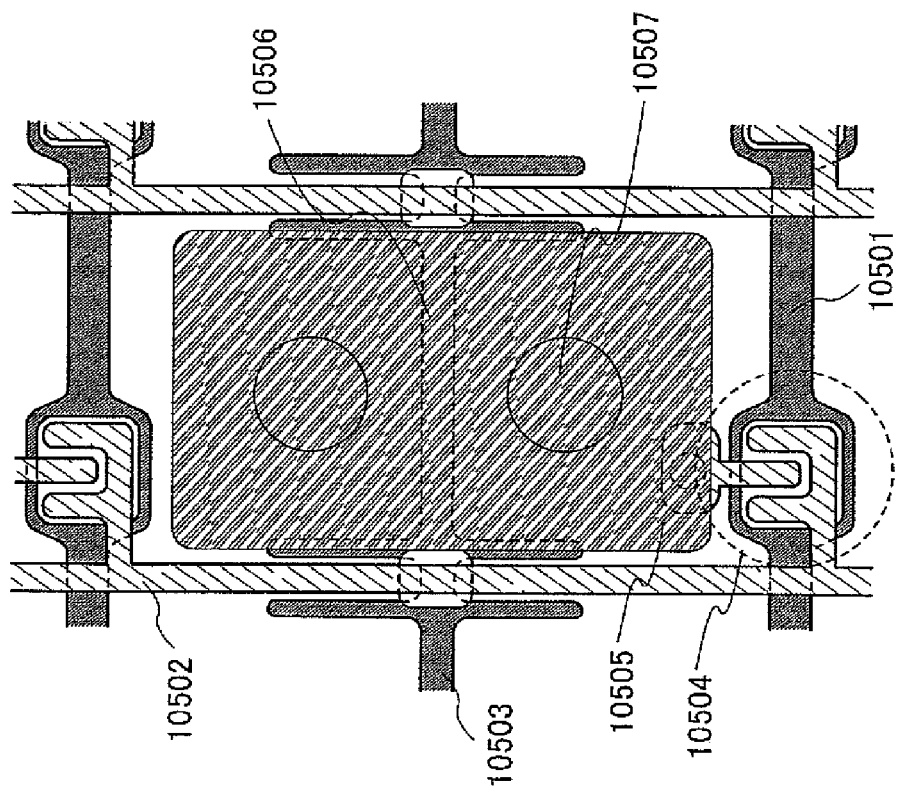

FIG. 71B shows an example of a top plan view of a pixel in the case where a PVA mode and a transistor are combined. By applying the pixel structure shown in FIG. 71B to a liquid crystal display device, a liquid crystal display device having a wide viewing angle, high response speed, and high contrast can be obtained.

The pixel shown in FIG. 71B includes a scan line 10511, a video signal line 10512, a capacitor line 10513, a transistor 10514, a pixel electrode 10515, a pixel capacitor 10516, and an electrode notch portion 10517.

FIG. 72A shows an example of a top plan view of a pixel in the case where an IPS mode and a transistor are combined. By applying the pixel structure shown in FIG. 72A to a liquid crystal display device, a liquid crystal display device having a wide viewing angle and response speed with low dependency on gray scale in principle can be obtained.

The pixel shown in FIG. 72A includes a scan line 10601, a video signal line 10602, a common electrode 10603, a transistor 10604, and a pixel electrode 10605.

FIG. 72B shows an example of a top plan view of a pixel in the case where an FFS mode and a transistor are combined. By applying the pixel structure shown in FIG. 72B to a liquid crystal display device, a liquid crystal display device having a wide viewing angle and response speed with low dependency on gray scale in principle can be obtained.

The pixel shown in FIG. 72B includes a scan line 10611, a video signal line 10612, a common electrode 10613, a transistor 10614, and a pixel electrode 10615.

Although this embodiment mode has been described with reference to various drawings, the contents (or part of the contents) described in each drawing can be freely applied to, combined with, or replaced with the contents (or part of the contents) described in another drawing. Further, much more drawings can be formed by combining each part in the above-described drawings with another part.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in the drawings in this embodiment mode with part of another embodiment mode.

Note that this embodiment mode has described just examples of embodying, slightly transforming, modifying, improving, describing in detail, or applying the contents (or part of the contents) described in other embodiment modes, an example of related part thereof, or the like. Therefore, the contents described in other embodiment modes can be freely applied to, combined with, or replaced with the contents described in this embodiment mode.

Embodiment Mode 15

Embodiment Mode 15 will describe a structure and an operation of a pixel in a display device.

Figures 73A, 73B:
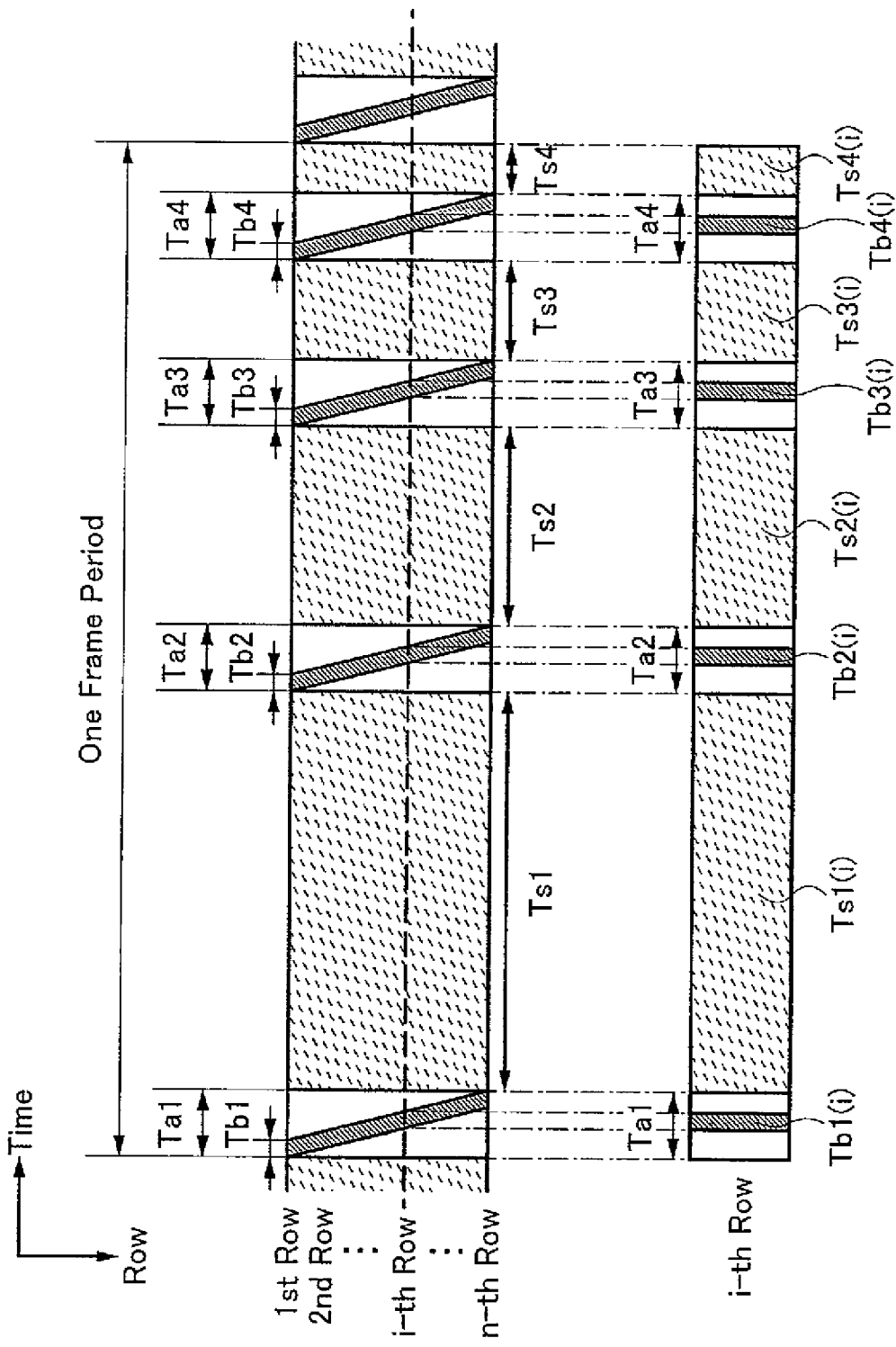
FIGS. 73A and 73B are diagrams illustrating a method for driving a semiconductor device according to the present invention.

FIGS. 73A and 73B are timing charts showing an example of digital time grayscale driving. The timing chart of FIG. 73A illustrates a driving method in which a signal writing period (address period) to a pixel and a light-emitting period (sustain period) are divided.

One frame period is a period for fully displaying an image of one display region. One frame period includes a plurality of subframe periods, and one subframe period includes an address period and a sustain period. Address periods Ta1 to Ta4 indicate time for writing signals to pixels of all rows, and periods Tb1 to Tb4 indicate time for writing signals to pixels of one row (or one pixel). Sustain periods Ts1 to Ts4 indicate time for maintaining a lighting state or a non-lighting state in accordance with a video signal written to the pixel, and a ratio of the lengths of the sustain periods is set to satisfy $Ts1:Ts2:Ts3:Ts4=2^3:2^2:2^1:2^0=8:4:2:1$. A grayscale is expressed depending on which sustain period light emission is performed.

Here, the i-th pixel row is described with reference to FIG. 73B. First, in the address period Ta1, a pixel selection signal is input to a scan line in order from a first row, and in a period Tb1(i) in the address period Ta1, pixels of the i-th row are selected. Then, while the pixels of the i-th row are selected, a video signal is input to the pixels of the i-th row from a signal line. Then, when the video signal is written to the pixels of the i-th row, the pixels of the i-th row maintain the signal until a signal is input again. Lighting and non-lighting of the pixels of the i-th row in the sustain period Ts1 are controlled by the written video signal. Similarly, in the address periods Ta2, Ta3, and Ta4, video signals are input to the pixels of the i-th row, and lighting and non-lighting of the pixels of the i-th row in the sustain periods Ts2, Ts3, and Ts4 are controlled by the video signals. Then, in each subframe period, pixels are not lit in the address period, and the sustain period starts after the address period ends, and pixels to which a signal for lighting is written are lit.

Here, the case where a 4-bit grayscale is expressed has been described; however, the number of bits and the number of grayscales are not limited thereto. Note that lighting is not needed to be performed in order of Ts1, Ts2, Ts3, and Ts4, and the order may be random or light emission may be performed in the period divided into a plurality of periods. A ratio of lighting times of Ts1, Ts2, Ts3, and Ts4 is not needed to be power-of-two, and may be the same length or slightly different from a power-of-two.

Next, a driving method in which a signal writing period (address period) to a pixel and a light-emitting period (sustain period) are not divided is described. A pixel in a row in which a writing operation of a video signal is completed maintains the signal until another signal is written to the pixel (or the signal is erased). Data holding time is a period between the writing operation and the next writing operation of another signal to the pixel. In the data holding time, the pixel is lit or not lit in accordance with the video signal written to the pixel. The same operations are performed to the last row, and the address period ends. Then, an operation proceeds to a signal writing operation in a next subframe period sequentially from a row in which the data holding time ends.

As described above, in the case of a driving method in which a pixel is lit or not lit in accordance with a video signal written to the pixel immediately after the signal writing operation is completed and the data holding time starts, signals cannot be input to two rows at the same time, even if the data holding time is desired to be shorter than the address period. Accordingly, address periods need to be prevented from overlapping with each other. Therefore, the data holding time cannot be made shorter than the address period. As a result, it becomes difficult to perform high-level grayscale display.

Figure 74A:
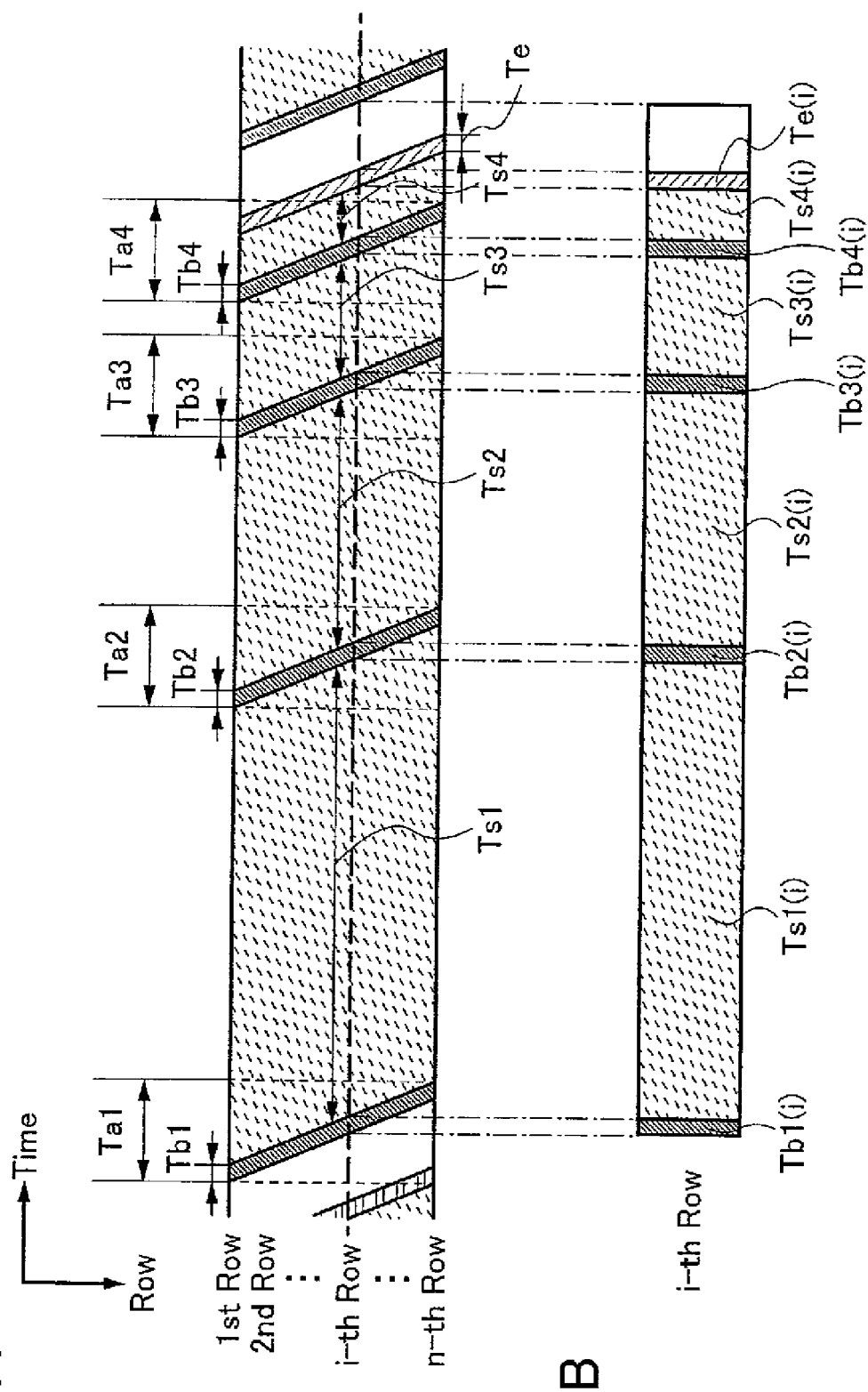
FIGS. 74A and 74B are diagrams illustrating a method for driving a semiconductor device according to the present invention.

Thus, the data holding time is set to be shorter than the address period by providing an erasing period. FIG. 74A illustrates a driving method in which the data holding time is set shorter than the address period by providing an erasing period.

Figure 74B:
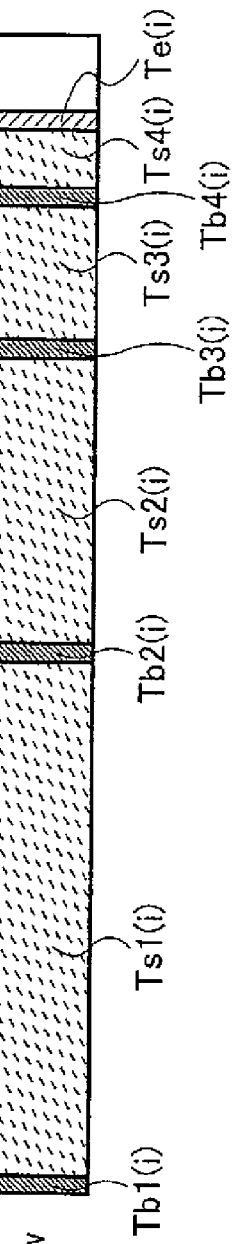

Here, the i-th pixel row is described with reference to FIG. 74B. In the address period Ta1, a pixel scan signal is input to a scan line in order from a first row, and pixels are selected. Then, in the period Th1(i), while the pixels of the i-th row are selected, a video signal is input to the pixels of the i-th row. Then, when the video signal is written to the pixels of the i-th row, the pixels of the i-th row maintain the signal until a signal is input again. Lighting and non-lighting of the pixels of the i-th row in the sustain period Ts1(i) are controlled by the written video signal. That is, the pixels of the i-th row are lit or not lit in accordance with the video signal written to the pixels immediately after the writing operation of the video signal to the i-th row is completed. Similarly, in the address periods Ta2, Ta3, and Ta4, a video signal is input to the pixels of the i-th row, and lighting and non-lighting of the pixels of the i-th row in the sustain periods Ts2, Ts3, and Ts4 are controlled by the video signal. Then, the end of a sustain period Ts4(i) is set by the start of an erasing operation. This is because the pixels are forced to be not lit regardless of the video signal written to the pixels of the i-th row in an erasing time Te(i). That is, the data holding time of the pixels of the i-th row ends when the erasing time Te(i) starts.

Thus, a display device with a high-level grayscale and a high duty ratio (ratio of a lighting period in one frame period), in which data holding time is shorter than an address period without separating the address period and a sustain period, can be provided. Reliability of a display element can be improved since instantaneous luminance can be lowered.

Here, the case where a 4-bit grayscale is expressed has been described; however, the number of bits and the number of grayscales are not limited thereto. Note that lighting is not needed to be performed in order of Ts1, Ts2, Ts3, and Ts4, and the order may be random or light emission may be performed in the period divided into a plurality of periods. A ratio of lighting time of Ts1, Ts2, Ts3, and Ts4 is not needed to be power-of-two, and may be the same length or slightly different from a power of two.

A structure and an operation of a pixel to which digital time grayscale driving can be applied are described.

Figure 75:
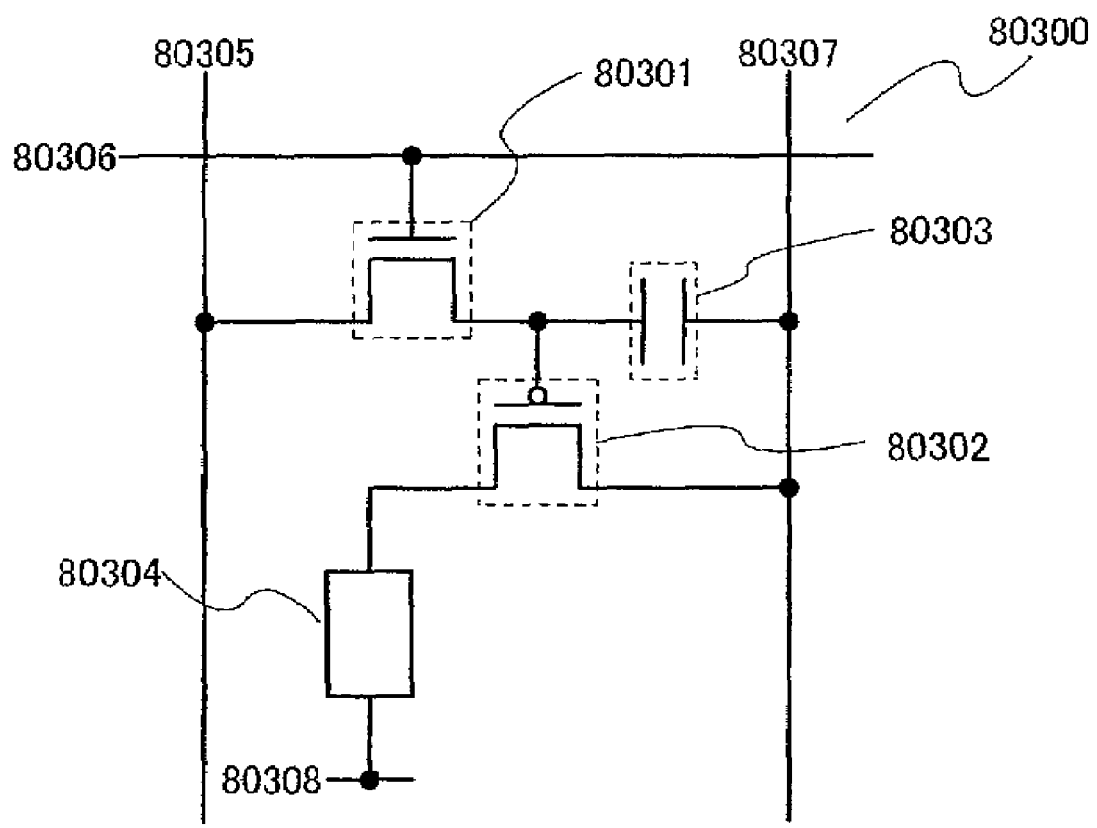
FIG. 75 is a diagram illustrating a structure of a pixel of a semiconductor device according to the present invention.

FIG. 75 is a diagram showing an example of a pixel structure to which digital time grayscale driving can be applied.

A pixel 80300 includes a switching transistor 80301, a driving transistor 80302, a light-emitting element 80304, and a capacitor 80303. A gate of the switching transistor 80301 is connected to a scan line 80306, a first electrode (one of a source electrode and a drain electrode) of the switching transistor 80301 is connected to a signal line 80305, and a second electrode (the other of the source electrode and the drain electrode) of the switching transistor 80301 is connected to a gate of the driving transistor 80302. The gate of the driving transistor 80302 is connected to a power supply line 80307 through the capacitor 80303, a first electrode of the driving transistor 80302 is connected to the power supply line 80307, and a second electrode of the driving transistor 80302 is connected to a first electrode (pixel electrode) of the light-emitting element 80304. A second electrode of the light-emitting element 80304 corresponds to a common electrode 80308.

The second electrode of the light-emitting element 80304 (the common electrode 80308) is set to a low power supply potential. The low power supply potential is a potential satisfying (low power supply potential)<(high power supply potential) with the high power supply potential set to the power supply line 80307 as a reference. As the low power supply potential, GND, 0 V, or the like may be set, for example. A potential difference between the high power supply potential and the low power supply potential is applied to the light-emitting element 80304, and a current is supplied to the light-emitting element 80304. Here, in order to make the light-emitting element 80304 emit light, each potential is set so that the potential difference between the high power supply potential and the low power supply potential is a forward threshold voltage or higher.

Gate capacitance of the driving transistor 80302 may be used as a substitute for the capacitor 80303, so that the capacitor 80303 can be omitted. The gate capacitance of the driving transistor 80302 may be formed in a region where a source region, a drain region, an LDD region, or the like overlaps with the gate electrode. Alternatively, capacitance may be formed between a channel region and the gate electrode.

In the case of voltage-input voltage driving method, a video signal is input to the gate of the driving transistor 80302 so that the driving transistor 80302 is in either of two states of being sufficiently turned on and turned off. That is, the driving transistor 80302 operates in a linear region.

The video signal such that the driving transistor 80302 operates in a saturation region is input, so that a current can be supplied to the light-emitting element 80304. When the light-emitting element 80304 is an element luminance of which is determined in accordance with a current, luminance decay due to deterioration of the light-emitting element 80304 can be suppressed. Further, when the video signal is an analog signal, a current corresponding to the video signal can be supplied to the light-emitting element 80304. In this case, analog grayscale driving can be performed.

A structure and an operation of a pixel called a threshold voltage compensation pixel are described. A threshold voltage compensation pixel can be applied to digital time grayscale driving and analog grayscale driving.

Figure 76:
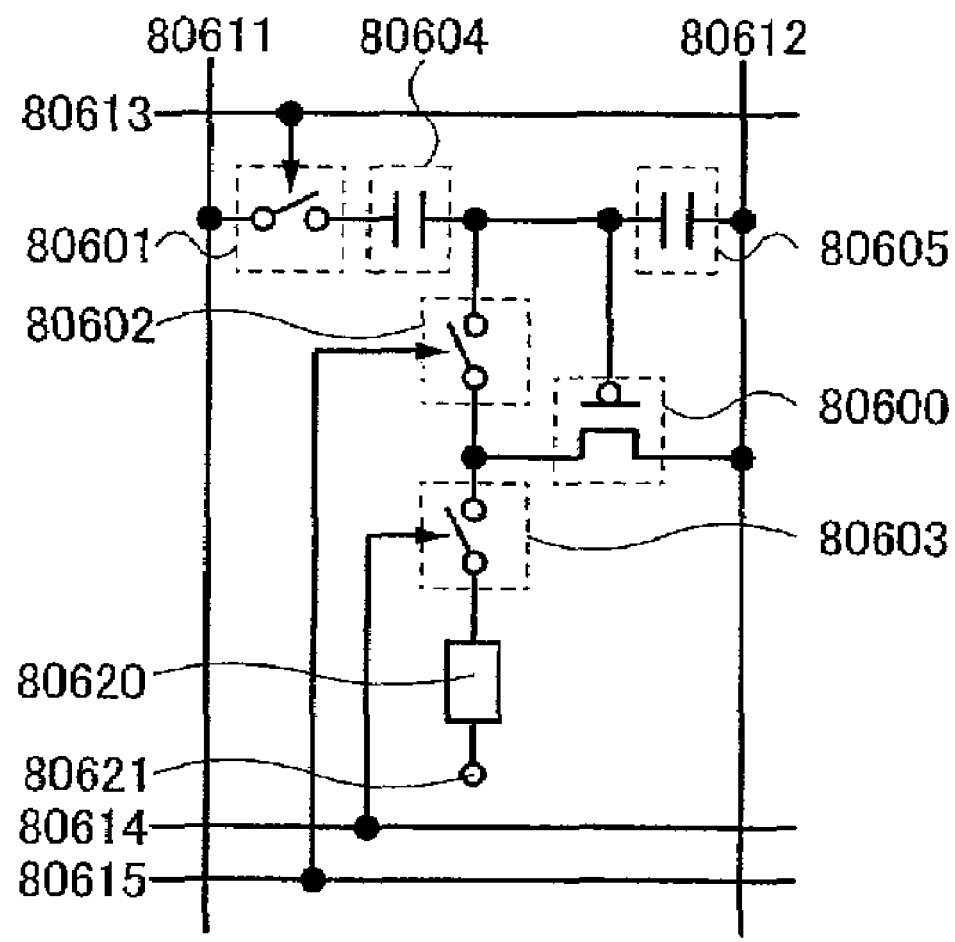
FIG. 76 is a diagram illustrating a structure of a pixel of a semiconductor device according to the present invention.

FIG. 76 is a diagram showing an example of a structure of a pixel called a threshold voltage compensation pixel.

The pixel in FIG. 76 includes a driving transistor 80600, a first switch 80601, a second switch 80602, a third switch 80603, a first capacitor 80604, a second capacitor 80605, and a light-emitting element 80620. A gate of the driving transistor 80600 is connected to a signal line 80611 through the first capacitor 80604 and the first switch 80601 in this order. Further, the gate of the driving transistor 80600 is connected to a power supply line 80612 through the second capacitor 80605. A first electrode of the driving transistor 80600 is connected to the power supply line 80612. A second electrode of the driving transistor 80600 is connected to a first electrode of the light-emitting element 80606 through the third switch 80603. Further, the second electrode of the driving transistor 80600 is connected to the gate of the driving transistor 80600 through the second switch 80602. A second electrode of the light-emitting element 80606 corresponds to a common electrode 80621. Note that whether the first switch 80601, the second switch 80602, and the third switch 8003 are turned on or off are controlled by a signal input to a first scan line 80613, a signal input to a second scan line 80615, and a signal input to a third scan line 80614, respectively.

A pixel structure shown in FIG. 76 is not limited thereto. For example, a switch, a resistor, a capacitor, a transistor, a logic circuit, or the like may be added to the pixel in FIG. 76. For example, the second switch 80602 may include a p-channel transistor or an n-channel transistor, the third switch 80603 may include a transistor having polarity opposite to that of the second switch 80602, and the second switch 80602 and the third switch 80603 may be controlled by the same scan line.

A structure and an operation of a pixel called a current input pixel are described. A current input pixel can be applied to digital grayscale driving and analog grayscale driving.

Figure 77:
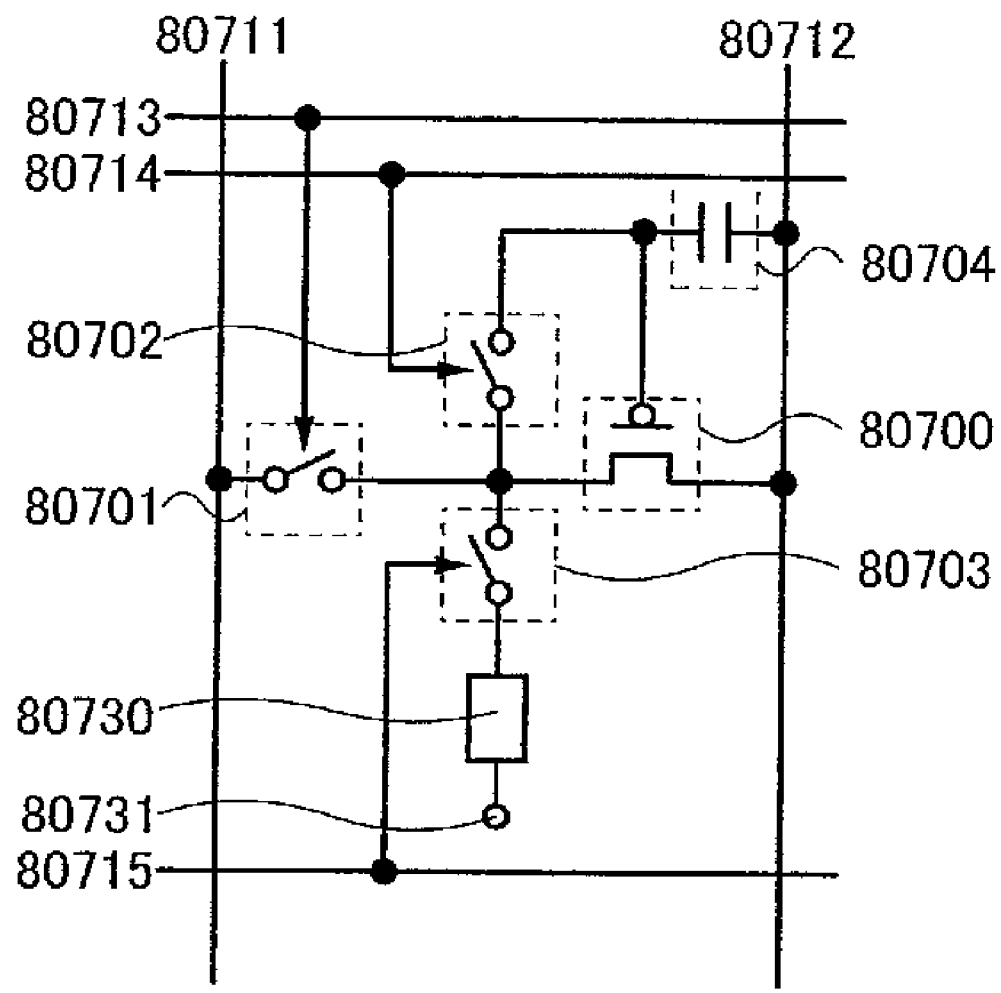
FIG. 77 is a diagram illustrating a structure of a pixel of a semiconductor device according to the present invention.

FIG. 77 illustrates an example of a structure of a pixel called a current input type.

The pixel in FIG. 77 includes a driving transistor 80700, a first switch 80701, a second switch 80702, a third switch 80703, a capacitor 80704, and a light-emitting element 80730. A gate of the driving transistor 80700 is connected to a signal line 80711 through the second switch 80702 and the first switch 80701 in this order. Further, the gate of the driving transistor 80700 is connected to a power supply line 80712 through the capacitor 80704. A first electrode of the driving transistor 80700 is connected to the power supply line 80712. A second electrode of the driving transistor 80700 is connected to the signal line 80711 through the first switch 80701. Further, the second electrode of the driving transistor 80700 is connected to a first electrode of the light-emitting element 80730 through the third switch 80703. A second electrode of the light-emitting element 80730 corresponds to a common electrode 80731.

A pixel structure shown in FIG. 77 is not limited thereto. For example, a switch, a resistor, a capacitor, a transistor, a logic circuit, or the like may be added to the pixel in FIG. 77. For example, the first switch 80701 may include a p-channel transistor or an n-channel transistor, the second switch 80702 may include a transistor with the same polarity as that of the first switch 80701, and the first switch 80701 and the second switch 80702 may be controlled by the same scan line. The second switch 80702 may be provided between the gate of the driving transistor 80700 and the signal line 80711. Note that whether the first switch 80701, the second switch 80702, and the third switch 80703 are turned on or off are controlled by a signal input to a first scan line 80713, a signal input to a second scan line 80714, and a signal input to a third scan line 80715, respectively.

Although this embodiment mode has been described with reference to various drawings, the contents (or part of the contents) described in each drawing can be freely applied to, combined with, or replaced with the contents (or part of the contents) described in another drawing. Further, much more drawings can be formed by combining each part in the above-described drawings with another part.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in the drawings in this embodiment mode with part of another embodiment mode.

Note that this embodiment mode has described just examples of embodying, slightly transforming, modifying, improving, describing in detail, or applying the contents (or part of the contents) described in other embodiment modes, an example of related part thereof, or the like. Therefore, the contents described in other embodiment modes can be freely applied to, combined with, or replaced with the contents described in this embodiment mode.

Embodiment Mode 16

Embodiment Mode 16 will describe a pixel structure of a display device. In particular, a pixel structure of a display device using an organic EL element is described.

Figure 78A:
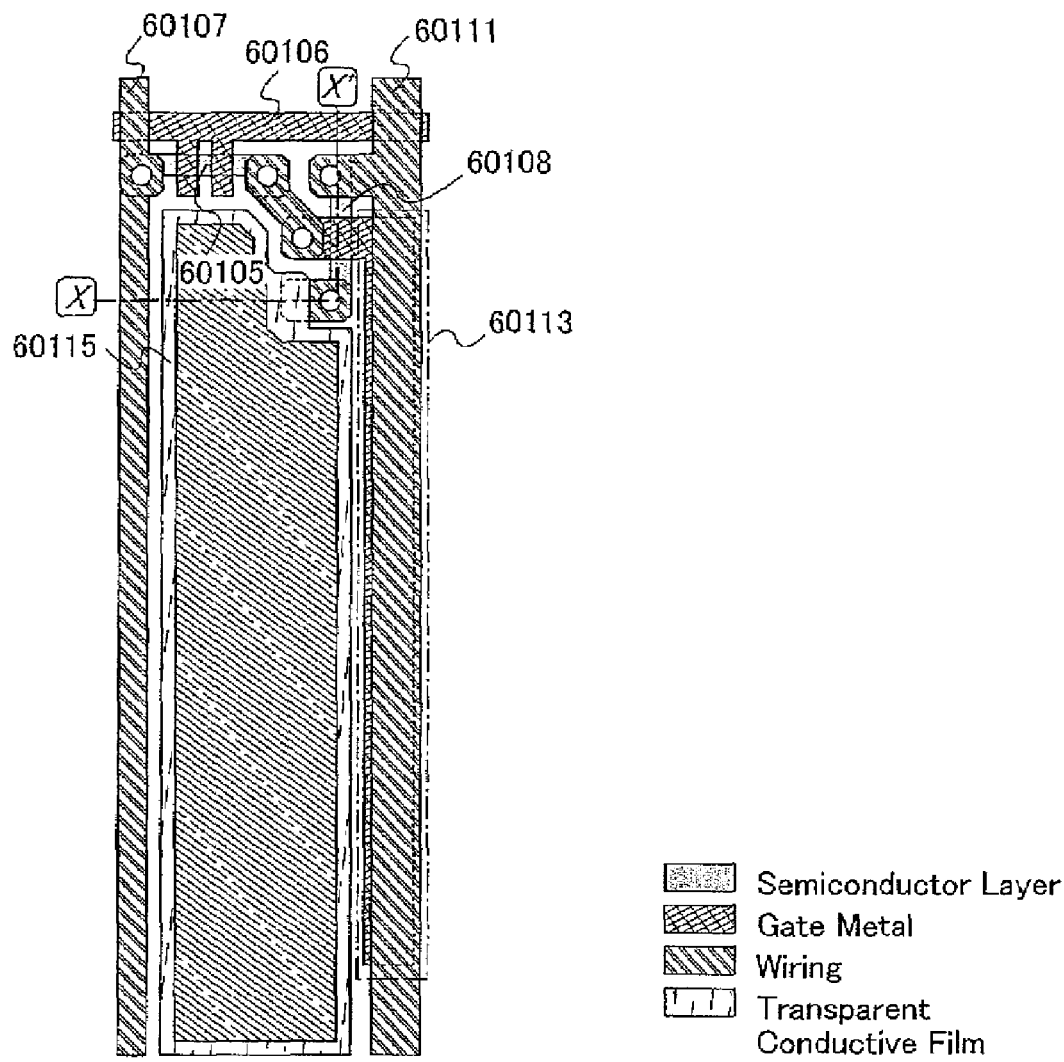
FIGS. 78A and 78B are a pixel layout example and a cross-sectional view of a semiconductor device according to the present invention.
Figure 78B:
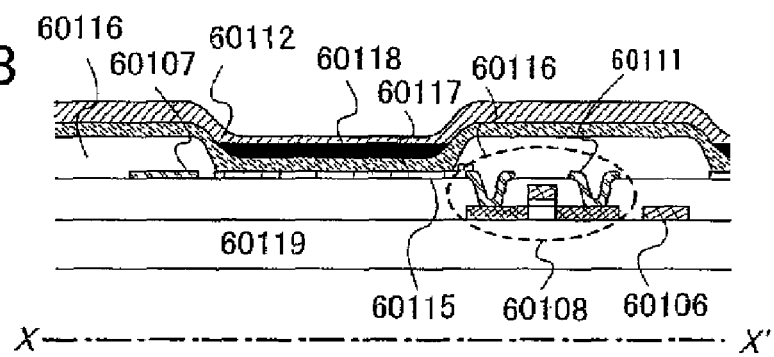

FIG. 78A illustrates an example of a top plan view (layout diagram) of a pixel including two transistors. FIG. 78B illustrates an example of a cross-sectional view along X-X' in FIG. 78A.

FIGS. 78A and 78B show a first transistor 60105, a first wiring 60106, a second wiring 60107, a second transistor 60108, a third wiring 60111, an opposite electrode 60112, a capacitor 60113, a pixel electrode 60115, a partition wall 60116, an organic conductive film 60117, an organic thin film 60118, and a substrate 60119. Note that it is preferable that the first transistor 60105 be used as a switching transistor, the second transistor 60108 as a driving transistor, the first wiring 60106 as a gate signal line, the second wiring 60107 as a source signal line, and the third wiring 60111 as a current supply line.

A gate electrode of the first transistor 60105 is electrically connected to the first wiring 60106, one of a source electrode and a drain electrode of the first transistor 60105 is electrically connected to the second wiring 60107, and the other of the source electrode or the drain electrode of the first transistor 60105 is electrically connected to a gate electrode of the second transistor 60108 and one electrode of the capacitor 60113. Note that the gate electrode of the first transistor 60105 includes a plurality of gate electrodes. Accordingly, a leakage current in the off state of the first transistor 60105 can be reduced.

One of a source electrode and a drain electrode of the second transistor 60108 is electrically connected to the third wiring 60111, and the other of the source electrode and the drain electrode of the second transistor 60108 is electrically connected to the pixel electrode 60115. Accordingly, a current flowing to the pixel electrode 60115 can be controlled by the second transistor 60108.

The organic conductive film 60117 is provided over the pixel electrode 60115, and the organic thin film 60118 (an organic compound layer) is further provided thereover. The opposite electrode 60112 is provided over the organic thin film 60118 (the organic compound layer). Note that the opposite electrode 60112 may be formed such that all pixels are commonly connected, or may be patterned using a shadow mask or the like.

Light emitted from the organic thin film 60118 (the organic compound layer) is transmitted through either the pixel electrode 60115 or the opposite electrode 60112.

In FIG. 78B, a case where light is emitted to the pixel electrode side, that is, a side on which the transistors and the like are formed is referred to as bottom emission; and a case where light is emitted to the opposite electrode side is referred to as top emission.

In the case of bottom emission, it is preferable that the pixel electrode 60115 be formed of a transparent conductive film. In the case of top emission, it is preferable that the opposite electrode 60112 be formed of a transparent conductive film.

In a light-emitting device for color display, EL elements having respective light emission colors of RGB may be separately formed, or an EL element with a single color may be formed over an entire surface uniformly and light emission of RGB can be obtained by using a color filter.

Note that the structure shown in FIGS. 78A and 78B is only an example, and various structures can be employed for a pixel layout, a cross-sectional structure, a stacking order of electrodes of an EL element, and the like, as well as the structure shown in FIGS. 78A and 78B. Further, as a light-emitting element, various elements such as a crystalline element such as an LED, and an element formed of an inorganic thin film can be used as well as the element formed of the organic thin film shown in the drawing.

Although this embodiment mode has been described with reference to various drawings, the contents (or part of the contents) described in each drawing can be freely applied to, combined with, or replaced with the contents (or part of the contents) described in another drawing. Further, much more drawings can be formed by combining each part in the above-described drawings with another part.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in the drawings in this embodiment mode with part of another embodiment mode.

Note that this embodiment mode has described just examples of embodying, slightly transforming, modifying, improving, describing in detail, or applying the contents (or part of the contents) described in other embodiment modes, an example of related part thereof, or the like. Therefore, the contents described in other embodiment modes can be freely applied to, combined with, or replaced with the contents described in this embodiment mode.

Embodiment Mode 17

This embodiment mode describes a structure of an EL element, particular, a structure of an organic EL element.

A structure of a mixed junction EL element is described. As an example, a structure is described, which includes a layer (a mixed layer) in which a plurality of materials among a hole injecting material, a hole transporting material, a light-emitting material, an electron transporting material, an electron injecting material, and the like are mixed (hereinafter referred to as a mixed junction type EL element), which is different from a stacked-layer structure where a hole injecting layer formed of a hole injecting material, a hole transporting layer formed of a hole transporting material, a light-emitting layer formed of a light-emitting material, an electron transporting layer formed of an electron transporting material, an electron injecting layer formed of an electron injecting material, and the like are clearly distinguished.

FIGS. 79A to 79E are schematic views each showing a structure of a mixed junction type EL element. Note that a layer interposed between an anode 190101 and a cathode 190102 corresponds to an EL layer.

Figure 79A:
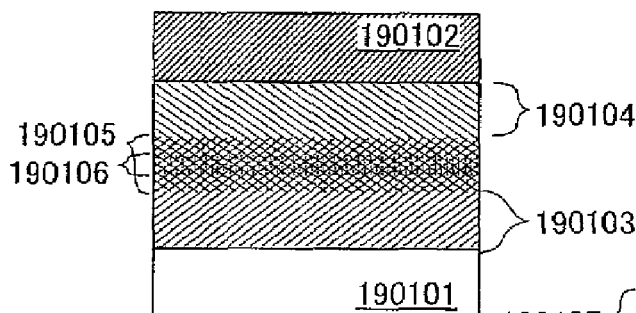
FIGS. 79A to 79E are cross-sectional views of display elements of a semiconductor device according to the present invention.

In the structure shown in FIG. 79A, the EL layer includes a hole transporting region 190103 formed of a hole transporting material and an electron transporting region 190104 formed of an electron transporting material. The hole transporting region 190103 is located closer to the anode than to the electron transporting region 190104. A mixed region 190105 including both the hole transporting material and the electron transporting material is provided between the hole transporting region 190103 and the electron transporting region 190104.

Along a direction from the anode 190101 to the cathode 190102, the concentration of the hole transporting material in the mixed region 190105 is decreased and the concentration of the electron transporting material in the mixed region 190105 is increased.

Note that a concentration gradient can be freely set. For example, a ratio of concentrations of each functional material may be changed (a concentration gradient may be formed) in the mixed region 190105 including both the hole transporting material and the electron transporting material, without including the hole transporting layer 190103 formed of only the hole transporting material. Alternatively, a ratio of concentrations of each functional material may be changed (a concentration gradient may be formed) in the mixed region 190105 including both the hole transporting material and the electron transporting material, without including the hole transporting layer 190103 formed of only the hole transporting material and the electron transporting layer 190104 formed of only the electron transporting material. Still alternatively, a ratio of concentrations may be changed depending on a distance from the anode or the cathode. Note that the ratio of concentrations may be changed continuously.

The mixed region 190105 includes a region 190106 to which a light-emitting material is added. A light emission color of the EL element can be controlled by the light-emitting material. Further, carriers can be trapped by the light-emitting material. As the light-emitting material, various fluorescent dyes as well as a metal complex having a quinoline skeleton, a benzoxazole skeleton, or a benzothiazole skeleton can be used. The light emission color of the EL element can be controlled by adding the light-emitting material.

The anode 190101 is preferably formed using an electrode material having a high work function in order to inject holes efficiently. For example, a light-transmitting electrode formed of indium tin oxide (ITO), indium zinc oxide (IZO), ZnO, $SnO_2$, $In_2O_3$, or the like can be used. When a light-transmitting property is not needed, the anode 190101 may be formed of an opaque metal material.

As the hole transporting material, an aromatic amine compound or the like can be used.

As the electron transporting material, a metal complex having a quinoline derivative, 8-quinolinol, or a derivative thereof as a ligand (especially tris(8-quinolinolato)aluminum ($Alq_3$)), or the like can be used.

The cathode 190102 is preferably formed using an electrode material having a low work function in order to inject electrons efficiently. For example, a metal such as aluminum, indium, magnesium, silver, calcium, barium, or lithium can be used alone. Alternatively, an alloy of the aforementioned metal or an alloy of the aforementioned metal and another metal may be used.

Figure 79B:
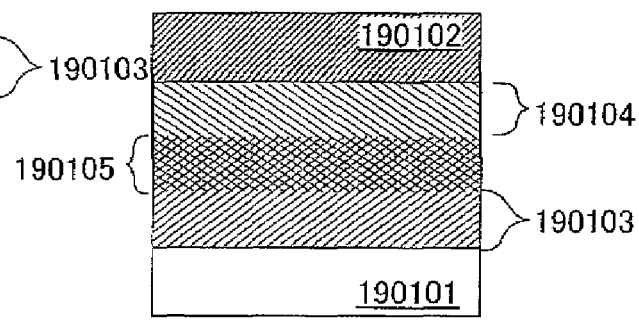

FIG. 79B is the schematic view of the structure of the EL element, which is different from that of FIG. 79A. Note that the same portions as those in FIG. 79A are denoted by the same reference numerals, and the description is omitted.

In FIG. 79B, a region to which a light-emitting material is added is not provided. However, light emission can be performed when a material (electron-transporting and light-emitting material) having both an electron transporting property and a light-emitting property, for example, tris(8-quinolinolato)aluminum ($Alq_3$) is used as a material added to the electron transporting region 190104.

Alternatively, as a material added to the hole transporting region 190103, a material (a hole-transporting and light-emitting material) having both a hole transporting property and a light-emitting property may be used.

Figure 79C:
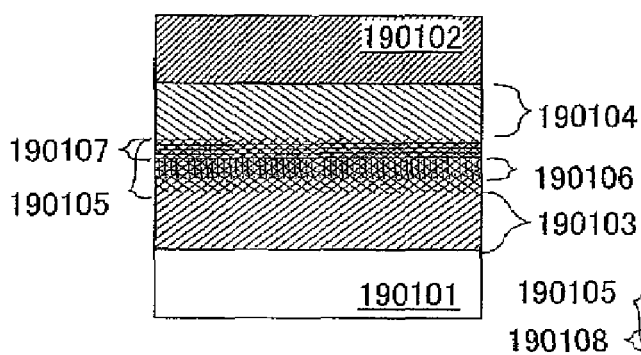

FIG. 79C is the schematic view of the structure of the EL element, which is different from those of FIGS. 79A and 79B. Note that the same portions as those in FIGS. 79A and 79B are denoted by the same reference numerals, and the description is omitted.

In FIG. 79C, the mixed region 190105 includes a region 190107 to which a hole blocking material having a larger energy difference between the highest occupied molecular orbital and the lowest unoccupied molecular orbital than the hole transporting material is added. When the region 190107 to which the hole blocking material is added is located closer to the cathode 190102 than to the region 190106 to which the light-emitting material is added in the mixed region 190105, a recombination rate of carriers and light emission efficiency can be increased. The aforementioned structure including the region 190107 to which the hole blocking material is added is especially effective in an EL element which utilizes light emission (phosphorescence) by a triplet exciton.

FIG. 73D is the schematic view of the structure of the EL element, which is different from those of FIGS. 73A to 73C. Note that the same portions as those in FIGS. 79A to 79C are denoted by the same reference numerals, and the description is omitted.

Figure 79D:
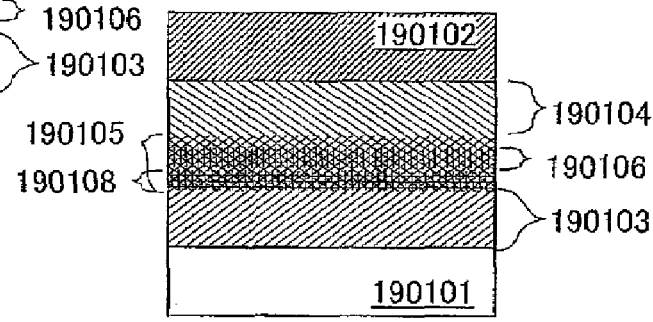

In FIG. 79D, the mixed region 190105 includes a region 190108 to which an electron blocking material having a larger energy difference between the highest occupied molecular orbital and the lowest unoccupied molecular orbital than the electron transporting material is added. When the region 190108 to which the electron blocking material is added is located closer to the anode 190101 than to the region 190106 to which the light-emitting material is added in the mixed region 190105, a recombination rate of carriers and light emission efficiency can be increased. The aforementioned structure including the region 190108 to which the electron blocking material is added is especially effective in an EL element which utilizes light emission (phosphorescence) by a triplet exciton.

Figure 79E:
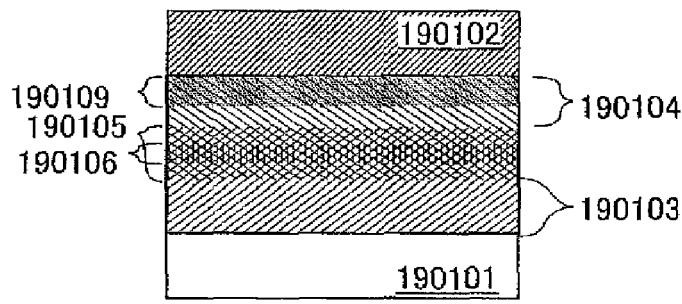

FIG. 79E is the schematic view of the structure of the mixed junction type EL element, which is different from those of FIGS. 79A to 79D. FIG. 79E shows an example of a structure where the EL layer includes a region 190109 to which a metal material is added in a portion in contact with an electrode of the EL element. In FIG. 79E, the same portions as those in FIGS. 79A to 79D are denoted by the same reference numerals, and the description is omitted. In the structure shown in FIG. 79E, the cathode 190102 may be formed using MgAg (an Mg—Ag alloy), and the electron transporting region 190104 to which the electron transporting material is added may include a region 190109 to which an aluminum (Al) alloy is added in a region in contact with the cathode 190102. By employing the aforementioned structure, oxidation of the cathode can be prevented, and the efficiency of electron injection from the cathode can be increased. Therefore, the lifetime of the mixed junction type EL element can be extended, and a driving voltage can be lowered.

As a method for forming the aforementioned mixed junction type EL element, a co-evaporation method or the like can be used.

In the mixed junction type EL elements as shown in FIGS. 79A to 79E, a distinct interface between the layers does not exist, and charge accumulation can be reduced. Thus, the lifetime of the EL element can be extended, and a driving voltage can be lowered.

Note that the structures shown in FIGS. 79A to 79E can be implemented in free combination with each other.

The structure of the mixed junction type EL element is not limited to those described above, and various structures can be freely used.

An organic material which is used to form an EL layer of an EL element may be a low molecular material, a high molecular material, or both of the materials. When a low molecular material is used as an organic compound material, a film can be formed by an evaporation method. On the other hand, when a high molecular material is used for the EL layer, the high molecular material can be dissolved in a solvent and a film can be formed by a spin coating method or an ink-jet method.

The EL layer may be formed of an intermediate molecular material. In this specification, an intermediate molecule organic light-emitting material refers to an organic light-emitting material without a sublimation property and with a polymerization degree of approximately 20 or less. When an intermediate molecular material is used for the EL layer, a film can be formed by an ink-jet method or the like.

Note that a low molecular material, a high molecular material, and an intermediate molecular material may be used in combination.

An EL element may utilize either light emission (fluorescence) by a singlet exciton or light emission (phosphorescence) by a triplet exciton.

Although this embodiment mode has been described with reference to various drawings, the contents (or part of the contents) described in each drawing can be freely applied to, combined with, or replaced with the contents (or part of the contents) described in another drawing. Further, much more drawings can be formed by combining each part in the above-described drawings with another part.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in the drawings in this embodiment mode with part of another embodiment mode.

Note that this embodiment mode has described just examples of embodying, slightly transforming, modifying, improving, describing in detail, or applying the contents (or part of the contents) described in other embodiment modes, an example of related part thereof, or the like. Therefore, the contents described in other embodiment modes can be freely applied to, combined with, or replaced with the contents described in this embodiment mode.

Embodiment Mode 18

This embodiment mode describes a structure of an EL element, particularly, a structure of an inorganic EL element.

As the base material used for a light-emitting material, a sulfide, an oxide, or a nitride can be used. As a sulfide, zinc sulfide (ZnS), cadmium sulfide (CdS), calcium sulfide (CaS), yttrium sulfide ($Y_2S_3$), gallium sulfide ($Ga_2S_3$), strontium sulfide (SrS), barium sulfide (BaS), or the like can be used, for example. As an oxide, zinc oxide (ZnO), yttrium oxide ($Y_2O_3$), or the like can be used, for example. As a nitride, aluminum nitride (AlN), gallium nitride (GaN), indium nitride (InN), or the like can be used, for example. Further, zinc selenide (ZnSe), zinc telluride (ZnTe), or the like can also be used. A ternary mixed crystal such as calcium gallium sulfide ($CaGa_2S_4$), strontium gallium sulfide ($SrGa_2S_4$), or barium gallium sulfide ($BaGa_2S_4$) may also be used.

As the light-emitting center of localized light emission, manganese (Mn), copper (Cu), samarium (Sm), terbium (Th), erbium (Er), thulium (Tm), europium (Eu), cerium (Ce), praseodymium (Pr), or the like can be used. Note that a halogen element such as fluorine (F) or chlorine (Cl) may be added as a charge compensation.

On the other hand, as the light-emitting center of donor-acceptor recombination light emission, a light-emitting material which contains a first impurity element forming a donor level and a second impurity element forming an acceptor level can be used. As the first impurity element, fluorine (F), chlorine (Cl), aluminum (Al), or the like can be used, for example. As the second impurity element, copper (Cu), silver (Ag), or the like can be used, for example.

Figure 80A:
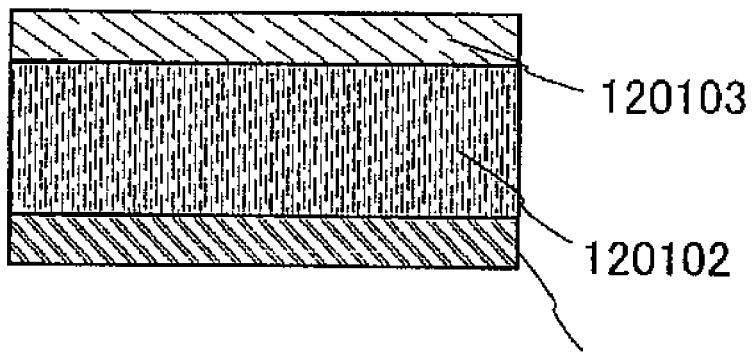
FIGS. 80A to 80C are cross-sectional views of display elements of a semiconductor device according to the present invention.
Figure 80B:
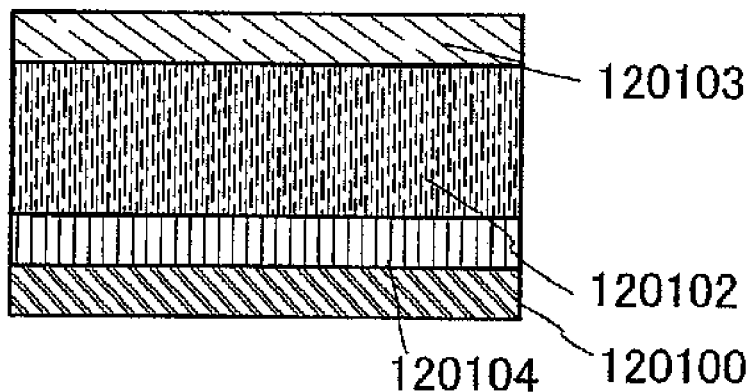
Figure 80C:
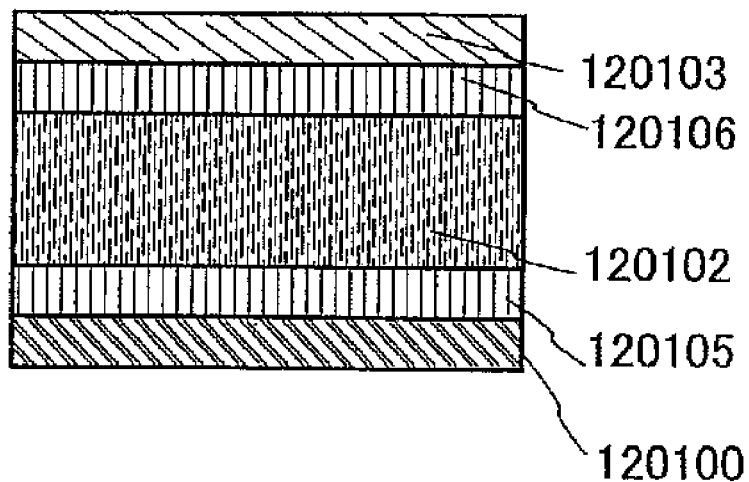

FIGS. 80A to 80C each show an example of a thin-film type inorganic EL element which can be used as a light-emitting element. In FIGS. 80A to 80C, the light-emitting element includes a first electrode layer 120100, an electroluminescent layer 120102, and a second electrode layer 120103.

The light-emitting elements in FIGS. 80B and 80C each have a structure where an insulating film is provided between the electrode layer and the electroluminescent layer in the light-emitting element in FIG. 80A. The light-emitting element in FIG. 80B includes an insulating film 120104 between the first electrode layer 120100 and the electroluminescent layer 120102. The light-emitting element in FIG. 80C includes an insulating film 120105 between the first electrode layer 120100 and the electroluminescent layer 120102, and an insulating film 120106 between the second electrode layer 120103 and the electroluminescent layer 120102. As described above, the insulating film may be provided between the electroluminescent layer and one of the electrode layers sandwiching the electroluminescent layer, or may be provided between the electroluminescent layer and each of the electrode layers sandwiching the electroluminescent layer. Further, the insulating film may be a single layer or stacked layers including a plurality of layers.

Figure 81A:
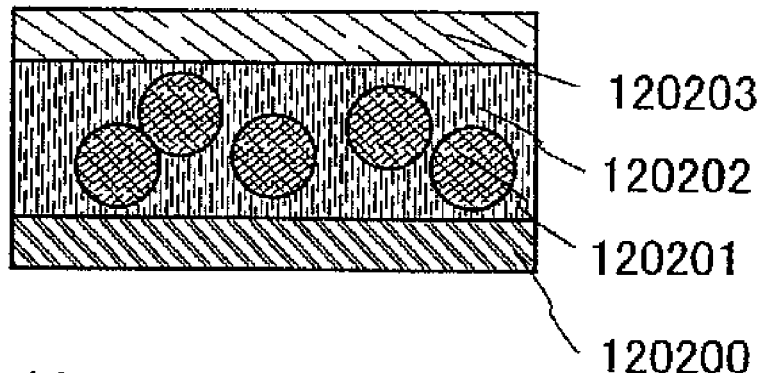
FIGS. 81A to 81C are cross-sectional views of display elements of a semiconductor device according to the present invention.
Figure 81B:
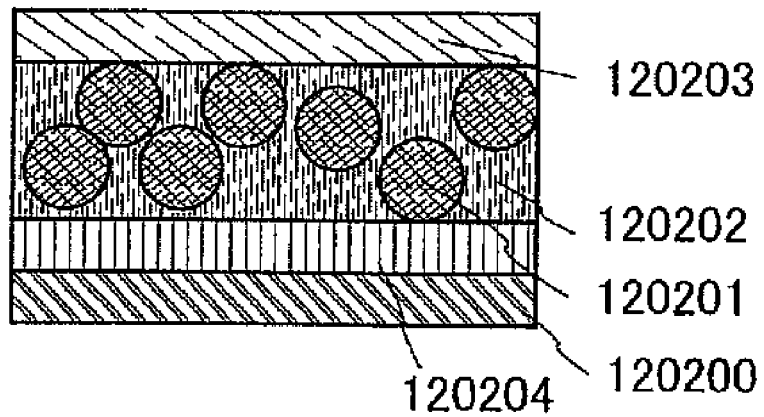
Figure 81C:
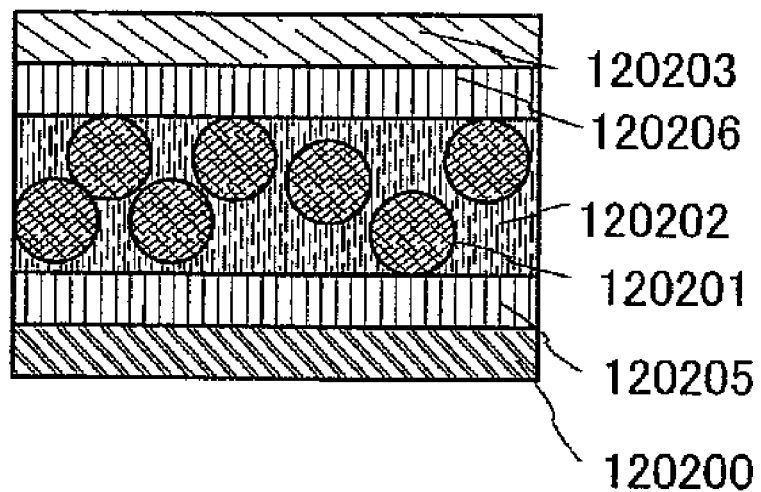

FIGS. 81A to 81C each show an example of a dispersion type inorganic EL element which can be used as a light-emitting element. A light-emitting element in FIG. 81A has a stacked-layer structure of a first electrode layer 120200, an electroluminescent layer 120202, and a second electrode layer 120203. The electroluminescent layer 120202 includes a light-emitting material 120201 held by a binder.

The light-emitting elements in FIGS. 81B and 81C each have a structure where an insulating film is provided between the electrode layer and the electroluminescent layer in the light-emitting element in FIG. 81A. The light-emitting element in FIG. 81B includes an insulating film 120204 between the first electrode layer 120200 and the electroluminescent layer 120202. The light-emitting element in FIG. 81C includes an insulating film 120205 between the first electrode layer 120200 and the electroluminescent layer 120202, and an insulating film 120206 between the second electrode layer 120203 and the electroluminescent layer 120202. As described above, the insulating film may be provided between the electroluminescent layer and one of the electrode layers sandwiching the electroluminescent layer, or may be provided between the electroluminescent layer and each of the electrode layers sandwiching the electroluminescent layer. Further, the insulating film may be a single layer or stacked layers including a plurality of layers.

The insulating film 120204 is provided in contact with the first electrode layer 120200 in FIG. 81B; however, the insulating film 120204 may be provided in contact with the second electrode layer 120203 by reversing the positions of the insulating film and the electroluminescent layer.

It is preferable that a material which can be used for the insulating films such as the insulating film 120104 in FIG. 80B and the insulating film 120204 in FIG. 81B has high withstand voltage and dense film quality. Further, the material preferably has high dielectric constant. For example, silicon oxide ($SiO_2$), yttrium oxide ($Y_2O_3$), titanium oxide ($TiO_2$), aluminum oxide ($Al_2O_3$), hafnium oxide ($HfO_2$), tantalum oxide ($Ta_2O_5$), barium titanate ($BaTiO_3$), strontium titanate ($SrTiO_3$), lead titanate ($PbTiO_3$), silicon nitride ($Si_3N_4$), or zirconium oxide ($ZrO_2$); or a mixed film of those materials or a stacked-layer film including two or more of those materials can be used. The insulating film can be formed by sputtering, evaporation, CVD, or the like. Alternatively, the insulating film may be formed by dispersing particles of these insulating materials in a binder. A binder material may be formed using a material similar to that of a binder contained in the electroluminescent layer, by using a method similar thereto. The thickness of the insulating film is preferably, but not limited to, in the range of 10 nm to 1000 nm.

Note that the light-emitting element can emit light when a voltage is applied between the pair of electrode layers sandwiching the electroluminescent layer. The light-emitting element can operate with DC drive or AC drive.

Although this embodiment mode has been described with reference to various drawings, the contents (or part of the contents) described in each drawing can be freely applied to, combined with, or replaced with the contents (or part of the contents) described in another drawing. Further, much more drawings can be formed by combining each part in the above-described drawings with another part.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in the drawings in this embodiment mode with part of another embodiment mode.

Note that this embodiment mode has described just examples of embodying, slightly transforming, modifying, improving, describing in detail, or applying the contents (or part of the contents) described in other embodiment modes, an example of related part thereof, or the like. Therefore, the contents described in other embodiment modes can be freely applied to, combined with, or replaced with the contents described in this embodiment mode.

Embodiment Mode 19

This embodiment mode describes an example of a display device, particularly, the case where a display device is optically treated.

Figure 82A:
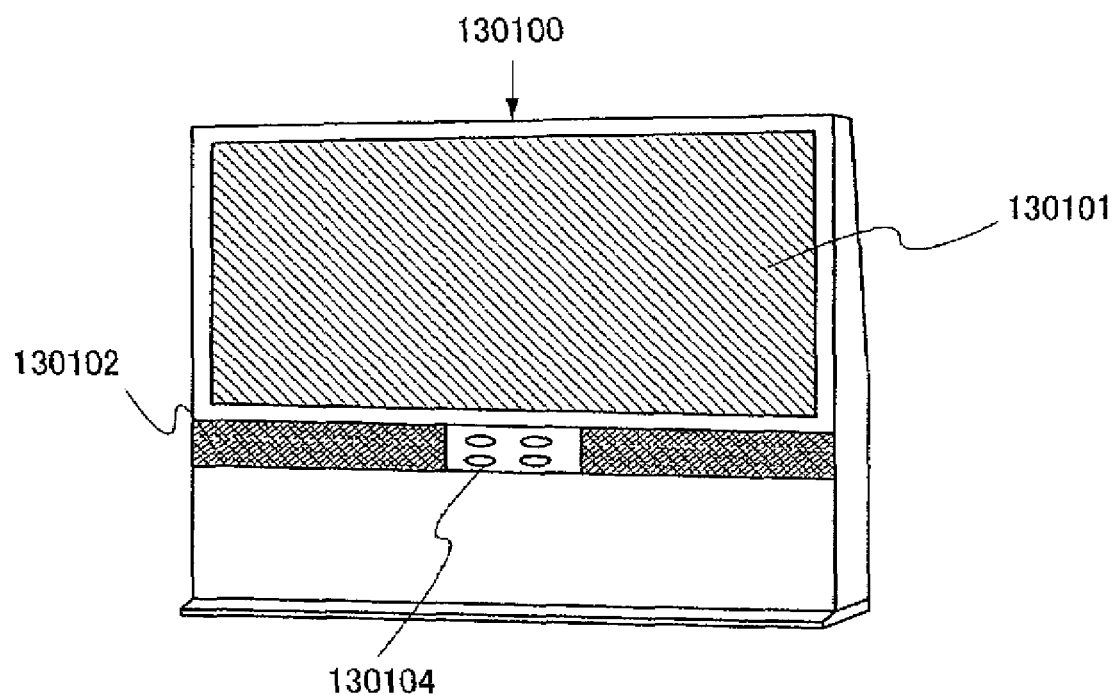
FIGS. 82A and 82B are diagrams illustrating a structure of a semiconductor device according to the present invention.
Figure 82B:
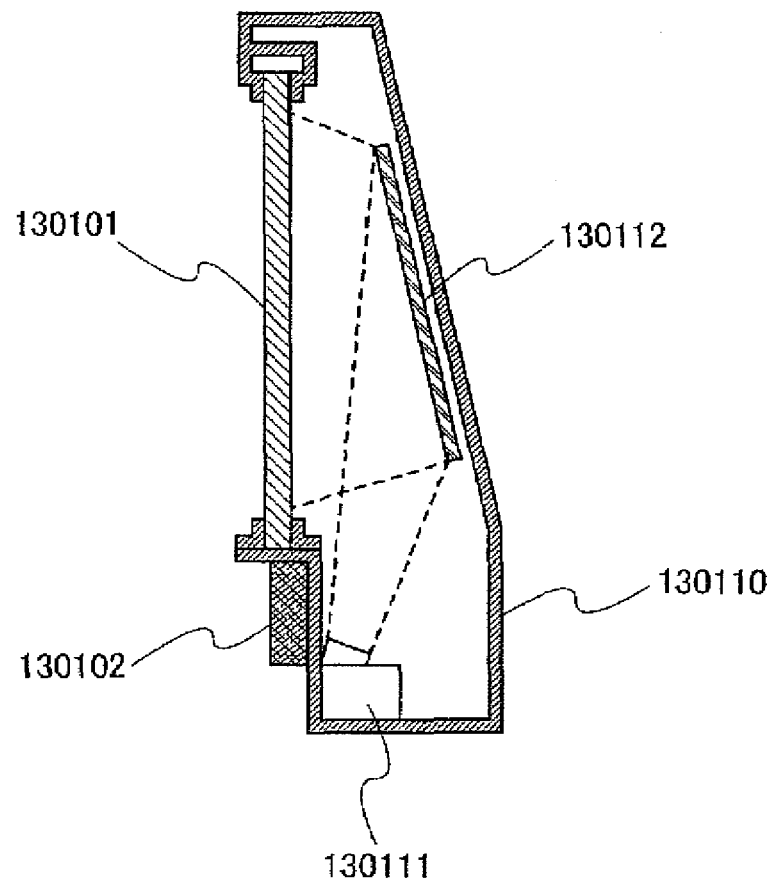

A rear projection display device 130100 in FIGS. 82A and 82B is provided with a projector unit 130111, a mirror 130112, and a screen panel 130101. The rear projection display device 130100 may also be provided with a speaker 130102 and operation switches 130104. The projector unit 130111 is provided in a lower portion of a housing 130110 of the rear projection display device 130100 and projects light for projecting an image based on a video signal to the mirror 130112. The rear projection display device 130100 displays an image projected from behind the screen panel 130101.

Figure 83:
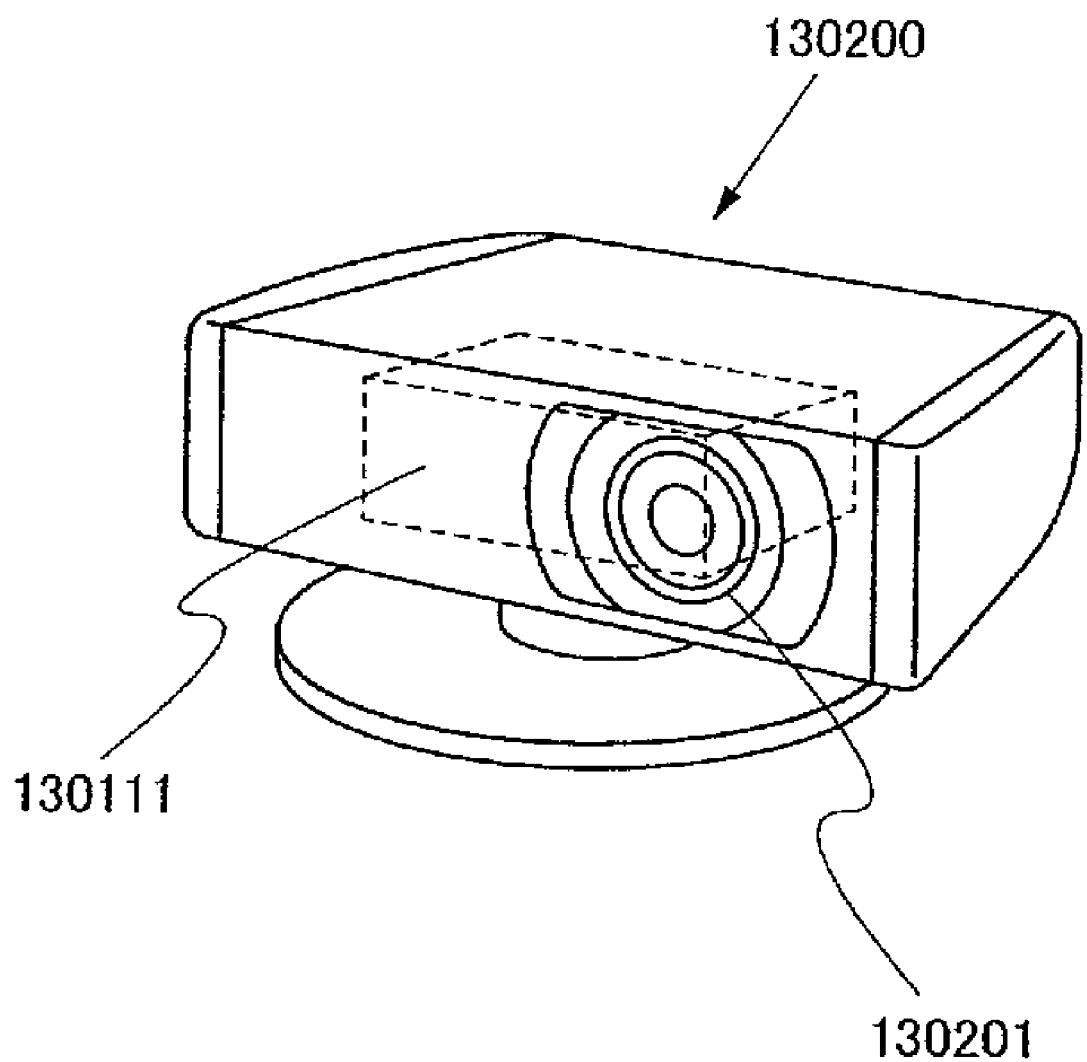
FIG. 83 is a diagram illustrating a structure of a semiconductor device according to the present invention.

FIG. 83 shows a front projection display device 130200. The front projection display device 130200 is provided with the projector unit 130111 and a projection optical system 130201. The projection optical system 130201 projects an image to a screen or the like provided at the front.

Figure 84:
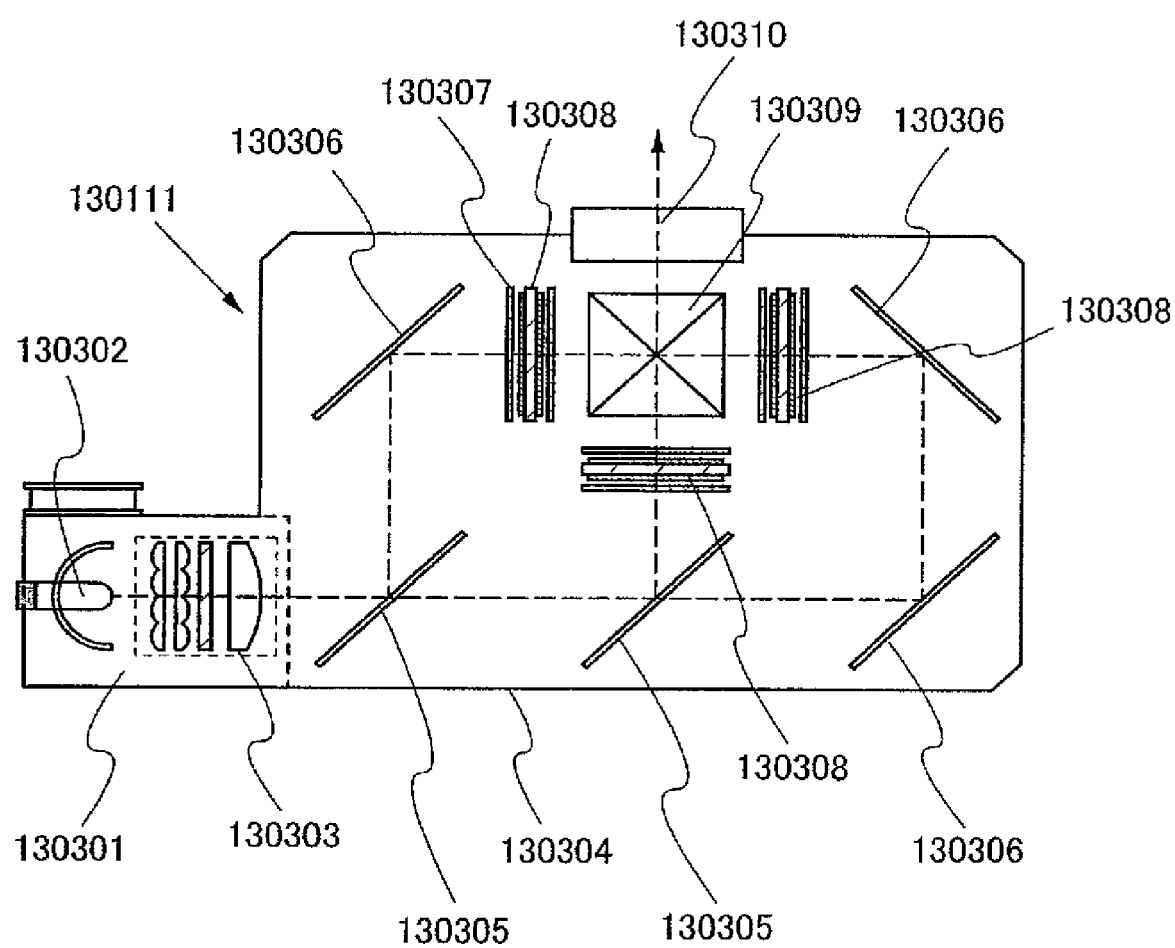
FIG. 84 is a diagram illustrating a structure of a semiconductor device according to the present invention.

Hereinafter, a structure of the projector unit 130111 which is applied to the rear projection display device 130100 in FIGS. 83A and 83B and the front projection display device 130200 in FIG. 84 is described.

FIG. 84 shows a structure example of the projector unit 130111. The projector unit 130111 is provided with a light source unit 130301 and a modulation unit 130304. The light source unit 130301 is provided with a light source optical system 130303 including lenses and a light source lamp 130302. The light source lamp 130302 is stored in a housing so that stray light is not scattered. As the light source lamp 130302, a high-pressure mercury lamp or a xenon lamp, for example, which can emit a large amount of light is used. The light source optical system 130303 is provided with an optical lens, a film having a light-polarizing function, a film for adjusting phase difference, an IR film, or the like as appropriate. The light source unit 130301 is provided so that emitted light is incident on the modulation unit 130304. The modulation unit 130304 is provided with a plurality of display panels 130308, a color filter, a dichroic mirror 130305, a total reflection mirror 130306, a retardation plate 130307, a prism 130309, and a projection optical system 130310. Light emitted from the light source unit 130301 is split into a plurality of optical paths by the dichroic mirror 130305.

In each optical path, a color filter which transmits light with a predetermined wavelength or wavelength band and the display panel 130308 are provided. The transmissive display panel 130308 modulates transmission light based on a video signal. Light of each color transmitted through the display panel 130308 is incident on the prism 130309, and an image is displayed on the screen through the projection optical system 130310. Note that a Fresnel lens may be provided between the mirror and the screen. Light which has been emitted from the projector unit 130111 and reflected by the mirror is converted into collimated light by the Fresnel lens and the collimated light is projected on the screen. Displacement of the collimated light between a chief ray and an optical axis is preferably ±10° or less, and more preferably, ±5° or less.

Figure 85:
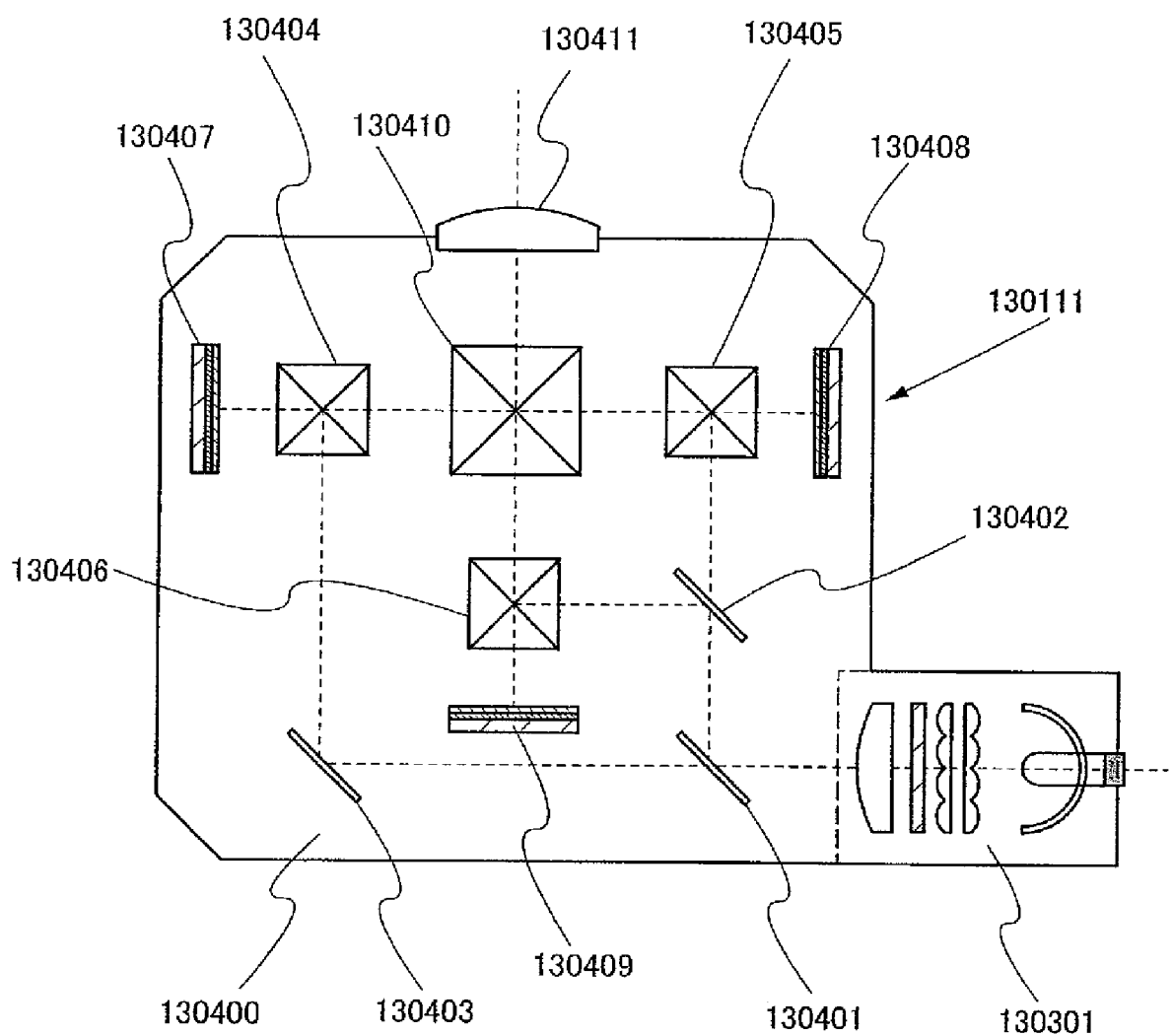
FIG. 85 is a diagram illustrating a structure of a semiconductor device according to the present invention.

The projector unit 130111 shown in FIG. 85 is provided with reflective display panels 130407, 130408, and 130409.

The projector unit 130111 in FIG. 85 is provided with the light source unit 130301 and a modulation unit 130400. The light source unit 130301 may have a structure similar to FIG. 84. Light from the light source unit 130301 is split into a plurality of optical paths by dichroic mirrors 130401 and 130402 and a total reflection mirror 130403 to be incident on polarization beam splitters 130404, 130405, and 130406. The polarization beam splitters 130404, 130405, and 130406 are provided corresponding to the reflective display panels 130407, 130408, and 130409 which correspond to respective colors. The reflective display panels 130407, 130408, and 130409 modulate reflected light based on a video signal. Light of each color, which is reflected by the reflective display panels 130407, 130408, and 130409, is incident on a prism 130410 to be composed, and projected through a projection optical system 130411.

Of light emitted from the light source unit 130301, the dichroic mirror 130401 transmits only light in a wavelength range of red and reflects light in wavelength ranges of green and blue. Further, the dichroic mirror 130402 reflects only the light in the wavelength range of green. The light in the wavelength range of red, which is transmitted through the dichroic mirror 130401, is reflected by the total reflection mirror 130403 and incident on the polarization beam splitter 130404. The light in the wavelength range of blue is incident on the polarization beam splitter 130405. The light in the wavelength range of green is incident on the polarization beam splitter 130406. The polarization beam splitters 130404, 130405, and 130406 have a function to split incident light into P-polarized light and S-polarized light and a function to transmit only P-polarized light. The reflective display panels 130407, 130408, and 130409 polarize incident light based on a video signal.

Only the S-polarized light corresponding to each color is incident on the reflective display panels 130407, 130408, and 130409 corresponding to each color. Note that the reflective display panels 130407, 130408, and 130409 may be liquid crystal panels. In this case, the liquid crystal panel operates in an electrically controlled birefringence (ECB) mode. Liquid crystal molecules are vertically aligned at an angle to a substrate. Accordingly, in the reflective display panels 130407, 130408, and 130409, when a pixel is turned off, display molecules are aligned not to change a polarization state of incident light so as to reflect the incident light. When the pixel is turned on, alignment of the display molecules is changed, and the polarization state of the incident light is changed.

The projector unit 130111 in FIG. 85 can be applied to the rear projection display device 130100 in FIGS. 82A and 82B and the front projection display device 130200 in FIG. 83.

Figure 86A:
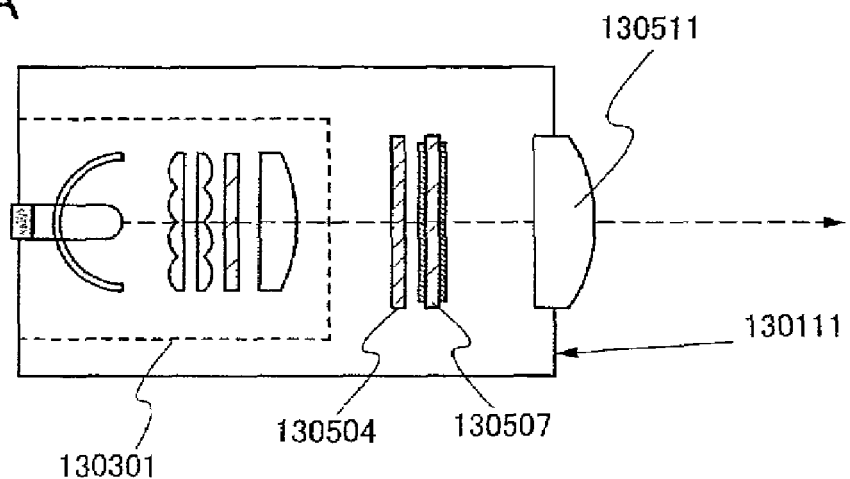
FIGS. 86A to 86C are diagrams illustrating structures of a semiconductor device according to the present invention.
Figure 86B:
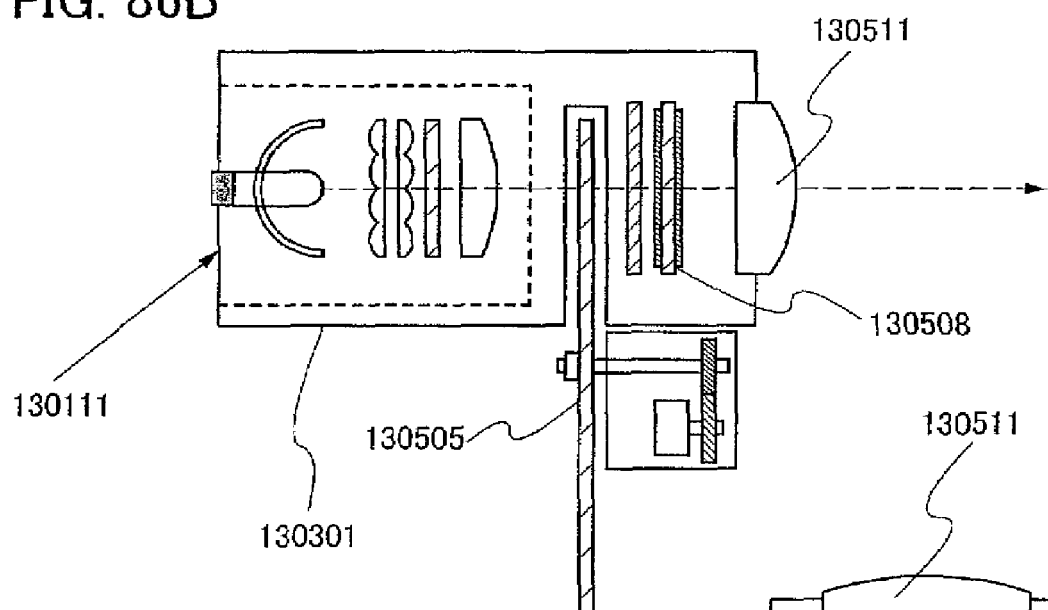
Figure 86C:
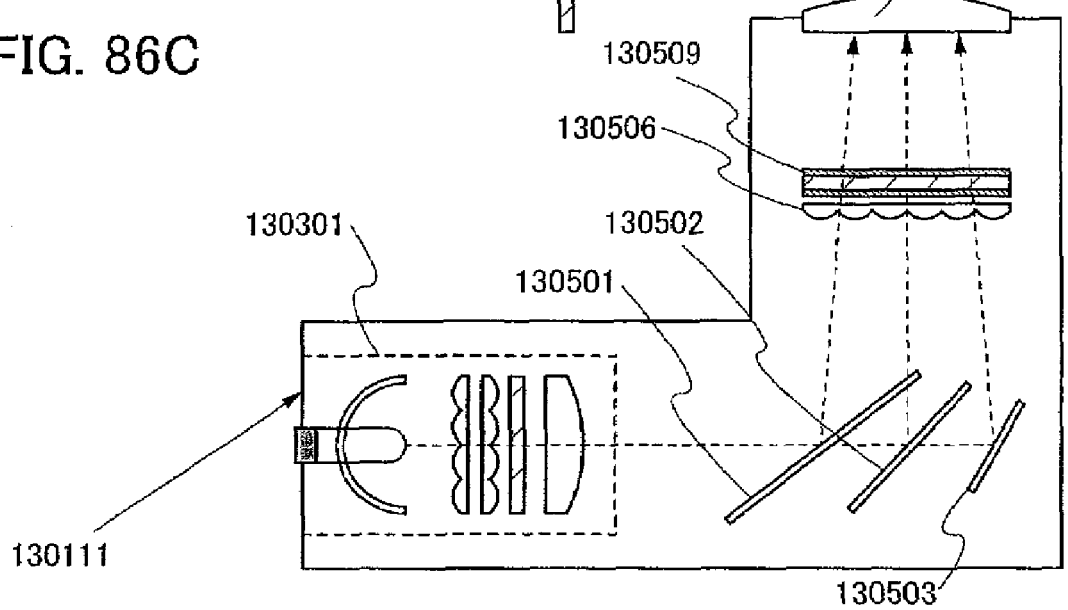

FIGS. 86A to 86C each show a single-panel type projector unit. The projector unit 130111 shown in FIG. 86A is provided with the light source unit 130301, a display panel 130507, a projection optical system 130511, and a retardation plate 130504. The projection optical system 130511 includes one or a plurality of lenses. The display panel 130507 may be provided with a color filter.

FIG. 86B shows a structure of the projector unit 130111 operating in a field sequential mode. The field sequential mode corresponds to a mode in which color display is performed by light of respective colors such as red, green, and blue sequentially incident on a display panel with a time lag, without a color filter. A high-definition image can be displayed particularly by combination with a display panel with high-speed response to a change in input signal. The projector unit 130111 in FIG. 80B is provided with a rotating color filter plate 130505 including a plurality of color filters with red, green, blue, or the like between the light source unit 130301 and a display panel 130508.

FIG. 86C shows a structure of the projector unit 130111 with a color separation system using a micro lens, as a color display method. The color separation system corresponds to a system in which color display is realized by providing a micro lens array 130506 on the side of a display panel 130509, on which light is incident, and light of each color is emitted from each direction. The projector unit 130111 employing this system has little loss of light due to a color filter, so that light from the light source unit 130301 can be efficiently utilized. The projector unit 130111 in FIG. 86C is provided with dichroic mirrors 130501, 130502, and 130503 so that light of each color is emitted to the display panel 130509 from each direction.

Although this embodiment mode has been described with reference to various drawings, the contents (or part of the contents) described in each drawing can be freely applied to, combined with, or replaced with the contents (or part of the contents) described in another drawing. Further, much more drawings can be formed by combining each part in the above-described drawings with another part.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in the drawings in this embodiment mode with part of another embodiment mode.

Note that this embodiment mode has described just examples of embodying, slightly transforming, modifying, improving, describing in detail, or applying the contents (or part of the contents) described in other embodiment modes, an example of related part thereof, or the like. Therefore, the contents described in other embodiment modes can be freely applied to, combined with, or replaced with the contents described in this embodiment mode.

Embodiment Mode 20

Embodiment Mode 20 will describe examples of electronic devices.

Figure 87:
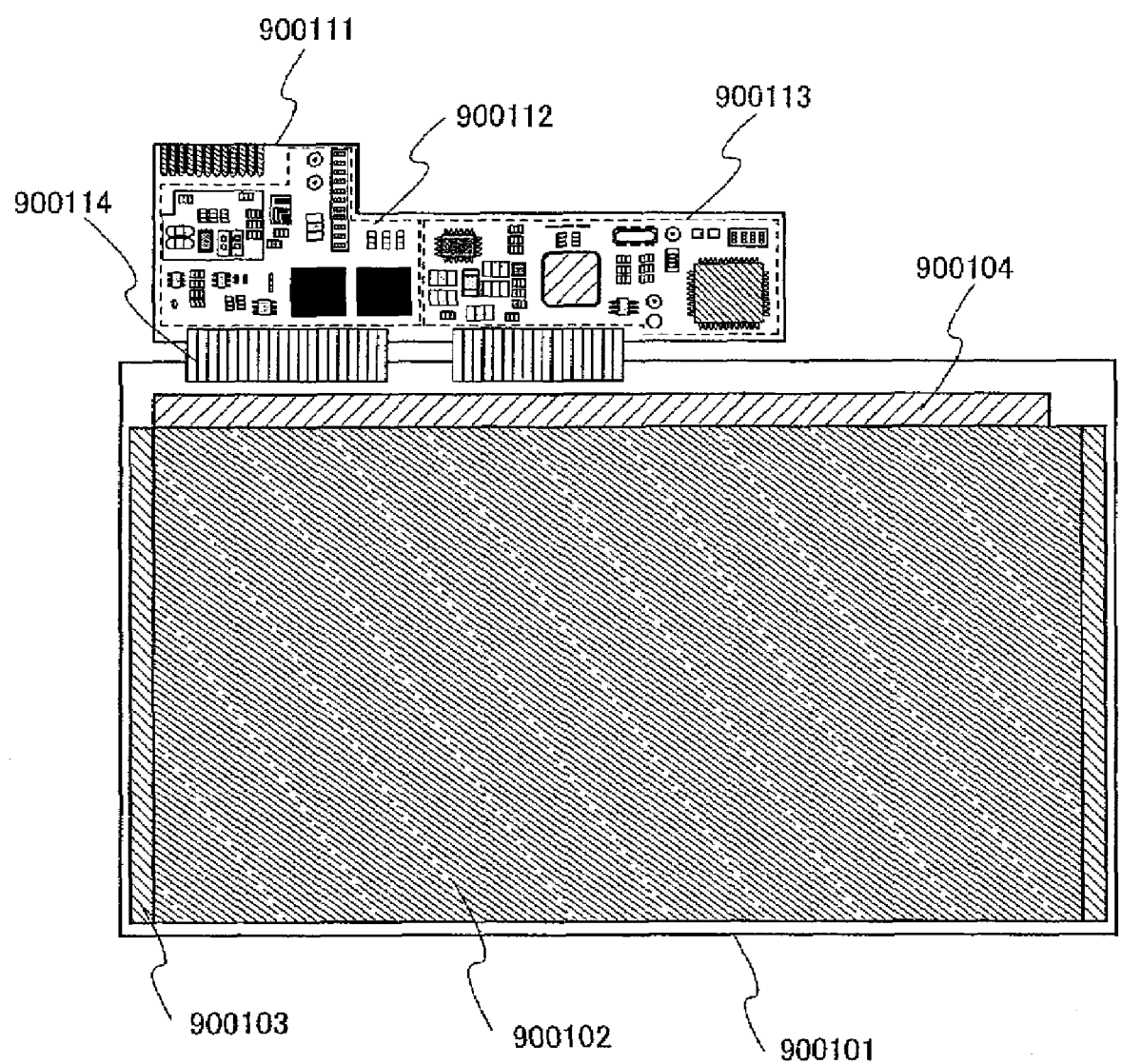
FIG. 87 is a diagram illustrating a structure of a semiconductor device according to the present invention.

FIG. 87 illustrates a display panel module combining a display panel 900101 and a circuit board 900111. The display panel 900101 includes a pixel portion 900102, a scan line driver circuit 900103, and a signal line driver circuit 900104. The circuit board 900111 is provided with a control circuit 900112, a signal dividing circuit 900113, and the like, for example. The display panel 900101 and the circuit board 900111 are connected to each other by a connection wiring 900114. An FPC or the like can be used as the connection wiring.

Figure 92:
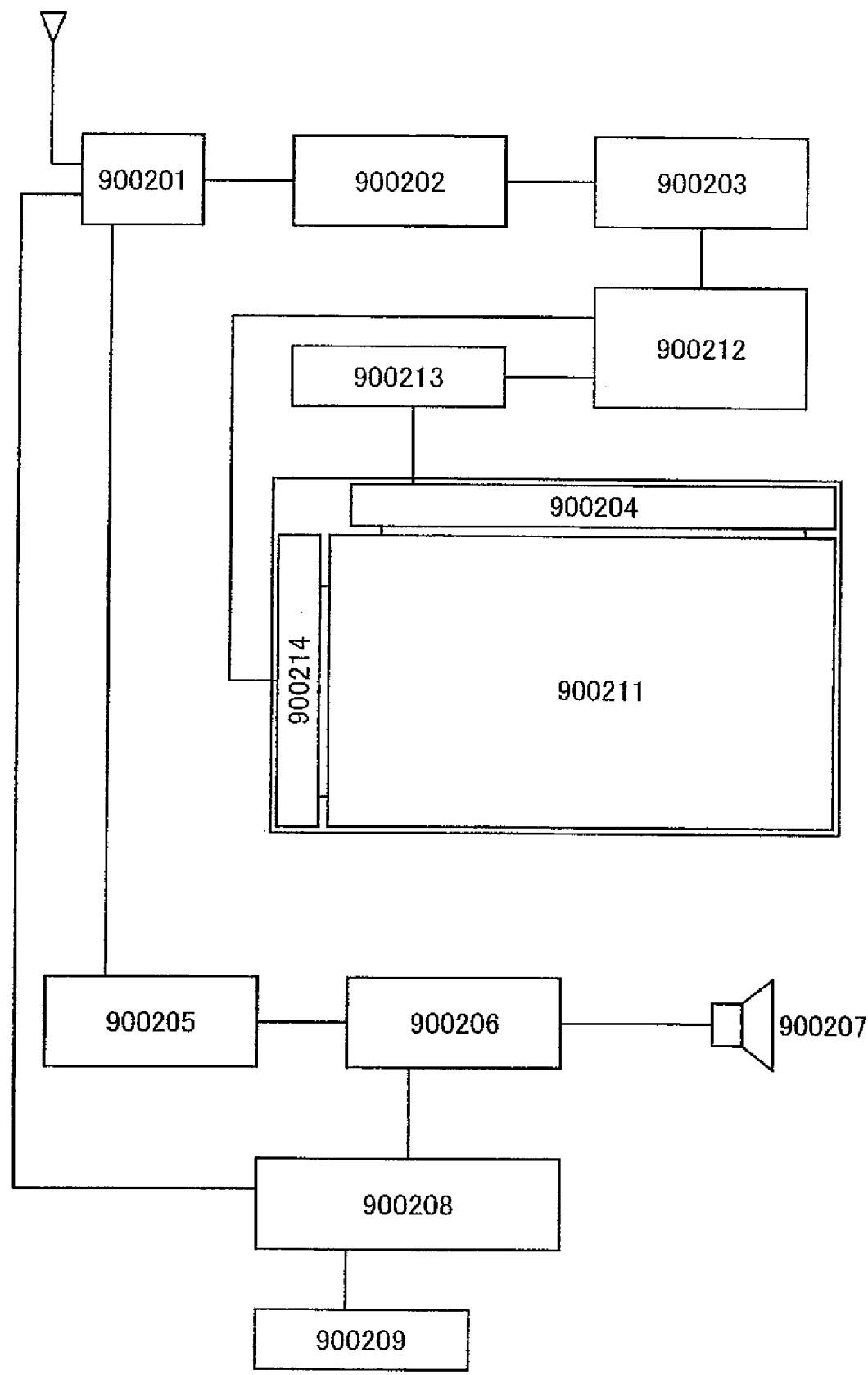
FIG. 92 is a diagram illustrating a structure of a semiconductor device according to the present invention.

FIG. 92 is a block diagram of a main structure of a television receiver. A tuner 900201 receives a video signal and an audio signal. The video signals are processed by a video signal amplifier circuit 900202; a video signal processing circuit 900203 and a control circuit 900212. The video signal processing circuit 900203 converts a signal output from the video signal amplifier circuit 900202 into a color signal corresponding to each color of red, green, and blue. The control circuit 900212 converts the video signal into the input specification of a driver circuit. The control circuit 900212 outputs a signal to each of a scan line driver circuit 900214 and a signal line driver circuit 900204. The scan line driver circuit 900214 and the signal line driver circuit 900204 drive a display panel 900211. When performing digital driving, a structure may be employed in which a signal dividing circuit 900213 is provided on the signal line side so that an input digital signal is divided into m signals (m is a positive integer) to be supplied.

Among the signals received by the tuner 900201, an audio signal is transmitted to an audio signal amplifier circuit 900205, and an output thereof is supplied to a speaker 900207 through an audio signal processing circuit 900206. A control circuit 900208 receives control information on receiving station (receiving frequency) and volume from an input portion 900209 and transmits signals to the tuner 900201 or the audio signal processing circuit 900206.

Figure 93A:
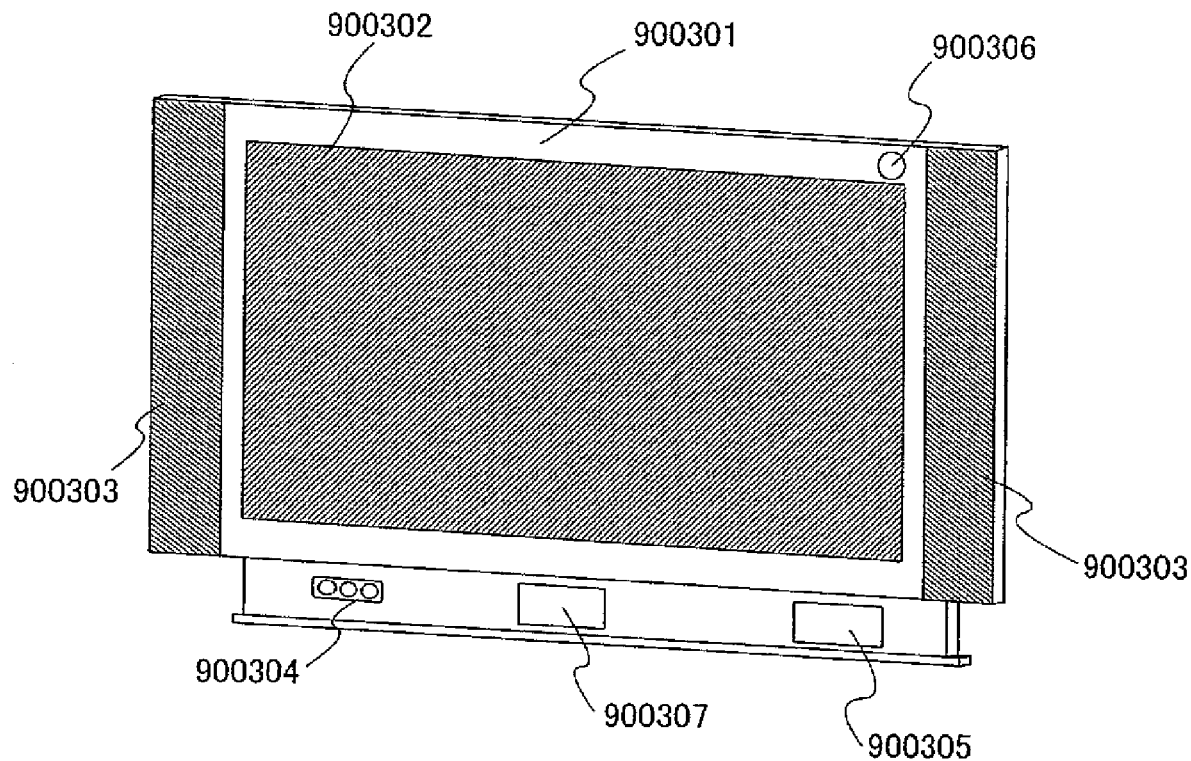
FIGS. 93A and 93B are diagrams illustrating electronic devices using a semiconductor device according to the present invention.

FIG. 93A illustrates a television receiver incorporated with a display panel module, which is different from FIG. 92. In FIG. 93A, a display screen 900302 incorporated in a housing 900301 is formed using the display panel module. Note that speakers 900303, input means (an operation key 900304, a connection terminal 900305, a sensor 900306 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 900307), and the like may be provided as appropriate.

Figure 93B:
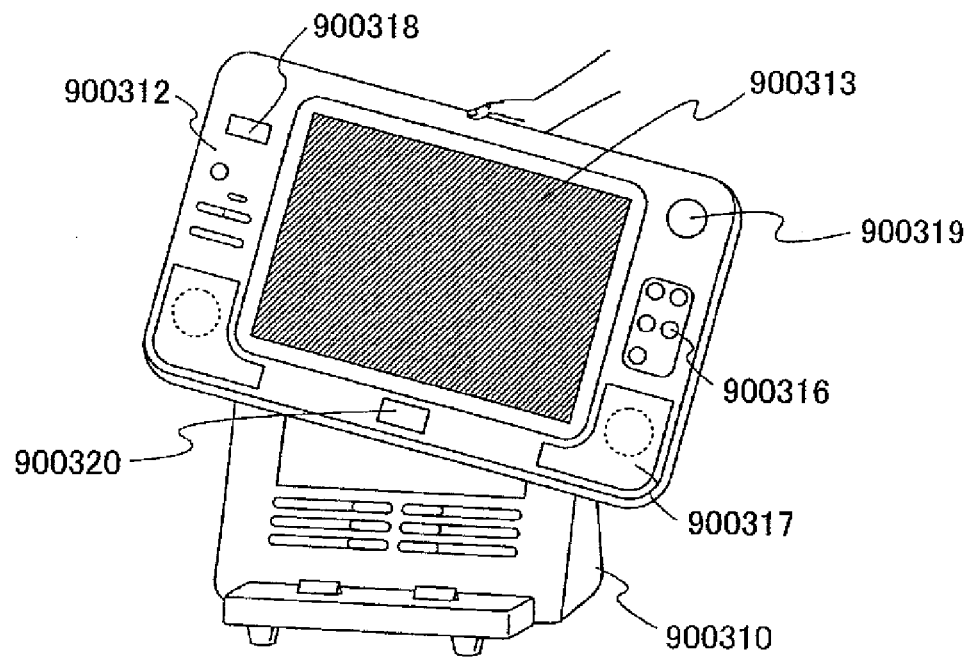

FIG. 93B illustrates a television receiver in which a display can be carried wirelessly. The television receiver is provided with a display portion 900313, a speaker portion 900317, input means (an operation key 900316, a connection terminal 900318, a sensor 900319 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 900320), and the like as appropriate. A battery and a signal receiver are incorporated in a housing 900312. The battery drives the display portion 900313, the speaker portion 900317, the sensor 900319, and the microphone 900320. The battery can be repeatedly charged by a charger 900310. The charger 900310 can transmit and receive a video signal and transmit the video signal to the signal receiver of the display. The device in FIG. 93B is controlled by the operation key 900316. Alternatively, the device in FIG. 93B can transmit a signal to the charger 900310 by operating the operation key 900316. That is, the device may be a video-audio two-way communication device. Further alternatively, by operating the operation key 900316, the device in FIG. 93B may transmit a signal to the charger 900310 and make another electronic device receive a signal which can be transmitted from the charger 900310; thus, the device in FIG. 93B can control communication of another electronic device. That is, the device may be a general-purpose remote control device. Note that the contents (or part thereof) described in each drawing of this embodiment mode can be applied to the display portion 900313.

Next, a structure example of a mobile phone is described with reference to FIG. 94.

A display panel 900501 is detachably incorporated in a housing 900530. The shape and size of the housing 900530 can be changed as appropriate in accordance with the size of the display panel 900501. The housing 900530 which fixes the display panel 900501 is fitted in a printed wiring board 900531 to be assembled as a module.

The display panel 900501 is connected to the printed wiring board 900531 through an FPC 900513. The printed wiring board 900531 is provided with a speaker 900532, a microphone 900533, a transmitting/receiving circuit 900534, a signal processing circuit 900535 including a CPU, a controller, and the like, and a sensor 900541 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray). Such a module, an operation key 900536, a battery 900537, and an antenna 900540 are combined and stored in a housing 900539. A pixel portion of the display panel 900501 is provided to be viewed from an opening window formed in the housing 900539.

In the display panel 900501, the pixel portion and part of peripheral driver circuits (a driver circuit having a low operation frequency among a plurality of driver circuits) may be formed over the same substrate by using transistors, and another part of the peripheral driver circuits (a driver circuit having a high operation frequency among the plurality of driver circuits) may be formed over an IC chip. Then, the IC chip may be mounted on the display panel 900501 by COG (Chip On Glass). Alternatively, the IC chip may be connected to a glass substrate by using TAB (Tape Automated Bonding) or a printed wiring board. With such a structure, power consumption of a display device can be reduced and operation time of the mobile phone per charge can be extended. Further, reduction in cost of the mobile phone can be realized.

Figure 94:
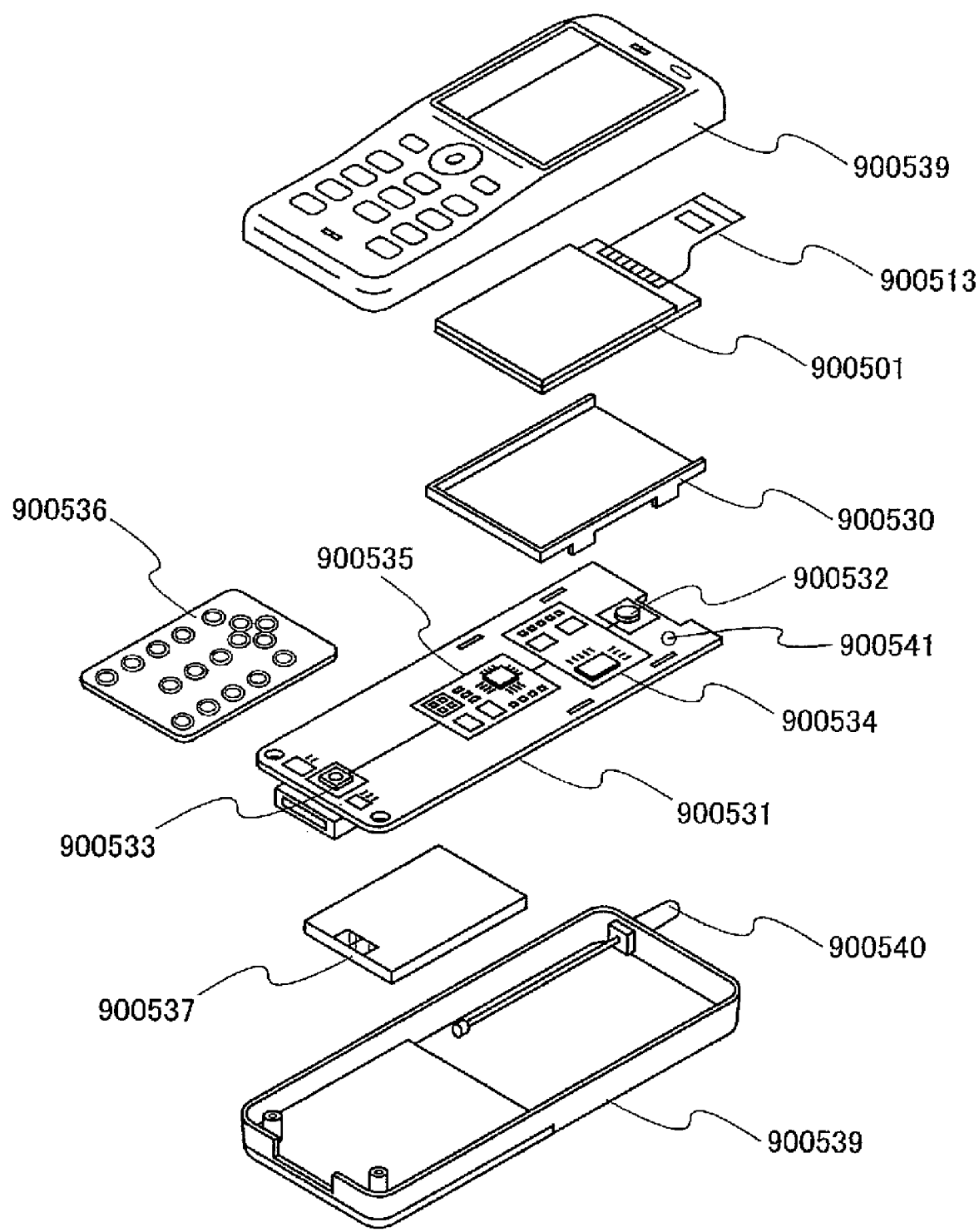
FIG. 94 is a diagram illustrating a structure of a semiconductor device according to the present invention.

The mobile phone in FIG. 94 has various functions such as, but not limited to, a function to display various kinds of information (e.g., a still image, a moving image, and a text image); a function to display a calendar, a date, the time, and the like on a display portion; a function to operate or edit the information displayed on the display portion; a function to control processing by various kinds of software (programs); a function of wireless communication; a function to communicate with another mobile phone, a fixed phone, or an audio communication device by using the wireless communication function; a function to connect with various computer networks by using the wireless communication function; a function to transmit or receive various kinds of data by using the wireless communication function; a function to operate a vibrator in accordance with incoming call, reception of data, or an alarm; and a function to produce a sound in accordance with incoming call, reception of data, or an alarm.

Figure 95A:
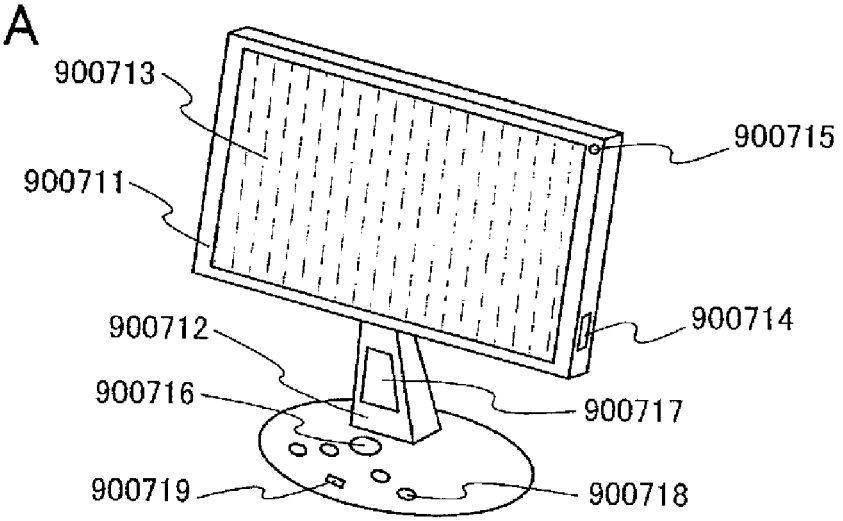
FIGS. 95A to 95C are diagrams illustrating electronic devices using a semiconductor device according to the present invention.

FIG. 95A illustrates a display, which includes a housing 900711, a support base 900712, a display portion 900713, a speaker 900717, an LED lamp 900719, input means (a connection terminal 900714, a sensor 900715 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), a microphone 900716, and an operation key 900718), and the like. The display in FIG. 95A can have various functions such as, but not limited to, a function to display various kinds of information (e.g., a still image, a moving image, and a text image) on the display portion.

Figure 95B:
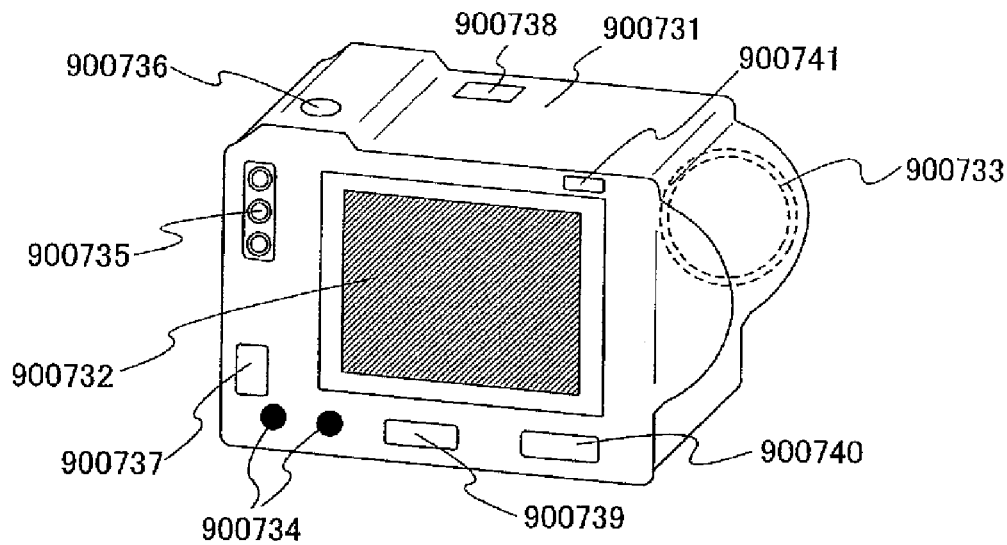

FIG. 95B illustrates a camera, which includes a main body 900731, a display portion 900732, a shutter button 900736, a speaker 900740, an LED lamp 900741, input means (an image receiving portion 900733, operation keys 900734, an external connection port 900735, a connection terminal 900737, a sensor 900738 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 900739), and the like. The camera in FIG. 95B can have various functions such as, but not limited to, a function to photograph a still image or a moving image; a function to automatically adjust the photographed image (still image or moving image); a function to store the photographed image in a recording medium (provided externally or incorporated in the camera); and a function to display the photographed image on the display portion.

Figure 95C:
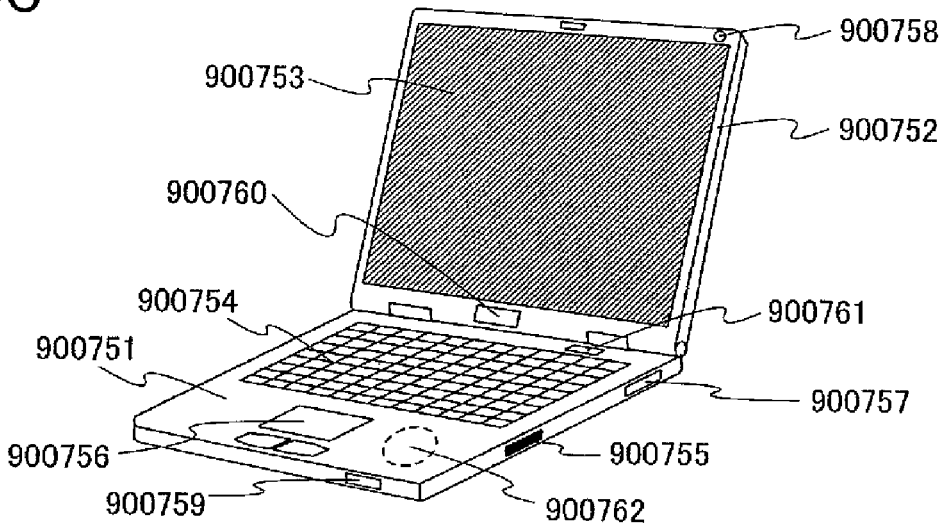

FIG. 95C illustrates a computer, which includes a main body 900751, a housing 900752, a display portion 900753, a speaker 900760, an LED lamp 900761, a reader/writer 900762, input means (a keyboard 900754, an external connection port 900755, a pointing device 900756, a connection terminal 900757, a sensor 900758 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 900759), and the like. The computer in FIG. 95C can have various functions such as, but not limited to, a function to display various kinds of information (e.g., a still image, a moving image, and a text image) on the display portion; a function to control processing by various kinds of software (programs); a communication function such as wireless communication or wire communication; a function to connect with various computer networks by using the communication function; and a function to transmit or receive various kinds of data by using the communication function.

Figure 102A:
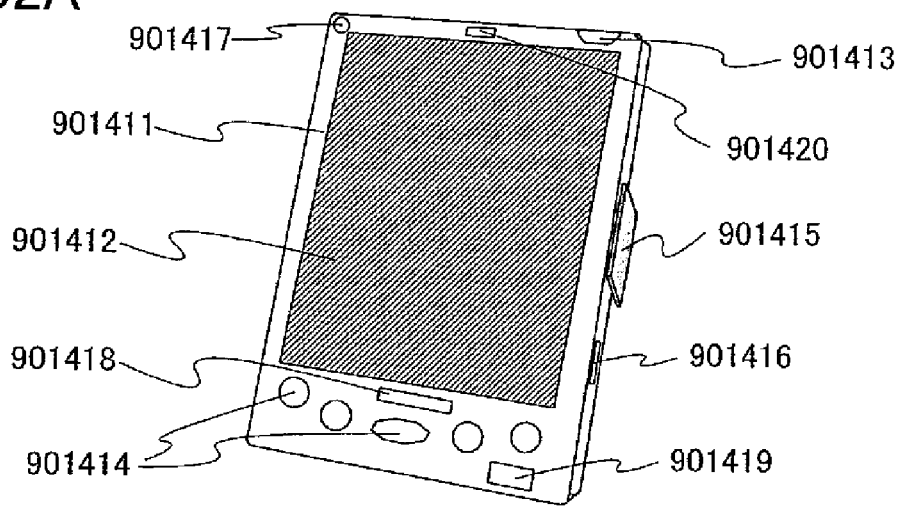
FIGS. 102A to 102C are diagrams illustrating electronic devices using a semiconductor device according to the present invention.

FIG. 102A illustrates a mobile computer, which includes a main body 901411, a display portion 901412, a switch 901413, a speaker 901419, an LED lamp 901420, input means (operation keys 901414, an infrared port 901415, a connection terminal 901416, a sensor 901417 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 901418), and the like. The mobile computer in FIG. 102A can have various functions such as, but not limited to, a function to display various kinds of information (e.g., a still image, a moving image, and a text image) on the display portion; a touch panel function provided on the display portion; a function to display a calendar, a date, the time, and the like on the display portion; a function to control processing by various kinds of software (programs); a function of wireless communication; a function to connect with various computer networks by using the wireless communication function; and a function to transmit or receive various kinds of data by using the wireless communication function.

Figure 102B:
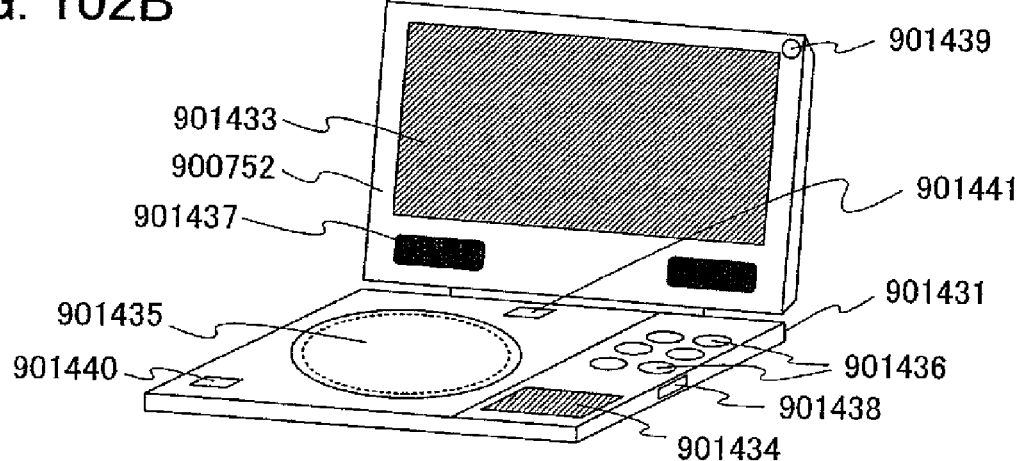

FIG. 102B illustrates a portable image reproducing device having a recording medium (e.g., a DVD player), which includes a main body 901431, a housing 901432, a display portion A 901433, a display portion B 901434, a speaker portion 901437, an LED lamp 901441, input means (a recording medium (e.g., DVD) reading portion 901435, operation keys 901436, a connection terminal 901438, a sensor 901439 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 901440), and the like. The display portion A 901433 mainly displays image information and the display portion B 901434 mainly displays text information.

Figure 102C:
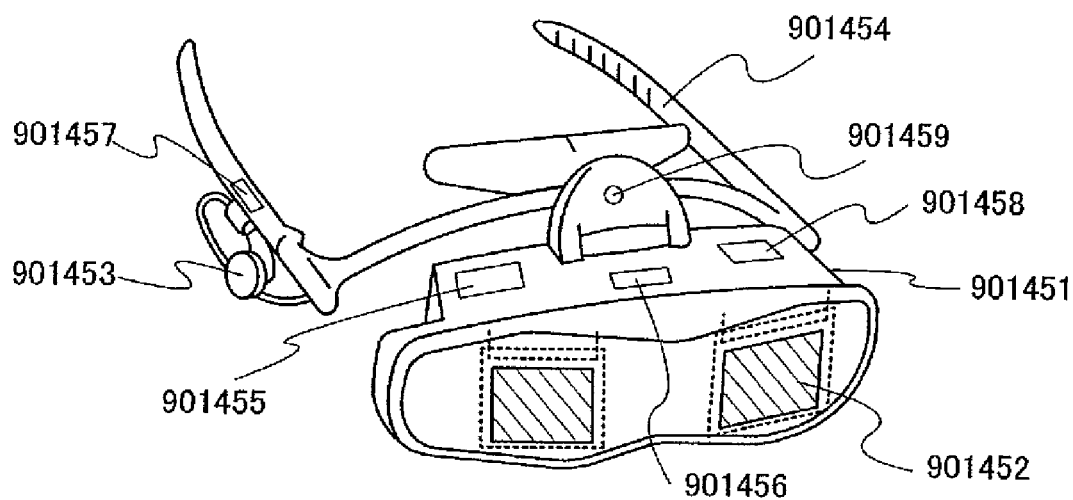

FIG. 102C illustrates a goggle-type display, which includes a main body 901451, a display portion 901452, an earphone 901453, a support portion 901454, an LED lamp 901459, a speaker 901458, input means (a connection terminal 901455, a sensor 901456 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 901457), and the like. The goggle-type display in FIG. 102C can have various functions such as, but not limited to, a function to display an externally obtained image (e.g., a still image, a moving image, and a text image) on the display portion.

Figure 103A:
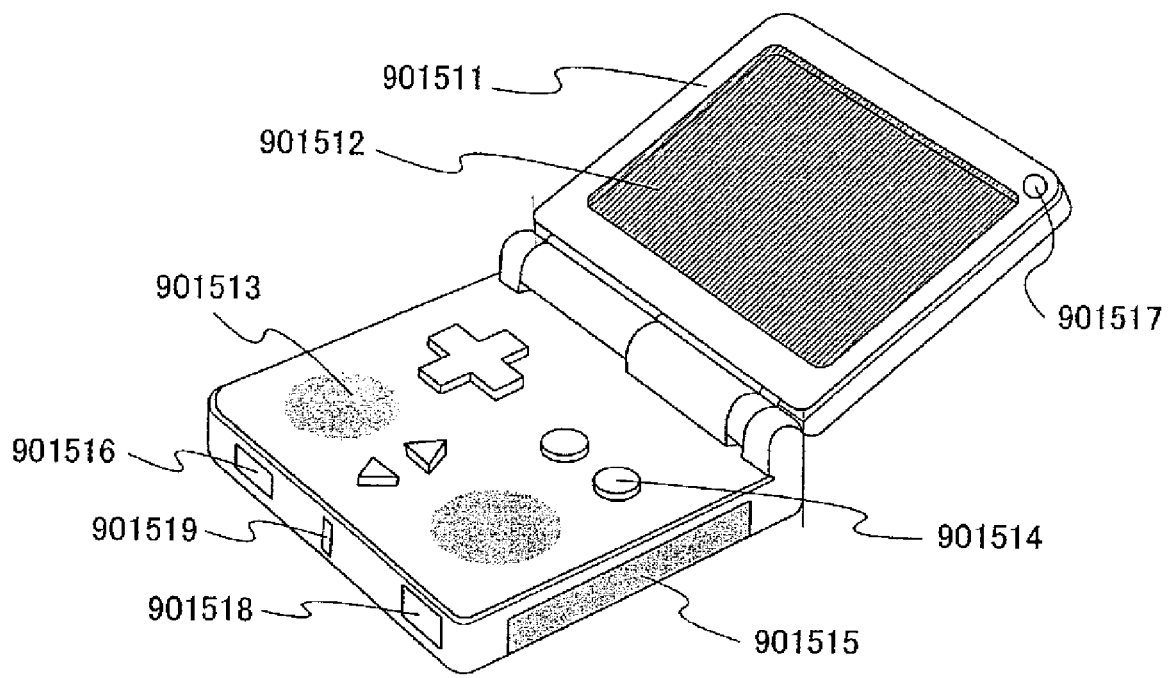
FIGS. 103A and 103B are diagrams illustrating electronic devices using a semiconductor device according to the present invention.

FIG. 103A illustrates a portable game machine, which includes a housing 901511, a display portion 901512, a speaker portion 901513, a recording medium insert portion 901515, an LED lamp 901519, input means (an operation key 901514, a connection terminal 901516, a sensor 901517 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 901518), and the like. The portable game machine in FIG. 103A can have various functions such as, but not limited to, a function to read a program or data stored in the recording medium to display on the display portion; and a function to share information with another portable game machine by wireless communication.

Figure 103B:
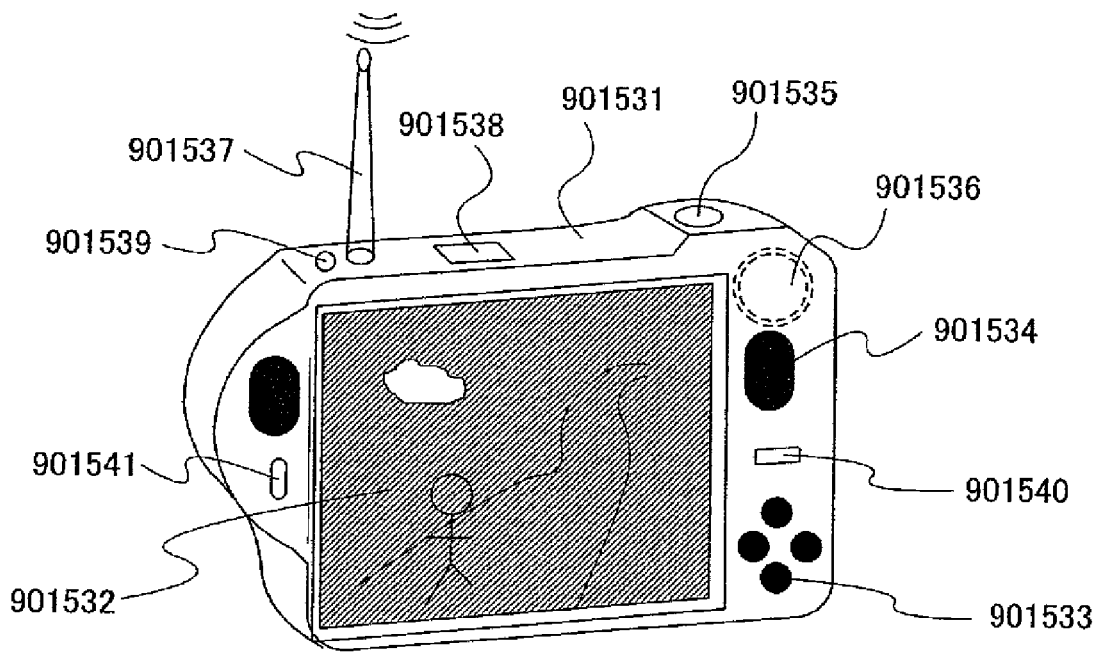

FIG. 103B illustrates a digital camera having a television reception function, which includes a main body 901531, a display portion 901532, a speaker 901534, a shutter button 901535, an LED lamp 901541, input means (an operation key 901533, an image receiving portion 901536, an antenna 901537, a connection terminal 901538, a sensor 901539 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 901540), and the like. The digital camera having a television reception function in FIG. 103B can have various functions such as, but not limited to, a function to photograph a still image or a moving image; a function to automatically adjust the photographed image; a function to obtain various kinds of information from the antenna; a function to store the photographed image or the information obtained from the antenna; and a function to display the photographed image or the information obtained from the antenna on the display portion.

Figure 104:
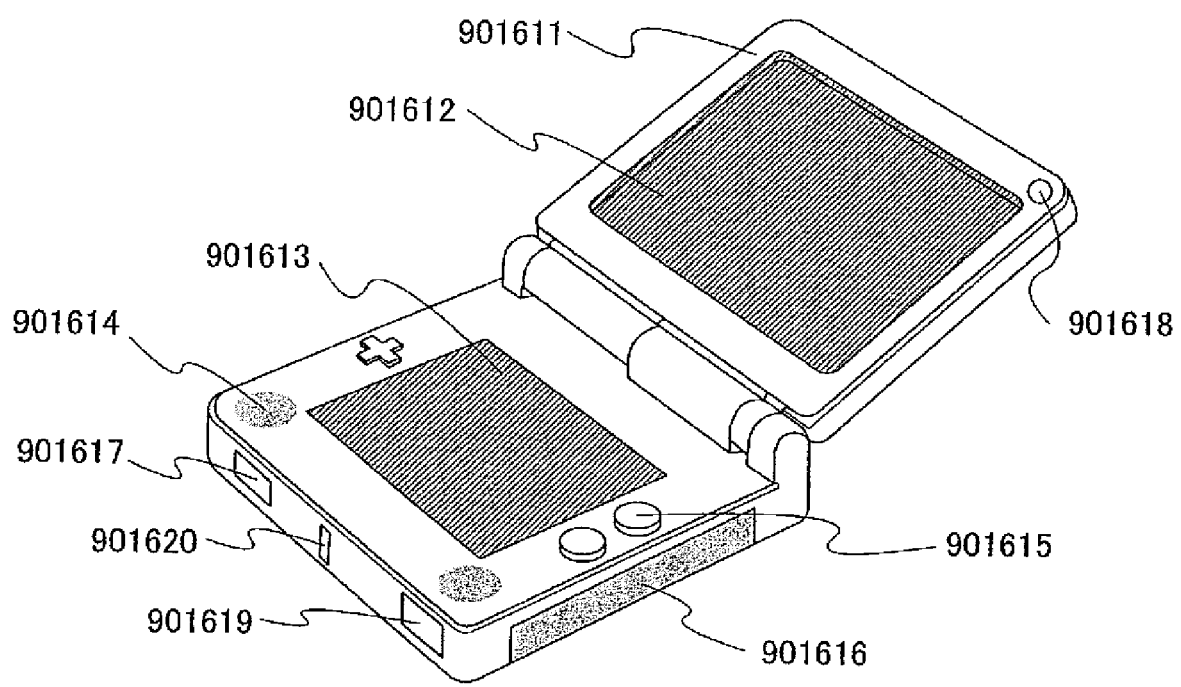
FIG. 104 is a diagram illustrating an electronic device using a semiconductor device according to the present invention.

FIG. 104 illustrates a portable game machine, which includes a housing 901611, a first display portion 901612, a second display portion 901613, a speaker portion 901614, a recording medium insert portion 901616, an LED lamp 901620, input means (an operation key 901615, a connection terminal 901617, a sensor 901618 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 901619), and the like. The portable game machine in FIG. 104 can have various functions such as, but not limited to, a function to read a program or data stored in the recording medium to display on the display portion; and a function to share information with another portable game machine by wireless communication.

As shown in FIGS. 95A to 95C, 102A to 102C, 103A, 103B, and 104, the electronic devices include a display portion for displaying some kind of information.

Next, application examples of a semiconductor device are described.

Figure 96:
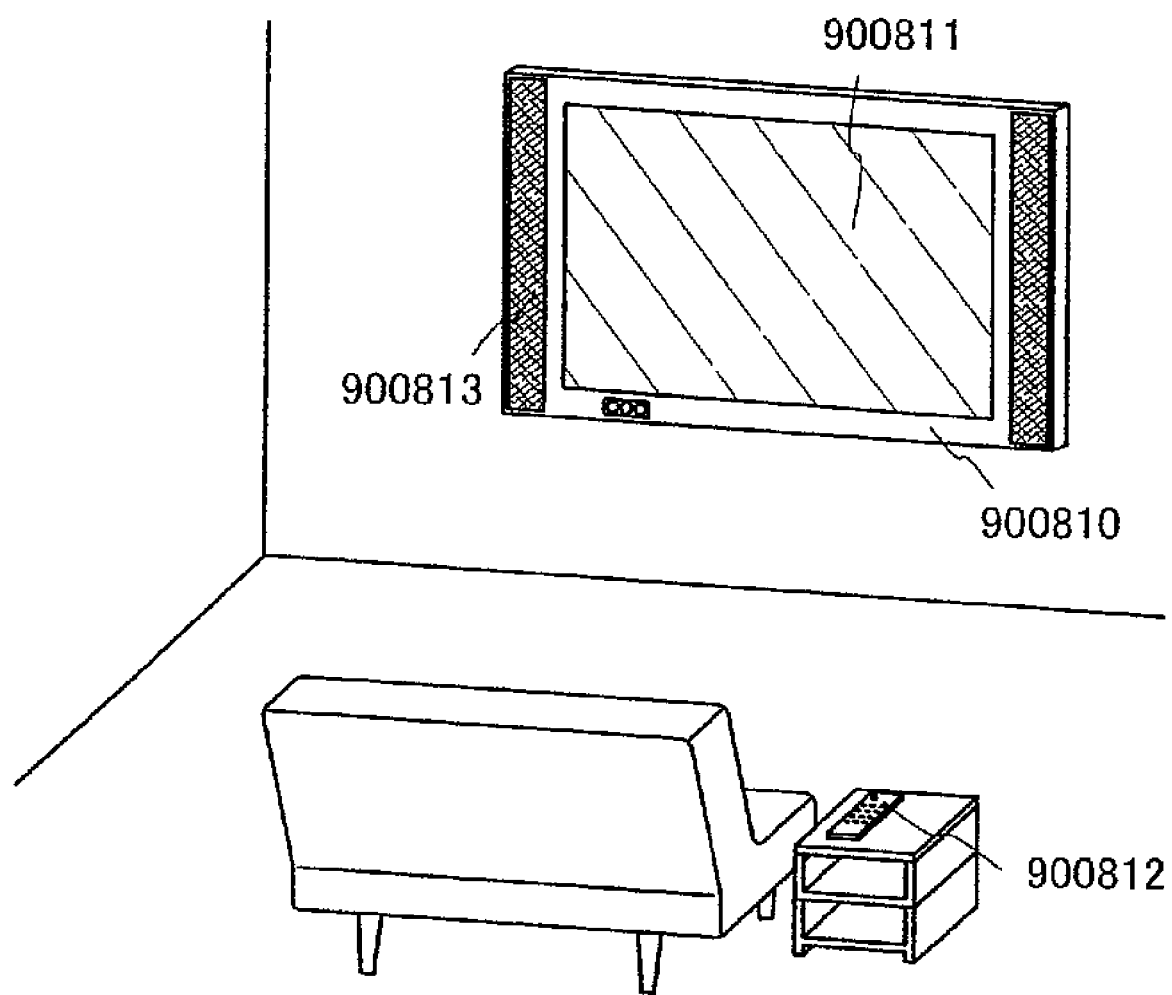
FIG. 96 is a diagram illustrating an electronic device using a semiconductor device according to the present invention.

FIG. 96 illustrates an example where a semiconductor device is incorporated in a constructed object. FIG. 96 illustrates a housing 900810, a display portion 900811, a remote control device 900812 which is an operation portion, a speaker portion 900813, and the like. The semiconductor device is attached to or incorporated in the constructed object as a wall-hanging type and can be provided without requiring a large space.

Figure 97:
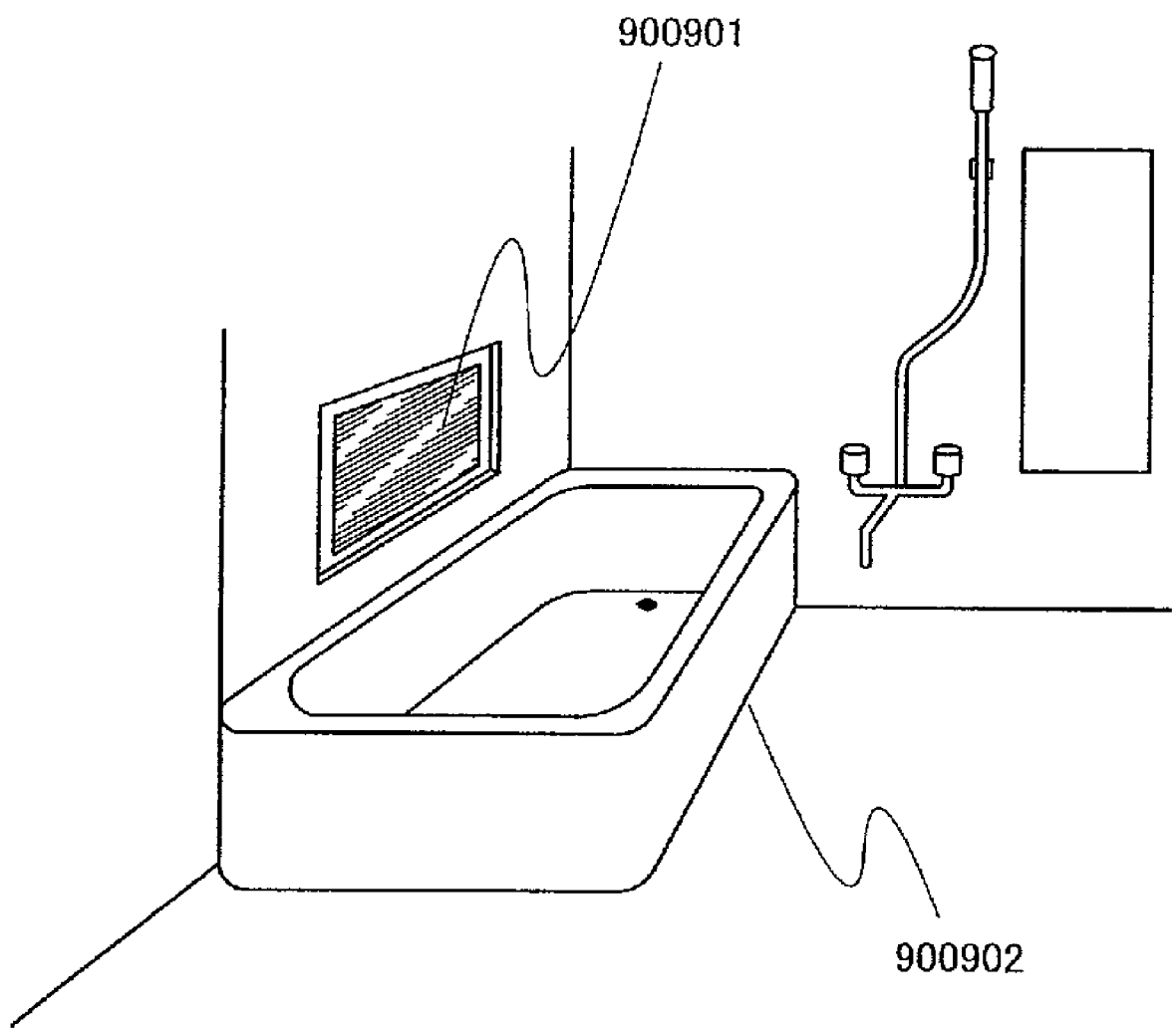
FIG. 97 is a diagram illustrating an electronic device using a semiconductor device according to the present invention.

FIG. 97 illustrates another example where a semiconductor device is incorporated in a constructed object. A display panel 900901 is incorporated with a prefabricated bath 900902, and a person who takes a bath can view the display panel 900901. The display panel 900901 has a function to display information by an operation by a person who takes a bath; and a function to be used as an advertisement or an entertainment means.

The semiconductor device can be provided not only to a side wall of the prefabricated bath 900902 as shown in FIG. 97, but also to various places. For example, the semiconductor device can be attached to or unified with part of a mirror, a bathtub itself, or the like. At this time, the shape of the display panel 900901 may be changed in accordance with the shape of the mirror or the bathtub.

Figure 98:
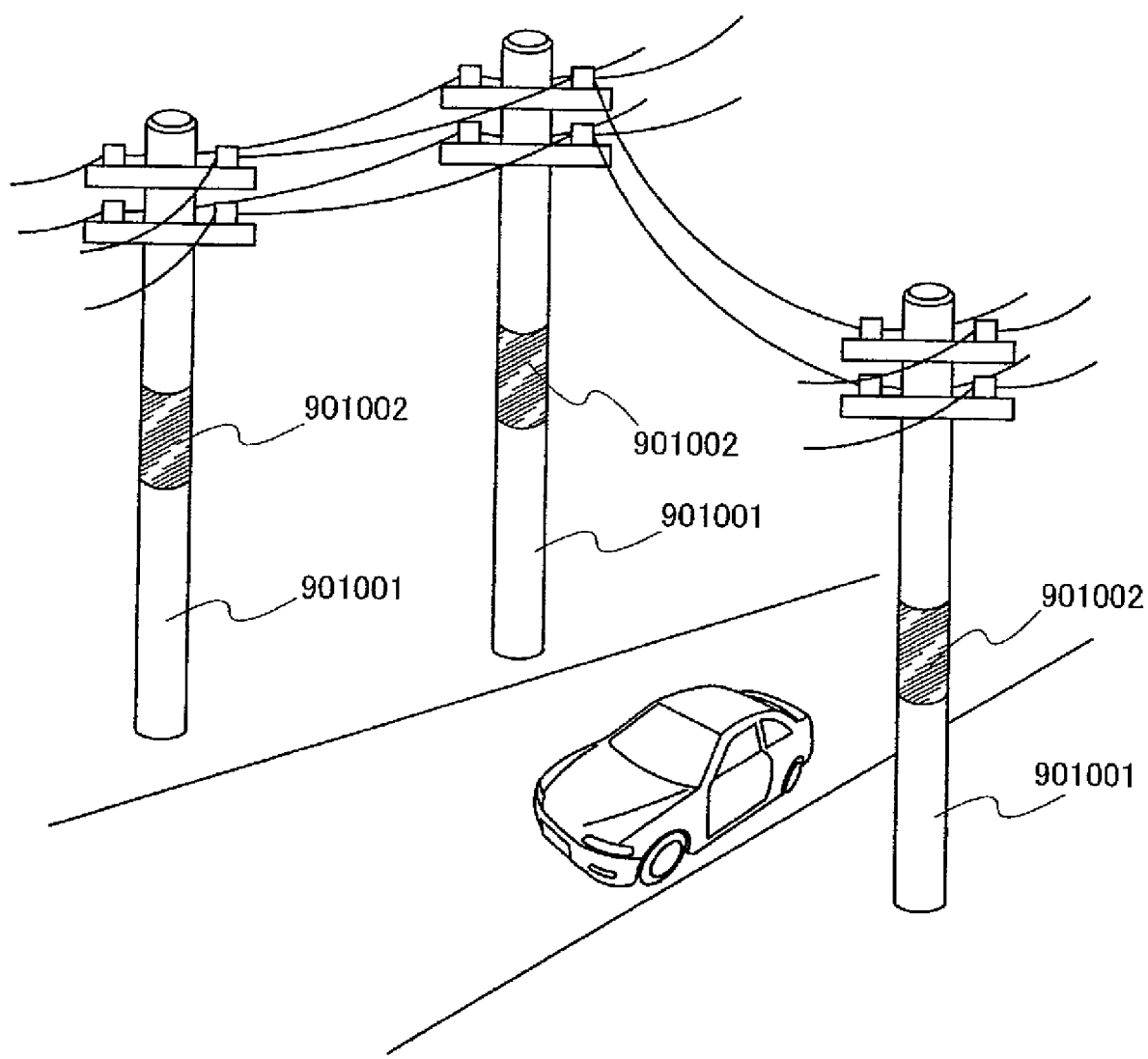
FIG. 98 is a diagram illustrating an electronic device using a semiconductor device according to the present invention.

FIG. 98 illustrates another example where a semiconductor device is unified with a constructed object. A display panel 901002 is bent and attached to a curved surface of a column-shaped object 901001. Here, a utility pole is described as the column-shaped object 901001.

The display panel 901002 in FIG. 98 is provided at a position higher than a human viewpoint. When the display panels 901002 are provided in constructed objects which stand together in large numbers outdoors, such as utility poles, advertisement to unspecified number of viewers can be performed. Since it is easy for the display panel 901002 to display the same images and instantly switch images by external control, highly effective information display and advertisement effect can be expected. When provided with self-luminous display elements, the display panel 901002 can be effectively used as a highly visible display medium even at night. When the display panel 901002 is provided in the utility pole, a power supply means for the display panel 901002 can be easily obtained. In an emergency such as disaster, the display panel 901002 can also rapidly transmit correct information to victims.

An example of the display panel 901002 is a display panel which displays an image by driving a display element with a switching element such as an organic transistor provided over a film-like substrate.

In this embodiment mode, a wall, a column-shaped object, and a prefabricated bath are shown as examples of a constructed object; however, this embodiment mode is not limited thereto, and various constructed objects can be provided with a semiconductor device.

Next, examples where a semiconductor device is incorporated with a moving object are described.

Figure 99:
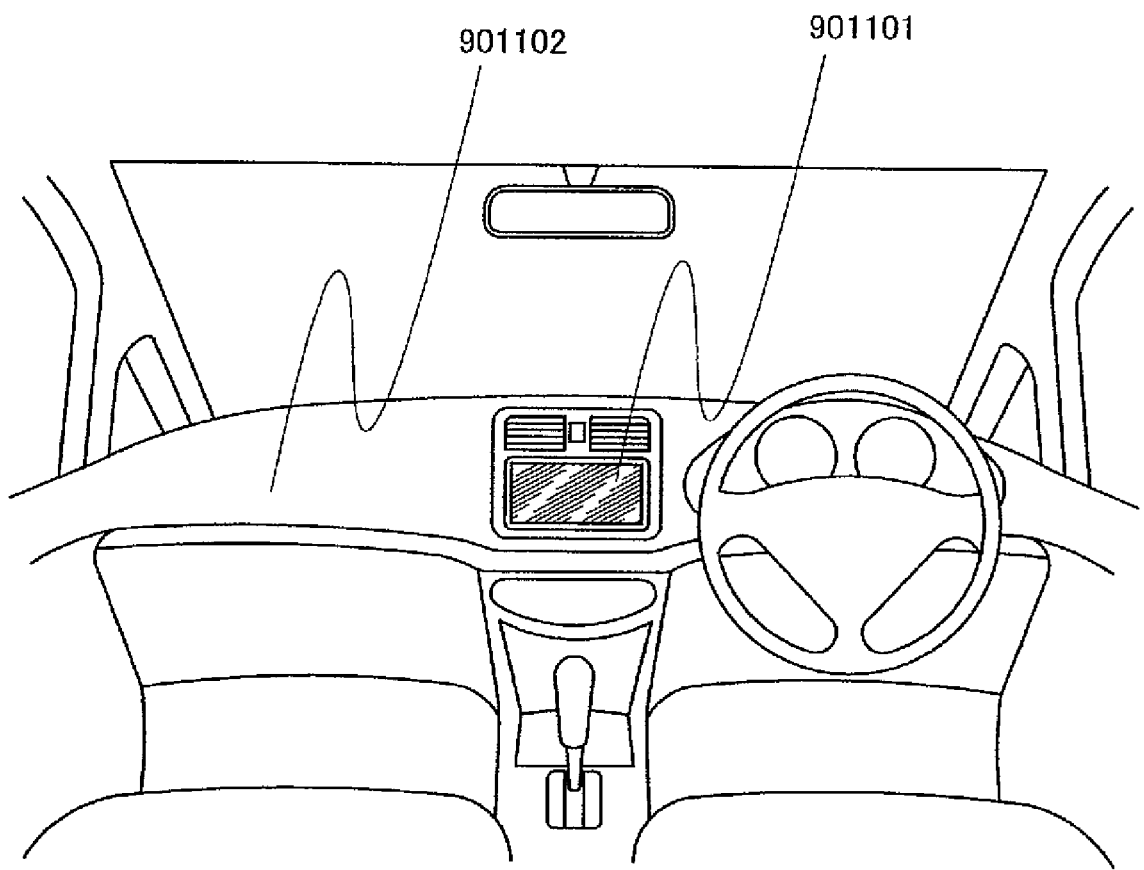
FIG. 99 is a diagram illustrating an electronic device using a semiconductor device according to the present invention.

FIG. 99 illustrates an example where a semiconductor device is incorporated with a car. A display panel 901102 is incorporated with a car body 901101, and can display an operation of the car body or information input from inside or outside the car body on demand. Note that a navigation function may be provided.

The semiconductor device can be provided not only to the car body 901101 as shown in FIG. 99, but also to various places. For example, the semiconductor device can be incorporated with a glass window, a door, a steering wheel, a gear shift, a seat, a rear-view mirror, and the like. At this time, the shape of the display panel 901102 may be changed in accordance with the shape of an object provided with the semiconductor device.

Figure 100A:
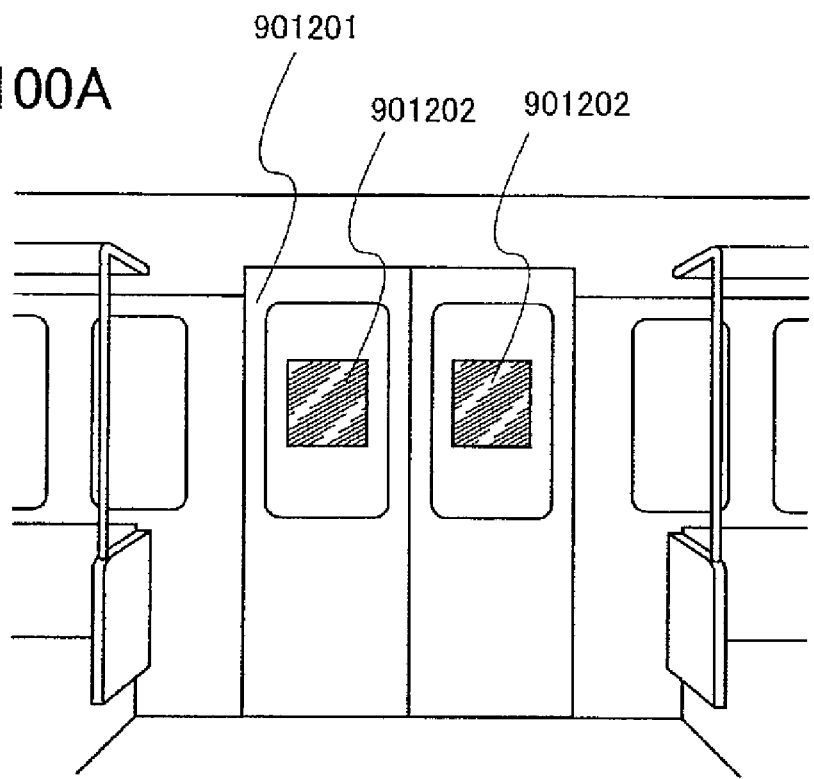
FIGS. 100A and 100B are diagrams illustrating electronic devices using a semiconductor device according to the present invention.
Figure 100B:
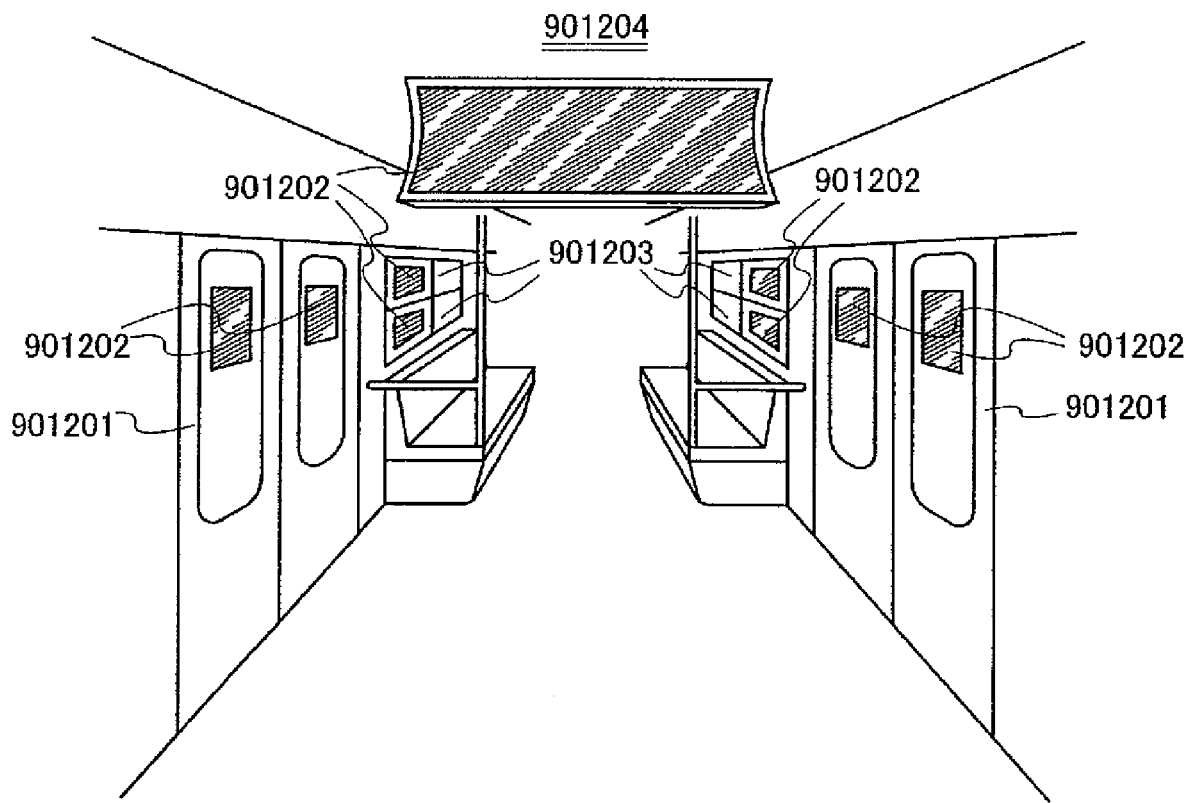

FIGS. 100A and 100B show examples where a semiconductor device is incorporated with a train car are described.

FIG. 100A illustrates an example where a display panel 901202 is provided in glass of a door 901201 in a train car, which has an advantage compared with a conventional advertisement using paper in that labor cost for changing an advertisement is not necessary. Since the display panel 901202 can instantly switch images displayed on a display portion by an external signal, images on the display panel can be switched every time period when types of passengers on the train are changed, for example; thus, more effective advertisement effect can be expected.

FIG. 100B illustrates an example where the display panels 901202 are provided to a glass window 901203 and a ceiling 901204 as well as the glass of the door 901201 in the train car. In this manner, the semiconductor device can be easily provided to a place where the semiconductor device has been difficult to be provided conventionally; thus, effective advertisement effect can be obtained. Further, the semiconductor device can instantly switch images displayed on a display portion by an external signal; thus, cost and time for changing an advertisement can be reduced, and more flexible advertisement management and information transmission can be realized.

The semiconductor device can be provided not only to the door 901201, the glass window 901203, and the ceiling 901204 as shown in FIG. 100, but also to various places. For example, the semiconductor device can be incorporated with a strap, a seat, a handrail, a floor, and the like. At this time, the shape of the display panel 901202 may be changed in accordance with the shape of an object provided with the semiconductor device.

Figure 101A:
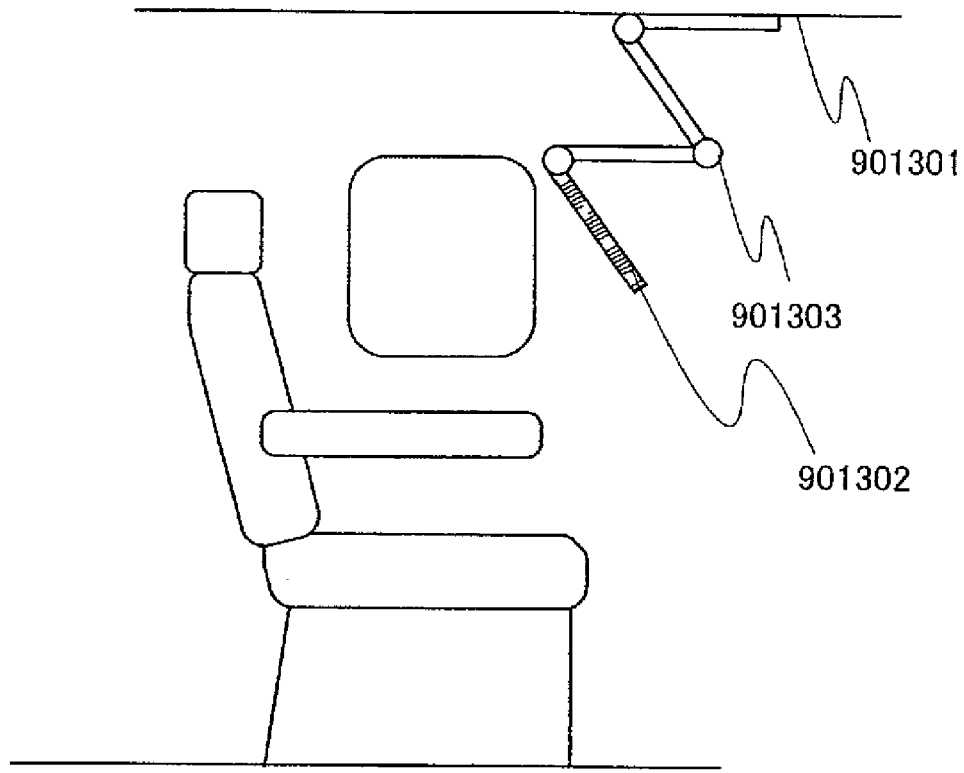
FIGS. 101A and 101B are diagrams illustrating electronic devices using a semiconductor device according to the present invention.
Figure 101B:
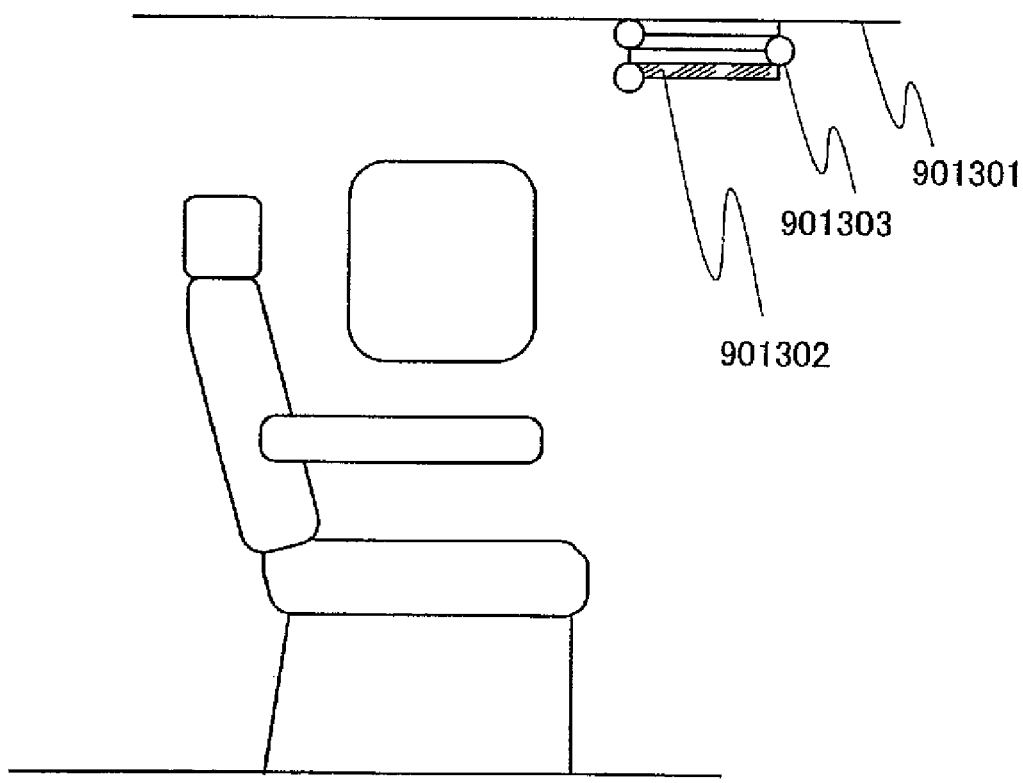

FIGS. 101A and 101B show an example where a semiconductor device is incorporated with a passenger airplane.

FIG. 101A illustrates the shape of a display panel 901302 attached to a ceiling 901301 above a seat of the passenger airplane when the display panel 901302 is used. The display panel 901302 is incorporated with the ceiling 901301 using a hinge portion 901303, and the passenger can view the display panel 901302 by stretching of the hinge portion 901303. The display panel 901302 has a function to display information by an operation by the passenger and a function to be used as an advertisement or an entertainment means. When the hinge portion is bent and put in the ceiling 901301 of the airplane as shown in FIG. 101B, safety in taking-off and landing can be assured. Note that when a display element in the display panel is lit in an emergency, the display panel can also be used as an information transmission means and an evacuation light.

The semiconductor device can be provided not only to the ceiling 901301 as shown in FIGS. 101A and 101B, but also to various places. For example, the semiconductor device can be incorporated with a seat, a table attached to a seat, an armrest, a window, and the like. A large-scale display panel which a large number of people can view may be provided at a wall of an airframe. At this time, the shape of the display panel 901302 may be changed in accordance with the shape of an object provided with the semiconductor device.

Note that in this embodiment mode, bodies of a train car, a car, and an airplane are shown as a moving object; however, the present invention is not limited thereto, and a semiconductor device can be provided to various objects such as a motorcycle, an four-wheel drive car (including a car, a bus, and the like), a train (including a monorail, a railroad car, and the like), and a vessel. Since a semiconductor device can instantly switch images displayed on a display panel in a moving object by an external signal, a moving object is provided with the semiconductor device, so that the moving object can be used as an advertisement display board for an unspecified number of customers, an information display board in disaster, and the like.

Although this embodiment mode has been described with reference to various drawings, the contents (or part of the contents) described in each drawing can be freely applied to, combined with, or replaced with the contents (or part of the contents) described in another drawing. Further, much more drawings can be formed by combining each part in the above-described drawings with another part.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in the drawings in this embodiment mode with part of another embodiment mode.

Note that this embodiment mode has described just examples of embodying, slightly transforming, modifying, improving, describing in detail, or applying the contents (or part of the contents) described in other embodiment modes, an example of related part thereof, or the like. Therefore, the contents described in other embodiment modes can be freely applied to, combined with, or replaced with the contents described in this embodiment mode.

Embodiment Mode 21

As described above, the present invention includes at least the following aspects.

One aspect is a display device including a pixel portion having a plurality of pixels and a driver circuit electrically connected to the pixel portion. The driver circuit includes a first transistor, a second transistor, a third transistor, a fourth transistor, a fifth transistor, a sixth transistor, and a seventh transistor. This driver circuit at least partly has the following connection relationship. A first electrode of the first transistor is electrically connected to a fourth wiring, and a second electrode of the first transistor is electrically connected to a third wiring. A first electrode of the second transistor is electrically connected to a sixth wiring, and a second electrode of the second transistor is electrically connected to the third wiring. A first electrode of the third transistor is electrically connected to a fifth wiring, a second electrode of the third transistor is electrically connected to a gate electrode of the second transistor, and a gate electrode of the third transistor is electrically connected to a seventh wiring. A first electrode of the fourth transistor is electrically connected to the sixth wiring, a second electrode of the fourth transistor is electrically connected to the gate electrode of the second transistor, and a gate electrode of the fourth transistor is electrically connected to a gate electrode of the first transistor. A first electrode of the fifth transistor is electrically connected to the seventh wiring, a second electrode of the fifth transistor is electrically connected to the gate electrode of the first transistor, and a gate electrode of the fifth transistor is electrically connected to a first wiring. A first electrode of the sixth transistor is electrically connected to the sixth wiring, a second electrode of the sixth transistor is electrically connected to the gate electrode of the first transistor, and a gate electrode of the sixth transistor is electrically connected to the gate electrode of the second transistor. A first electrode of the seventh transistor is electrically connected to the sixth wiring, a second electrode of the seventh transistor is electrically connected to the gate electrode of the first transistor, and a gate electrode of the seventh transistor is electrically connected to a second wiring.

The display device including the pixel portion having a plurality of pixels and the driver circuit electrically connected to the pixel portion may have the following feature. A feature is that a value of ratio W/L of a channel length L and a channel width W of the first transistor is the greatest among values of ratios W/L of the first to seventh transistors. Another feature is that a value of ratio W/L of a channel length L and a channel width W of the first transistor is two to five times greater than a value of ratio W/L of the fifth transistor. Another feature is that a channel length L of the third transistor is greater than a channel length of the fourth transistor. Another feature is that a capacitor is provided between the second electrode of the first transistor and the gate electrode of the first transistor. Another feature is that each of the first to seventh transistors is an n-channel transistor. Another feature is that each of the first to seventh transistors uses amorphous silicon as a semiconductor layer.

Another aspect is a display device including a pixel portion having a plurality of pixels, and a first driver circuit and a second driver circuit electrically connected to the pixel portion. The first driver circuit and the second driver circuit at least partly has the following connection relationship. The first driver circuit includes a first transistor, a second transistor, a third transistor, a fourth transistor, a fifth transistor, a sixth transistor, and a seventh transistor. A first electrode of the first transistor is electrically connected to a fourth wiring, and a second electrode of the first transistor is electrically connected to a third wiring. A first electrode of the second transistor is electrically connected to a sixth wiring, and a second electrode of the second transistor is electrically connected to the third wiring. A first electrode of the third transistor is electrically connected to a fifth wiring, a second electrode of the third transistor is electrically connected to a gate electrode of the second transistor, and a gate electrode of the third transistor is electrically connected to a seventh wiring. A first electrode of the fourth transistor is electrically connected to the sixth wiring, a second electrode of the fourth transistor is electrically connected to the gate electrode of the second transistor, and a gate electrode of the fourth transistor is electrically connected to a gate electrode of the first transistor. A first electrode of the fifth transistor is electrically connected to the seventh wiring, a second electrode of the fifth transistor is electrically connected to the gate electrode of the first transistor, and a gate electrode of the fifth transistor is electrically connected to a first wiring. A first electrode of the sixth transistor is electrically connected to the sixth wiring, a second electrode of the sixth transistor is electrically connected to the gate electrode of the first transistor, and a gate electrode of the sixth transistor is electrically connected to the gate electrode of the second transistor. A first electrode of the seventh transistor is electrically connected to the sixth wiring, a second electrode of the seventh transistor is electrically connected to the gate electrode of the first transistor, and a gate electrode of the seventh transistor is electrically connected to a second wiring. The second driver circuit includes an eighth transistor, a ninth transistor, a tenth transistor, an eleventh transistor, a twelfth transistor, a thirteenth transistor, and a fourteenth transistor. A first electrode of the eighth transistor is electrically connected to a eleventh wiring, and a second electrode of the eighth transistor is electrically connected to a tenth wiring. A first electrode of the ninth transistor is electrically connected to a thirteenth wiring, and a second electrode of the ninth transistor is electrically connected to the tenth wiring. A first electrode of the tenth transistor is electrically connected to a twelfth wiring, a second electrode of the tenth transistor is electrically connected to a gate electrode of the ninth transistor, and a gate electrode of the tenth transistor is electrically connected to a fourteenth wiring. A first electrode of the eleventh transistor is electrically connected to the thirteenth wiring, a second electrode of the eleventh transistor is electrically connected to the gate electrode of the ninth transistor, and a gate electrode of the eleventh transistor is electrically connected to a gate electrode of the eighth transistor. A first electrode of the twelfth transistor is electrically connected to the 14th wiring, wherein a second electrode of the twelfth transistor is electrically connected to the gate electrode of the eighth transistor, wherein a gate electrode of the twelfth transistor is electrically connected to an eighth wiring. A first electrode of the thirteenth transistor is electrically connected to the thirteenth wiring, a second electrode of the thirteenth transistor is electrically connected to the gate electrode of the eighth transistor, and a gate electrode of the thirteenth transistor is electrically connected to the gate electrode of the ninth transistor. A first electrode of the fourteenth transistor is electrically connected to the thirteenth wiring, a second electrode of the fourteenth transistor is electrically connected to the gate electrode of the eighth transistor, and a gate electrode of the fourteenth transistor is electrically connected to a ninth wiring.

The display device including the pixel portion having a plurality of pixels, and the first driver circuit and the second driver circuit electrically connected to the pixel portion may have the following feature. One feature is that the fourth wiring and the eleventh wiring are electrically connected to each other, the fifth wiring and the twelfth wiring are electrically connected to each other, the sixth wiring and the thirteenth wiring are electrically connected to each other, and the seventh wiring and the fourteenth wiring are electrically connected to each other. Another feature is that the fourth wiring and the eleventh wiring are the same wiring, the fifth wiring and the twelfth wiring are the same wiring, the sixth wiring and the thirteenth wiring are the same wiring, and the seventh wiring and the fourteenth wiring are the same wiring. Another feature is that the third wiring and the tenth wiring are electrically connected to each other. Another feature is that the third wiring and the tenth wiring are the same wiring. Another feature is that a value of ratio W/L of a channel length L and a channel width W of the first transistor is the greatest among values of ratios W/L of the first to seventh transistors, and a value of ratio W/L of a channel length L and a channel width W of the eighth transistor is the greatest among values of ratios W/L of the eighth to fourteenth transistors. Another feature is that the value of ratio W/L of a channel length L and a channel width W of the first transistor is two to five times greater than a value of W/L of the fifth transistor, and the value of ratio W/L of a channel length L and a channel width W of the eighth transistor is two to five times greater than a value of W/L of the twelfth transistor. Another feature is that a channel length L of the third transistor is larger than a channel length L of the fourth transistor, and a channel length L of the tenth transistor is larger than a channel length of the eleventh transistor. Another feature is that a capacitor is provided between the second electrode and the gate electrode of the first transistor, and a capacitor is provided between the second electrode and the gate electrode of the eighth transistor. Another feature is that each of the first driver circuit and the second driver circuit is a flip-flop circuit. Another feature is that each of the first to fourteenth transistors is an n-channel transistor.

Each display device in this embodiment mode corresponds to the display devices disclosed in this specification. Therefore, operation effects similar to those in the other embodiment modes are obtained.

This application is based on Japanese Patent Application serial No. 2006-269689 filed in Japan Patent Office on Sep. 29, 2006, the entire contents of which are hereby incorporated by reference.

What is claimed is:

1. A display device comprising:
   a pixel portion including a plurality of pixels; and
   a driver circuit electrically connected to the pixel portion,
   wherein the driver circuit includes a first transistor, a second transistor, a third transistor, a fourth transistor, a fifth transistor, a sixth transistor, and a seventh transistor,
   wherein a first electrode of the first transistor is electrically connected to a fourth wiring, and a second electrode of the first transistor is electrically connected to a third wiring,
   wherein a first electrode of the second transistor is electrically connected to a sixth wiring, and a second electrode of the second transistor is electrically connected to the third wiring,
   wherein a first electrode of the third transistor is electrically connected to a fifth wiring, a second electrode of the third transistor is electrically connected to a gate electrode of the second transistor, and a gate electrode of the third transistor is electrically connected to a seventh wiring,
   wherein a first electrode of the fourth transistor is electrically connected to the sixth wiring, a second electrode of the fourth transistor is electrically connected to the gate electrode of the second transistor, and a gate electrode of the fourth transistor is electrically connected to a gate electrode of the first transistor,
   wherein a first electrode of the fifth transistor is electrically connected to the seventh wiring, a second electrode of the fifth transistor is electrically connected to the gate electrode of the first transistor, and a gate electrode of the fifth transistor is electrically connected to a first wiring,
   wherein a first electrode of the sixth transistor is electrically connected to the sixth wiring, a second electrode of the sixth transistor is electrically connected to the gate electrode of the first transistor, and a gate electrode of the sixth transistor is electrically connected to the gate electrode of the second transistor, and
   wherein a first electrode of the seventh transistor is electrically connected to the sixth wiring, a second electrode of the seventh transistor is electrically connected to the gate electrode of the first transistor, and a gate electrode of the seventh transistor is electrically connected to a second wiring.

2. The display device according to claim 1, wherein a value of a ratio W/L of a channel width W to a channel length L of the first transistor is the greatest among values of ratios W/L of the first to seventh transistors.

3. The display device according to claim 1, wherein a value of a ratio W/L of a channel width W to a channel length L of the first transistor is two to five times greater than a value of a ratio W/L of the fifth transistor.

4. The display device according to claim 1, wherein a channel length L of the third transistor is larger than a channel length L of the fourth transistor.

5. The display device according to claim 1, wherein a capacitor is provided between the second electrode of the first transistor and the gate electrode of the first transistor.

6. The display device according to claim 1, wherein each of the first to seventh transistors is an n-channel transistor.

7. The display device according to claim 1, wherein amorphous silicon is used for a semiconductor layer including a channel formation region of each of the first to seventh transistors.

8. The display device according to claim 1, wherein the driver circuit is a flip-flop circuit.

9. An electronic device comprising the display device according to claim 1.

10. A display device comprising:
    a pixel portion including a plurality of pixels; and
    a first driver circuit and a second driver circuit which are electrically connected to the pixel portion,
    wherein the first driver circuit includes a first transistor, a second transistor, a third transistor, a fourth transistor, a fifth transistor, a sixth transistor, and a seventh transistor,
    wherein a first electrode of the first transistor is electrically connected to a fourth wiring, and a second electrode of the first transistor is electrically connected to a third wiring,
    wherein a first electrode of the second transistor is electrically connected to a sixth wiring, and a second electrode of the second transistor is electrically connected to the third wiring,
    wherein a first electrode of the third transistor is electrically connected to a fifth wiring, a second electrode of the third transistor is electrically connected to a gate electrode of the second transistor, and a gate electrode of the third transistor is electrically connected to a seventh wiring,
    wherein a first electrode of the fourth transistor is electrically connected to the sixth wiring, a second electrode of the fourth transistor is electrically connected to the gate electrode of the second transistor, and a gate electrode of the fourth transistor is electrically connected to a gate electrode of the first transistor,
    wherein a first electrode of the fifth transistor is electrically connected to the seventh wiring, a second electrode of the fifth transistor is electrically connected to the gate electrode of the first transistor, and a gate electrode of the fifth transistor is electrically connected to a first wiring,
    wherein a first electrode of the sixth transistor is electrically connected to the sixth wiring, a second electrode of the sixth transistor is electrically connected to the gate electrode of the first transistor, and a gate electrode of the sixth transistor is electrically connected to the gate electrode of the second transistor,
    wherein a first electrode of the seventh transistor is electrically connected to the sixth wiring, a second electrode of the seventh transistor is electrically connected to the gate electrode of the first transistor, and a gate electrode of the seventh transistor is electrically connected to a second wiring, wherein the second driver circuit includes an eighth transistor, a ninth transistor, a tenth transistor, an eleventh transistor, a twelfth transistor, a thirteenth transistor, and a fourteenth transistor, wherein a first electrode of the eighth transistor is electrically connected to an eleventh wiring, and a second electrode of the eighth transistor is electrically connected to a tenth wiring, wherein a first electrode of the ninth transistor is electrically connected to a thirteenth wiring, and a second electrode of the ninth transistor is electrically connected to the tenth wiring, wherein a first electrode of the tenth transistor is electrically connected to a twelfth wiring, a second electrode of the tenth transistor is electrically connected to a gate electrode of the ninth transistor, and a gate electrode of the tenth transistor is electrically connected to a fourteenth wiring, wherein a first electrode of the eleventh transistor is electrically connected to the thirteenth wiring, a second electrode of the eleventh transistor is electrically connected to the gate electrode of the ninth transistor, and a gate electrode of the eleventh transistor is electrically connected to a gate electrode of the eighth transistor, wherein a first electrode of the twelfth transistor is electrically connected to the fourteenth wiring, a second electrode of the twelfth transistor is electrically connected to the gate electrode of the eighth transistor, and a gate electrode of the twelfth transistor is electrically connected to an eighth wiring, wherein a first electrode of the thirteenth transistor is electrically connected to the thirteenth wiring, a second electrode of the thirteenth transistor is electrically connected to the gate electrode of the eighth transistor, and a gate electrode of the thirteenth transistor is electrically connected to the gate electrode of the ninth transistor, and wherein a first electrode of the fourteenth transistor is electrically connected to the thirteenth wiring, a second electrode of the fourteenth transistor is electrically connected to the gate electrode of the eighth transistor, and a gate electrode of the fourteenth transistor is electrically connected to a ninth wiring.

11. The display device according to claim 10,
wherein the fourth wiring and the eleventh wiring are electrically connected to each other,
the fifth wiring and the twelfth wiring are electrically connected to each other,
the sixth wiring and the thirteenth wiring are electrically connected to each other, and
the seventh wiring and the fourteenth wiring are electrically connected to each other.

12. The display device according to claim 10,
wherein the fourth wiring and the eleventh wiring are the same wiring,
the fifth wiring and the twelfth wiring are the same wiring,
the sixth wiring and the thirteenth wiring are the same wiring, and
the seventh wiring and the fourteenth wiring are the same wiring.

13. The display device according to claim 10, wherein the third wiring and the tenth wiring are electrically connected to each other.

14. The display device according to claim 10, wherein the third wiring and the tenth wiring are the same wiring.

15. The display device according to claim 10, wherein a value of a ratio W/L of a channel width W to a channel length L of the first transistor is the greatest among values of ratios W/L of the first to seventh transistors, and a value of a ratio W/L of a channel width W to a channel length L of the eighth transistor is the greatest among values of ratios W/L of the eighth to fourteenth transistors.

16. The display device according to claim 10, wherein a value of a ratio W/L of a channel width W to a channel length L of the first transistor is two to five times greater than a value of a ratio of W/L of the fifth transistor, and a value of a ratio W/L of a channel width W to a channel length L of the eighth transistor is two to five times greater than a value of a ratio W/L of the twelfth transistor.

17. The display device according to claim 10, wherein a channel length L of the third transistor is larger than a channel length L of the fourth transistor, and a channel length L of the tenth transistor is larger than a channel length L of the eleventh transistor.

18. The display device according to claim 10, wherein a capacitor is provided between the second electrode of the first transistor and the gate electrode of the first transistor, and a capacitor is provided between the second electrode of the eighth transistor and the gate electrode of the eighth transistor.

19. The display device according to claim 10, wherein each of the first driver circuit and the second driver circuit is a flip-flop circuit.

20. The display device according to claim 10, wherein each of the first to fourteenth transistors is an n-channel transistor.

21. The display device according to claim 10, wherein amorphous silicon is used for a semiconductor layer including a channel formation region of each of the first to fourteenth transistors.

22. An electronic device comprising the display device according to claim 10.

23. A semiconductor device comprising:
a first transistor;
a second transistor;
a third transistor;
a first clock wiring;
a second clock wiring;
a first power supply line;
a second power supply line;
an output node,
wherein the first transistor and the second transistor are connected in series between the first clock signal and the first power supply line,
wherein a first electrode of the third transistor is connected to a gate electrode of the second transistor, a second electrode of the third transistor is connected to the second clock wiring, and a gate electrode of the third transistor is connected to the second power supply line, and
wherein the first transistor and the second transistor are connected to the output node.

24. The semiconductor device according to claim 23, wherein each of the first to third transistors is an n-channel transistor.

25. The semiconductor device according to claim 23, wherein amorphous silicon is used for a semiconductor layer of each of the first to third transistors.

* * * * *